United States Patent
Sasada et al.

(10) Patent No.: US 11,588,119 B2
(45) Date of Patent: *Feb. 21, 2023

(54) LIGHT EMITTING DEVICE

(71) Applicant: Sumitomo Chemical Company, Limited, Tokyo (JP)

(72) Inventors: Toshiaki Sasada, Tsukuba (JP); Rei Okamura, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 464 days.

This patent is subject to a terminal disclaimer.

(21) Appl. No.: 16/500,903

(22) PCT Filed: Apr. 20, 2018

(86) PCT No.: PCT/JP2018/016310
§ 371 (c)(1),
(2) Date: Oct. 4, 2019

(87) PCT Pub. No.: WO2018/198975
PCT Pub. Date: Nov. 1, 2018

(65) Prior Publication Data
US 2020/0136062 A1 Apr. 30, 2020

(30) Foreign Application Priority Data

Apr. 27, 2017 (JP) .............................. JP2017-088011

(51) Int. Cl.
*H01L 51/00* (2006.01)
*C09K 11/06* (2006.01)
*H01L 51/50* (2006.01)

(52) U.S. Cl.
CPC .......... *H01L 51/0074* (2013.01); *C09K 11/06* (2013.01); *H01L 51/006* (2013.01);
(Continued)

(58) Field of Classification Search
CPC ............... H01L 51/0074; H01L 51/006; H01L 51/0072; H01L 51/0073; H01L 51/0085; H01L 51/0056; H01L 51/5016; H01L 51/5056; H01L 51/5072; H01L 51/5088; H01L 51/5092; H01L 51/50; H01L 51/0067; H01L 51/0035; H01L 51/0058; H01L 51/0077; H01L 51/0094; H01L 51/5048; H01L 51/0039; C09K 11/06; C09K 2211/1029; C09K 2211/185; C07C 11/61; C07D 219/14; C07D 265/38;
(Continued)

(56) References Cited

U.S. PATENT DOCUMENTS 10,141,514 B2 * 11/2018 Sasada .................... C08L 65/00
11,225,602 B2 * 1/2022 Sasada .................... H05B 33/12
(Continued)

FOREIGN PATENT DOCUMENTS

EP 3154101 A1 4/2017
JP 2013177361 A 9/2013
(Continued)

OTHER PUBLICATIONS

Claims 1-16 in U.S. Appl. No. 16/493,446, filed Sep. 12, 2019. (Year: 2019).*
(Continued)

*Primary Examiner* — Douglas J McGinty
(74) *Attorney, Agent, or Firm* — Panitch Schwarze Belisario & Nadel LLP

(57) ABSTRACT

A light emitting device having excellent luminance life contains an anode, a cathode, a first organic layer disposed between the anode and the cathode and a second organic layer disposed between the anode and the cathode. The first organic layer contains a compound represented by the formula (C-1), and the second organic layer contains a compound represented by the formula (C-1) and a cross-linked body of a crosslinkable material.

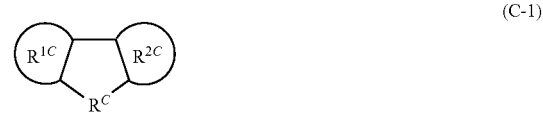

(C-1)

Ring $R^{1C}$ and Ring $R^{2C}$ represent an aromatic hydrocarbon ring or an aromatic hetero ring and $R^C$ represents an oxygen atom, a sulfur atom or a group represented by the formula (C'-1).

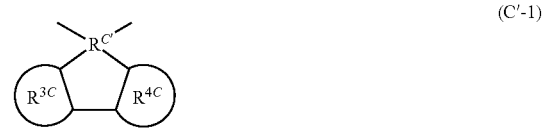

(C'-1)

Ring $R^{3C}$ and Ring $R^{4C}$ represent an aromatic hydrocarbon ring or an aromatic hetero ring and $R^{C'}$ represents a carbon atom, a silicon atom, a germanium atom, a tin atom or a lead atom.

16 Claims, No Drawings

(52) U.S. Cl.
CPC ...... *H01L 51/0072* (2013.01); *H01L 51/0073* (2013.01); *H01L 51/0085* (2013.01); *C09K 2211/1029* (2013.01); *C09K 2211/185* (2013.01); *H01L 51/0056* (2013.01); *H01L 51/5016* (2013.01); *H01L 51/5056* (2013.01); *H01L 51/5072* (2013.01); *H01L 51/5088* (2013.01); *H01L 51/5092* (2013.01)

(58) Field of Classification Search
CPC .. C07D 307/91; C07D 333/76; C07D 403/10; C07D 409/14; C07D 417/10; C07F 15/00; C08G 61/12
USPC ......................................................... 428/690
See application file for complete search history.

(56) References Cited

U.S. PATENT DOCUMENTS

| | | |
|---|---|---|
| 2010/0108991 A1 | 5/2010 | Tanaka et al. |
| 2010/0171101 A1 | 7/2010 | Tanaka et al. |
| 2013/0200340 A1 | 8/2013 | Otsu et al. |
| 2013/0207046 A1* | 8/2013 | Pflumm .............. C07D 307/91 252/500 |
| 2015/0069303 A1 | 3/2015 | Eckes et al. |
| 2017/0040538 A1* | 2/2017 | Matsumoto ......... H01L 51/5036 |
| 2017/0040542 A1* | 2/2017 | Sasada ................ C09K 11/025 |
| 2017/0117491 A1 | 4/2017 | Sasada et al. |
| 2017/0194584 A1* | 7/2017 | An ........................ C07F 15/00 |
| 2020/0044156 A1* | 2/2020 | Sasada ................ C07D 279/22 |
| 2020/0052228 A1* | 2/2020 | Usui ..................... C08G 61/12 |
| 2020/0091438 A1* | 3/2020 | Inakazu .............. H01L 51/0074 |

FOREIGN PATENT DOCUMENTS

| | | | |
|---|---|---|---|
| JP | 2014075605 A | 4/2014 | |
| JP | 2015519424 A | 7/2015 | |
| WO | 2007114244 A1 | 10/2007 | |
| WO | 2007119473 A1 | 10/2007 | |
| WO | 2008029729 A1 | 3/2008 | |
| WO | 2015156235 A1 | 10/2015 | |
| WO | 2015159744 A1 | 10/2015 | |
| WO | 2015163174 A1 | 10/2015 | |
| WO | WO-2015163174 A1 * | 10/2015 | .......... C07F 15/0033 |
| WO | 2016194695 A1 | 12/2016 | |

OTHER PUBLICATIONS

Office Action dated Jan. 12, 2022 in KR Application No. 1020197034216.
Office Action dated Jun. 21, 2021 in CN Application No. 201880027269.5.
Extended European Search Report dated Dec. 4, 2020 in EP Application No. 18792310.7.
International Search Report dated Jul. 24, 2018 in International Application No. PCT/JP2018/016310.
Liaptsis et al., "Solution Processed Organic Double Light-Emitting Layer Diode Based on Cross-Linkable Smaill Molecular Systems," Agnew. Chem. Int. Ed., vol. 52, pp. 9563-9567 (2013).
Written Opinion dated Jul. 24, 2018 in International Application No. PCT/JP2018/016310.
Office Action dated Mar. 17, 2022 in EP Application No. 18792310.7.
Office Action dated Jul. 19, 2022 in KR Application No. 1020197034216.

* cited by examiner

LIGHT EMITTING DEVICE

CROSS-REFERENCE TO RELATED APPLICATIONS

This application is a Section 371 of International Application No. PCT/JP2018/016310, filed Apr. 20, 2018, which was published in the Japanese language on Nov. 1, 2018 under International Publication No. WO 2018/198975 A1, which claims priority under 35 U.S.C. § 119(b) to Japanese Application No. 2017-088011, filed Apr. 27, 2017, the disclosures of which are incorporated herein by reference in their entirety.

TECHNICAL FIELD

The present invention relates to a light emitting device.

BACKGROUND ART

Light emitting devices such as organic electroluminescent devices and the like can be suitably used for display and lighting applications. For example, Patent Document 1 describes a light emitting device having a second organic layer composed only of a cross-linked body of a crosslinkable material and a first organic layer containing a compound (HO) and a metal complex (B0).

[Chemical Formula 1]

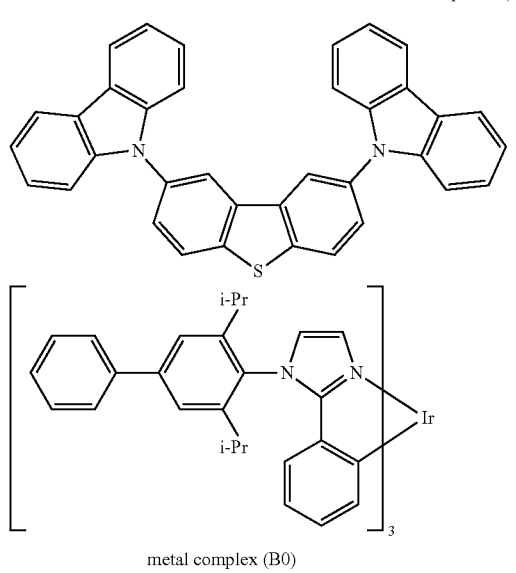

compound (H0)

metal complex (B0)

PRIOR ART DOCUMENT

Patent Document

[Patent Document 1] International Publication WO 2015/159744

SUMMARY OF THE INVENTION

Problem to be Solved by the Invention

However, the above-described light emitting device was not necessarily sufficient in luminance life. Then, the present invention has an object of providing a light emitting device excellent in luminance life.

Means for Solving the Problem

The present invention provides the following [1] to [15].

[1] A light emitting device comprising an anode, a cathode, a first organic layer disposed between the anode and the cathode and a second organic layer disposed between the anode and the cathode, wherein the first organic layer is a layer containing a compound represented by the formula (C-1), and the second organic layer is a layer containing a compound represented by the formula (C-1) and a cross-linked body of a crosslinkable material:

[Chemical Formula 2]

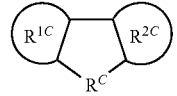
(C-1)

[wherein,

Ring $R^{1C}$ and Ring $R^{2C}$ each independently represent an aromatic hydrocarbon ring or an aromatic hetero ring, and the foregoing rings optionally have a substituent. When a plurality of the substituents are present, they may be combined together to form a ring together with atoms to which they are attached $R^C$ represents an oxygen atom, a sulfur atom or a group represented by the formula (C'-1).]

[Chemical Formula 3]

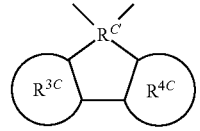
(C'-1)

[wherein,

Ring $R^{3C}$ and Ring $R^{4C}$ each independently represent an aromatic hydrocarbon ring or an aromatic hetero ring, and the foregoing rings optionally have a substituent. When a plurality of the substituents are present, they may be combined together to form a ring together with atoms to which they are attached.

$R^{C'}$ represents a carbon atom, a silicon atom, a germanium atom, a tin atom or a lead atom.].

[2] The light emitting device according to [1], wherein at least one of the above-described compound represented by the formula (C-1) contained in the above-described first organic layer and the above-described compound represented by the formula (C-1) contained in the above-described second organic layer is a compound represented by the formula (C-2-1) or a compound represented by the formula (C-2-2):

[Chemical Formula 4]

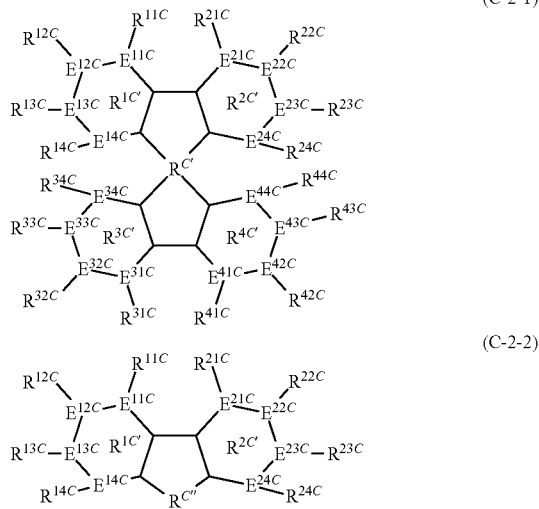

(C-2-1)

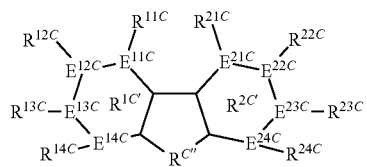

(C-2-2)

[wherein, $R^{C'}$ represents the same meaning as described above.

$R^{C''}$ represents an oxygen atom or a sulfur atom.

$E^{11C}$, $E^{12C}$, $E^{13C}$, $E^{14C}$, $E^{21C}$, $E^{22C}$, $E^{23C}$, $E^{24C}$, $E^{31C}$, $E^{32C}$, $E^{33}$, $E^{34C}$, $E^{41C}$, $E^{42C}$, $E^{43C}$ and $E^{44C}$ each independently represent a nitrogen atom or a carbon atom.

Ring $R^{1C'}$, Ring $R^{2C'}$, Ring $R^{3C'}$ and Ring $R^{4C'}$ each independently represent a benzene ring, a pyridine ring or a diazabenzene ring.

$R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent.

When $E^{11C}$ is a nitrogen atom, $R^{11C}$ is absent. When $E^{12C}$ is a nitrogen atom, $R^{12C}$ is absent. When $E^{13C}$ is a nitrogen atom, $R^{13C}$ is absent. When $E^{14C}$ is a nitrogen atom, $R^{14C}$ is absent. When $E^{21C}$ is a nitrogen atom, $R^{21C}$ is absent. When $E^{22C}$ is a nitrogen atom, $R^{22C}$ is absent. When $E^{23C}$ is a nitrogen atom, $R^{23C}$ is absent. When $E^{24C}$ is a nitrogen atom, $R^{24C}$ is absent. When $E^{31C}$ is a nitrogen atom, $R^{31C}$ is absent. When $E^{32C}$ is a nitrogen atom, $R^{32C}$ is absent. When $E^{33C}$ is a nitrogen atom, $R^{33C}$ is absent. When $E^{34C}$ is a nitrogen atom, $R^{34C}$ is absent. When $E^{41C}$ is a nitrogen atom, $R^{41C}$ is absent. When $E^{42C}$ is a nitrogen atom, $R^{42C}$ is absent. When $E^{43C}$ is a nitrogen atom, $R^{43C}$ is absent. When $E^{44C}$ is a nitrogen atom, $R^{44C}$ is absent.

$R^{11C}$ and $R^{12C}$, $R^{12C}$ and $R^{13C}$, $R^{13C}$ and $R^{14C}$, $R^{14C}$ and $R^{34C}$, $R^{34C}$ and $R^{33C}$, $R^{33C}$ and $R^{32C}$, $R^{32C}$ and $R^{31C}$, $R^{31C}$ and $R^{41C}$, $R^{41C}$ and $R^{42C}$, $R^{42C}$ and $R^{43C}$, $R^{43C}$ and $R^{44C}$, $R^{44C}$ and $R^{24C}$, $R^{24C}$ and $R^{23C}$, $R^{23C}$ and $R^{22C}$, $R^{22C}$ and $R^{21C}$, and $R^{21C}$ and $R^{11C}$ each may be combined together to form a ring together with the carbon atoms to which they are attached.].

[3] The light emitting device according to [2], wherein at least one of the above-described compound represented by the formula (C-1) contained in the above-described first organic layer and the above-described compound represented by the formula (C-1) contained in the above-described second organic layer is a compound represented by the formula (C-2-1), and the above-described compound represented by the formula (C-2-1) is a compound represented by the formula (C-3-1):

[Chemical Formula 5]

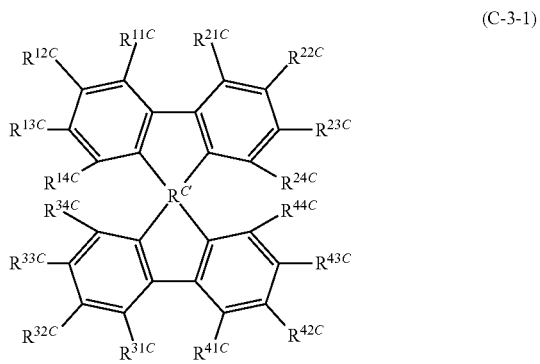

(C-3-1)

[wherein, $R^{C'}$, $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ represent the same meaning as described above.].

[4] The light emitting device according to [2], wherein at least one of the above-described compound represented by the formula (C-1) contained in the above-described first organic layer and the above-described compound represented by the formula (C-1) contained in the above-described second organic layer is a compound represented by the formula (C-2-2), and the above-described compound represented by the formula (C-2-2) is a compound represented by the formula (C-3-2):

[Chemical Formula 6]

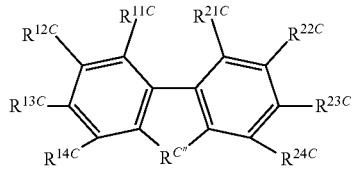

(C-3-2)

[wherein, $R^{C''}$, $R^{11C}$, $R^{12C}$, $R^{13C}$, $R^{14C}$, $R^{21C}$, $R^{22C}$, $R^{23C}$ and $R^{24C}$ represent the same meaning as described above.].

[5] The light emitting device according to any one of [1] to [4], wherein the above-described first organic layer is a layer further containing a phosphorescent compound, and the above-described phosphorescent compound is a phosphorescent compound represented by the formula (1):

[Chemical Formula 7]

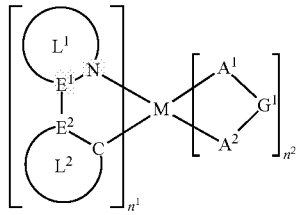

(1)

[wherein,

M represents a ruthenium atom, a rhodium atom, a palladium atom, an iridium atom or a platinum atom.

$n^1$ represents an integer of 1 or more, and $n^2$ represents an integer of 0 or more. $n^1+n^2$ is 3 when M is a ruthenium atom, a rhodium atom or an iridium atom, while $n^1+n^2$ is 2 when M is a palladium atom or a platinum atom.

$E^1$ and $E^2$ each independently represent a carbon atom or a nitrogen atom. At least one of $E^1$ and $E^2$ is a carbon atom. When a plurality of $E^1$ and $E^2$ are present, they may be the same or different at each occurrence.

Ring $L^1$ represents an aromatic hetero ring, and the aromatic hetero ring optionally has a substituent. When a plurality of the substituents are present, they may be combined together to form a ring together with the atoms to which they are attached. When a plurality of Ring $L^1$ are present, they may be the same or different.

Ring $L^2$ represents an aromatic hydrocarbon ring or an aromatic hetero ring, and the foregoing rings optionally have a substituent. When a plurality of the substituents are present, they may be combined together to form a ring together with the atoms to which they are attached. When a plurality of Ring $L^2$ are present, they may be the same or different.

The substituent which Ring $L^1$ optionally has and the substituent which Ring $L^2$ optionally has may be combined together to form a ring together with the atoms to which they are attached.

$A^1$-$G^1$-$A^2$ represents an anionic bidentate ligand. $A^1$ and $A^2$ each independently represent a carbon atom, an oxygen atom or a nitrogen atom, and the foregoing atoms may be a ring constituent atom. $G^1$ represents a single bond or an atomic group constituting a bidentate ligand together with $A^1$ and $A^2$. When a plurality of $A^1$-$G^1$-$A^2$ are present, they may be the same or different.].

[6] The light emitting device according to [5], wherein the above-described phosphorescent compound represented by the formula (1) is a phosphorescent compound represented by the formula (1-B):

[Chemical Formula 8]

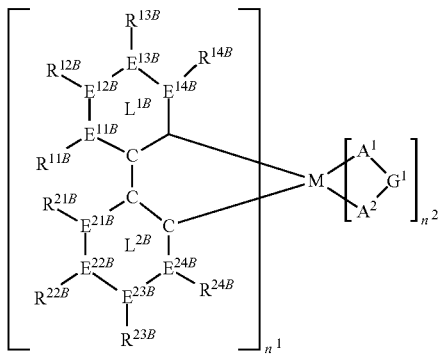

(1-B)

[wherein,

M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. When $E^{11B}$ is a nitrogen atom, $R^{11B}$ is absent. When $E^{12B}$ is a nitrogen atom, $R^{12B}$ is absent. When $E^{13B}$ is a nitrogen atom, $R^{13B}$ is absent. When $E^{14B}$ is a nitrogen atom, $R^{14B}$ is absent. When $E^{21B}$ is a nitrogen atom, $R^{21B}$ is absent. When $E^{22B}$ is a nitrogen atom, $R^{22B}$ is absent. When $E^{23B}$ is a nitrogen atom, $R^{23B}$ is absent. When $E^{24B}$ is a nitrogen atom, $R^{24B}$ is absent.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{11B}$, $R^{12B}$, $R^{11B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with the atoms to which they are attached.

Ring $L^{1B}$ represents a pyridine ring or a diazabenzene ring.

Ring $L^{2B}$ represents a benzene ring, a pyridine ring or a diazabenzene ring.].

[7] The light emitting device according to [6], wherein the above-described phosphorescent compound represented by the formula (1-B) is a phosphorescent compound represented by the formula (1-B1), a phosphorescent compound represented by the formula (1-B2), a phosphorescent compound represented by the formula (1-B3), a phosphorescent compound represented by the formula (1-B4) or a phosphorescent compound represented by the formula (1-B5):

[Chemical Formula 9]

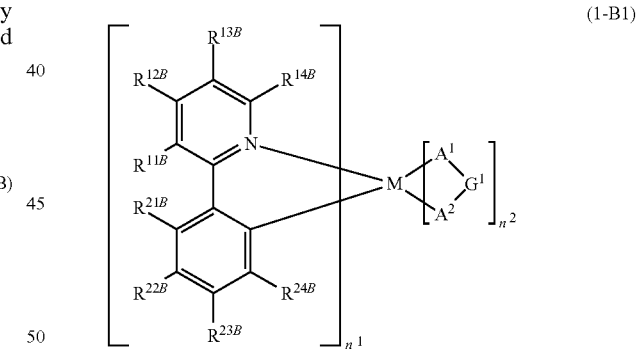

(1-B1)

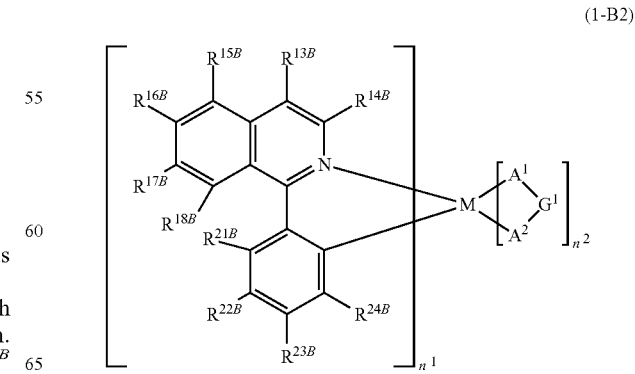

(1-B2)

-continued

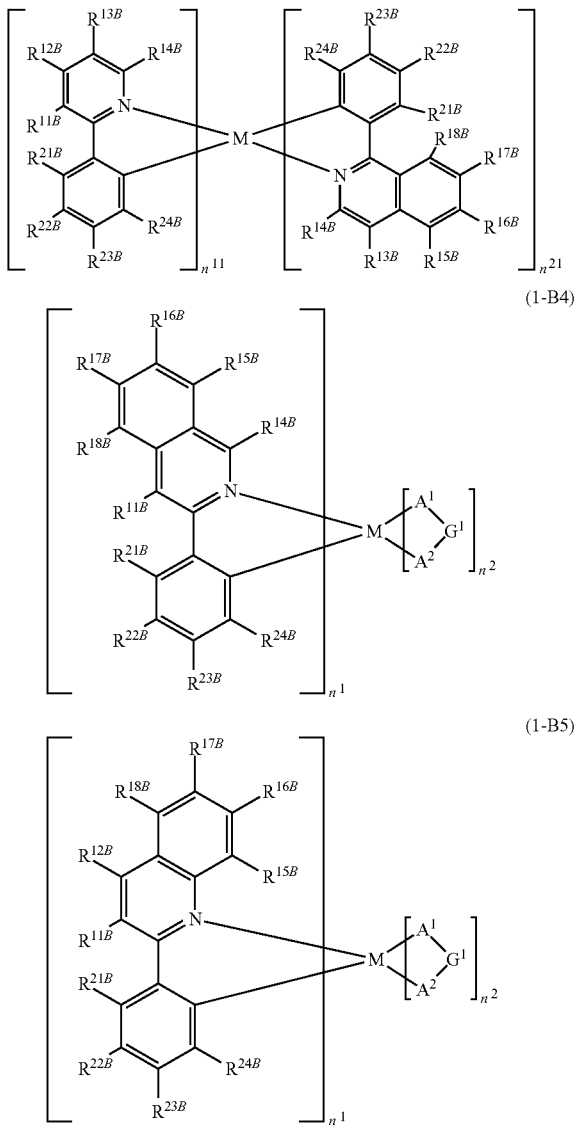

[wherein,

M, $n^1$, $n^2$, $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above.

$n^{11}$ and $n^{12}$ each independently represent an integer of 1 or more. $n^{11}+n^{12}$ is 3 when M is a ruthenium atom, a rhodium atom or an iridium atom, while $n^{11}+n^{12}$ is 2 when M is a palladium atom or a platinum atom.

$R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{15B}$, $R^{16B}$, $R^{17B}$ and $R^{18B}$ are present, they may be the same or different at each occurrence. $R^{13B}$ and $R^{15B}$, $R^{15B}$ and $R^{16B}$, $R^{16B}$ and $R^{17B}$, $R^{17B}$ and $R^{18B}$, and $R^{16B}$ and $R^{21B}$ each may be combined together to form a ring together with the atoms to which they are attached.].

[8] The light emitting device according to [5], wherein the above-described phosphorescent compound represented by the formula (1) is a phosphorescent compound represented by the formula (1-A):

[Chemical Formula 10]

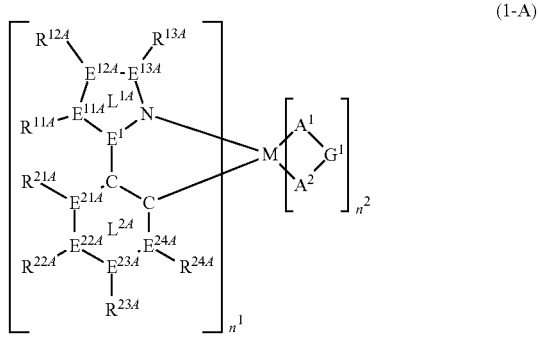

[wherein,

M, $n^1$, $n^2$, $E^1$ and $A^1$-$G^1$-$A^2$ represent the same meaning as described above.

$E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. When $E^{11A}$ is a nitrogen atom, $R^{11A}$ may be present or absent. When $E^{12A}$ is a nitrogen atom, $R^{12A}$ may be present or absent. When $E^{13A}$ is a nitrogen atom, $R^{13A}$ may be present or absent. When $E^{21A}$ is a nitrogen atom, $R^{21A}$ is absent. When $E^{22A}$ is a nitrogen atom, $R^{22A}$ is absent. When $E^{23A}$ is a nitrogen atom, $R^{23A}$ is absent. When $E^{24A}$ is a nitrogen atom, $R^{24A}$ is absent.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{11A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached.

Ring $L^{1A}$ represents a triazole ring or a diazole ring.

Ring $L^{2A}$ represents a benzene ring, a pyridine ring or a diazabenzene ring.].

[9] The light emitting device according to [8], wherein the above-described phosphorescent compound represented by the formula (1-A) is a phosphorescent compound represented by the formula (1-A1), a phosphorescent compound represented by the formula (1-A2), a phosphorescent compound represented by the formula (1-A3), a phosphorescent compound represented by the formula (1-A4) or a phosphorescent compound represented by the formula (1-A5):

[Chemical Formula 11]

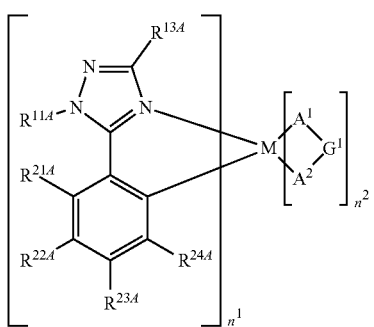
(1-A1)

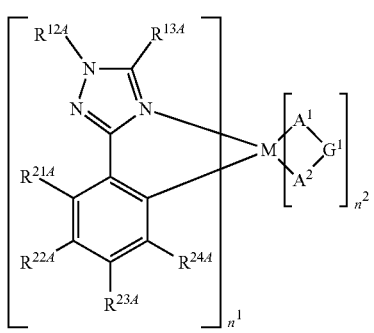
(1-A2)

[Chemical Formula 12]

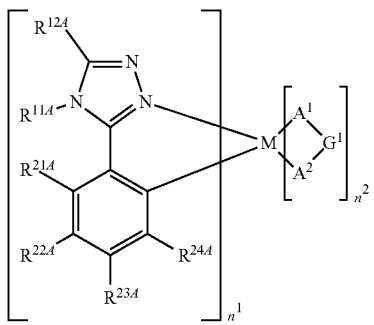
(1-A3)

[Chemical Formula 13]

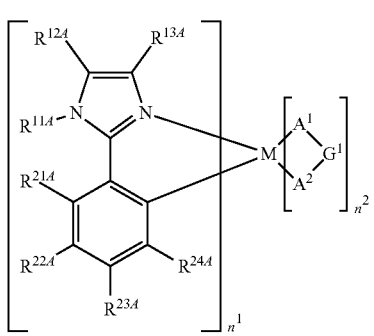
(1-A4)

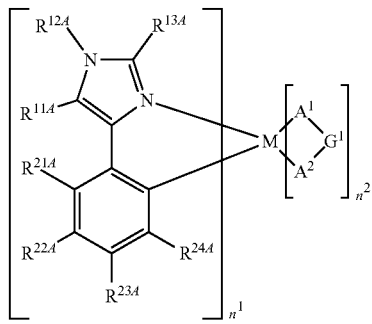
(1-A5)

[wherein, M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.].

[10] The light emitting device according to any one of [1] to [9], wherein the above-described crosslinkable material is a low molecular compound having at least one crosslinkable group selected from Group A of crosslinkable group, or a polymer compound containing a crosslinkable constitutional unit having at least one crosslinkable group selected from Group A of crosslinkable group:

(Group a of Crosslinkable Group)

[Chemical Formula 14]

(XL-1)

(XL-2)

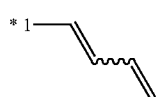
(XL-3)

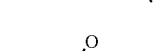
(XL-4)

(XL-5)

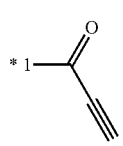
(XL-6)

-continued (XL-7)
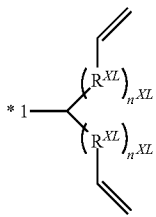

(XL-8)
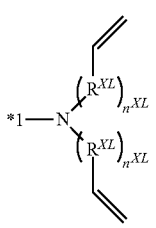

(XL-9)
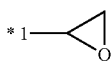

(XL-10)
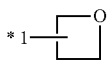

(XL-11)
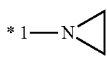

(XL-12)
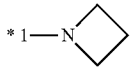

(XL-13)
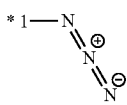

(XL-14)
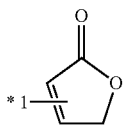

(XL-15)
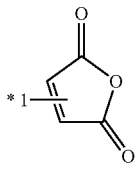

(XL-16)
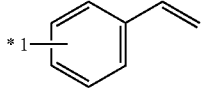

(XL-17)
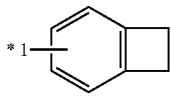

[wherein, $R^{XL}$ represents a methylene group, an oxygen atom or a sulfur atom, and $n^{XL}$ represents an integer of 0 to 5. When a plurality of $R^{XL}$ are present, they may be the same or different, and when a plurality of $n^{XL}$ are present, they may be the same or different. *1 represents a binding position. The foregoing crosslinkable groups optionally have a substituent.].

[11] The light emitting device according to [10], wherein the above-described crosslinkable material is a polymer compound containing a crosslinkable constitutional unit having at least one crosslinkable group selected from Group A of crosslinkable group, and the above-described crosslinkable constitutional unit is a constitutional unit represented by the formula (2) or a constitutional unit represented by the formula (2'):

[Chemical Formula 15]

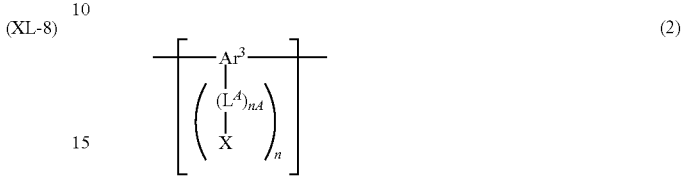

[wherein, nA represents an integer of 0 to 5, and n represents 1 or 2. When a plurality of nA are present, they may be the same or different.

$Ar^3$ represents an aromatic hydrocarbon group or a heterocyclic group, and the foregoing groups optionally have a substituent.

$L^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $L^A$ are present, they may be the same or different.

X represents a crosslinkable group selected from the above-described Group A of crosslinkable group. When a plurality of X are present, they may be the same or different.]

[Chemical Formula 16]

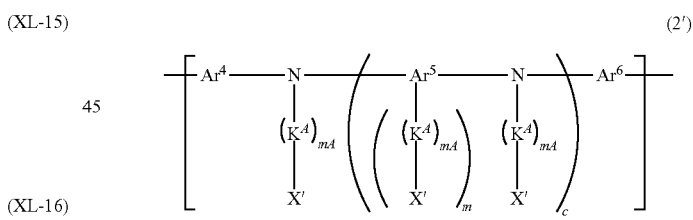

[wherein, mA represents an integer of 0 to 5, m represents an integer of 1 to 4, and c represents 0 or 1. When a plurality of mA are present, they may be the same or different.

$Ar^5$ represents an aromatic hydrocarbon group, a heterocyclic group, or a group in which at least one aromatic hydrocarbon ring and at least one hetero ring are bonded directly, and the foregoing groups optionally have a substituent.

$Ar^4$ and $Ar^6$ each independently represent an arylene group or a divalent heterocyclic group, and the foregoing groups optionally have a substituent.

$Ar^4$, $Ar^5$ and $Ar^6$ may each be bonded directly or via an oxygen atom or a sulfur atom to a group other than the group bonding to the nitrogen atom to which the group is attached, thereby forming a ring.

K$^A$ represents an alkylene group, a cycloalkylene group, an arylene group, a divalent heterocyclic group, a group represented by —NR"—, an oxygen atom or a sulfur atom, and the foregoing groups optionally have a substituent. R" represents a hydrogen atom, an alkyl group, a cycloalkyl group, an aryl group or a monovalent heterocyclic group, and the foregoing groups optionally have a substituent. When a plurality of K$^A$ are present, they may be the same or different.

X' represents a crosslinkable group selected from the above-described Group A of crosslinkable group, a hydrogen atom, an alkyl group, a cycloalkyl group, an aryl group or a monovalent heterocyclic group, and the foregoing groups optionally have a substituent. At least one X' is a crosslinkable group selected from the above-described Group A of crosslinkable group.].

[12] The light emitting device according to [10], wherein the above-described crosslinkable material is a low molecular compound represented by the formula (3):

[Chemical Formula 17]

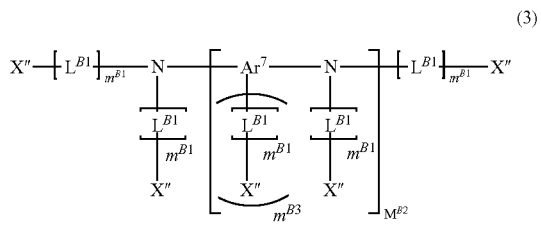

(3)

[wherein, m$^{B1}$, m$^{B2}$ and m$^{B3}$ each independently represent an integer of 0 or more and 10 or less. A plurality of m$^{B1}$ may be the same or different. When a plurality of m$^{B3}$ are present, they may be the same or different.

Ar$^7$ represents an aromatic hydrocarbon group, a heterocyclic group, or a group in which at least one aromatic hydrocarbon ring and at least one hetero ring are bonded directly, and the foregoing groups optionally have a substituent. When a plurality of Ar$^7$ are present, they may be the same or different.

L$^{B1}$ represents an alkylene group, a cycloalkylene group, an arylene group, a divalent heterocyclic group, a group represented by —NR'"—, an oxygen atom or a sulfur atom, and the foregoing groups optionally have a substituent. R'" represents a hydrogen atom, an alkyl group, a cycloalkyl group, an aryl group or a monovalent heterocyclic group, and the foregoing groups optionally have a substituent. When a plurality of L$^{B1}$ are present, they may be the same or different.

X" represents a crosslinkable group selected from Group A of crosslinkable group, a hydrogen atom, an alkyl group, a cycloalkyl group, an aryl group or a monovalent heterocyclic group, and the foregoing groups optionally have a substituent. A plurality of X" may be the same or different. At least one of the plurality of X" is a crosslinkable group selected from Group A of crosslinkable group.].

[13] The light emitting device according to any one of [1] to [12], wherein the above-described first organic layer further contains at least one material selected from the group consisting of a hole transporting material, a hole injection material, an electron transporting material, an electron injection material and a light emitting material.

[14] The light emitting device according to any one of [1] to [13], wherein the above-described first organic layer and the above-described second organic layer are adjacent.

[15] The light emitting device according to any one of [1] to [14], wherein the above-described second organic layer is a layer disposed between the above-described anode and the above-described first organic layer.

Effect of the Invention

According to the present invention, a light emitting device excellent in luminance life can be provided.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

In the formula representing a metal complex, the solid line representing the bond to the central metal means a covalent bond or a coordinate bond.

"The polymer compound" means a polymer having molecular weight distribution and having a polystyrene-equivalent number-average molecular weight of $1\times10^3$ to $1\times10^8$.

"The low molecular compound" means a compound having no molecular weight distribution and having a molecular weight of $1\times10^4$ or less.

"The constitutional unit" means a unit which is present one or more times in the polymer compound.

"The alkyl group" may be any of linear or branched. The number of carbon atoms of the linear alkyl group is, not including the number of carbon atoms of the substituent, usually 1 to 50, preferably 3 to 30, more preferably 4 to 20. The number of carbon atoms of the branched alkyl group is, not including the number of carbon atoms of the substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and these groups in which its hydrogen atom is substituted with a cycloalkyl group, an alkoxy group, a cycloalkoxy group, an aryl group, a fluorine atom or the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group and a 6-ethyloxyhexyl group).

The number of carbon atoms of the "cycloalkyl group" is, not including the number of carbon atoms of the substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"The aryl group" means an atomic group remaining after removing from an aromatic hydrocarbon one hydrogen atom directly bonding to a carbon atom constituting the ring. The number of carbon atoms of the aryl group is, not including the number of carbon atoms of the substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and these groups in which its hydrogen atom is substituted with an alkyl group, a cycloalkyl group, an alkoxy group, a cycloalkoxy group, an aryl group, a fluorine atom or the like.

"The alkoxy group" may be any of linear or branched. The number of carbon atoms of the linear alkoxy group is, not including the number of carbon atoms of the substituent, usually 1 to 40, preferably 4 to 10. The number of carbon atoms of the branched alkoxy group is, not including the number of carbon atoms of the substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and these groups in which its hydrogen atom is substituted with a cycloalkyl group, an alkoxy group, a cycloalkoxy group, an aryl group, a fluorine atom or the like.

The number of carbon atoms of the "cycloalkoxy group" is, not including the number of carbon atoms of the substituent, usually 3 to 40, preferably 4 to 10.

The cycloalkoxy group optionally has a substituent, and examples thereof include a cyclohexyloxy group.

The number of carbon atoms of the "aryloxy group" is, not including the number of carbon atoms of the substituent, usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group and a 1-pyrenyloxy group, and these groups in which its hydrogen atom is substituted with an alkyl group, a cycloalkyl group, an alkoxy group, a cycloalkoxy group, a fluorine atom or the like.

"The p-valent heterocyclic group" (p represents an integer of 1 or more) means an atomic group remaining after removing from a heterocyclic compound p hydrogen atoms among hydrogen atoms directly bonding to carbon atoms or hetero atoms constituting the ring. Of the p-valent heterocyclic groups, preferable are "p-valent aromatic heterocyclic groups" which are atomic groups remaining after removing from an aromatic heterocyclic compound p hydrogen atoms among hydrogen atoms directly bonding to carbon atoms or hetero atoms constituting the ring.

"The aromatic heterocyclic compound" means a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like and a compound in which an aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent heterocyclic group is, not including the number of carbon atoms of the substituent, usually 2 to 60, preferably 4 to 20.

The monovalent heterocyclic group optionally has a substituent, and examples thereof include a thienyl group, a pyrrolyl group, a furyl group, a pyridyl group, a piperidinyl group, a quinolinyl group, an isoquinolinyl group, a pyrimidinyl group and a triazinyl group, and these groups in which its hydrogen atom is substituted with an alkyl group, a cycloalkyl group, an alkoxy group, a cycloalkoxy group or the like.

"The halogen atom" denotes a fluorine atom, a chlorine atom, a bromine atom or an iodine atom.

"The amino group" optionally has a substituent, and a substituted amino group is preferable. The substituent which the amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"The alkenyl group" may be any of linear or branched. The number of carbon atoms of the linear alkenyl group is, not including the number of carbon atoms of the substituent, usually 2 to 30, preferably 3 to 20. The number of carbon atoms of the branched alkenyl group is, not including the number of carbon atoms of the substituent, usually 3 to 30, preferably 4 to 20.

The number of carbon atoms of "the cycloalkenyl group" is, not including the number of carbon atoms of the substituent, usually 3 to 30, preferably 4 to 20.

The alkenyl group and the cycloalkenyl group optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"The alkynyl group" may be any of linear or branched. The number of carbon atoms of the alkynyl group is, not including the number of carbon atoms of the substituent, usually 2 to 20, preferably 3 to 20. The number of carbon atoms of the branched alkynyl group is, not including the number of carbon atoms of the substituent, usually 4 to 30, preferably 4 to 20.

The number of carbon atoms of "the cycloalkynyl group" is, not including the number of carbon atoms of the substituent, usually 4 to 30, preferably 4 to 20.

The alkynyl group and the cycloalkynyl group optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"The arylene group" means an atomic group remaining after removing from an aromatic hydrocarbon two hydrogen atoms directly bonding to carbon atoms constituting the ring. The number of carbon atoms of the arylene group is, not including the number of carbon atoms of the substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and preferable are groups represented by the formula (A-1) to the formula (A-20). The arylene group includes groups in which a plurality of these groups are connected.

[Chemical Formula 18]

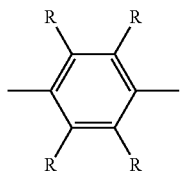
(A-1)

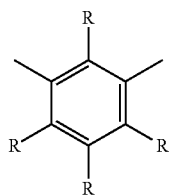
(A-2)

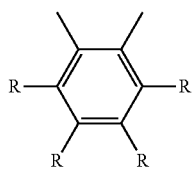
(A-3)

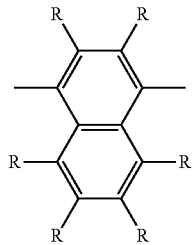
(A-4)

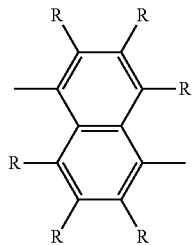
(A-5)

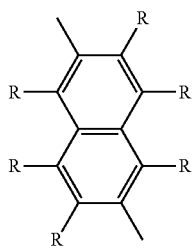
(A-6)

[Chemical Formula 19]

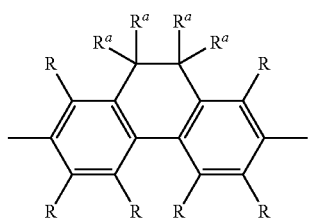
(A-7)

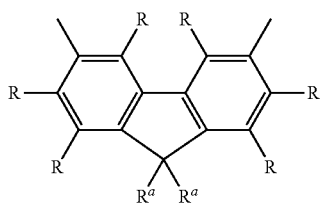
(A-8)

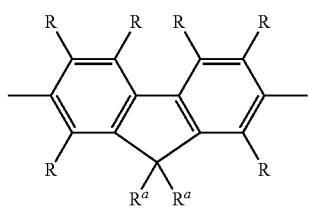
(A-9)

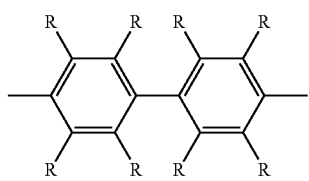
(A-10)

[Chemical Formula 20]

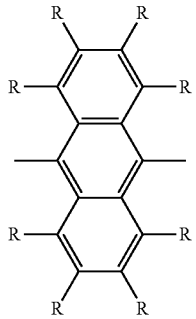
(A-11)

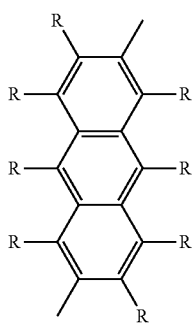
(A-12)

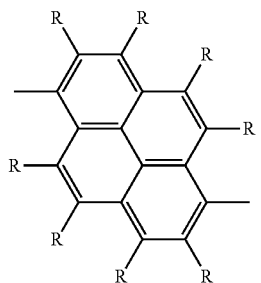

(A-13)

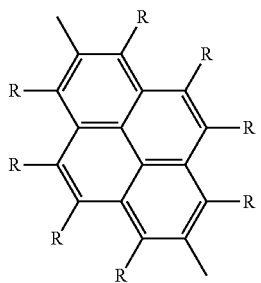

(A-14)

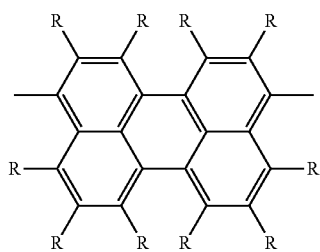

(A-15)

[Chemical Formula 21]

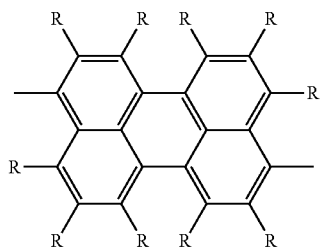

(A-16)

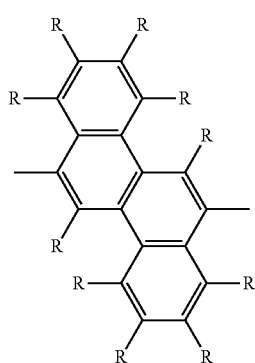

(A-17)

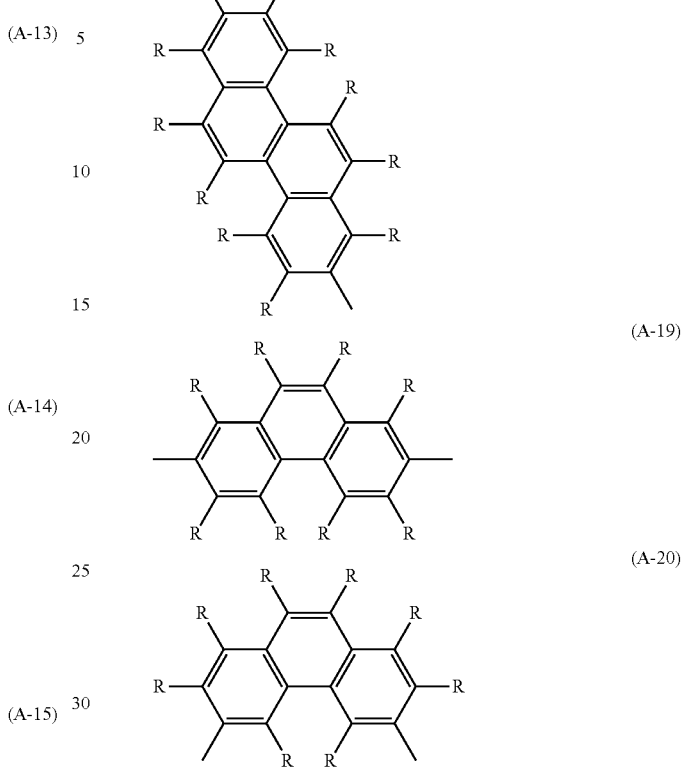

[wherein, R and $R^a$ each independently represent a hydrogen atom, an alkyl group, a cycloalkyl group, an aryl group or a monovalent heterocyclic group. A plurality of R and $R^a$ each may be the same or different and the groups $R^a$ may be combined together to form a ring together with the atoms to which they are attached.]

The number of carbon atoms of the divalent heterocyclic group is, not including the number of carbon atoms of the substituent, usually 2 to 60, preferably 3 to 20, more preferably 4 to 15. The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole or triazole two hydrogen atoms among hydrogen atoms directly bonding to carbon atoms or hetero atoms constituting the ring, and preferable are groups represented by the formula (AA-1) to the formula (AA-34). The divalent heterocyclic group includes groups in which a plurality of these groups are connected.

[Chemical Formula 22]

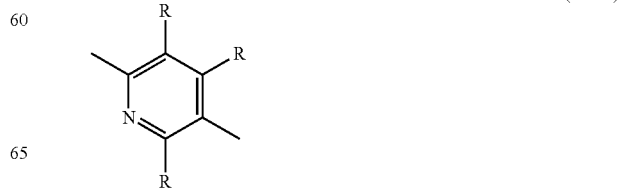

-continued
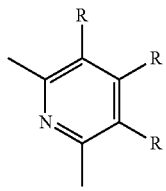 (AA-2)
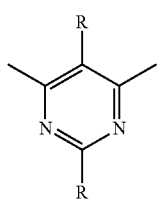 (AA-3)
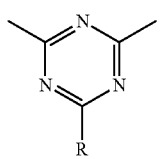 (AA-4)
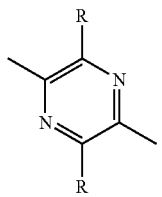 (AA-5)
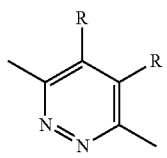 (AA-6)
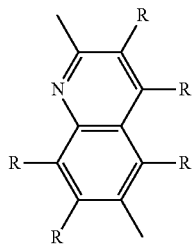 (AA-7)
[Chemical Formula 23]
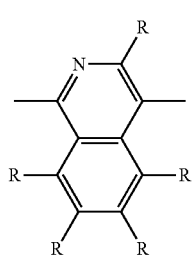 (AA-8)
-continued
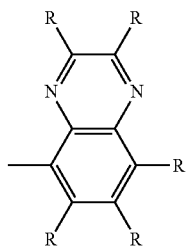 (AA-9)
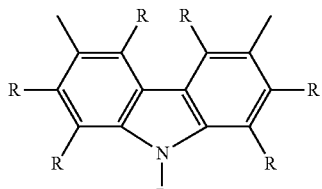 (AA-10)
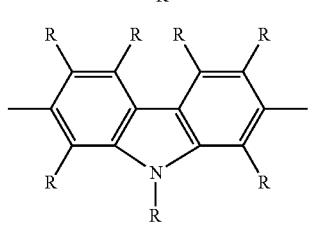 (AA-11)
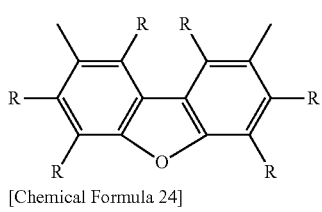 (AA-12)
[Chemical Formula 24]
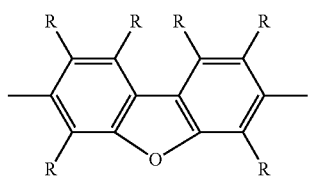 (AA-13)
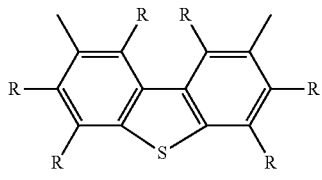 (AA-14)
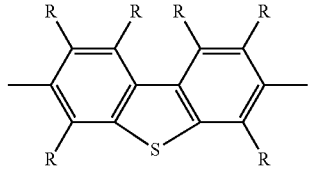 (AA-15)
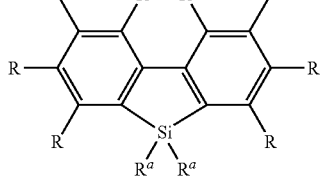 (AA-16)

[Chemical Formula 25]
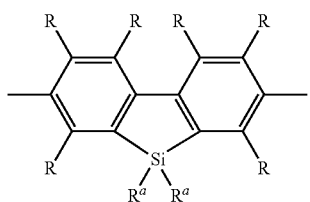 (AA-17)
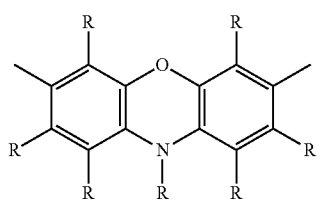 (AA-18)
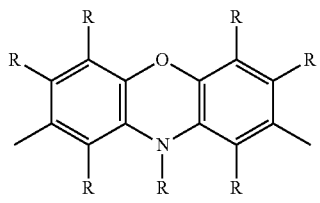 (AA-19)
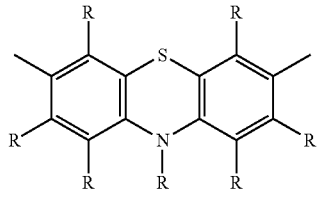 (AA-20)
[Chemical Formula 26]
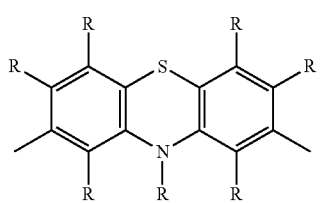 (AA-21)
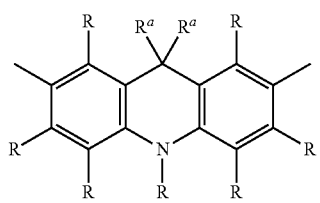 (AA-22)
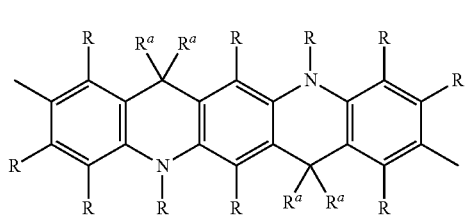 (AA-23)
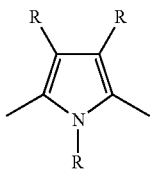 (AA-24)
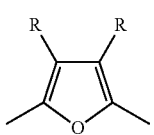 (AA-25)
[Chemical Formula 27]
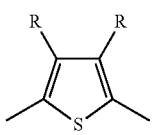 (AA-26)
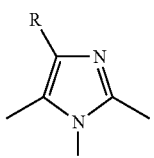 (AA-27)
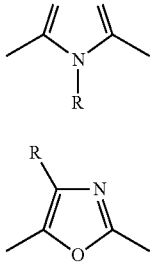 (AA-28)
(AA-29)
(AA-30)
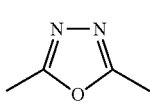 (AA-31)
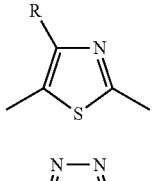 (AA-32)
[Chemical Formula 28]
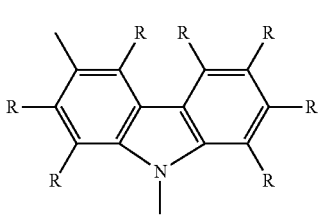 (AA-33)

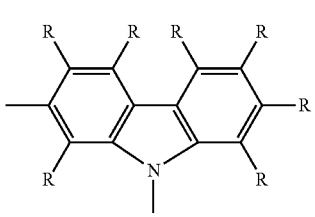

(AA-34)

[wherein, R and $R^a$ represent the same meaning as described above.]

"The crosslinkable group" is a group capable of generating a new bond by being subjected to heating, ultraviolet irradiation, near ultraviolet irradiation, visible light irradiation, infrared irradiation, radical reaction and the like, and preferably is a crosslinkable group represented by the formula (XL-1) to the formula (XL-17) in Group A of crosslinkable group described above.

"The substituent" represents a halogen atom, a cyano group, an alkyl group, a cycloalkyl group, an aryl group, a monovalent heterocyclic group, an alkoxy group, a cycloalkoxy group, an aryloxy group, amino group, a substituted amino group, an alkenyl group, a cycloalkenyl group, an alkynyl group or a cycloalkynyl group. The substituent may be a crosslinkable group.

<Light Emitting Device>
[First Organic Layer]

The first organic layer which the light emitting device of the present invention has is a layer containing a compound represented by the formula (C-1).

[Compound Represented by the Formula (C-1)]

The compound represented by the formula (C-1) has a molecular weight of preferably $2\times10^2$ to $5\times10^4$, more preferably $2\times10^2$ to $5\times10^3$, further preferably $3\times10^2$ to $3\times10^3$, particularly preferably $4\times10^2$ to $1\times10^3$.

The number of carbon atoms of the aromatic hydrocarbon ring represented by Ring $R^{1C}$ and Ring $R^{2C}$ is, not including the number of carbon atoms of the substituent, usually 6 to 60, preferably 6 to 30, more preferably 6 to 18.

The aromatic hydrocarbon ring represented by Ring $R^{1C}$ and Ring $R^{2C}$ includes, for example, a benzene ring, a naphthalene ring, an anthracene ring, an indene ring, a fluorene ring, a spirobifluorene ring, a phenanthrene ring, a dihydrophenanthrene ring, a pyrene ring, a chrysene ring and a triphenylene ring, and is preferably a benzene ring, a naphthalene ring, an anthracene ring, a fluorene ring, a spirobifluorene ring, a phenanthrene ring or a dihydrophenanthrene ring, more preferably a benzene ring, a naphthalene ring, a fluorene ring or a spirobifluorene ring, further preferably a benzene ring, and the foregoing rings optionally have a substituent.

The number of carbon atoms of the aromatic hetero ring represented by Ring $R^{1C}$ and Ring $R^{2C}$ is, not including the number of carbon atoms of the substituent, usually 2 to 60, preferably 3 to 30, more preferably 4 to 15.

The aromatic hetero ring represented by Ring $R^{1C}$ and Ring $R^{2C}$ includes, for example, a pyrrole ring, a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, a carbazole ring, an azacarbazole ring, a diazacarbazole ring, a phenoxazine ring, a phenothiazine ring, a dihydroacridine ring and a dihydrophenazine ring, and is preferably a pyridine ring, a diazabenzene ring, an azanaphthalene ring, a diazanaphthalene ring, an azaanthracene ring, a diazaanthracene ring, an azaphenanthrene ring, a diazaphenanthrene ring, a dibenzofuran ring, a dibenzothiophene ring, a carbazole ring, a phenoxazine ring, a phenothiazine ring, a dihydroacridine ring or a dihydrophenazine ring, more preferably a pyridine ring, a diazabenzene ring, an azanaphthalene ring, a diazanaphthalene ring, a dibenzofuran ring, a dibenzothiophene ring or a carbazole ring, further preferably a pyridine ring or a diazabenzene ring, and the foregoing rings optionally have a substituent.

It is preferable that at least one of Ring $R^{1C}$ and Ring $R^{2C}$ is an aromatic hydrocarbon ring, it is more preferable that both of them are each aromatic hydrocarbon rings, it is further preferable that both of them are each a benzene ring, since the light emitting device of the present invention is more excellent in luminance life.

The substituent which Ring $R^{1C}$ and Ring $R^{2C}$ optionally have is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an aryl group, a monovalent heterocyclic group or a substituted amino group, further preferably an aryl group, a monovalent heterocyclic group or a substituted amino group, particularly preferably an aryl group or a monovalent heterocyclic group, especially preferably a monovalent heterocyclic group, and the foregoing groups optionally further have a substituent.

The number of carbon atoms of the aryl group as the substituent which Ring $R^{1C}$ and Ring $R^{2C}$ optionally have is, not including the number of carbon atoms of the substituent, usually 6 to 60, preferably 6 to 40, more preferably 6 to 25.

The aryl group as the substituent which Ring $R^{1C}$ and Ring $R^{2C}$ optionally have includes, for example, groups obtained by removing from a benzene ring, a naphthalene ring, an anthracene ring, an indene ring, a fluorene ring, a spirobifluorene ring, a phenanthrene ring, a dihydrophenanthrene ring, a pyrene ring, a chrysene ring, a triphenylene ring or a ring obtained by condensing these rings one hydrogen atom directly bonding to a carbon atom constituting the ring, and is preferably a group obtained by removing from a benzene ring, a naphthalene ring, a fluorene ring, a spirobifluorene ring, a phenanthrene ring, a dihydrophenanthrene ring or a triphenylene ring one hydrogen atom directly bonding to a carbon atom constituting ring, more preferably a group obtained by removing from a benzene ring, a fluorene ring or a spirobifluorene ring one hydrogen atom directly bonding to a carbon atom constituting the ring, further preferably a group obtained by removing from a fluorene ring or a spirobifluorene ring one hydrogen atom directly bonding to a carbon atom constituting the ring, and the foregoing groups optionally further have a substituent.

The number of carbon atoms of the monovalent heterocyclic group as the substituent which Ring $R^{1C}$ and Ring $R^{2C}$ optionally have is, not including the number of carbon atoms of the substituent, usually 2 to 60, preferably 3 to 30, more preferably 3 to 15. The monovalent heterocyclic group as the substituent which Ring $R^{1C}$ and Ring $R^{2C}$ optionally have includes, for example, groups obtained by removing from a pyrrole ring, a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, a carbazole ring, an azacarbazole ring, a diazacarbazole ring, a phenoxazine ring, a phenothiazine ring, a dihydroacridine ring, a dihydrophenazine ring or a ring obtained by condensing an aromatic ring to these rings one hydrogen atom bonding directly to a carbon atom or a hetero atom constituting the ring, and is preferably a group obtained by removing from a pyridine ring, a diazabenzene ring, a triazine ring, an azanaphthalene ring, a diazanaphthalene ring, a dibenzofuran ring, a dibenzothiophene ring, a carbazole ring, an azacarbazole ring, a diazacarbazole ring, a phenoxazine ring, a phenothiazine ring, a dihydroacridine ring or a dihydrophenazine ring one hydrogen atom directly bonding to a carbon atom or a hetero atom constituting the ring, more preferably a group obtained by removing from a pyridine ring, a diazabenzene ring, a triazine ring, a dibenzofuran ring, a dibenzothiophene ring, a carbazole ring, an azacarbazole ring, a diazacarbazole ring, a phenoxazine ring, a phenothiazine ring, a dihydroacridine ring or a dihydrophenazine ring one hydrogen atom directly bonding to a carbon atom or a hetero atom constituting the ring, further preferably a group obtained by removing from a dibenzofuran ring, a dibenzothiophene ring, a carbazole ring, a phenoxazine ring, a phenothiazine ring, a dihydroacridine ring or a dihydrophenazine ring one hydrogen atom directly bonding to a carbon atom or a hetero atom constituting the ring, particularly preferably a group obtained by removing from a dibenzofuran ring, a dibenzothiophene ring or a carbazole ring one hydrogen atom directly bonding to a carbon atom or a hetero atom constituting the ring, especially preferably a group obtained by removing from a dibenzofuran ring or a dibenzothiophene ring one hydrogen atom directly bonding to a carbon atom or a hetero atom constituting the ring, and the foregoing rings optionally have a substituent.

In the substituted amino group as the substituent which Ring $R^{1C}$ and Ring $R^{24}$ optionally have, the substituent which the amino group has is preferably an aryl group or a monovalent heterocyclic group, more preferably an aryl group, and the foregoing groups optionally further have a substituent. The examples and preferable ranges of the aryl group as the substituent which the amino group has are the same as the examples and preferable ranges of the aryl group as the substituent which Ring $R^{1C}$ and Ring $R^{2C}$ optionally have. The examples and preferable ranges of the monovalent heterocyclic group as the substituent which the amino group has are the same as the examples and preferable ranges of the monovalent heterocyclic group as the substituent which Ring $R^{1C}$ and Ring $R^{2C}$ optionally have.

The substituent which the substituent which Ring $R^{1C}$ and Ring $R^{2C}$ optionally have optionally further has is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an aryl group or a monovalent heterocyclic group, further preferably an alkyl group or an aryl group, and the foregoing groups optionally further have a substituent.

The examples and preferable ranges of the aryl group, the monovalent heterocyclic group and the substituted amino group as the substituent which the substituent which Ring $R^{1C}$ and Ring $R^{2C}$ optionally have optionally further has are the same as the examples and preferable ranges of the aryl group, the monovalent heterocyclic group and the substituted amino group as the substituent which Ring $R^{1C}$ and Ring $R^{2C}$ optionally have, respectively.

$R^C$ is preferably a sulfur atom or a group represented by the formula (C'-1), more preferably a group represented by the formula (C'-1), since the light emitting device of the present invention is more excellent in luminance life.

Group Represented by the Formula (C'-1)

$R^{C'}$ is preferably a carbon atom, a silicon atom or a germanium atom, more preferably a carbon atom or a silicon atom, further preferably a carbon atom, since the light emitting device of the present invention is more excellent in luminance life.

It is preferable that at least one of Ring $R^{3C}$ and Ring $R^{4C}$ is an aromatic hydrocarbon ring, it is more preferable that both of them are each an aromatic hydrocarbon ring, it is further preferable that both of them are each a benzene ring, since the light emitting device of the present invention is more excellent in luminance life.

The examples and preferable ranges of the aromatic hydrocarbon ring and the aromatic hetero ring represented by Ring $R^{3C}$ and Ring $R^{4C}$ are the same as the examples and preferable ranges of the aromatic hydrocarbon ring and the aromatic hetero ring represented by Ring $R^{1C}$ and Ring $R^{2C}$, respectively. The examples and preferable ranges of the substituent which Ring $R^{3C}$ and Ring $R^{4C}$ optionally have are the same as the examples and preferable ranges of the substituent which Ring $R^{1C}$ and Ring $R^{2C}$ optionally have.

The examples and preferable ranges of the substituent which the substituent which Ring $R^{3C}$ and Ring $R^{4C}$ optionally have optionally further has are the same as the examples and preferable ranges of the substituent which the substituent which Ring $R^{1C}$ and Ring $R^{2C}$ optionally have optionally further has.

When $R^C$ is a group represented by the formula (C'-1), it is preferable that at least one of Ring $R^{1C}$, Ring $R^{2C}$, Ring $R^{3C}$ and Ring $R^{4C}$ has an aryl group or a monovalent heterocyclic group, it is more preferable that at least one of Ring $R^{1C}$, Ring $R^{2C}$, Ring $R^{3C}$ and Ring $R^{4C}$ has a group represented by the formula (D-1) or the formula (E-1) described later, it is further preferable that at least one of Ring $R^{1C}$, Ring $R^{2C}$, Ring $R^{3C}$ and Ring $R^{4C}$ has a group represented by the formula (D-1), since the light emitting device of the present invention is more excellent in luminance life.

When $R^C$ is a group represented by the formula (C'-1) and at least one of Ring $R^{1C}$, Ring $R^{2C}$, Ring $R^{3C}$ and Ring $R^{4C}$ has an aryl group or a monovalent heterocyclic group, the total number of the aryl group and the monovalent heterocyclic group which Ring $R^{1C}$, Ring $R^{2C}$, Ring $R^{3C}$ and Ring $R^{4C}$ have is preferably 1 to 5, more preferably 1 to 3, further preferably 1 or 2, particularly preferably 1.

When $R^C$ is a group represented by the formula (C'-1) and at least one of Ring $R^{1C}$, Ring $R^{2C}$, Ring $R^{3C}$ and Ring $R^{4C}$ has a group represented by the formula (D-1) or the formula (E-1) described later, the total number of the groups represented by the formula (D-1) and the formula (E-1) which Ring $R^{1C}$, Ring $R^{2C}$, Ring $R^{3C}$ and Ring $R^{4C}$ have is preferably 1 to 5, more preferably 1 to 3, further preferably 1 or 2, particularly preferably 1.

When $R^C$ is an oxygen atom or a sulfur atom, it is preferable that at least one of Ring $R^{1C}$ and Ring $R^{2C}$ has an aryl group or a monovalent heterocyclic group, more preferably a group represented by the formula (D-1) or the formula (E-1) described later, further preferably a group represented by the formula (E-1), and the foregoing groups optionally have a substituent, since the light emitting device of the present invention is more excellent in luminance life.

When $R^C$ is an oxygen atom or a sulfur atom and at least one of Ring $R^{1C}$ and Ring $R^{2C}$ has an aryl group or a monovalent heterocyclic group, the total number of the aryl group and the monovalent heterocyclic group which Ring $R^{1C}$ and Ring $R^{2C}$ have is preferably 1 to 5, more preferably 1 to 3, further preferably 1 or 2, particularly preferably 1.

When $R^C$ is an oxygen atom or a sulfur atom and at least one of Ring $R^{1C}$ and Ring $R^{2C}$ has a group represented by the formula (D-1) or the formula (E-1) described later, the total number of the groups represented by the formula (D-1) and the formula (E-1) which Ring $R^{1C}$ and Ring $R^{2C}$ have is preferably 1 to 5, more preferably 1 to 3, further preferably 1 or 2, particularly preferably 1.

Group Represented by the Formula (D-1)

[Chemical Formula 29]

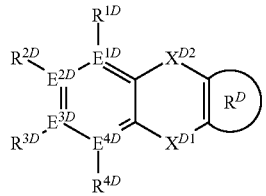

(D-1)

[wherein,

Ring $R^D$ represents an aromatic hydrocarbon ring or an aromatic hetero ring, and the foregoing rings optionally have a substituent. When a plurality of the substituents are present, they may be combined together to form a ring together with the atoms to which they are attached.

$X^{D1}$ and $X^{D2}$ each independently represent a single bond, an oxygen atom, a sulfur atom, a group represented by —N($R^{XD1}$)—, or a group represented by —C($R^{XD2}$)$_2$—. $R^{XD1}$ and $R^{XD2}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. A plurality of $R^{XD2}$ may be the same or different, and may be combined together to form a ring together with the carbon atoms to which they are attached.

$E^{1D}$, $E^{2D}$, $E^{3D}$ and $E^{4D}$ each independently represent a nitrogen atom or a carbon atom. At least one of $E^{1D}$, $E^{2D}$, $E^{3D}$ and $E^{4D}$ is a carbon atom.

$R^{1D}$, $R^{2D}$, $R^{3D}$ and $R^{4D}$ each independently represent a connecting bond, a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. At least one of $R^{1D}$, $R^{2D}$, $R^{3D}$ and $R^{4D}$ is a connecting bond.

When $E^{1D}$ is a nitrogen atom, $R^{1D}$ is absent. When $E^2$ is a nitrogen atom, $R^{2D}$ is absent. When $E^{3D}$ is a nitrogen atom, $R^{3D}$ is absent. When $E^{4D}$ is a nitrogen atom, $R^{4D}$ is absent.

When $R^{1D}$ is a connecting bond, $E^{1D}$ is a carbon atom. When $R^{2D}$ is a connecting bond, $E^{2D}$ is a carbon atom. When $R^{3D}$ is a connecting bond, $E^{3D}$ is a carbon atom. When $R^{4D}$ is a connecting bond, $E^{4D}$ is a carbon atom.

$R^{1D}$ and $R^{2D}$ may be combined together to form a ring together with the atoms to which they are attached. $R^{2D}$ and $R^{3D}$ may be combined together to form a ring together with the atoms to which they are attached. $R^{3D}$ and $R^{4D}$ may be combined together to form a ring together with the atoms to which they are attached. $R^{1D}$ and $R^{XD1}$ may be combined together to form a ring together with the atoms to which they are attached. $R^{1D}$ and $R^{XD2}$ may be combined together to form a ring together with the atoms to which they are attached. $R^{4D}$ and $R^{XD1}$ may be combined together to form a ring together with the atoms to which they are attached. $R^{4D}$ and $R^{XD2}$ may be combined together to form a ring together with the atoms to which they are attached. The substituent which Ring $R^D$ optionally has and $R^{XD1}$ may be combined together to form a ring together with the atoms to which they are attached. The substituent which Ring $R^D$ optionally has and $R^{XD2}$ may be combined together to form a ring together with the carbon atoms to which they are attached.]

The examples and preferable ranges of the aromatic hydrocarbon ring and the aromatic hetero ring represented by Ring $R^D$ are the same as the examples and preferable ranges of the aromatic hydrocarbon ring and the aromatic hetero ring represented by Ring $R^{1C}$ and Ring $R^{2C}$, respectively The examples and preferable ranges of the substituent which Ring $R^D$ optionally has are the same as the examples and preferable ranges of the substituent which the substituent which Ring $R^{1C}$ and Ring $R^{2C}$ optionally have optionally further has.

Ring $R^D$ is preferably an aromatic hydrocarbon ring, more preferably a benzene ring, since the light emitting device of the present invention is more excellent in luminance life.

$X^{D1}$ and $X^{D2}$ are each preferably a single bond, an oxygen atom, a sulfur atom or a group represented by —C($R^{XD2}$)$_2$—, more preferably a single bond, an oxygen atom or a sulfur atom, further preferably a single bond or a sulfur atom, since the light emitting device of the present invention is more excellent in luminance life.

It is preferable that at least one of $X^{D1}$ and $X^{D2}$ is a single bond, and it is more preferable that $X^{D2}$ is a single bond.

$R^{XD1}$ is preferably an alkyl group, a cycloalkyl group, an aryl group or a monovalent heterocyclic group, more preferably an aryl group or a monovalent heterocyclic group, further preferably an aryl group, and the foregoing groups optionally have a substituent.

$R^{XD2}$ is preferably an alkyl group, a cycloalkyl group, an aryl group or a monovalent heterocyclic group, more preferably an alkyl group or an aryl group, and the foregoing groups optionally have a substituent.

The examples and preferable ranges of the aryl group, the monovalent heterocyclic group and the substituted amino group represented by $R^{XD1}$ and $R^{XD2}$ are the same as the examples and preferable ranges of the aryl group, the monovalent heterocyclic group and the substituted amino group as the substituent which Ring $R^{1C}$ and Ring $R^{2C}$ optionally have, respectively.

Regarding the combination of two groups $R^{XD2}$ in the group represented by —C($R^{XD2}$)$_2$— represented by $X^{D1}$ and $X^{D2}$, it is preferable that the both are alkyl groups or cycloalkyl groups, the both are aryl groups, the both are monovalent heterocyclic groups, or one is an alkyl group or a cycloalkyl group and the other is an aryl group or a monovalent heterocyclic group, it is more preferable that the both are aryl groups, or one is an alkyl group or a cycloalkyl group and the other is an aryl group, it is further preferable that the both are aryl groups, and the foregoing groups optionally have a substituent. It is preferable that two groups $R^{XD2}$ are combined together to form a ring together with the carbon atom to which they are attached. When $R^{XD2}$ forms a ring, the group represented by —C($R^{XD2}$)$_2$— is preferably a group represented by the formula (Y-A1) to the formula (Y-A5), more preferably a group represented by the formula (Y-A4), and the foregoing groups optionally have a substituent.

[Chemical Formula 30]

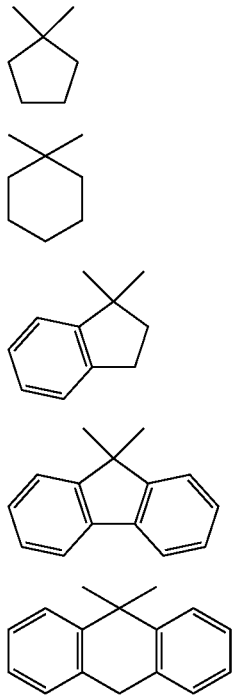

(Y-A1)

(Y-A2)

(Y-A3)

(Y-A4)

(Y-A5)

The examples and preferable ranges of the substituent which $R^{XD1}$ and $R^{XD2}$ optionally have are the same as the examples and preferable ranges of the substituent which the substituent which Ring $R^{1C}$ and Ring $R^{2C}$ optionally have optionally further has.

$E^{1D}$, $E^{2D}$, $E^{3D}$ and $E^{4D}$ are each preferably a carbon atom.

It is preferable that $R^{1D}$, $R^{3D}$ or $R^{4D}$ is a connecting bond, it is more preferable that $R^{1D}$ or $R^{4D}$ is a connecting bond, it is further preferable that $R^{4D}$ is a connecting bond.

When $R^{1D}$, $R^{2D}$, $R^{3D}$ and $R^{4D}$ are other than a connecting bond, $R^{1D}$, $R^{2D}$, $R^{3D}$ and $R^{4D}$ are each preferably a hydrogen atom, an alkyl group, a cycloalkyl group, an aryl group, a monovalent heterocyclic group or a substituted amino group, more preferably a hydrogen atom, an alkyl group or an aryl group, further preferably a hydrogen atom, and the foregoing groups optionally further have a substituent.

The examples and preferable ranges of the aryl group, the monovalent heterocyclic group and the substituted amino group represented by $R^{1D}$, $R^{2D}$, $R^{3D}$ and $R^{4D}$ are the same as the examples and preferable ranges of the aryl group, the monovalent heterocyclic group and the substituted amino group as the substituent which Ring $R^{1C}$ and Ring $R^{2C}$ optionally have, respectively.

The examples and preferable ranges of the substituent which $R^{1D}$, $R^{2D}$, $R^{3D}$ and $R^{4D}$ optionally have are the same as the examples and preferable ranges of the substituent which $R^{XD1}$ and $R^{XD2}$ optionally have.

$R^{1D}$ and $R^{2D}$, $R^{2D}$ and $R^{3D}$, $R^{3D}$ and $R^{4D}$, $R^{1D}$ and $R^{XD1}$, $R^{1D}$ and $R^{XD1}$, $R^{1D}$ and $R^{XD2}$, $R^{4D}$ and $R^{XD1}$, $R^{4D}$ and $R^{XD2}$, $R^{XD1}$ and the substituent which Ring $R^D$ optionally has, and $R^{XD2}$ and the substituent which Ring $R^D$ optionally has each may be combined together to form a ring together with the carbon atoms to which they are attached, but it is preferable that they do not form a ring.

The group represented by the formula (D-1) is preferably a group represented by the formula (D-2), since the light emitting device of the present invention is more excellent in luminance life.

Group Represented by the Formula (D-2)

[Chemical Formula 31]

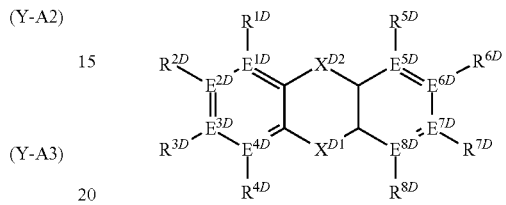

(D-2)

[wherein, $X^{D1}$, $X^{D2}$, $E^{1D}$, $E^{2D}$, $E^{3D}$, $E^{4D}$, $R^{1D}$, $R^{2D}$, $R^{3D}$ and $R^{4D}$ represent the same meaning as described above.

$E^{5D}$, $E^{6D}$, $E^{7D}$ and $E^{8D}$ each independently represent a nitrogen atom or a carbon atom.

$R^{5D}$, $R^{6D}$, $R^{7D}$ and $R^{8D}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent.

When $E^{5D}$ is a nitrogen atom, $R^{5D}$ is absent. When $E^{6D}$ is a nitrogen atom, $R^{6D}$ is absent. When $E^{7D}$ is a nitrogen atom, $R^{7D}$ is absent. When $E^{8D}$ is a nitrogen atom, $R^{8D}$ is absent.

$R^{5D}$ and $R^{6D}$, $R^{6D}$ and $R^{7D}$, $R^{7D}$ and $R^{8D}$, $R^{5D}$ and $R^{XD1}$, $R^{5D}$ and $R^{XD2}$, $R^{8D}$ and $R^{XD1}$, and $R^{8D}$ and $R^{XD2}$ each may be combined together to form a ring together with the carbon atoms to which they are attached.]

$E^{5D}$, $E^{6D}$, $E^{7D}$ and $E^{8D}$ are each preferably a carbon atom.

The examples and preferable ranges of $R^{5D}$, $R^{6D}$, $R^{7D}$ and $R^{8D}$ are the same as the examples and preferable ranges of $R^{1D}$, $R^{2D}$, $R^{3D}$ and $R^{4D}$ in the case where $R^{1D}$, $R^{2D}$, $R^{3D}$ and $R^{4D}$ are other than a connecting bond.

The examples and preferable ranges of the substituent which $R^{5D}$, $R^{6D}$, $R^{7D}$ and $R^{8D}$ optionally have are the same as the examples and preferable ranges of the substituent which $R^{1D}$, $R^{2D}$, $R^{3D}$ and $R^{4D}$ optionally have.

$R^{5D}$ and $R^{6D}$, $R^{6D}$ and $R^{7D}$, $R^{7D}$ and $R^{8D}$, $R^{5D}$ and $R^{XD1}$, $R^{5D}$ and $R^{XD2}$, $R^{8D}$ and $R^{XD1}$, and $R^{8D}$ and $R^{XD2}$ each may be combined together to form a ring together with the carbon atoms to which they are attached, but it is preferable that they do not form a ring.

Group Represented by the Formula (E-1)

[Chemical Formula 32]

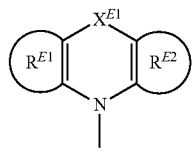

(E-1)

[wherein,

Ring $R^{E1}$ and Ring $R^{E2}$ each independently represent an aromatic hydrocarbon ring or an aromatic hetero ring, and the foregoing rings optionally have a substituent. When a plurality of the substituents are present, they may be combined together to form a ring together with the atoms to which they are attached.

$X^{E1}$ represents a single bond, an oxygen atom, a sulfur atom, a group represented by $-N(R^{XE1})-$ or a group represented by $-C(R^{XE2})_2-$. $R^{XE1}$ and $R^{XE2}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. A plurality of $R^{XE2}$ may be the same or different, and may be combined together to form a ring together with the carbon atoms to which they are attached.]

The examples and preferable ranges of the aromatic hydrocarbon ring and the aromatic hetero ring represented by Ring $R^{E1}$ and Ring $R^{E2}$ are the same as the examples and preferable ranges of the aromatic hydrocarbon ring and the aromatic hetero ring represented by Ring $R^{1C}$ and Ring $R^{2C}$, respectively. The examples and preferable ranges of the substituent which Ring $R^{E1}$ and Ring $R^{E2}$ optionally have are the same as the examples and preferable ranges of the substituent which the substituent which Ring $R^{1C}$ and Ring $R^{2C}$ optionally have optionally further has, respectively.

It is preferable that at least one of Ring $R^{E1}$ and Ring $R^{E2}$ is an aromatic hydrocarbon ring, it is more preferable that the both are each aromatic hydrocarbon rings, it is further preferable that the both represent each a benzene ring, since the light emitting device of the present invention is more excellent in luminance life.

$X^{E1}$ is preferably a single bond, an oxygen atom, a sulfur atom or a group represented by $-C(R^{XD2})_2-$, more preferably a single bond, an oxygen atom or a sulfur atom, further preferably a single bond, since the light emitting device of the present invention is more excellent in luminance life.

The examples and preferable ranges of the group represented by $R^{XE1}$ are the same as the examples and preferable ranges of the group represented by $R^{XD1}$. The examples and preferable ranges of the group represented by $R^{XE2}$ are the same as the examples and preferable ranges of the group represented by $R^{XD2}$.

The group represented by the formula (E-1) is preferably a group represented by the formula (E-2), since the light emitting device of the present invention is more excellent in luminance life.

[Chemical Formula 33]

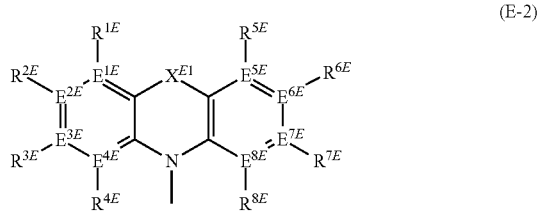

(E-2)

[wherein, $X^{E1}$ represents the same meaning as described above.
$E^{1E}$, $E^{2E}$, $E^{3E}$, $E^{4E}$, $E^{5E}$, $E^{6E}$, $E^{7E}$ and $E^{8E}$ each independently represent a nitrogen atom or a carbon atom.

$R^{1E}$, $R^{2E}$, $R^{3E}$, $R^{4E}$, $R^{5E}$, $R^{6E}$, $R^{7E}$ and $R^{3E}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent.

When $E^{1E}$ is a nitrogen atom, $R^{1E}$ is absent. When $E^{2E}$ is a nitrogen atom, $R^{2E}$ is absent. When $E^{3E}$ is a nitrogen atom, $R^{3E}$ is absent. When $E^{4E}$ is a nitrogen atom, $R^{4E}$ is absent. When $E^{5E}$ is a nitrogen atom, $R^{5E}$ is absent. When $E^{6E}$ is a nitrogen atom, $R^{6E}$ is absent. When $E^{7E}$ is a nitrogen atom, $R^{7E}$ is absent. When $E^{8E}$ is a nitrogen atom, $R^{8E}$ is absent.

$R^{1E}$ and $R^{2E}$, $R^{2E}$ and $R^{3E}$, $R^{3E}$ and $R^{4E}$, $R^{5E}$ and $R^{6E}$, $R^{6E}$ and $R^{7E}$, $R^{7E}$ and $R^{8E}$, $R^{5E}$ and $R^{XD1}$, $R^{5E}$ and $R^{XD2}$, $R^{1E}$ and $R^{XD1}$, and $R^{1E}$ and $R^{XD2}$ each may be combined together to form a ring together with the carbon atoms to which they are attached.]

$E^{1E}$, $E^{2E}$, $E^{3E}$, $E^{4E}$, $E^{5E}$, $E^{6E}$, $E^{7E}$ and $E^{8E}$ are each preferably a carbon atom.

The examples and preferable ranges of $R^{1E}$, $R^{2E}$, $R^{3E}$, $R^{4E}$, $R^{8E}$, $R^{6E}$, $R^{7E}$ and $R^{6E}$ are the same as the examples and preferable ranges of $R^{1D}$, $R^{2D}$, $R^{3D}$ and $R^{4D}$ in the case where $R^{1D}$, $R^{2D}$, $R^{3D}$ and $R^{4D}$ are other than a connecting bond.

The examples and preferable ranges of the substituent which $R^{1E}$, $R^{2E}$, $R^{3E}$, $R^{4E}$, $R^{5E}$, $R^{6E}$, $R^{7E}$ and $R^{8E}$ optionally have are the same as the examples and preferable ranges of the substituent which $R^{1D}$, $R^{2D}$, $R^{3D}$ and $R^{4D}$ optionally have.

$R^{1E}$ and $R^{2E}$, $R^{2E}$ and $R^{3E}$, $R^{3E}$ and $R^{4E}$, $R^{5E}$ and $R^{6E}$, $R^{6E}$ and $R^{7E}$, $R^{7E}$ and $R^{8E}$, $R^{8E}$ and $R^{XD1}$, $R^{5E}$ and $R^{XD2}$, $R^{1E}$ and $R^{XD1}$, and $R^{1E}$ and $R^{XD2}$ each may be combined together to form a ring together with the carbon atoms to which they are attached, but it is preferable that they do not form a ring.

Compound Represented by the Formula (C-2-1) and Compound Represented by the Formula (C-2-2)

The compound represented by the formula (C-1) is preferably a compound represented by the formula (C-2-1) or a compound represented by the formula (C-2-2), more preferably a compound represented by the formula (C-2-1), since the light emitting device of the present invention is more excellent in luminance life.

In the compound represented by the formula (C-2-1) and the formula (C-2-2), $E^{11C}$, $E^{12C}$, $E^{13C}$, $E^{14C}$, $E^{21C}$, $E^{22C}$, $E^{23C}$, $E^{24C}$, $E^{31C}$, $E^{32C}$, $E^{33C}$, $E^{34C}$, $E^{41C}$, $E^{42C}$, $E^{43C}$ and $E^{44C}$ are each preferably a carbon atom.

In the compound represented by the formula (C-2-1) and the formula (C-2-2), Ring $R^{1C'}$, Ring $R^{2C'}$, Ring $R^{3C'}$ and Ring $R^{4C'}$ are each preferably a benzene ring.

In the compound represented by the formula (C-2-2), $R^{C''}$ is preferably a sulfur atom, since the light emitting device of the present invention is more excellent in luminance life.

In the compound represented by the formula (C-2-1), $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ are each preferably a hydrogen atom, an alkyl group, a cycloalkyl group, an aryl group, a monovalent heterocyclic group or a substituted amino group, more preferably a hydrogen atom, an aryl group or a monovalent heterocyclic group, further preferably a hydrogen atom, a group represented by the formula (D-1) or a group represented by the formula (E-1), particularly preferably a hydrogen atom or a group represented by the formula (D-1), and the foregoing groups optionally further have a substituent.

In the compound represented by the formula (C-2-1), at least one of $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is preferably an aryl group or a monovalent heterocyclic group, more preferably a group represented by the formula (D-1) or a group represented by the formula (E-1), further preferably a group represented by the formula (D-1), and the foregoing groups optionally further have a substituent.

In the compound represented by the formula (C-2-1), when at least one of $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is an aryl group or a monovalent heterocyclic group, the total number of the aryl group or the monovalent heterocyclic group represented by $R^{11C}$, $R^{12C}$, $R^{13C}$, $R^{14C}$, $R^{21C}$, $R^{22C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is preferably 1 to 5, more preferably 1 to 3, further preferably 1 or 2, particularly preferably 1.

In the compound represented by the formula (C-2-1), when at least one of $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is a group represented by the formula (D-1) or the formula (E-1), the total number of the group represented by the formula (D-1) or the formula (E-1) represented by $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is preferably 1 to 5, more preferably 1 to 3, further preferably 1 or 2, particularly preferably 1.

In the compound represented by the formula (C-2-1), when at least one of $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is an aryl group or a monovalent heterocyclic group, it is preferable that at least one of $R^{11C}$, $R^{12C}$, $R^{14C}$, $R^{21C}$, $R^{22C}$, $R^{24C}$, $R^{31C}$, $R^{32C}$, $R^{34C}$, $R^{41C}$, $R^{42C}$ and $R^{44C}$ is an aryl group or a monovalent heterocyclic group, it is more preferable that at least one of $R^{11C}$, $R^{12C}$, $R^{21C}$, $R^{22C}$, $R^{32C}$, $R^{32C}$, $R^{41C}$ and $R^{42C}$ is an aryl group or a monovalent heterocyclic group, it is further preferable that at least one of $R^{11C}$, $R^{12C}$, $R^{21C}$ and $R^{22C}$ is an aryl group or a monovalent heterocyclic group, it is particularly preferable that at least one of $R^{11C}$ and $R^{12C}$ is an aryl group or a monovalent heterocyclic group, and the foregoing groups optionally have a substituent.

In the compound represented by the formula (C-2-1), when at least one of $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ is a group represented by the formula (D-1) or a group represented by the formula (E-1), it is preferable that at least one of $R^{11C}$, $R^{12C}$, $R^{14C}$, $R^{21C}$, $R^{22C}$, $R^{24C}$, $R^{31C}$, $R^{32C}$, $R^{34C}$, $R^{41C}$, $R^{42C}$ and $R^{44C}$ is a group represented by the formula (D-1) or a group represented by the formula (E-1), it is more preferable that at least one of $R^{11C}$, $R^{12C}$, $R^{21C}$, $R^{22C}$, $R^{31C}$, $R^{32C}$, $R^{14C}$ and $R^{42C}$ is a group represented by the formula (D-1) or a group represented by the formula (E-1), it is further preferable that at least one of $R^{11C}$, $R^{12C}$, $R^{21C}$ and $R^{22C}$ is a group represented by the formula (D-1) or a group represented by the formula (E-1), it is particularly preferable that at least one of $R^{11C}$ and $R^{12C}$ is a group represented by the formula (D-1) or a group represented by the formula (E-1).

In the compound represented by the formula (C-2-2), $R^{11C}$, $R^{12C}$, $R^{13C}$, $R^{14C}$, $R^{21C}$, $R^{22C}$, $R^{23C}$ and $R^{24C}$ are each preferably a hydrogen atom, an alkyl group, a cycloalkyl group, an aryl group, a monovalent heterocyclic group or a substituted amino group, more preferably a hydrogen atom, an aryl group or a monovalent heterocyclic group, further preferably a hydrogen atom or a group represented by the formula (D-1) or the formula (E-1), particularly preferably a hydrogen atom or a group represented by the formula (E-1), and the foregoing groups optionally further have a substituent.

In the compound represented by the formula (C-2-2), at least one of $R^{11C}$, $R^{12C}$, $R^{13C}$, $R^{14C}$, $R^{21C}$, $R^{22C}$, $R^{23C}$ and $R^{24C}$ is preferably an aryl group or a monovalent heterocyclic group, more preferably a group represented by the formula (D-1) or the formula (E-1), further preferably a group represented by the formula (E-1), and the foregoing groups optionally further have a substituent.

In the compound represented by the formula (C-2-2), when at least one of $R^{11C}$, $R^{12C}$, $R^{13C}$, $R^{14C}$, $R^{21C}$, $R^{22C}$, $R^{23C}$ and $R^{24C}$ is an aryl group or a monovalent heterocyclic group, the total number of the aryl group, the monovalent heterocyclic group or the substituted amino group represented by $R^{11C}$, $R^{12C}$, $R^{13C}$, $R^{14C}$, $R^{21C}$, $R^{22C}$, $R^{23C}$ and $R^{24C}$ is preferably 1 to 5, more preferably 1 to 3, further preferably 1 or 2, particularly preferably 2.

In the compound represented by the formula (C-2-2), when at least one of $R^{11C}$, $R^{12C}$, $R^{13C}$, $R^{14C}$, $R^{21C}$, $R^{22C}$, $R^{23C}$ and $R^{24C}$ is a group represented by the formula (D-1) or the formula (E-1), the total number of the group represented by the formula (D-1) or the formula (E-1) represented by $R^{11C}$, $R^{12C}$, $R^{13C}$, $R^{14C}$, $R^{21C}$, $R^{22C}$, $R^{23C}$ and $R^{24C}$ is preferably 1 to 5, more preferably 1 to 3, further preferably 1 or 2, particularly preferably 2.

In the compound represented by the formula (C-2-2), when at least one of $R^{11C}$, $R^{12C}$, $R^{13C}$, $R^{14C}$, $R^{21C}$, $R^{22C}$, $R^{23C}$ and $R^{24C}$ is an aryl group or a monovalent heterocyclic group, it is preferable that at least one of $R^{11C}$, $R^{12C}$, $R^{13C}$, $R^{21C}$, $R^{22C}$ and $R^{23C}$ is an aryl group or a monovalent heterocyclic group, it is more preferable that at least one of $R^{12C}$ and $R^{22C}$ is an aryl group or a monovalent heterocyclic group.

In the compound represented by the formula (C-2-2), when at least one of $R^{11C}$, $R^{12C}$, $R^{13C}$, $R^{14C}$, $R^{21C}$, $R^{22C}$, $R^{23C}$ and $R^{24C}$ is a group represented by the formula (D-1) or the formula (E-1), it is preferable that at least one of $R^{11C}$, $R^{12C}$, $R^{13C}$, $R^{21C}$, $R^{22C}$ and $R^{23C}$ is a group represented by the formula (D-1) or the formula (E-1), it is more preferable that at least one of $R^{12C}$ and $R^{22C}$ is a group represented by the formula (D-1) or the formula (E-1), it is further preferable that at least one of $R^{12C}$ and $R^{22C}$ is a group represented by the formula (E-1).

In the compound represented by the formula (C-2-1) and the formula (C-2-2), the examples and preferable ranges of the aryl group, the monovalent heterocyclic group and the substituted amino group represented by $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ are the same as the examples and preferable ranges of the aryl group, the monovalent heterocyclic group and the substituted amino group as the substituent which Ring $R^{1C}$ and Ring $R^{2C}$ optionally have, respectively.

In the compound represented by the formula (C-2-1) and the formula (C-2-2), the examples and preferable ranges of the substituent which $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ optionally have are the same as the examples and preferable ranges of the substituent which the substituent which Ring $R^{1C}$ and Ring $R^{2C}$ optionally have optionally further has.

In the compound represented by the formula (C-2-1) and the formula (C-2-2), $R^{11C}$ and $R^{12C}$, $R^{12C}$ and $R^{13C}$, $R^{13C}$ and $R^{14C}$, $R^{14C}$ and $R^{34C}$, $R^{34C}$ and $R^{33C}$, $R^{33C}$ and $R^{32C}$, $R^{32C}$ and $R^{31C}$, $R^{31C}$ and $R^{41C}$, $R^{41C}$ and $R^{42C}$, $R^{42C}$ and $R^{43C}$, $R^{43C}$ and $R^{44C}$, $R^{44C}$ and $R^{24C}$, $R^{24C}$ and $R^{23C}$, $R^{23C}$ and $R^{22C}$, $R^{22C}$ and $R^{21C}$, and $R^{21C}$ and $R^{11C}$ each may be combined together to form a ring together with the carbon atoms to which they are attached, but it is preferable that they do not form a ring.

The compound represented by the formula (C-2-1) is preferably a compound represented by the formula (C-3-1), since the light emitting device of the present invention is more excellent in luminance life.

The compound represented by the formula (C-2-2) is preferably a compound represented by the formula (C-3-2), since the light emitting device of the present invention is more excellent in luminance life.

The compound represented by the formula (C-1) includes, for example, compounds represented by the formula (C-101) to the formula (C-146).

[Chemical Formula 34]

(C-101)

(C-102)

(C-103)

[Chemical Formula 35]

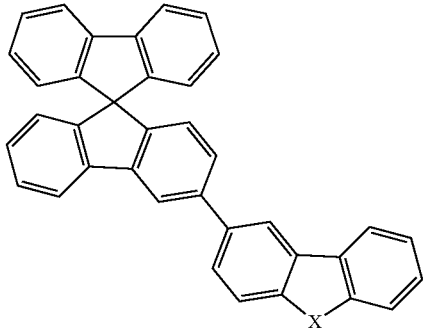

(C-104)

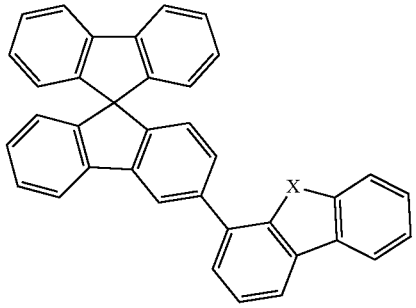

(C-105)

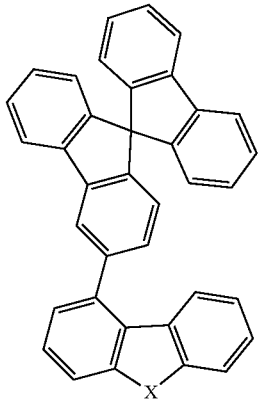

(C-106)

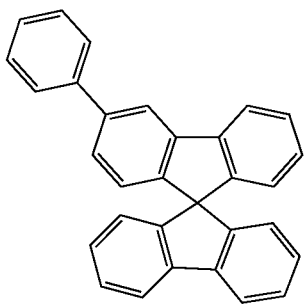

(C-107)

(C-108)
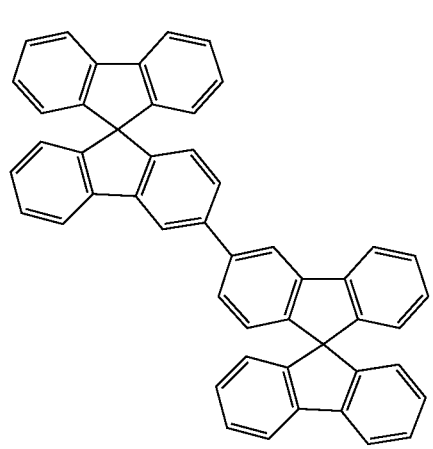
(C-111)
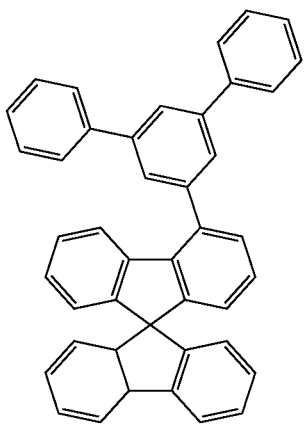
(C-109)
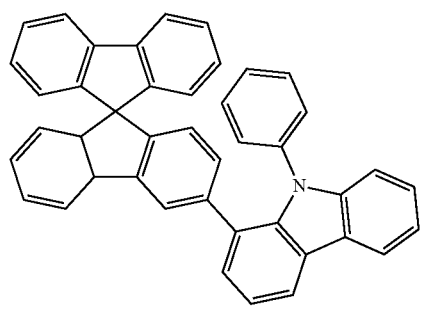
(C-112)
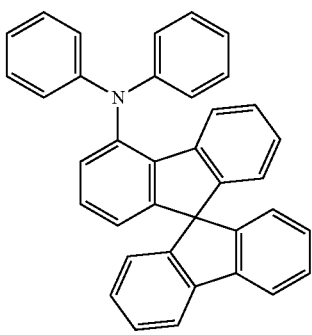
[Chemical Formula 36]
(C-110)
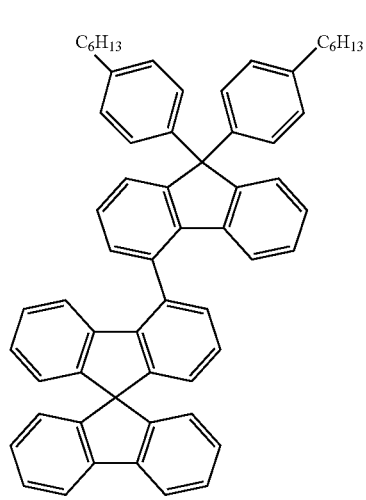
(C-113)
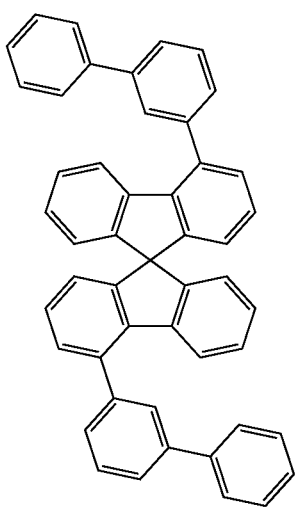

(C-114)
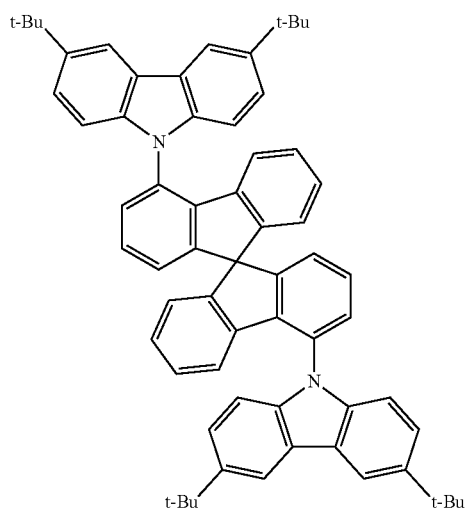
(C-115)
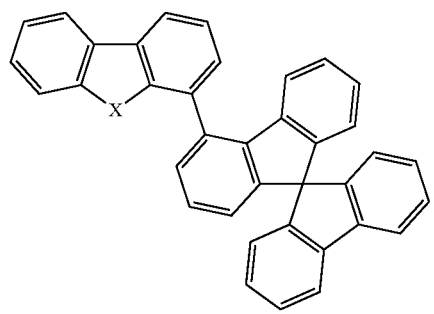
[Chemical Formula 37]
(C-116)
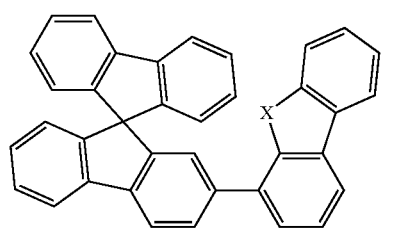
(C-117)
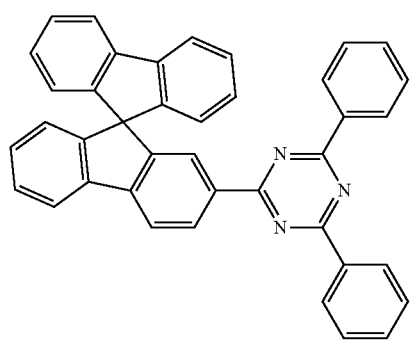
(C-118)
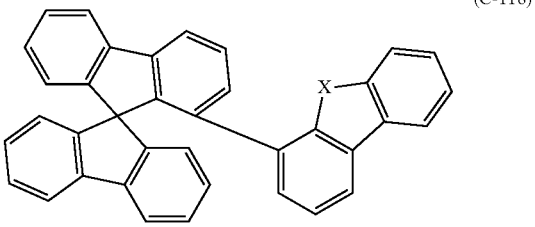
(C-119)
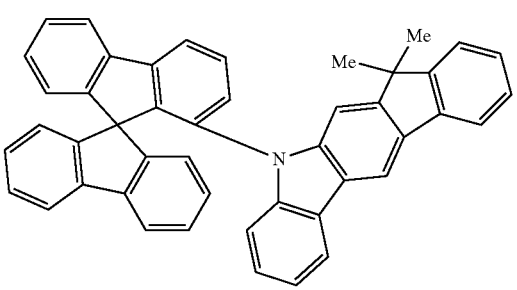
[Chemical Formula 38]
(C-120)
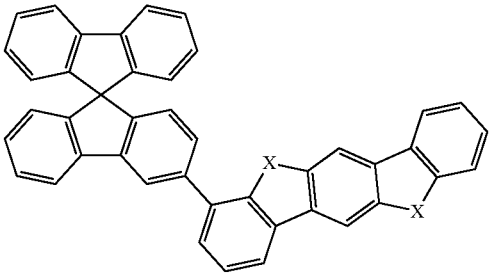
(C-121)
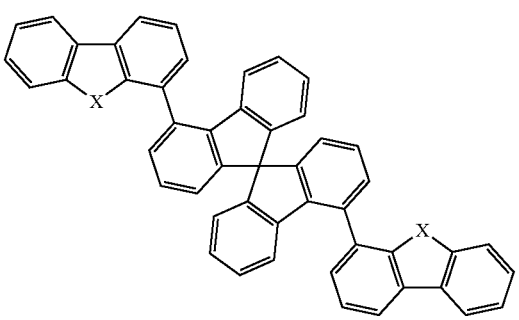
(C-122)
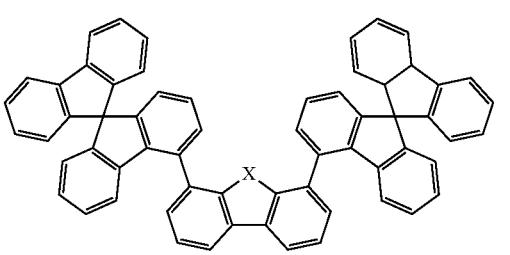

(C-123)
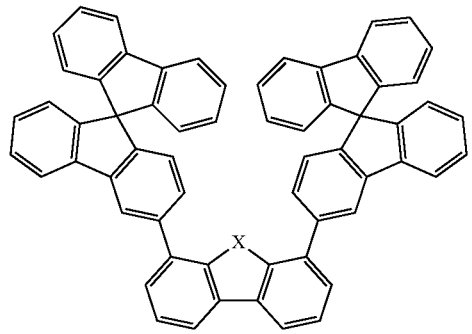
[Chemical Formula 39]
(C-124)
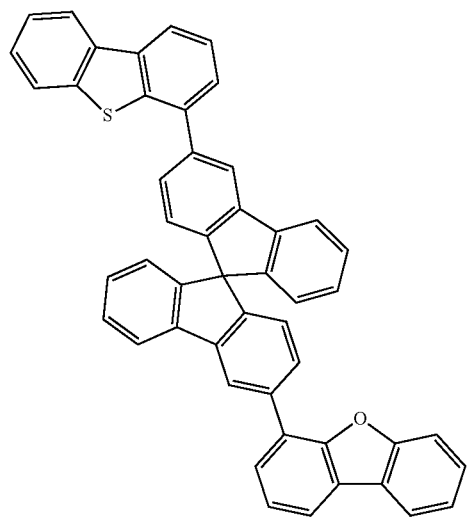
(C-125)
(C-126)
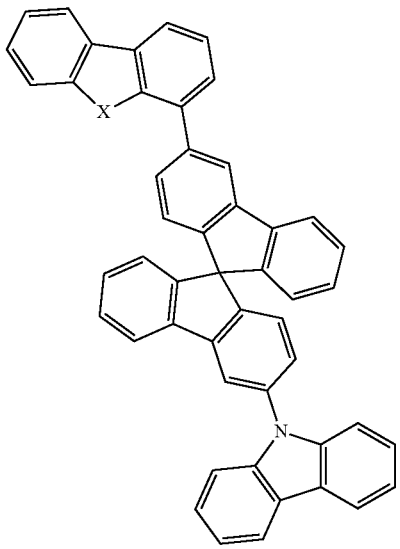
(C-127)
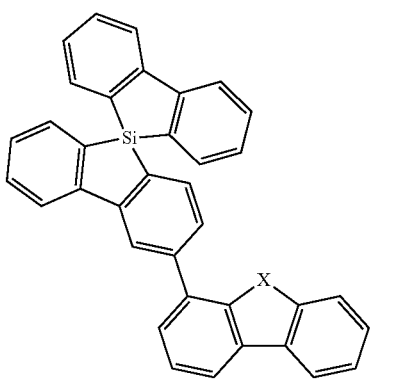
(C-128)
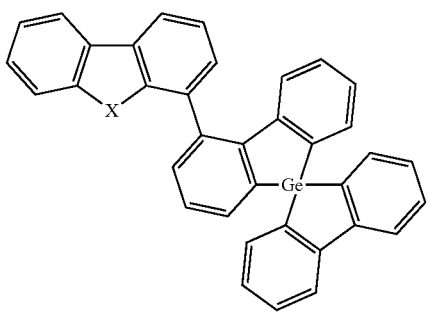
[Chemical Formula 40]
(C-129)
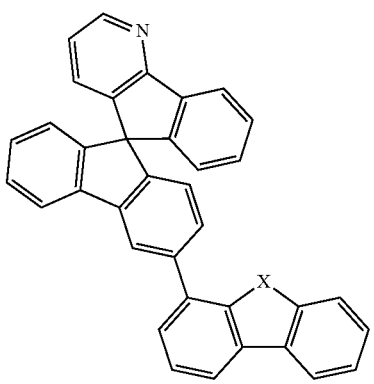

[Chemical Formula 41]
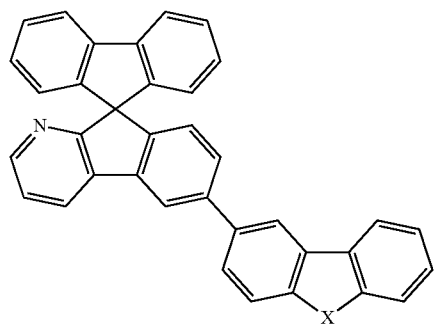
(C-130)
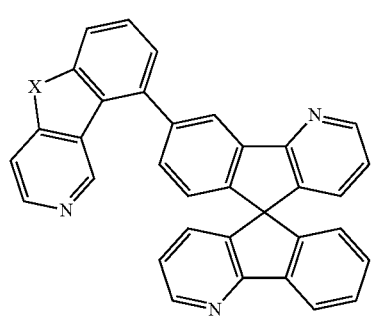
(C-131)
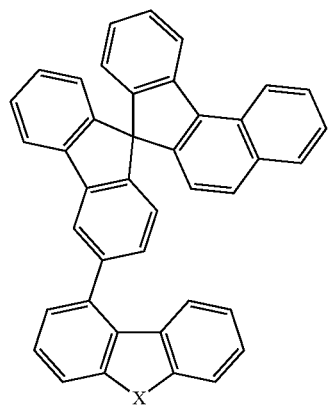
(C-132)
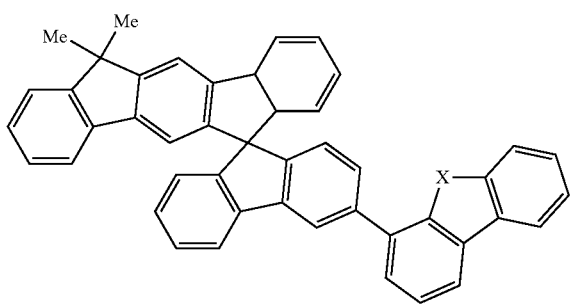
(C-133)
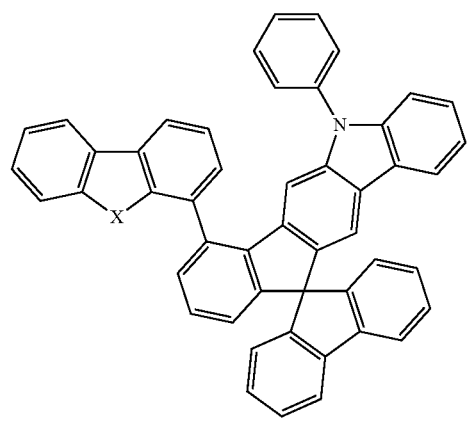
(C-134)
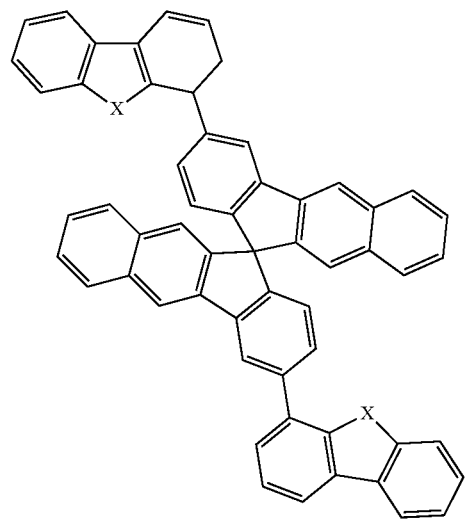
(C-135)
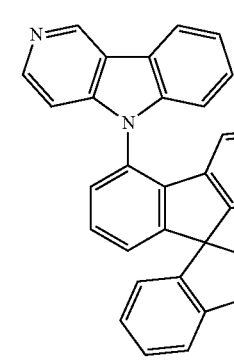
(C-136)

[Chemical Formula 42]
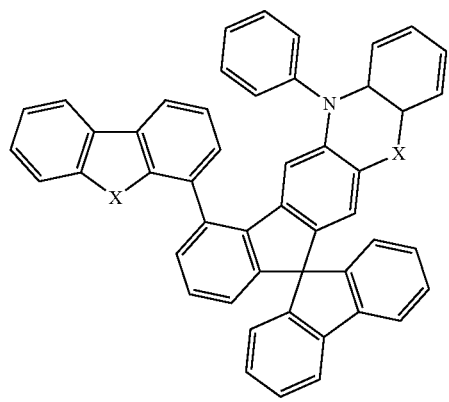
(C-137)
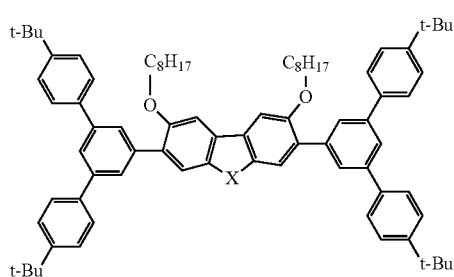
(C-138)
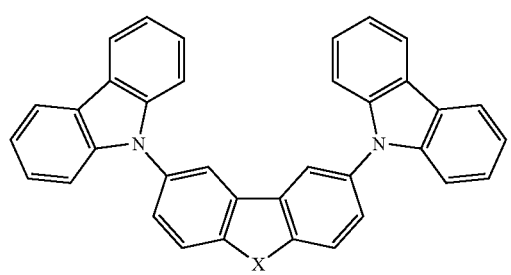
(C-139)
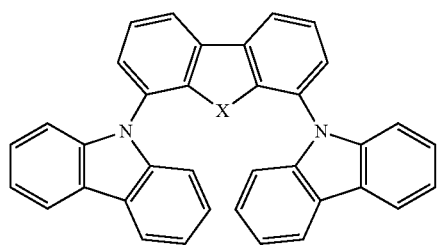
(C-140)
[Chemical Formula 43]
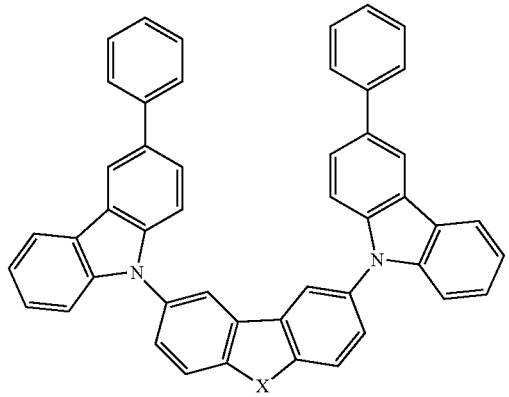
(C-141)
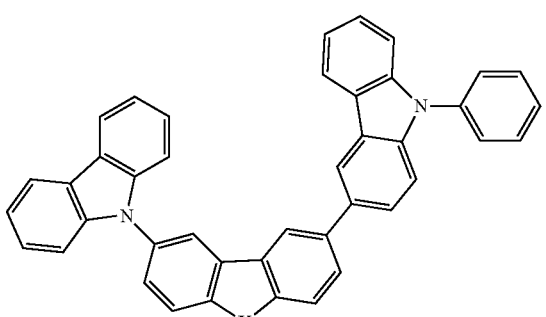
(C-142)
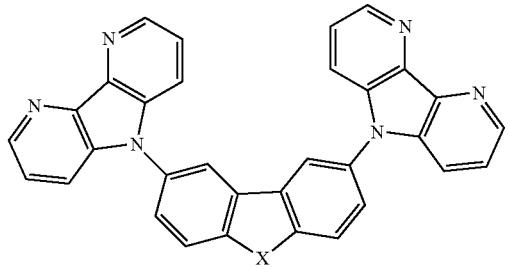
(C-143)
[Chemical Formula 44]
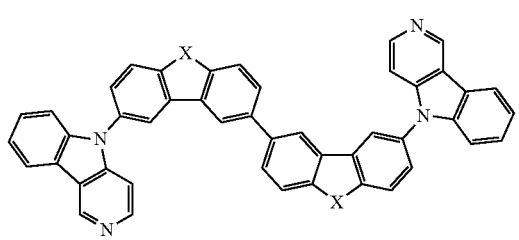
(C-144)
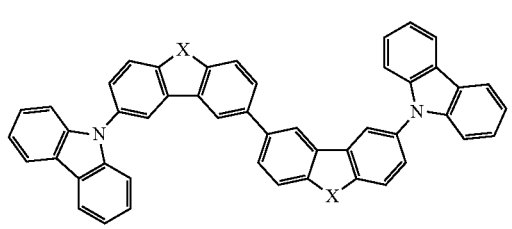
(C-145)

-continued

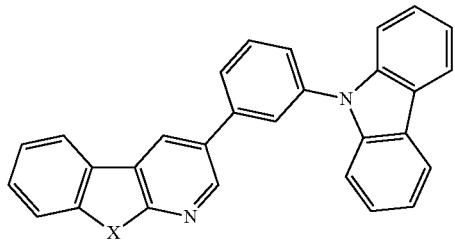

(C-146)

[wherein, X represents an oxygen atom or a sulfur atom. When a plurality of X are present, they may be the same or different.]

X is preferably a sulfur atom.

The compound represented by the formula (C-1) is available, for example, from Aldrich and Luminescence Technology Corp. The compound represented by the formula (C-1) can be synthesized according to methods described, for example, in International Publication WO 2014/023388, International Publication WO 2013/045408, International Publication WO 2013/045410, International Publication WO 2013/045411, International Publication WO 2012/048820, International Publication WO 2012/048819, International Publication WO 2011/006574, "Organic Electronics, vol. 14, 902-908 (2013)", International Publication WO 2009/096202, International Publication WO 2009/086028, Japanese Unexamined Patent Application Publication (JP-A) No. 2009-267255 and JP-A No. 2009-46408, as other means Others The first organic layer is preferably a layer containing a compound represented by the formula (C-1) and a phosphorescent compound, since the light emitting device of the present invention is more excellent in luminance life.

In the first organic layer, the compound represented by the formula (C-1) may be contained singly or in combination of two or more. When the first organic layer is a layer containing a compound represented by the formula (C-1) and a phosphorescent compound, the phosphorescent compound may be contained singly or in combination of two or more.

When the first organic layer is a layer containing a compound represented by the formula (C-1) and a phosphorescent compound, the amount of the phosphorescent compound is usually 0.01 to 95 parts by mass, preferably 0.1 to 70 parts by mass, more preferably 1 to 50 parts by mass, further preferably 10 to 40 parts by mass, when the sum of the phosphorescent compound and the compound represented by the formula (C-1) is taken as 100 parts by mass.

When the first organic layer is a layer containing a compound represented by the formula (C-1) and a phosphorescent compound, the compound represented by the formula (C-1) is preferably a host material having at least one function selected from the group consisting of hole injectability, hole transportability, electron injectability and electron transportability, since the light emitting device of the present invention is more excellent in luminance life.

When the first organic layer is a layer containing a compound represented by the formula (C-1) and a phosphorescent compound, the lowest excited triplet state ($T_1$) of the compound represented by the formula (C-1) is preferably at energy level corresponding to that of the phosphorescent compound contained in the first organic layer or higher energy level than it, more preferably at higher energy level than it, since the light emitting device of the present invention is more excellent in luminance life.

The phosphorescent compound is preferably one that shows solubility in a solvent which is capable of dissolving a compound represented by the formula (C-1) contained in the first organic layer, since the light emitting device of the present invention can be fabricated by a solution application process.

"The phosphorescent compound" means usually a compound showing phosphorescence at room temperature (25° C.), and is preferably a metal complex showing light emission from triplet excited state at room temperature. This metal complex showing light emission from triplet excited state has a central metal atom and a ligand.

The central metal atom includes, for example, metal atoms having an atomic number of 40 or more, having the spin-orbital interaction to the complex and capable of causing intersystem crossing between singlet state and triplet state. The metal atom includes, for example, a ruthenium atom, a rhodium atom, a palladium atom, an iridium atom and a platinum atom, and is preferably an iridium atom or a platinum atom, since the light emitting device of the present invention is more excellent in luminance life.

The ligand includes, for example, neutral or anionic monodentate ligands or neutral or anionic polydentate ligands forming at least one bond selected from the group consisting of a coordination bond and a covalent bond with a central metal atom. The bond between a central metal atom and a ligand includes, for example, a metal-nitrogen bond, a metal-carbon bond, a metal-oxygen bond, a metal-phosphorus bond, a metal-sulfur bond and a metal-halogen bond. The polydentate ligand means usually a bidentate or more and hexadentate or less ligand.

Phosphorescent Compound Represented by the Formula (1)

The phosphorescent compound is preferably a phosphorescent compound represented by the above-described formula (1).

M is preferably an iridium atom or a platinum atom, more preferably an iridium atom, since the light emitting device of the present invention is more excellent in luminance life.

When M is a ruthenium atom, a rhodium atom or an iridium atom, $n^1$ is preferably 2 or 3, more preferably 3.

When M is a palladium atom or a platinum atom, $n^1$ is preferably 2.

$E^1$ and $E^2$ are each preferably a carbon atom.

Ring $L^1$ is preferably a 5-membered aromatic hetero ring or a 6-membered aromatic hetero ring, more preferably a 5-membered aromatic hetero ring having two or more and four or less nitrogen atoms as a constituent atom or a 6-membered aromatic hetero ring having one or more and four or less nitrogen atoms as a constituent atom, further preferably a 5-membered aromatic hetero ring having two or more and three or less nitrogen atoms as a constituent atom or a 6-membered aromatic hetero ring having one or more and two or less nitrogen atoms as a constituent atom, and the foregoing rings optionally have a substituent. When Ring $L^1$ is a 6-membered aromatic hetero ring, $E^1$ is preferably a carbon atom.

Ring $L^1$ includes, for example, a diazole ring, a triazole ring, a pyridine ring, a diazabenzene ring, a triazine ring, an azanaphthalene ring and a diazanaphthalene ring, and is preferably a diazole ring, a triazole ring, a pyridine ring, a diazabenzene ring, a quinoline ring or an isoquinoline ring, more preferably a diazole ring, a triazole ring, a pyridine ring, a quinoline ring or an isoquinoline ring, further preferably a diazole ring or a triazole ring, particularly preferably a diazole ring, and the foregoing rings optionally have a substituent.

Ring $L^2$ is preferably a 5-membered or 6-membered aromatic hydrocarbon ring or a 5-membered or 6-membered aromatic hetero ring, more preferably a 6-membered aromatic hydrocarbon ring or a 6-membered aromatic hetero ring, further preferably a 6-membered aromatic hydrocarbon ring, and the foregoing rings optionally have a substituent. When Ring $R^2$ is a 6-membered aromatic hetero ring, $E^2$ is preferably a carbon atom.

Ring $L^2$ includes, for example, a benzene ring, a naphthalene ring, a fluorene ring, a phenanthrene ring, an indene ring, a pyridine ring, a diazabenzene ring and a triazine ring, and is preferably a benzene ring, a naphthalene ring, a fluorene ring, a pyridine ring or a diazabenzene ring, more preferably a benzene ring, a pyridine ring or a diazabenzene ring, further preferably a benzene ring, and the foregoing rings optionally have a substituent.

The substituent which Ring $L^1$ and Ring $L^2$ optionally have is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an alkoxy group, a cycloalkoxy group, an aryl group, a monovalent heterocyclic group, a substituted amino group or a fluorine atom, further preferably an alkyl group, a cycloalkyl group, an aryl group, a monovalent heterocyclic group or a substituted amino group, particularly preferably an aryl group or a monovalent heterocyclic group, especially preferably an aryl group, and the foregoing groups optionally further have a substituent.

The aryl group as the substituent which Ring $L^1$ and Ring $L^2$ optionally have is preferably a phenyl group, a naphthyl group, an anthracenyl group, a phenanthrenyl group, a dihydrophenanthrenyl group, a fluorenyl group or a pyrenyl group, more preferably a phenyl group, a naphthyl group or a fluorenyl group, further preferably a phenyl group, and the foregoing groups optionally further have a substituent.

The monovalent heterocyclic group as the substituent which Ring $L^1$ and Ring $L^2$ optionally have is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a carbazolyl group, an azacarbazolyl group or a diazacarbazolyl group, further preferably a pyridyl group, a pyrimidinyl group or a triazinyl group, particularly preferably a triazinyl group, and the foregoing groups optionally further have a substituent.

In the substituted amino group as the substituent which Ring $L^1$ and Ring $L^2$ optionally have, the substituent which the amino group has is preferably an aryl group or a monovalent heterocyclic group, more preferably an aryl group, and the foregoing groups optionally further have a substituent. The examples and preferable range of the aryl group as the substituent which the amino group has are the same as the examples and preferable range of the aryl group as the substituent which Ring $L^1$ and Ring $L^2$ optionally have. The examples and preferable range of the monovalent heterocyclic group as the substituent which the amino group has are the same as the examples and preferable range of the monovalent heterocyclic group as the substituent which Ring $L^1$ and Ring $L^2$ optionally have.

The substituent which the substituent which Ring $L^1$ and Ring $L^2$ optionally have optionally further has is preferably an alkyl group, a cycloalkyl group, an aryl group, a monovalent heterocyclic group, an alkoxy group, a cycloalkoxy group or a substituted amino group, more preferably an alkyl group, a cycloalkyl group, an aryl group, a monovalent heterocyclic group or a substituted amino group, further preferably an alkyl group, a cycloalkyl group or an aryl group, particularly preferably an alkyl group or a cycloalkyl group, and the foregoing groups optionally further have a substituent, but it is preferable that these groups do not further have a substituent.

The aryl group, the monovalent heterocyclic group or the substituted amino group as the substituent which Ring $L^1$ and Ring $L^2$ optionally have is preferably a group represented by the formula (D-A), the formula (D-B) or the formula (D-C), more preferably a group represented by the formula (D-A) or the formula (D-C), further preferably a group represented by the formula (D-C), since the light emitting device of the present invention is more excellent in luminance life.

[Chemical Formula 45]

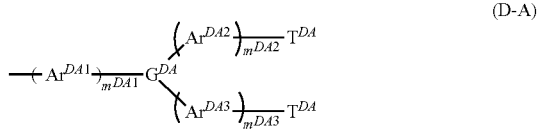

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and the foregoing groups optionally have a substituent.

$Ar^{DA1}$, $Ar^{DA2}$ and $Ar^{DA3}$ each independently represent an arylene group or a divalent heterocyclic group, and the foregoing groups optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and the foregoing groups optionally have a substituent. A plurality of $T^{DA}$ may be the same or different.]

[Chemical Formula 46]

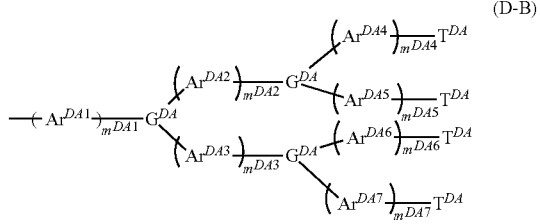

(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and the foregoing groups optionally have a substituent. A plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and the foregoing groups optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and the foregoing groups optionally have a substituent. A plurality of $T^{DA}$ may be the same or different.]

[Chemical Formula 47]

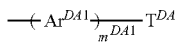
(D-C)

[wherein, $m^{DA1}$ represents an integer of 0 or more.

$Ar^{DA1}$ represents an arylene group or a divalent heterocyclic group, and the foregoing groups optionally have a substituent. When a plurality of $Ar^{DA1}$ are present, they may be the same or different.

$T^{DA}$ represents an aryl group or a monovalent heterocyclic group, and the foregoing groups optionally have a substituent.]

$m^{DA1}$, $m^{DA2}$, $m^{DA3}$, $m^{DA4}$, $m^{DA5}$, $m^{DA6}$ and $m^{DA7}$ are each usually an integer of 10 or less, preferably an integer of 5 or less, more preferably an integer of 2 or less, further preferably 0 or 1. It is preferable that $m^{DA2}$, $m^{DA3}$, $m^{DA4}$, $m^{DA5}$, $m^{DA6}$ and $m^{DA7}$ are the same integer, and it is more preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably an aromatic hydrocarbon group or a heterocyclic group, more preferably a group obtained by removing from a benzene ring, a pyridine ring, a pyrimidine ring, a triazine ring or a carbazole ring three hydrogen atoms directly bonding to carbon atoms or nitrogen atoms constituting the ring, and the foregoing groups optionally have a substituent.

The substituent which $G^{DA}$ optionally has is preferably an alkyl group, a cycloalkyl group, an alkoxy group, a cycloalkoxy group, an aryl group or a monovalent heterocyclic group, more preferably an alkyl group, a cycloalkyl group, an alkoxy group or a cycloalkoxy group, further preferably an alkyl group or a cycloalkyl group, and the foregoing groups optionally further have a substituent, but it is preferable that these groups do not further have a substituent.

$G^{DA}$ is preferably a group represented by the formula (GDA-11) to the formula (GDA-15), more preferably a group represented by the formula (GDA-11) to the formula (GDA-14), further preferably a group represented by the formula (GDA-11) or the formula (GDA-14), particularly preferably a group represented by the formula (GDA-11).

[Chemical Formula 48]

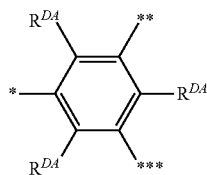
(GDA-11)

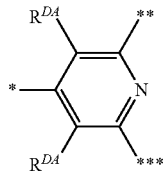
(GDA-12)

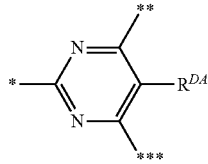
(GDA-13)

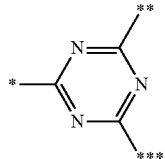
(GDA-14)

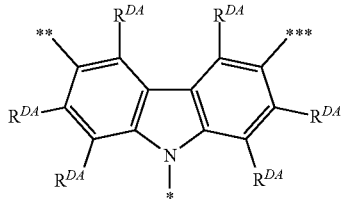
(GDA-15)

[wherein,

* represents a bond to $Ar^{DA1}$ in the formula (D-A), to $Ar^{DA1}$ in the formula (D-B), to $Ar^{DA2}$ in the formula (D-B) or to $Ar^{DA3}$ in the formula (D-B).

** represents a bond to $Ar^{DA2}$ in the formula (D-A), to $Ar^{DA2}$ in the formula (D-B), to $Ar^{DA4}$ in the formula (D-B) or to $Ar^{DA6}$ in the formula (D-B).

*** represents a bond to $Ar^{DA3}$ in the formula (D-A), to $Ar^{DA3}$ in the formula (D-B), to $Ar^{DA5}$ in the formula (D-B) or to $Ar^{DA7}$ in the formula (D-B).

$R^{DA}$ represents a hydrogen atom, an alkyl group, a cycloalkyl group, an alkoxy group, a cycloalkoxy group, an aryl group or a monovalent heterocyclic group, and the foregoing groups optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or a cycloalkyl group, and the foregoing groups optionally have a substituent.

$Ar^{DA1}$, $Ar^{DA2}$, $Ar^{DA3}$, $Ar^{DA4}$, $Ar^{DA5}$, $Ar^{DA6}$ and $Ar^{DA7}$ are each preferably a phenylene group, a fluorenediyl group or a carbazolediyl group, more preferably a group represented by the formula (ArDA-1) to the formula (ArDA-5), further preferably a group represented by the formula (ArDA-1) to the formula (ArDA-3), particularly preferably a group represented by the formula (ArDA-1) or the formula (ArDA-2), especially preferably a group represented by the formula (ArDA-1), and the foregoing groups optionally have a substituent.

[Chemical Formula 49]

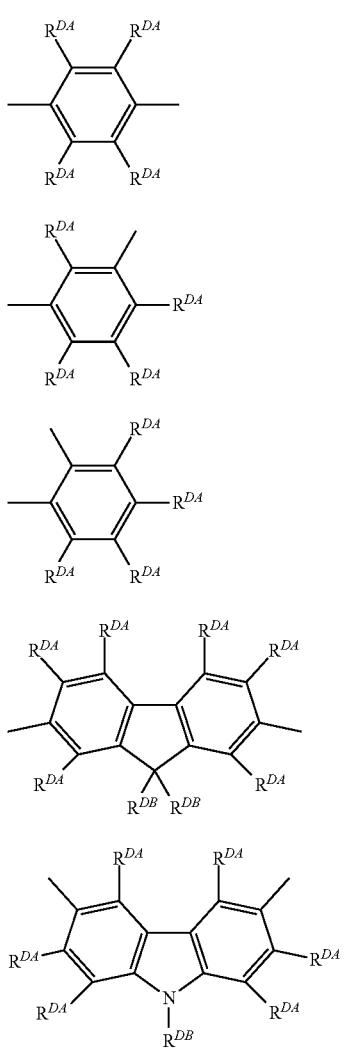

(ArDA-1)
(ArDA-2)
(ArDA-3)
(ArDA-4)
(ArDA-5)

[wherein, $R^{DA}$ represents the same meaning as described above.

$R^{DB}$ represents a hydrogen atom, an alkyl group, a cycloalkyl group, an aryl group or a monovalent heterocyclic group, and the foregoing groups optionally have a substituent. When a plurality of $R^{DB}$ are present, they may be the same or different.]

$R^{DB}$ is preferably an alkyl group, a cycloalkyl group, an aryl group or a monovalent heterocyclic group, more preferably an aryl group or a monovalent heterocyclic group, further preferably an aryl group, and the foregoing groups optionally have a substituent.

The examples and preferable ranges of the substituent which $Ar^{DA1}$, $Ar^{DA2}$, $Ar^{DA3}$, $Ar^{DA4}$, $Ar^{DA5}$, $Ar^{DA6}$, $Ar^{DA7}$ and $R^{DB}$ optionally have are the same as the examples and preferable ranges of the substituent which $G^{DA}$ optionally has.

$T^{DA}$ is preferably a group represented by the formula (TDA-1) to the formula (TDA-3), more preferably a group represented by the formula (TDA-1).

[Chemical Formula 50]

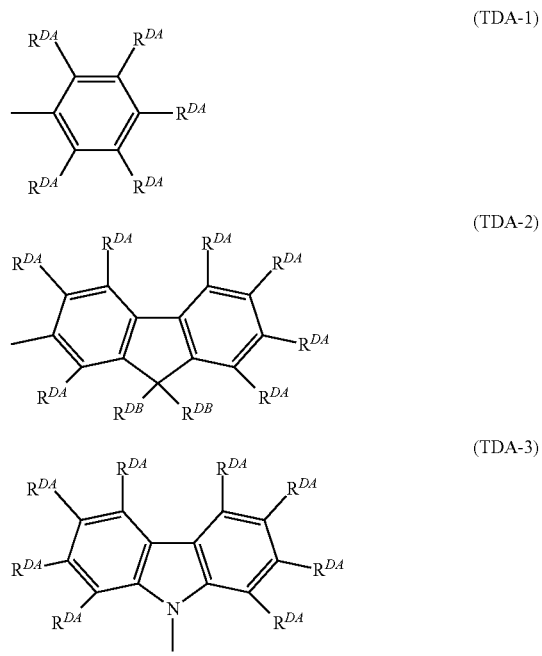

(TDA-1)
(TDA-2)
(TDA-3)

[wherein, $R^{DA}$ and $R^{DB}$ represent the same meaning as described above.]

The group represented by the formula (D-A) is preferably a group represented by the formula (D-A1) to the formula (D-A5), more preferably a group represented by the formula (D-A1) or the formula (D-A3) to the formula (D-A5), further preferably a group represented by the formula (D-A1).

[Chemical Formula 51]

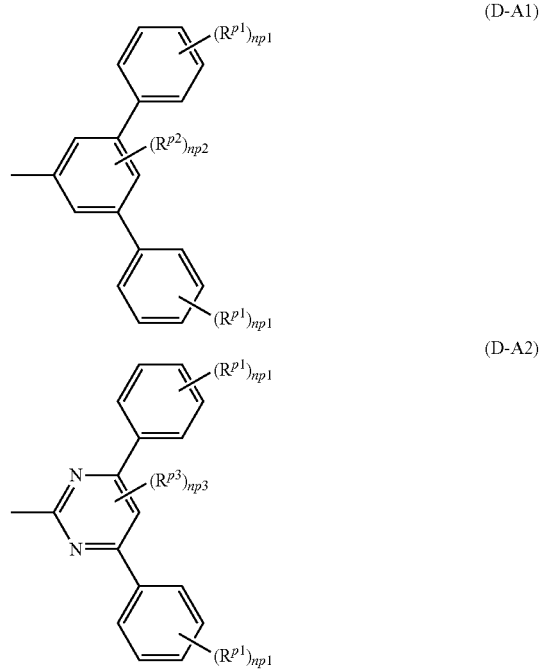

(D-A1)
(D-A2)

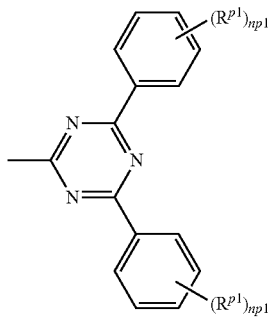
(D-A3)

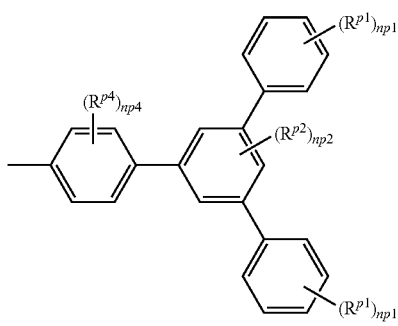
(D-A4)

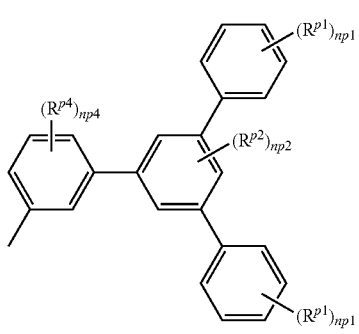
(D-A5)

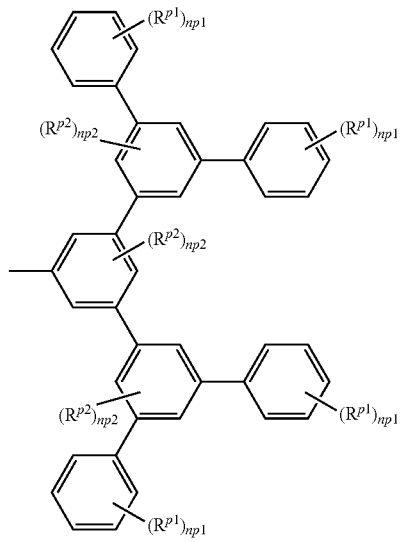
(D-B1)

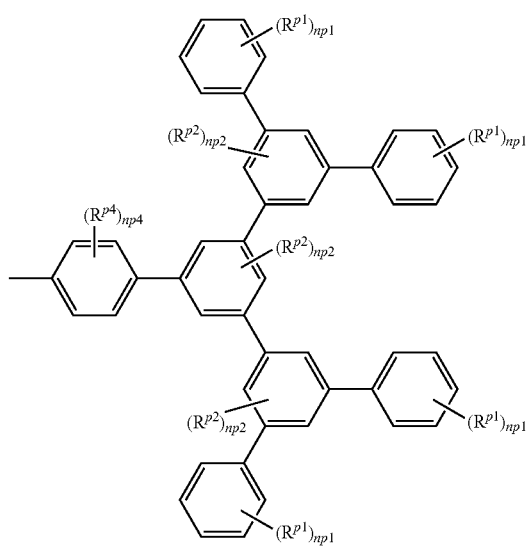
(D-B2)

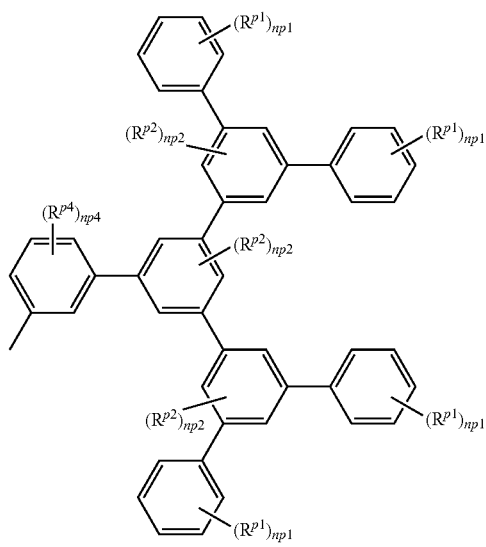
(D-B3)

[wherein,
$R^{p1}$, $R^{p2}$, $R^{p3}$ and $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 to 5, np2 represents an integer of 0 to 3, np3 represents 0 or 1, and np4 represents an integer of 0 to 4. A plurality of np1 may be the same or different.]

The group represented by the formula (D-B) is preferably a group represented by the formula (D-B1) to the formula (D-B6), more preferably a group represented by the formula (D-B1) to the formula (D-B3) or the formula (D-B5), further preferably a group represented by the formula (D-B1).

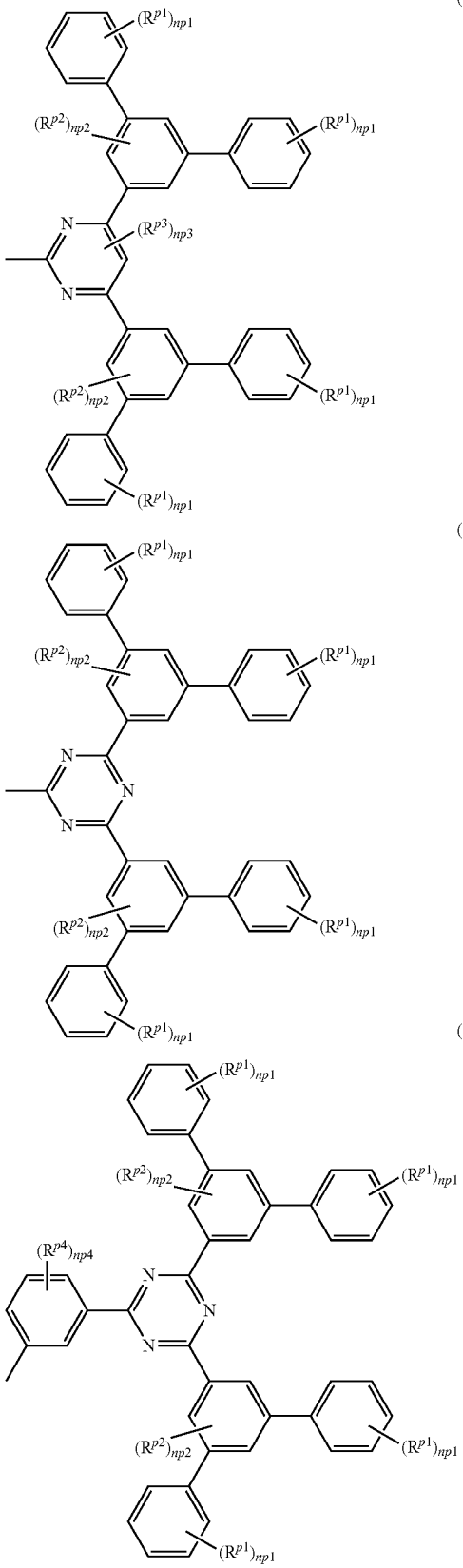

(D-B4)

(D-B5)

(D-B6)

[wherein,
$R^{p1}$, $R^{p2}$, $R^{p3}$ and $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 to 5 represents, np2 represents an integer of 0 to 3 represents, np3 represents 0 or 1, and np4 represents an integer of 0 to 4. A plurality of np1 may be the same or different. A plurality of np2 may be the same or different.]

The group represented by the formula (D-C) is preferably a group represented by the formula (D-C1) to the formula (D-C4), more preferably a group represented by the formula (D-C1) or the formula (D-C2), further preferably a group represented by the formula (D-C2).

[Chemical Formula 54]

(D-C1)

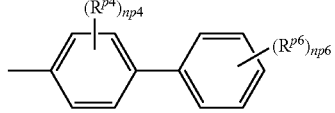

(D-C2)

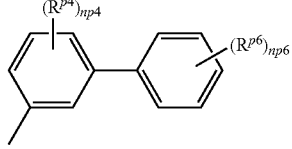

(D-C3)

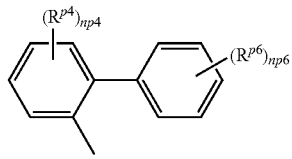

(D-C4)

[wherein,
$R^{p4}$, $R^{p5}$ and $R^{p6}$ each independently represent an alkyl group, a cycloalkyl group, an alkoxy group, a cycloalkoxy group or a halogen atom. When a plurality of $R^{p4}$, $R^{p5}$ and $R^{p6}$ are present, they may be the same or different at each occurrence.

np4 represents an integer of 0 to 4, np5 represents an integer of 0 to 5, and np6 represents an integer of 0 to 5.]

np1 is preferably an integer of 0 to 2, more preferably 0 or 1. np2 is preferably 0 or 1, more preferably 0. np3 is preferably 0. np4 is preferably an integer of 0 to 2, more preferably 0. np5 is preferably an integer of 0 to 3, more preferably 0 or 1. np6 is preferably an integer of 0 to 2, more preferably 0 or 1.

The alkyl group or the cycloalkyl group represented by $R^{p1}$, $R^{p1}$, $R^{p3}$, $R^{p4}$, $R^{p5}$ and $R^{p6}$ is preferably a methyl group, an ethyl group, an isopropyl group, a tert-butyl group, a hexyl group, a 2-ethylhexyl group, a cyclohexyl group or a tert-octyl group.

The alkoxy group or the cycloalkoxy group represented by $R^{p1}$, $R^{p2}$, $R^{p3}$, $R^{p4}$, $R^{p5}$ and $R^{p}$ is preferably a methoxy group, a 2-ethylhexyloxy group or a cyclohexyloxy group.

$R^{p1}$, $R^{p2}$, $R^{p3}$, $R^{p4}$, $R^{p5}$ and $R^{p6}$ are each preferably an alkyl group optionally having a substituent or a cycloalkyl group optionally having a substituent, more preferably an alkyl group optionally having a substituent, further preferably a methyl group, an ethyl group, an isopropyl group, a tert-butyl group, a hexyl group, a 2-ethylhexyl group or a tert-octyl group.

When a plurality of the substituents which Ring $L^1$ optionally has are present, it is preferable that they are not combined together to form a ring together with the atoms to which they are attached.

When a plurality of the substituents which Ring $L^2$ optionally has are present, it is preferable that they are not combined together to form a ring together with the atoms to which they are attached.

It is preferable that the substituent which Ring $L^1$ optionally has and the substituent which Ring $L^2$ optionally has are not combined together to form a ring together with the atoms to which they are attached.

[Anionic Bidentate Ligand]

The anionic bidentate ligand represented by $A^1$-$G^1$-$A^2$ includes, for example, ligands represented by the following formulae. However, the anionic bidentate ligand represented by $A^1$-$G^1$-$A^2$ is different from a ligand of which number is defined by subscript $n^1$.

[Chemical Formula 55]

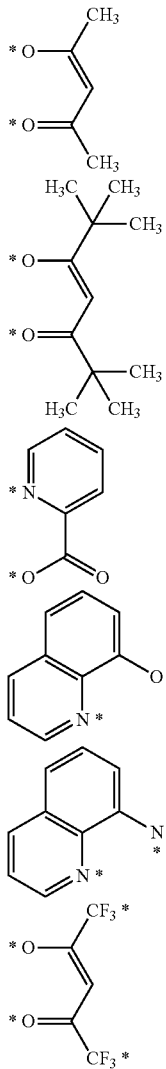

[Chemical Formula 56]

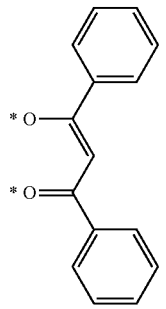

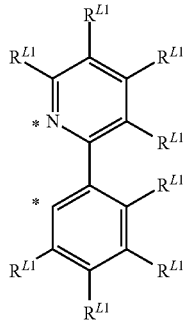

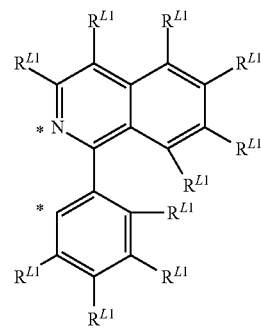

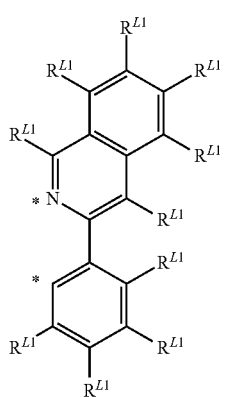

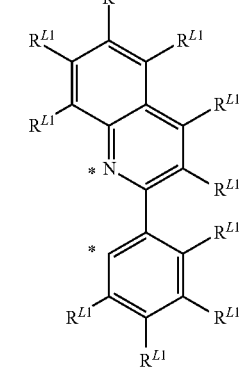

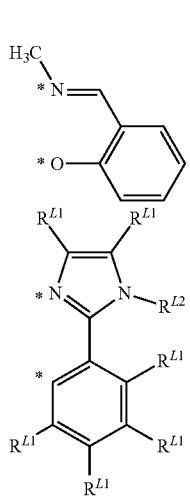

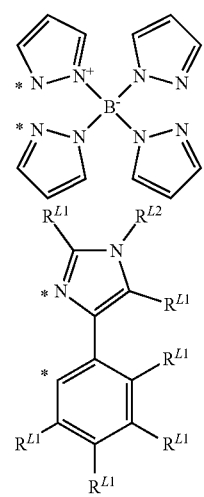

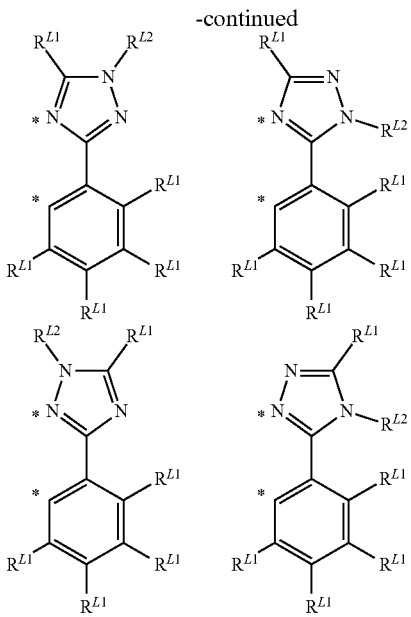

[wherein,
* represents a site binding to M.

$R^{L1}$ represents a hydrogen atom, an alkyl group, a cycloalkyl group, an aryl group, a monovalent heterocyclic group or a halogen atom, and the foregoing groups optionally have a substituent. A plurality of $R^{L1}$ may be the same or different.

$R^{L2}$ represents an alkyl group, a cycloalkyl group, an aryl group, a monovalent heterocyclic group or a halogen atom, and the foregoing groups optionally have a substituent.]

$R^{L1}$ is preferably a hydrogen atom, an alkyl group, a cycloalkyl group, an aryl group or a fluorine atom, more preferably a hydrogen atom or an alkyl group, and the foregoing groups optionally have a substituent.

$R^{L2}$ is preferably an alkyl group or an aryl group, and the foregoing groups optionally have a substituent.

The phosphorescent compound represented by the formula (1) is preferably a phosphorescent compound represented by the formula (1-A) or a phosphorescent compound represented by the formula (1-B), more preferably a phosphorescent compound represented by the formula (1-A), since the light emitting device of the present invention is more excellent in luminance life.

[Phosphorescent Compound Represented by the Formula (1-A)]

When Ring $L^{1A}$ is a diazole ring, an imidazole ring in which $E^{11A}$ is a nitrogen atom or an imidazole ring in which $E^{12A}$ is a nitrogen atom is preferable, an imidazole ring in which $E^{11A}$ is a nitrogen atom is more preferable.

When Ring $L^{1A}$ is a triazole ring, a triazole ring in which $E^{11A}$ and $E^{12A}$ are each a nitrogen atom or a triazole ring in which $E^{11A}$ and $E^{13A}$ are each a nitrogen atom is preferable, a triazole ring in which $E^{11A}$ and $E^{12A}$ are each a nitrogen atom is more preferable.

Ring $L^{1A}$ is preferably a diazole ring.

The examples and preferable range of the aryl group, the monovalent heterocyclic group and the substituted amino group represented by $R^{11A}$, $R^{12A}$, $R^{13A}$, $R^{21A}$, $R^{22A}$, $R^{23A}$ and $R^{24A}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{11A}$, $R^{12A}$, $R^{13A}$, $R^{21A}$, $R^{22A}$, $R^{23A}$ and $R^{24A}$ optionally have are the same as the examples and preferable range of the substituent which the substituent which Ring $L^1$ and Ring $L^2$ optionally have optionally further has.

When $E^{11A}$ is a nitrogen atom and $R^{11A}$ is present, $R^{11A}$ is preferably an alkyl group, a cycloalkyl group, an aryl group or a monovalent heterocyclic group, more preferably an aryl group or a monovalent heterocyclic group, further preferably an aryl group, and the foregoing groups optionally have a substituent.

When $E^{11A}$ is a carbon atom, $R^{11A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or a cycloalkyl group, particularly preferably a hydrogen atom, and the foregoing groups optionally have a substituent.

When $E^{12A}$ is a nitrogen atom and $R^{12A}$ is present, $R^{12A}$ is preferably an alkyl group, a cycloalkyl group, an aryl group or a monovalent heterocyclic group, more preferably an aryl group or a monovalent heterocyclic group, further preferably an aryl group, and the foregoing groups optionally have a substituent.

When $E^{12A}$ is a carbon atom, $R^{12A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or a cycloalkyl group, particularly preferably a hydrogen atom, and the foregoing groups optionally have a substituent.

When $E^{13A}$ is a nitrogen atom and $R^{13A}$ is present, $R^{13A}$ is preferably an alkyl group, a cycloalkyl group, an aryl group or a monovalent heterocyclic group, more preferably an aryl group or a monovalent heterocyclic group, further preferably an aryl group, and the foregoing groups optionally have a substituent.

When $E^{13A}$ is a carbon atom, $R^{13A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or a cycloalkyl group, particularly preferably a hydrogen atom, and the foregoing groups optionally have a substituent.

When Ring $L^{1A}$ is a diazole ring, Ring $L^{1A}$ is preferably an imidazole ring in which $E^{11A}$ is a nitrogen atom and $R^{11A}$ is present or an imidazole ring in which $E^{12A}$ is a nitrogen atom and $R^{12A}$ is present, more preferably an imidazole ring in which $E^{11A}$ is a nitrogen atom and $R^{11A}$ is present.

When Ring $L^{1A}$ is a triazole ring, Ring $L^{1A}$ is preferably a triazole ring in which $E^{11A}$ and $E^{12A}$ are each a nitrogen atom and $R^{11A}$ is present and $R^{12A}$ is absent or a triazole ring in which $E^{11A}$ and $E^{13A}$ are each a nitrogen atom and $R^{11A}$ is present and $R^{13A}$ is absent, more preferably a triazole ring in which $E^{11A}$ and $E^{12A}$ are a nitrogen atom and $R^{11A}$ is present and $R^{12A}$ is absent.

When Ring $L^{1A}$ is a triazole ring, two of $R^{11A}$, $R^{12A}$ and $R^{13A}$ are each preferably an alkyl group, a cycloalkyl group, an aryl group or a monovalent heterocyclic group, more preferably an alkyl group or an aryl group, further preferably an alkyl group, and the foregoing groups optionally have a substituent.

When Ring $L^{2A}$ is a pyridine ring, Ring $L^{2A}$ is preferably a pyridine ring in which $E^{21A}$ is a nitrogen atom, a pyridine ring in which $E^{22A}$ is a nitrogen atom or a pyridine ring in which $E^{23A}$ is a nitrogen atom, more preferably a pyridine ring in which $E^{22A}$ is a nitrogen atom.

When Ring $L^{2A}$ is a diazabenzene ring, Ring $L^{2A}$ is preferably a pyrimidine ring in which $E^{22A}$ and $E^{24A}$ are each a nitrogen atom or a pyrimidine ring in which $E^{22A}$ and $E^{24A}$ are each a nitrogen atom, more preferably a pyrimidine ring in which $E^{22A}$ and $E^{24A}$ are each a nitrogen atom.

Ring $L^{2A}$ is preferably a benzene ring.

$R^{21A}$, $R^{22A}$, $R^{23A}$ and $R^{24A}$ are each preferably a hydrogen atom, an alkyl group, a cycloalkyl group, an alkoxy group, a cycloalkoxy group, an aryl group, a monovalent heterocyclic group, a substituted amino group or a fluorine atom, more preferably a hydrogen atom, an alkyl group, a cycloalkyl group, an aryl group, a monovalent heterocyclic group or a substituted amino group, further preferably a hydrogen atom, an alkyl group or a group represented by the formula (D-A), the formula (D-B) or the formula (D-C), particularly preferably a hydrogen atom or a group represented by the formula (D-A), especially preferably a hydrogen atom, and the foregoing groups optionally have a substituent.

When Ring $L^{2A}$ has an aryl group, a monovalent heterocyclic group or a substituted amino group, it is preferable that $R^{22A}$ or $R^{23A}$ is an aryl group, a monovalent heterocyclic group or a substituted amino group, it is more preferable that $R^{22A}$ is an aryl group, a monovalent heterocyclic group or a substituted amino group.

It is preferable that $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ are not each combined together to form a ring together with the atoms to which they are attached.

The phosphorescent compound represented by the formula (1-A) is preferably a phosphorescent compound represented by the formula (1-A1) to the formula (1-A5), more preferably a phosphorescent compound represented by the formula (1-A1), the formula (1-A3) or the formula (1-A4), further preferably a phosphorescent compound represented by the formula (1-A1) or the formula (1-A4), particularly preferably a phosphorescent compound represented by the formula (1-A4), since the light emitting device of the present invention is further excellent in luminance life.

[Phosphorescent Compound Represented by the Formula (1-B)]

When Ring $L^{1B}$ is a diazabenzene ring, Ring $L^{1B}$ is preferably a pyrimidine ring in which $E^{11B}$ is a nitrogen atom or a pyrimidine ring in which $E^{13B}$ is a nitrogen atom, more preferably a pyrimidine ring in which $E^{11B}$ is a nitrogen atom.

Ring $L^{1B}$ is preferably a pyridine ring.

When Ring $L^{2B}$ is a pyridine ring, Ring $L^{2B}$ is preferably a pyridine ring in which $E^{21B}$ is a nitrogen atom, a pyridine ring in which $E^{22B}$ is a nitrogen atom or a pyridine ring in which $E^{23B}$ is a nitrogen atom, more preferably a pyridine ring in which $E^{22B}$ is a nitrogen atom.

When Ring $L^{2B}$ is a diazabenzene ring, Ring $L^{2B}$ is preferably a pyrimidine ring in which $E^{22B}$ and $E^{24B}$ are each a nitrogen atom or a pyrimidine ring in which $E^{21B}$ and $E^{23B}$ are each a nitrogen atom, more preferably a pyrimidine ring in which $E^{22B}$ and $E^{24B}$ are each a nitrogen atom.

Ring $L^{2B}$ is preferably a benzene ring.

The examples and preferable range of the aryl group, the monovalent heterocyclic group and the substituted amino group represented by $R^{11B}$, $R^{12B}$, $R^{13B}$, $R^{14B}$, $R^{21B}$, $R^{22B}$, $R^{23B}$ and $R^{24B}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{11B}$, $R^{12B}$, $R^{13B}$, $R^{14B}$, $R^{21B}$, $R^{22B}$, $R^{23B}$ and $R^{24B}$ optionally have are the same as the examples and preferable range of the substituent which the substituent which Ring $L^1$ and Ring $L^2$ optionally have optionally further has.

$R^{11B}$, $R^{12B}$, $R^{13B}$, $R^{14B}$, $R^{21B}$, $R^{22B}$, $R^{23B}$ and $R^{24B}$ are each preferably a hydrogen atom, an alkyl group, a cycloalkyl group, an alkoxy group, a cycloalkoxy group, an aryl group, a monovalent heterocyclic group, a substituted amino group or a fluorine atom, more preferably a hydrogen atom, an alkyl group, a cycloalkyl group, an aryl group, a monovalent heterocyclic group or a substituted amino group, further preferably a hydrogen atom, an alkyl group or a group represented by the formula (D-A), the formula (D-B) or the formula (D-C), particularly preferably a hydrogen atom or a group represented by the formula (D-A), and the foregoing groups optionally have a substituent.

When Ring $L^{1B}$ has an aryl group, a monovalent heterocyclic group or a substituted amino group, it is preferable that $R^{11B}$, $R^{12B}$ or $R^{13B}$ is an aryl group, a monovalent heterocyclic group or a substituted amino group, it is more preferable that $R^{12B}$ or $R^{13B}$ is an aryl group, a monovalent heterocyclic group or a substituted amino group, it is further preferable that $R^{13B}$ is an aryl group, a monovalent heterocyclic group or a substituted amino group.

When Ring $L^{2B}$ has an aryl group, a monovalent heterocyclic group or a substituted amino group, it is preferable that $R^{22B}$ or $R^{23B}$ is an aryl group, a monovalent heterocyclic group or a substituted amino group, it is more preferable that $R^{22B}$ is an aryl group, a monovalent heterocyclic group or a substituted amino group.

The phosphorescent compound represented by the formula (1-B) is preferably a phosphorescent compound represented by the formula (1-B1) to the formula (1-B5), more preferably a phosphorescent compound represented by the formula (1-B1) to the formula (1-B3), further preferably a phosphorescent compound represented by the formula (1-B1) or a phosphorescent compound represented by the formula (1-B2), particularly preferably a phosphorescent compound represented by the formula (1-B1), since the light emitting device of the present invention is further excellent in luminance life.

The examples and preferable range of the aryl group, the monovalent heterocyclic group and the substituted amino group represented by $R^{15B}$, $R^{16B}$, $R^{17B}$ and $R^{18B}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{15E}$, $R^{16B}$, $R^{17B}$ and $R^{18B}$ optionally have are the same as the examples and preferable range of the substituent which the substituent which Ring $L$ and Ring $L^2$ optionally have optionally further has.

$R^{15B}$, $R^{16B}$, $R^{17B}$ and $R^{18B}$ are each preferably a hydrogen atom, an alkyl group, a cycloalkyl group, an alkoxy group, a cycloalkoxy group, a fluorine atom, an aryl group, a monovalent heterocyclic group or a substituted amino group, more preferably a hydrogen atom, an alkyl group, a cycloalkyl group, an aryl group, a monovalent heterocyclic group or a substituted amino group, further preferably a hydrogen atom, an alkyl group or a cycloalkyl group, particularly preferably a hydrogen atom, and the foregoing groups optionally have a substituent.

The phosphorescent compound includes, for example, phosphorescent compounds represented by the following formulae.

[Chemical Formula 57]
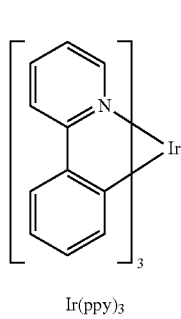
Ir(ppy)₃
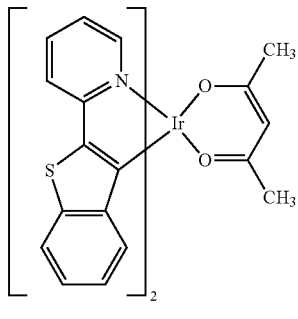
Btp₂Ir(acac)
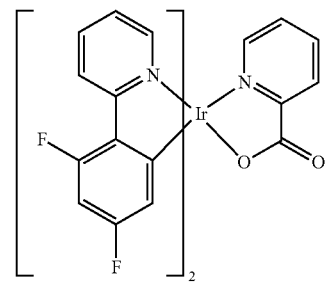
FIrpic
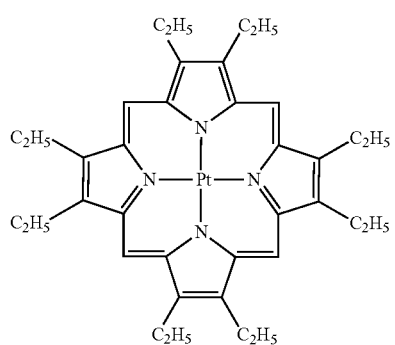
PtOEP
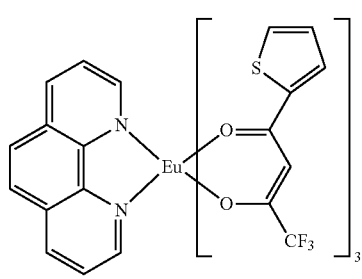
Eu(TTA)₃phen
[Chemical Formula 58]
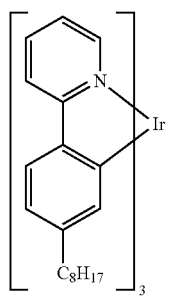
COM-1
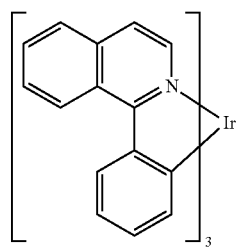
COM-2
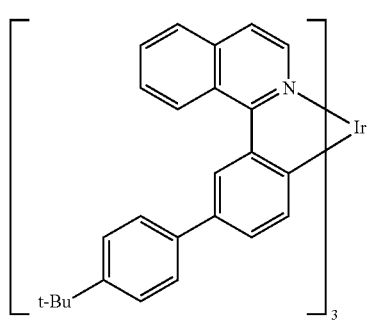
COM-3
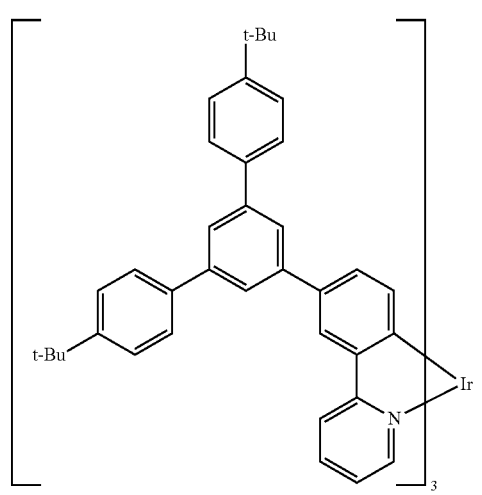
COM-4

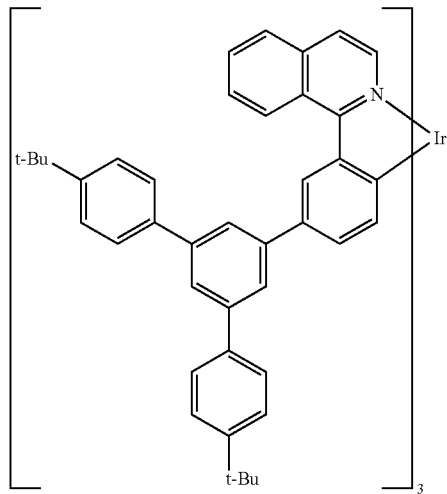
COM-5
[Chemical Formula 59]
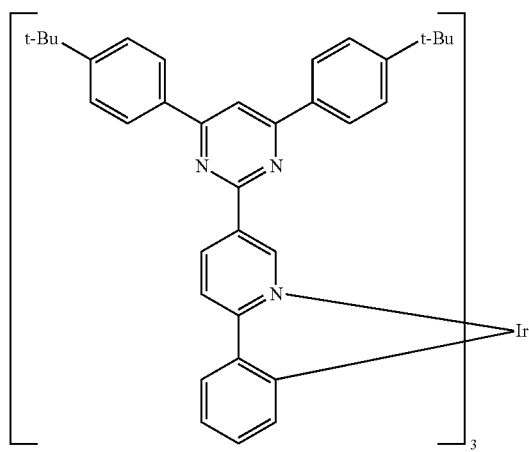
COM-6
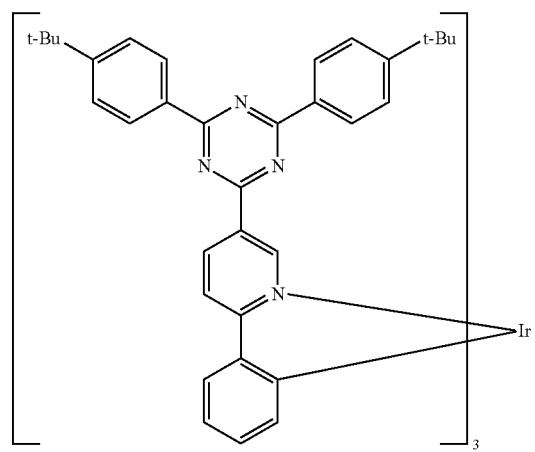
COM-7

-continued
COM-8
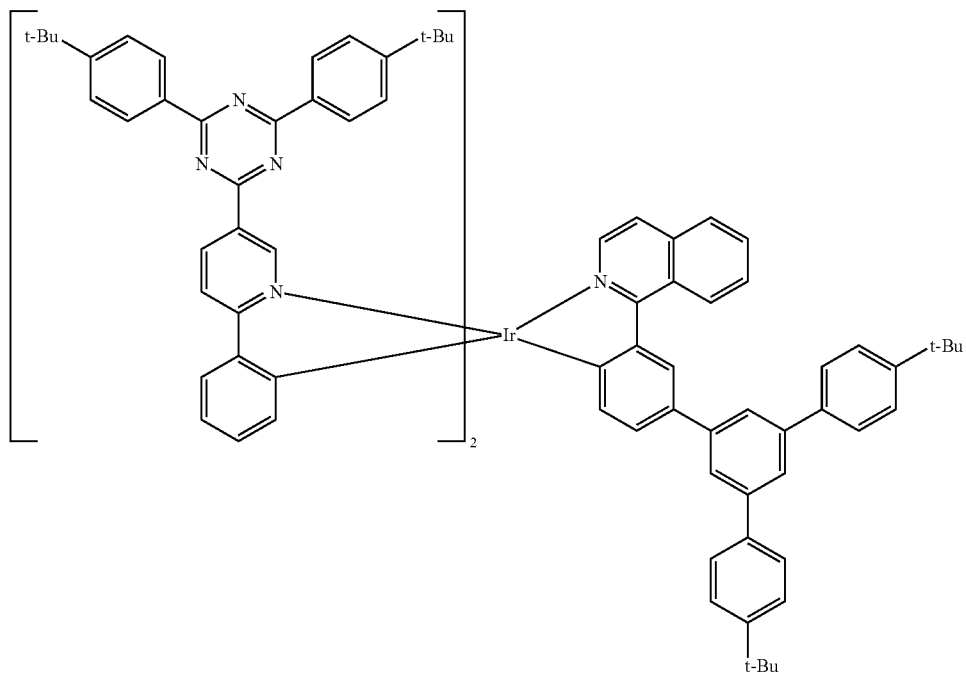
[Chemical Formula 60]
COM-9                              COM-10
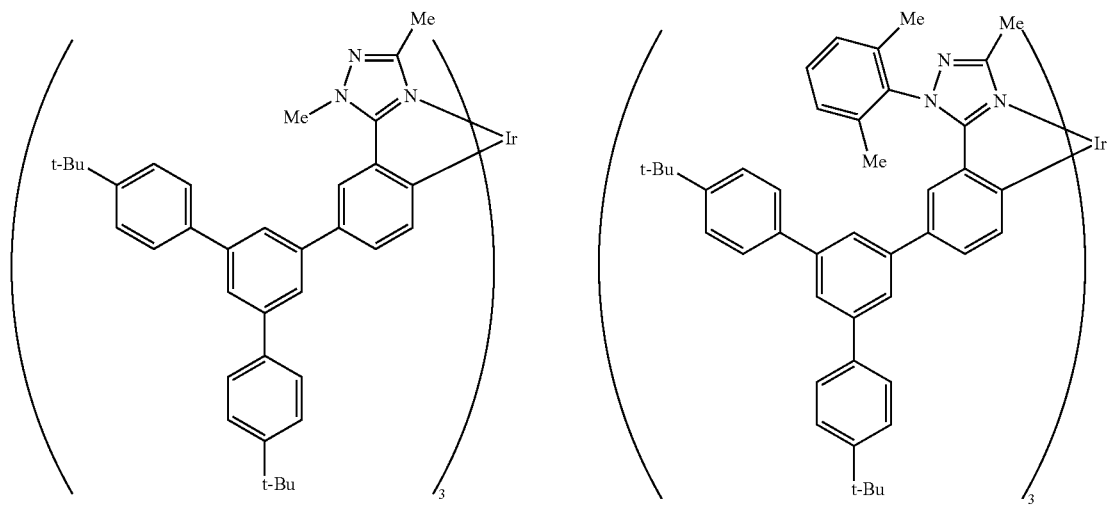
COM-11
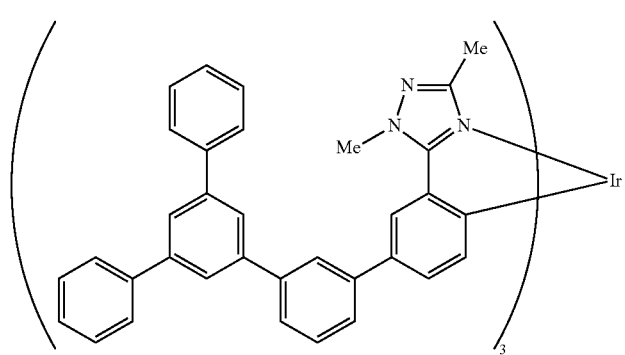

-continued
[Chemical Formula 61]
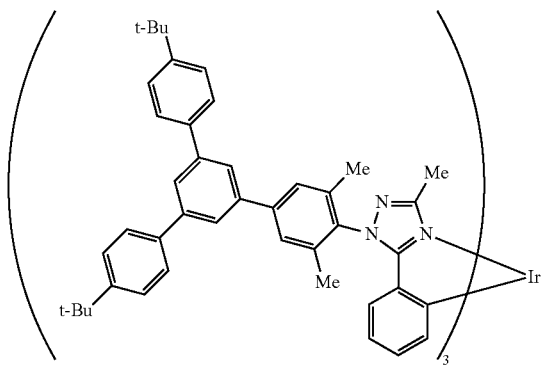
COM-12
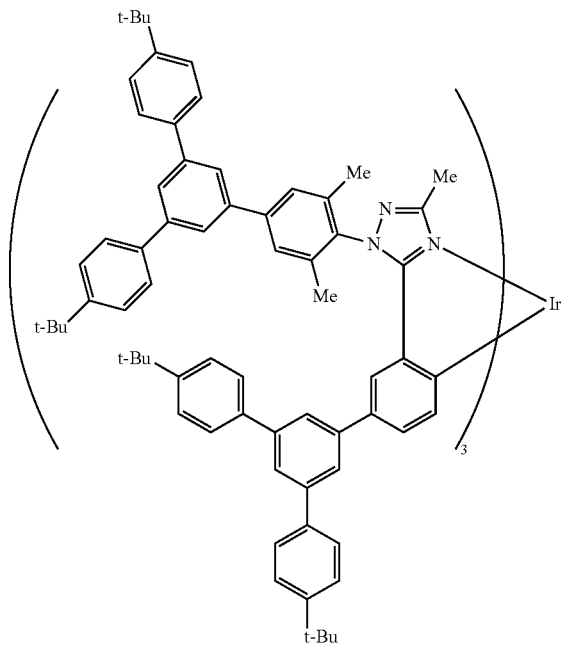
COM-13
[Chemical Formula 62]
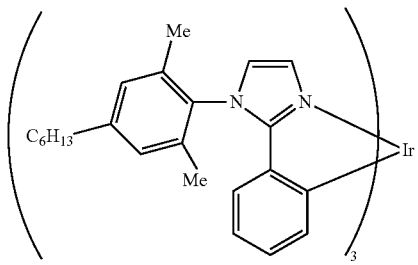
COM-14
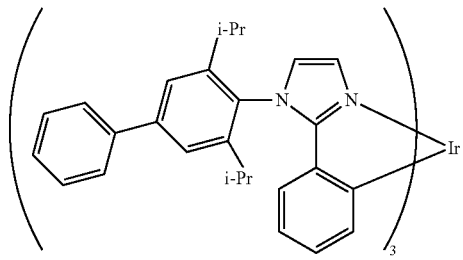
COM-15
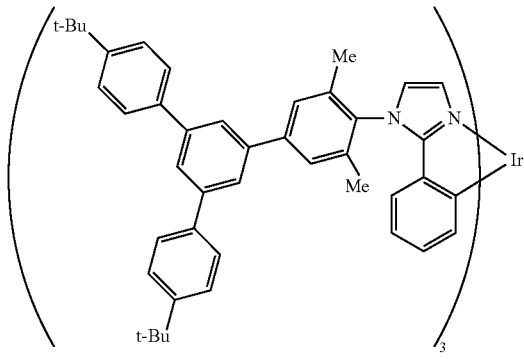
COM-16
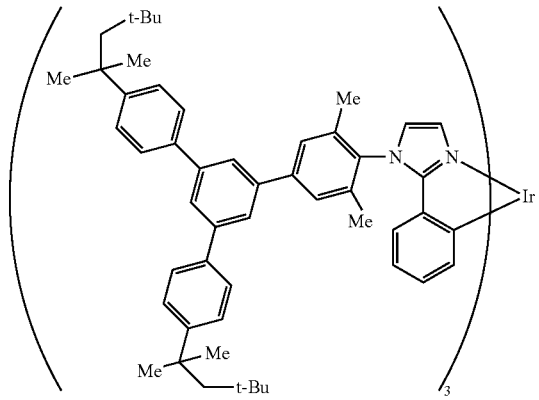
COM-17

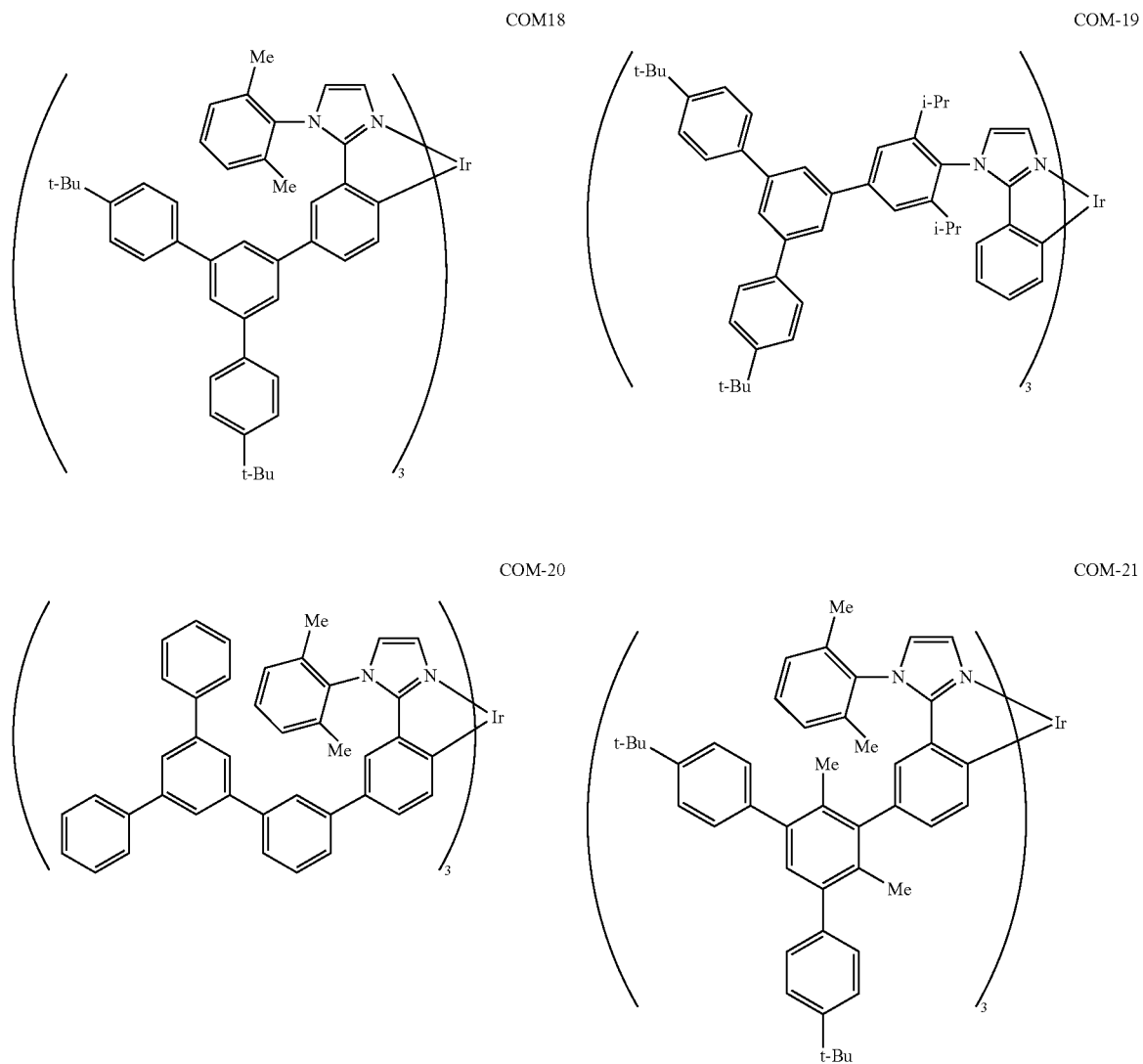
[Chemical Formula 63]
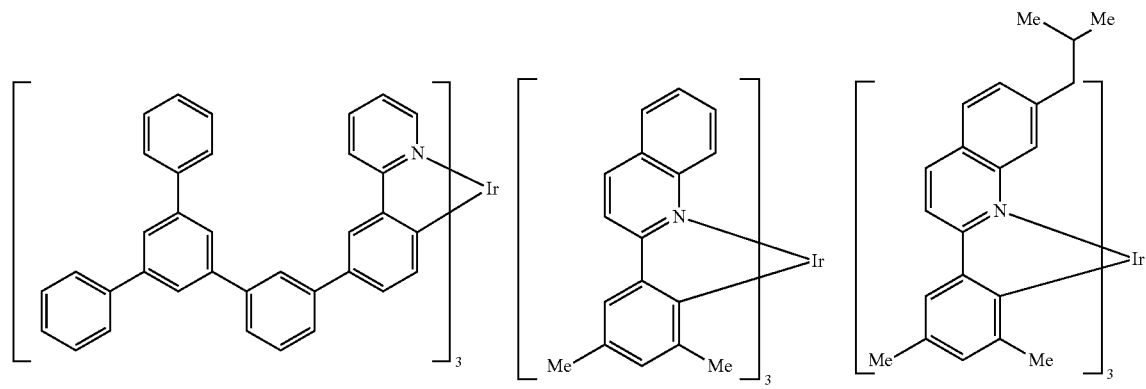

-continued
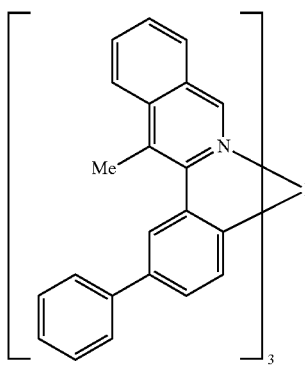
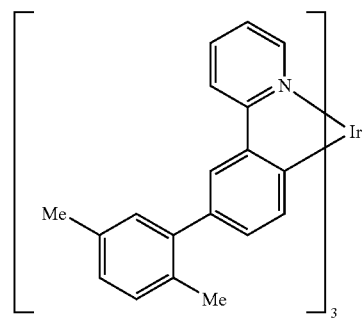
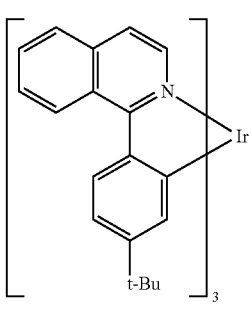
[Chemical Formula 64]
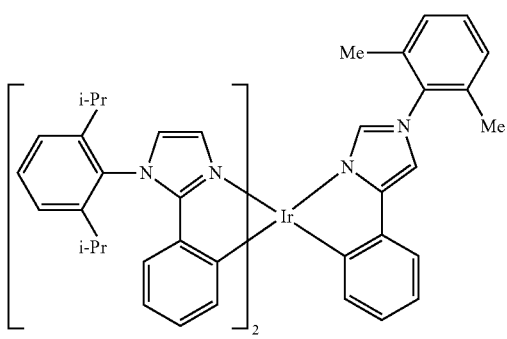
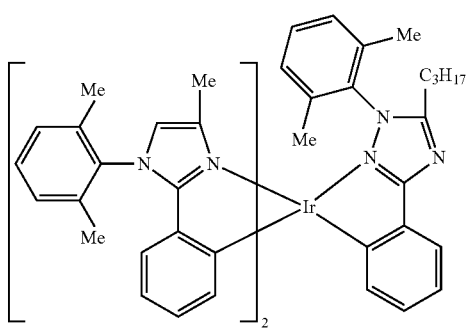
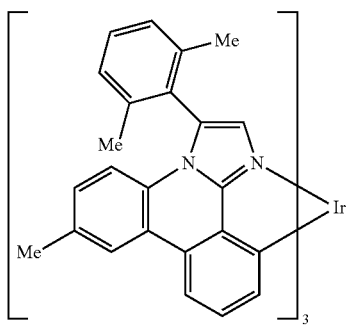
[Chemical Formula 65]
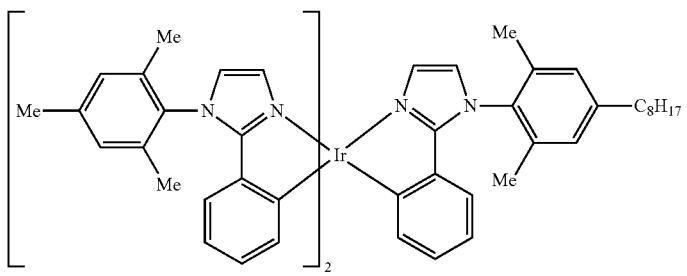
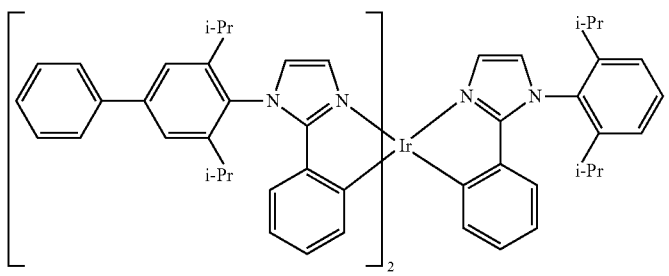

[Chemical Formula 66]

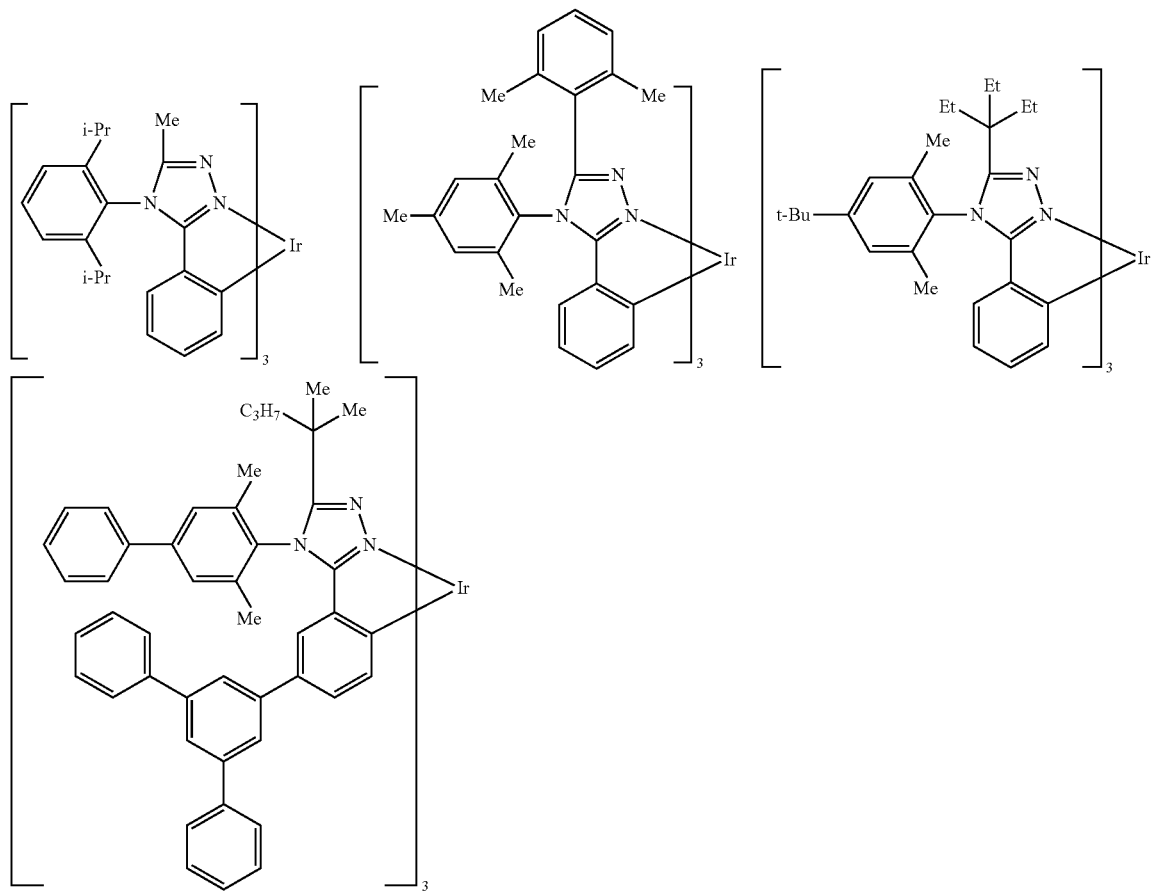

The phosphorescent compound is available, for example, from Aldrich, Luminescence Technology Corp. and American Dye Source.

Further, the phosphorescent compound can also be produced by known methods described in literatures such as Journal of the American Chemical Society, vol. 107, 1431-1432 (1985), Journal of the American Chemical Society, vol. 106, 6647-6653 (1984), International Publication WO 2011/024761, International Publication WO 2002/44189, JP-A No. 2006-188673 and the like.

[First Composition]

The first organic layer may be a layer containing a composition (hereinafter, referred to also as "first composition") containing a compound represented by the formula (C-1) and at least one material selected from the group consisting of the phosphorescent compound described above, a hole transporting material, a hole injection material, an electron transporting material, an electron injection material, a light emitting material and an antioxidant. The hole transporting material, the hole injection material, the electron transporting material and the electron injection material contained in the first composition are different from the compound represented by the formula (C-1), and the light emitting material contained in the first composition is different from the compound represented by the formula (C-1) and different from the phosphorescent compound.

Hole Transporting Material

The hole transporting material is classified into low molecular compounds and polymer compounds, and preferable are polymer compounds. The hole transporting material may have a crosslinkable group.

The polymer compound includes, for example, polyvinylcarbazole, and derivatives thereof; polyarylenes having an aromatic amine structure in the side chain or main chain, and derivatives thereof. The polymer compound may also be a compound to which an electron accepting site is bound. The electron accepting site includes, for example, fullerene, tetrafluorotetracyanoquinodimethane, tetracyanoethylene, trinitrofluorenone and the like, preferably fullerene.

In the first composition, the compounding amount of the hole transporting material is usually 1 to 400 parts by mass, preferably 5 to 150 parts by mass, when the amount of the compound represented by the formula (C-1) is taken as 100 parts by mass.

The hole transporting material may be used each singly or in combination of two or more.

Electron Transporting Material

The electron transporting material is classified into low molecular compounds and polymer compounds. The electron transporting material may have a crosslinkable group.

The low molecular compound includes, for example, metal complexes having 8-hydroxyquinoline as a ligand; oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the first composition, the compounding amount of the electron transporting material is usually 1 to 400 parts by mass, preferably 5 to 150 parts by mass, when the amount of the compound represented by the formula (C-1) is taken as 100 parts by mass.

The electron transporting material may be used each singly or in combination of two or more.

Hole Injection Material and Electron Injection Material

The hole injection material and the electron injection material are each classified into low molecular compounds and polymer compounds. The hole injection material and the electron injection material optionally have a crosslinkable group.

The low molecular compound includes, for example, metal phthalocyanines such as copper phthalocyanine and the like; carbon; oxides of metals such as molybdenum, tungsten and the like; and metal fluorides such as lithium fluoride, sodium fluoride, cesium fluoride, potassium fluoride and the like.

The polymer compound includes electrically conductive polymers such as, for example, polyaniline, polythiophene, polypyrrole, polyphenylenevinylene, polythienylenevinylene, polyquinoline and polyquinoxaline, and derivatives thereof; polymers containing an aromatic amine structure in the main chain or side chain, and the like.

In the first composition, the compounding amounts of the hole injection material and the electron injection material are each usually 1 to 400 parts by mass, preferably 5 to 150 parts by mass, when the amount of the compound represented by the formula (C-1) is taken as 100 parts by mass.

The electron injection material and the hole injection material may each be used singly or in combination of two or more.

Ion Doping

When the hole injection material or the electron injection material contains an electrically conductive polymer, the electric conductivity of the electrically conductive polymer is preferably $1\times10^{-5}$ S/cm to $1\times10^{3}$ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used each singly or in combination of two or more.

Light Emitting Material

The light emitting material is classified into low molecular compounds and polymer compounds. The light emitting material may have a crosslinkable group.

The low molecular compound includes, for example, naphthalene and derivatives thereof, anthracene and derivatives thereof, and perylene and derivatives thereof.

The polymer compound includes polymer compounds containing, for example, a phenylene group, a naphthalenediyl group, an anthracenediyl group, a fluorenediyl group, a phenanthrenediyl group, a dihydrophenanthrenediyl group, a group represented by the formula (X) described later, a carbazolediyl group, a phenoxazinediyl group, a phenothiazinediyl group, a pyrenediyl group and the like.

In the first composition, the compounding amount of the light emitting material is usually 1 to 400 parts by mass, preferably 5 to 150 parts by mass, when the amount of the compound represented by the formula (C-1) is taken as 100 parts by mass.

The light emitting material may be used singly or in combination of two or more.

Antioxidant

The antioxidant may be a compound which is soluble in the same solvent as for a compound represented by the formula (C-1) and which does not disturb light emission and charge transportation, and includes, for example, phenol-based antioxidants and phosphorus-based antioxidants.

In the first composition, the compounding amount of the antioxidant is usually 0.001 to 10 parts by mass, when the amount of the compound represented by the formula (C-1) is taken as 100 parts by mass.

The antioxidant may be used each singly or in combination of two or more.

First Ink

The composition containing a compound represented by the formula (C-1) and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, capillary coat method, a nozzle coat method and the like.

The viscosity of the first ink may be adjusted depending on the kind of the application method, and when applied to a printing method in which a solution passes through a discharge device such as an inkjet printing method and the like, it is preferably 1 to 20 mPa·s at 25° C. since clogging and flight bending hardly occur during discharge.

The solvent contained in the first ink is preferably a solvent which can dissolve or uniformly disperse solid components in the ink. The solvent includes, for example, chlorine-based solvents such as 1,2-dichloroethane, 1,1,2-trichloroethane, chlorobenzene, o-dichlorobenzene and the like; ether-based solvents such as tetrahydrofuran, dioxane, anisole, 4-methylanisole and the like; aromatic hydrocarbon-based solvents such as toluene, xylene, mesitylene, ethylbenzene, n-hexylbenzene, cyclohexylbenzene and the like; aliphatic hydrocarbon-based solvents such as cyclohexane, methylcyclohexane, n-pentane, n-hexane, n-heptane, n-octane, n-nonane, n-decane, n-dodecane, bicyclohexyl and the like; ketone-based solvents such as acetone, methyl ethyl ketone, cyclohexanone, acetophenone and the like; ester-based solvents such as ethyl acetate, butyl acetate, ethylcellosolve acetate, methyl benzoate, phenyl acetate and the like; polyhydric alcohol-based solvents such as ethylene glycol, glycerin, 1,2-hexanediol and the like; alcohol-based solvents such as isopropyl alcohol, cyclohexanol and the like; sulfoxide-based solvents such as dimethyl sulfoxide and the like; and amide-based solvents such as N-methyl-2-pyrrolidone, N,N-dimethylformamide and the like. The solvent may be used each singly or in combination of two or more.

In the first ink, the compounding amount of the solvent is usually 1000 to 100000 parts by mass, preferably 2000 to 20000 parts by mass, when the amount of the compound represented by the formula (C-1) is taken as 100 parts by mass.

[Second Organic Layer]

The second organic layer which the light emitting device of the present invention has is a layer containing a compound represented by the formula (C-1) and a cross-linked body of a crosslinkable material. That is, a compound represented by the formula (C-1) and a cross-linked body of a crosslinkable material are contained as separate compounds in the second organic layer. It is preferable that the compound represented by the formula (C-1) is a compound containing no crosslinkable group.

Cross-Linked Body of Crosslinkable Material

The cross-linked body of a crosslinkable material is obtained by bringing the crosslinkable material into a cross-linked state by methods and conditions described below and the like.

The crosslinkable material may be a low molecular compound or a polymer compound, and is preferably a low molecular compound having at least one crosslinkable group selected from Group A of crosslinkable group (hereinafter, referred to also as "low molecular compound of second organic layer") or a polymer compound containing a crosslinkable constitutional unit having at least one crosslinkable group selected from Group A of crosslinkable group (hereinafter, referred to also as "polymer compound of second organic layer"), more preferably a polymer compound containing a crosslinkable constitutional unit having at least one crosslinkable group selected from Group A of crosslinkable group, since the light emitting device of the present invention is more excellent in luminance life.

The crosslinkable group selected from Group A of crosslinkable group is preferably a crosslinkable group represented by the formula (XL-1) to the formula (XL-4), the formula (XL-7) to the formula (XL-10) or the formula (XL-14) to the formula (XL-17), more preferably a crosslinkable group represented by the formula (XL-1), the formula (XL-3), the formula (XL-9), the formula (XL-10), the formula (XL-16) or the formula (XL-17), further preferably a crosslinkable group represented by the formula (XL-1), the formula (XL-16) or the formula (XL-17), particularly preferably a crosslinkable group represented by the formula (XL-1) or the formula (XL-17), especially preferably a crosslinkable group represented by the formula (XL-17), since the light emitting device of the present invention is more excellent in luminance life.

Polymer Compound of Second Organic Layer

The constitutional unit having at least one crosslinkable group selected from Group A of crosslinkable group contained in the polymer compound of the second organic layer is preferably a constitutional unit represented by the formula (2) or a constitutional unit represented by the formula (2'), and constitutional units represented by the following formulae may also be permissible.

[Chemical Formula 67]

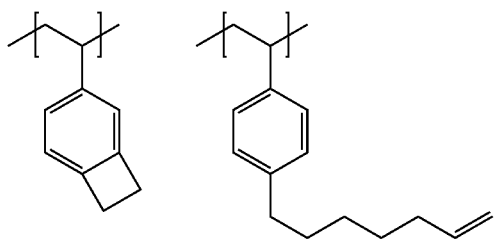

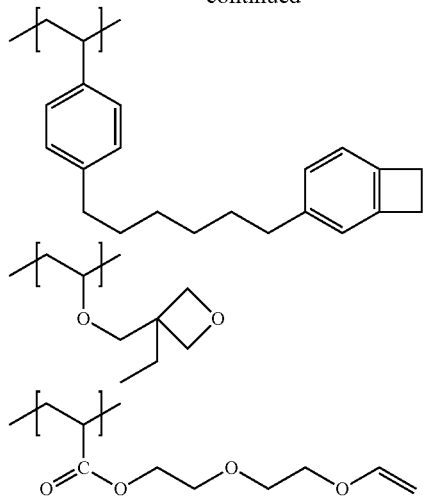

When the polymer compound of the second organic layer contains two or more constitutional units having at least one crosslinkable group selected from Group A of crosslinkable group, it is preferable for at least two constitutional units having at least one crosslinkable group selected from Group A of crosslinkable group that the crosslinkable groups are mutually different. As the combination of mutually different crosslinkable groups, a combination of a crosslinkable group represented by the formula (XL-1), the formula (XL-2), the formula (XL-5) to the formula (XL-8) or the formula (XL-14) to the formula (XL-16) with a crosslinkable group represented by the formula (XL-3), the formula (XL-4), the formula (XL-13) or the formula (XL-17) is preferable, a combination of a crosslinkable group represented by the formula (XL-1) or the formula (XL-16) with a crosslinkable group represented by the formula (XL-17) is more preferable, a combination of a crosslinkable group represented by the formula (XL-1) with a crosslinkable group represented by the formula (XL-17) is further preferable.

Constitutional Unit Represented by the Formula (2)

nA is preferably an integer of 0 to 3, more preferably an integer of 0 to 2, further preferably 1 or 2, particularly preferably 1, since the light emitting device of the present invention is more excellent in luminance life.

n is preferably 2, since the light emitting device of the present invention is more excellent in luminance life.

$Ar^3$ is preferably an aromatic hydrocarbon group optionally having a substituent, since the light emitting device of the present invention is more excellent in luminance life.

The number of carbon atoms of the aromatic hydrocarbon group represented by $Ar^3$ is, not including the number of carbon atoms of the substituent, usually 6 to 60, preferably 6 to 30, more preferably 6 to 18.

The arylene group portion obtained by removing n substituents from an aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and the foregoing groups optionally have a substituent.

The number of carbon atoms of the heterocyclic group represented by $Ar^3$ is, not including the number of carbon atoms of the substituent, usually 2 to 60, preferably 3 to 30, more preferably 4 to 18.

The divalent heterocyclic group portion obtained by removing n substituents from a heterocyclic group represented by $Ar^3$ is preferably a group represented by the formula (AA-1) to the formula (AA-34).

The aromatic hydrocarbon group and the heterocyclic group represented by $Ar^3$ optionally have a substituent, and the substituent is preferably an alkyl group, a cycloalkyl group, an alkoxy group, a cycloalkoxy group, an aryl group, an aryloxy group, a halogen atom, a monovalent heterocyclic group or a cyano group.

The number of carbon atoms of the alkylene group represented by $L^A$ is, not including the number of carbon atoms of the substituent, usually 1 to 20, preferably 1 to 15, more preferably 1 to 10. The number of carbon atoms of the cycloalkylene group represented by $L^A$ is, not including the number of carbon atoms of the substituent, usually 3 to 20.

The alkylene group and the cycloalkylene group optionally have a substituent and examples thereof include a methylene group, an ethylene group, a propylene group, a butylene group, a hexylene group, a cyclohexylene group and an octylene group.

The alkylene group and the cycloalkylene group represented by $L^A$ optionally have a substituent. The substituent which the alkylene group and the cycloalkylene group optionally have is preferably an alkyl group, a cycloalkyl group, an alkoxy group, a cycloalkoxy group, a halogen atom or a cyano group, and the foregoing groups optionally further have a substituent.

The arylene group represented by $L^A$ optionally has a substituent. The arylene group is preferably a phenylene group or a fluorenediyl group, more preferably a m-phenylene group, a p-phenylene group, a fluorene-2,7-diyl group or a fluorene-9,9-diyl group. The substituent which the arylene group optionally has is preferably an alkyl group, a cycloalkyl group, an alkoxy group, a cycloalkoxy group, an aryl group, an aryloxy group, a monovalent heterocyclic group, a halogen atom, a cyano group or a crosslinkable group selected from Group A of crosslinkable group, and the foregoing groups optionally further have a substituent.

The divalent heterocyclic group represented by $L^A$ is preferably a group represented by the formula (AA-1) to the formula (AA-34).

$L^A$ is preferably an arylene group or an alkylene group, more preferably a phenylene group, a fluorenediyl group or an alkylene group, and the foregoing groups optionally have a substituent, since production of the polymer compound of the second organic layer is easy.

The crosslinkable group represented by X is preferably a crosslinkable group represented by the formula (XL-1) to the formula (XL-4), the formula (XL-7) to the formula (XL-10) or the formula (XL-14) to the formula (XL-17), more preferably a crosslinkable group represented by the formula (XL-1), the formula (XL-3), the formula (XL-9), the formula (XL-10), the formula (XL-16) or the formula (XL-17), further preferably a crosslinkable group represented by the formula (XL-1), the formula (XL-16) or the formula (XL-17), particularly preferably a crosslinkable group represented by the formula (XL-1) or the formula (XL-17), especially preferably a crosslinkable group represented by the formula (XL-17), since the light emitting device of the present invention is more excellent in luminance life.

The amount of the constitutional unit represented by the formula (2) is preferably 0.5 to 80% by mol, more preferably 3 to 65% by mol, further preferably 5 to 50% by mol, with respect to the total amount of the constitutional unit contained in the polymer compound of the second organic layer, since the polymer compound of the second organic layer is excellent in stability and crosslinkability.

The constitutional unit represented by the formula (2) may be contained only singly or in combination of two or more in the polymer compound of the second organic layer.

When the polymer compound of the second organic layer contains two or more constitutional units represented by the formula (2), it is preferable for at least two constitutional units represented by the formula (2) that crosslinkable groups represented by X are mutually different. The preferable range of the combination of the mutually different crosslinkable groups represented by X is the same as the preferable range of the combination of mutually different crosslinkable groups described above.

Constitutional Unit Represented by the Formula (2')

mA is preferably an integer of 0 to 3, more preferably an integer of 0 to 2, further preferably 0 or 1, particularly preferably 0, since the light emitting device of the present invention is more excellent in luminance life.

m is preferably 1 or 2, more preferably 2, since the light emitting device of the present invention is more excellent in luminance life.

c is preferably 0, since production of the polymer compound of the second organic layer is easy and since the light emitting device of the present invention is more excellent in luminance life.

$Ar^5$ is preferably an aromatic hydrocarbon group optionally having a substituent, since the light emitting device of the present invention is more excellent in luminance life.

The definition and examples of the arylene group portion obtained by removing m substituents from an aromatic hydrocarbon group represented by $Ar^5$ are the same as the definition and examples of the arylene group represented by $Ar^{X2}$ in the formula (X).

The definition and examples of the divalent heterocyclic group portion obtained by removing m substituents from a heterocyclic group represented by $Ar^5$ are the same as the definition and examples of the divalent heterocyclic group represented by $Ar^{X2}$ in the formula (X).

The definition and examples of the divalent group obtained by removing m substituents from a group in which at least one aromatic hydrocarbon group and at least one heterocyclic group are bonded directly represented by $Ar^5$ are the same as the definition and examples of the divalent group in which at least one arylene group and at least one divalent heterocyclic group are bonded directly represented by $Ar^{X2}$ in the formula (X).

$Ar^4$ and $Ar^6$ are each preferably an arylene group optionally having a substituent, since the light emitting device of the present invention is more excellent in luminance life.

The definition and examples of the arylene group represented by $Ar^4$ and $Ar^6$ are the same as the definition and examples of the arylene group represented by $Ar^{X1}$ and $Ar^{X3}$ in the formula (X) described later.

The definition and examples of the divalent heterocyclic group represented by $Ar^4$ and $Ar^6$ are the same as the definition and examples of the divalent heterocyclic group represented by $Ar^{X1}$ and $Ar^{X3}$ in the formula (X) described later.

The group represented by $Ar^4$, $Ar^5$ and $Ar^6$ optionally have a substituent, and the substituent is preferably an alkyl group, a cycloalkyl group, an alkoxy group, a cycloalkoxy group, an aryl group, an aryloxy group, a halogen atom, a monovalent heterocyclic group and a cyano group.

The definition and examples of the alkylene group, the cycloalkylene group, the arylene group and the divalent heterocyclic group represented by $K^A$ are the same as the definition and examples of the alkylene group, the cycloalkylene group, the arylene group and the divalent heterocyclic group represented by $L^A$, respectively.

$K^A$ is preferably a phenylene group or a methylene group, since production of the polymer compound of the second organic layer is easy.

The definition and examples of the crosslinkable group represented by X' are the same as the definition and examples of the crosslinkable group represented by X described above.

The amount of the constitutional unit represented by the formula (2') is preferably 0.5 to 50% by mol, more preferably 3 to 30% by mol, further preferably 5 to 20% by mol, with respect to the total amount of the constitutional unit contained in the polymer compound of the second organic layer, since the polymer compound of the second organic layer is excellent in stability and the polymer compound of the second organic layer is excellent in crosslinkability.

The constitutional unit represented by the formula (2') may be contained only singly or in combination of two or more in the polymer compound of the second organic layer.

When the polymer compound of the second organic layer contains two constitutional units represented by the formula (2'), it is preferable for at least two constitutional units represented by the formula (2') that crosslinkable groups represented by X' are mutually different. The preferable range of the combination of the mutually different crosslinkable groups represented by X' are the same as the preferable range of the combination of mutually different crosslinkable groups described above.

Preferable Embodiments of Constitutional Unit Represented by the Formula (2) or (2')

The constitutional unit represented by the formula (2) includes, for example, constitutional units represented by the formula (2-1) to the formula (2-30), and the constitutional unit represented by the formula (2') includes, for example, constitutional units represented by the formula (2'-1) to the formula (2'-9). Of them, preferable are constitutional units represented by the formula (2-1) to the formula (2-30), more preferable are constitutional units represented by the formula (2-1) to the formula (2-15), the formula (2-19), the formula (2-20), the formula (2-23), the formula (2-25) or the formula (2-30), further preferable are constitutional units represented by the formula (2-1) to the formula (2-9) or the formula (2-30), since the polymer compound of the second organic layer is excellent in crosslinkability.

[Chemical Formula 68]

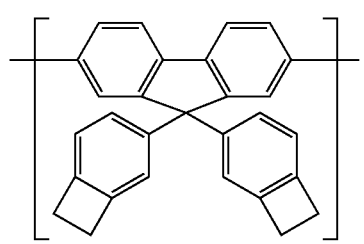

(2-1)

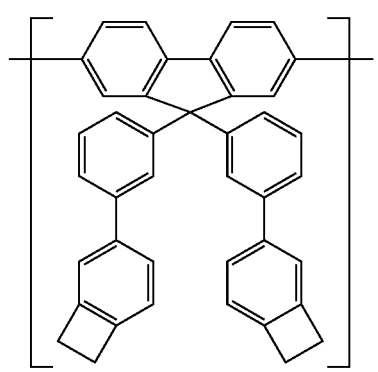

(2-2)

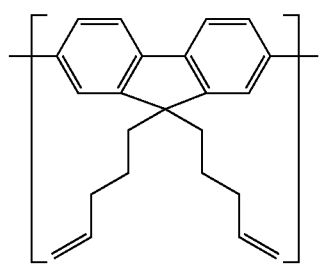

(2-3)

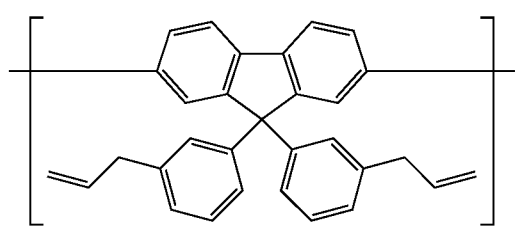

(2-4)

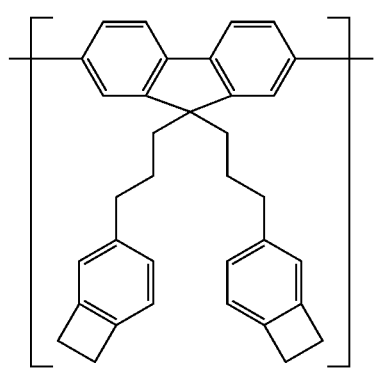

(2-5)

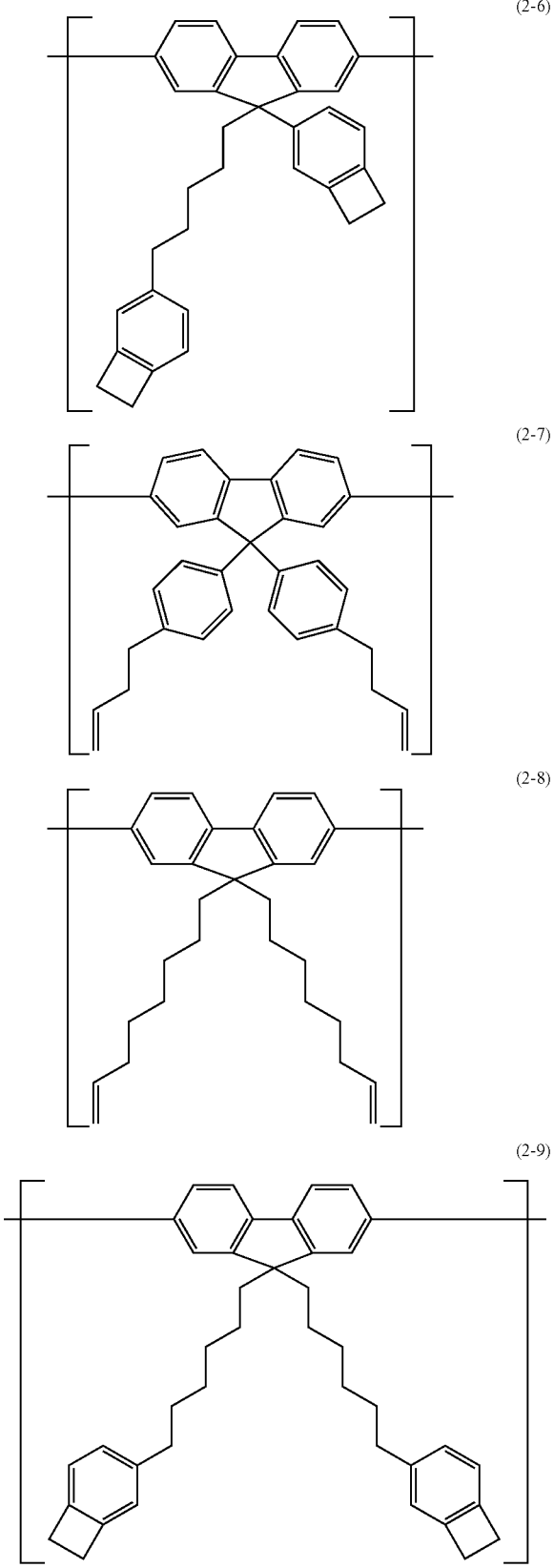
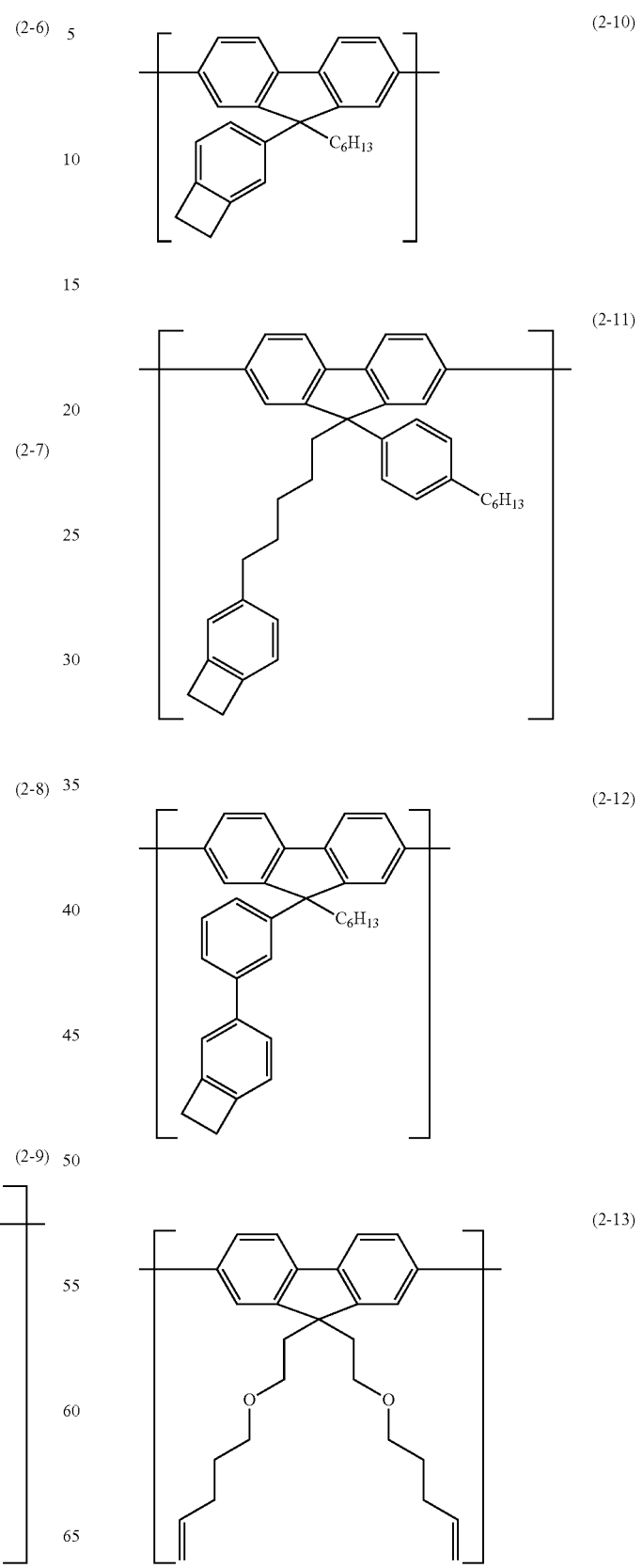

(2-14)
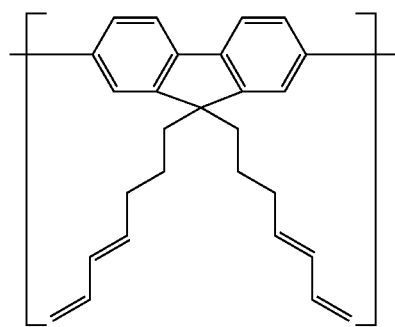
(2-15)
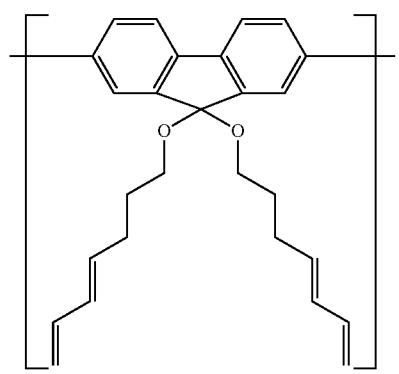
[Chemical Formula 69]
(2-16)
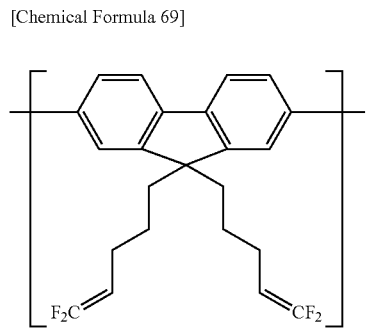
(2-17)
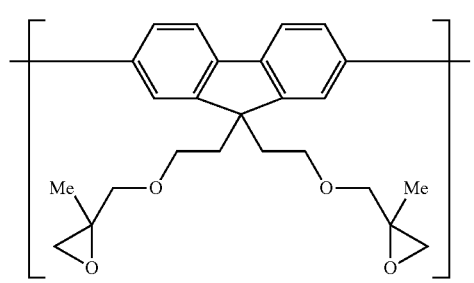
(2-18)
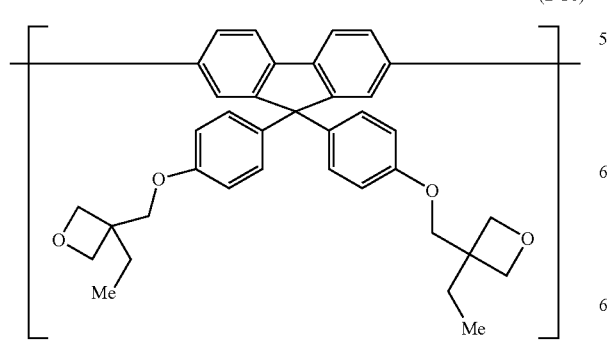
(2-19)
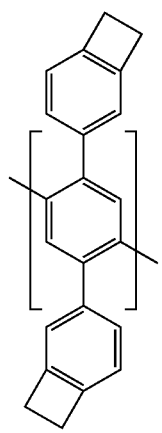
(2-20)
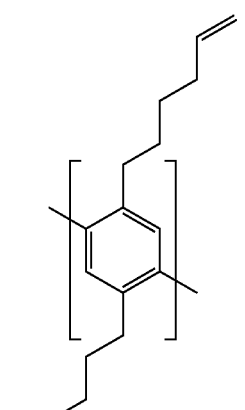
[Chemical Formula 70]
(2-21)
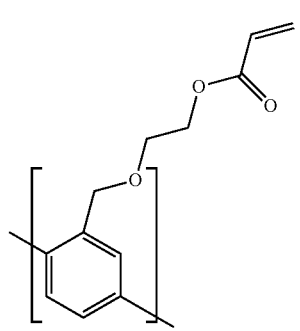

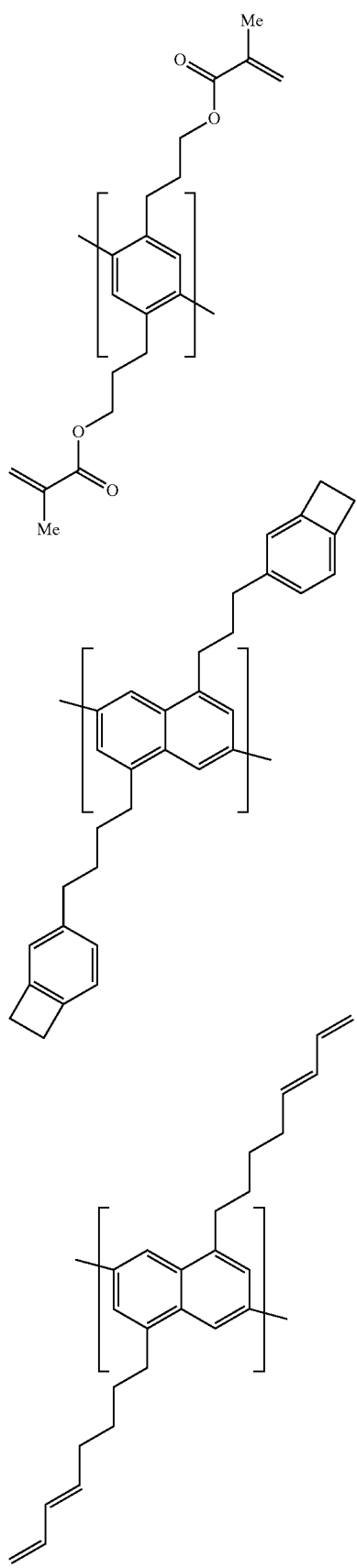
(2-22)
(2-23)
(2-24)
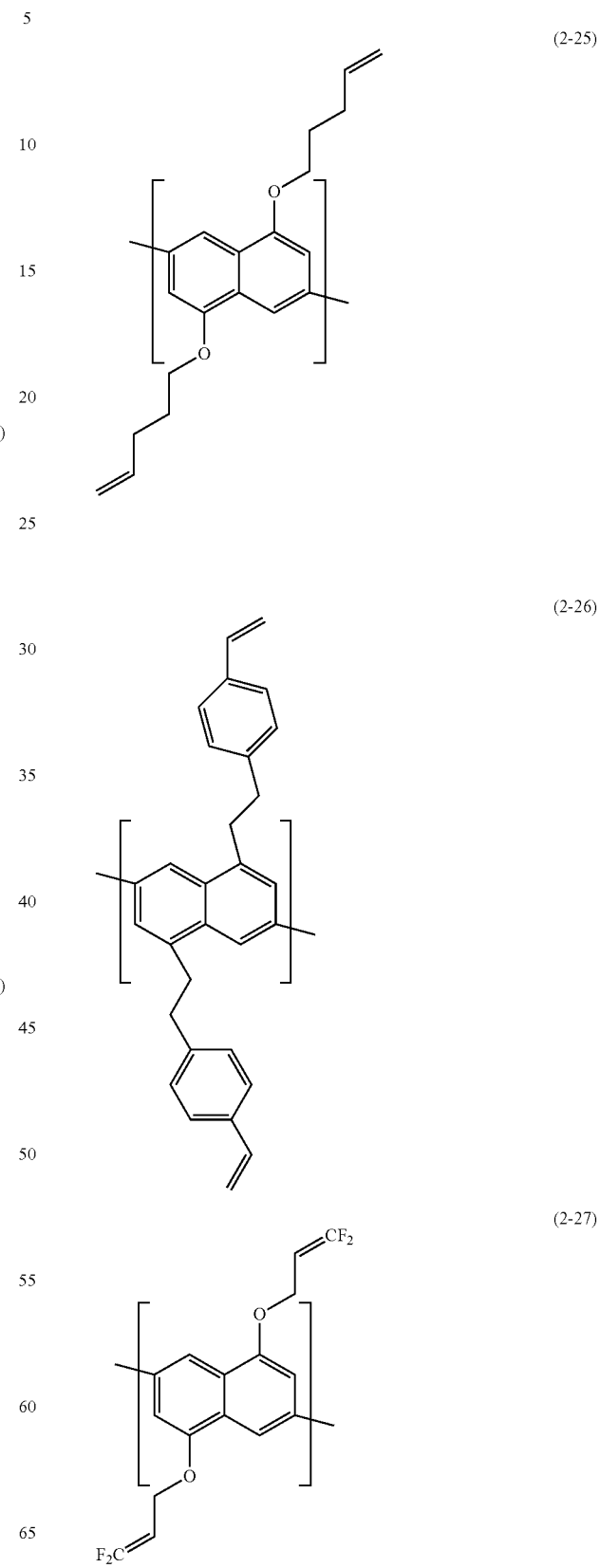
(2-25)
(2-26)
(2-27)

(2-28)
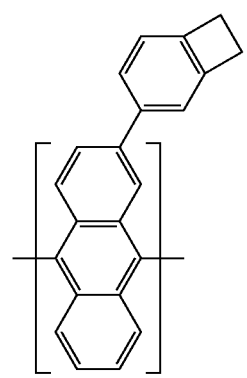
(2-29)
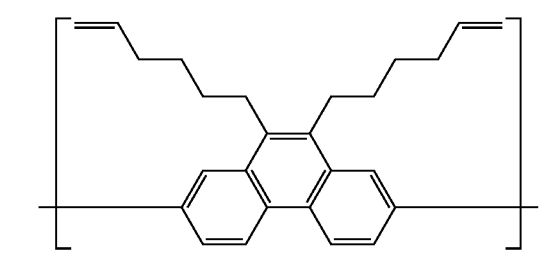
(2-30)
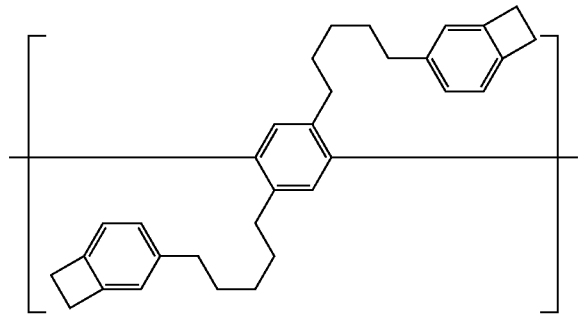
[Chemical Formula 71]
(2'-1)
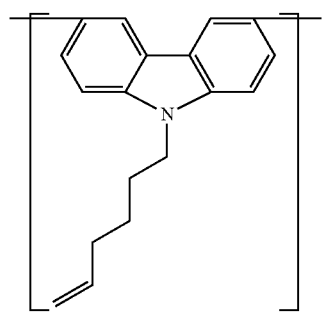
(2'-2)
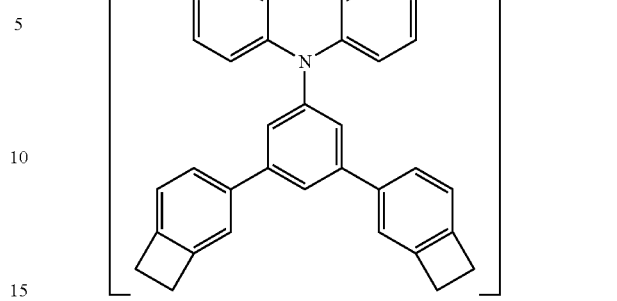
(2'-3)
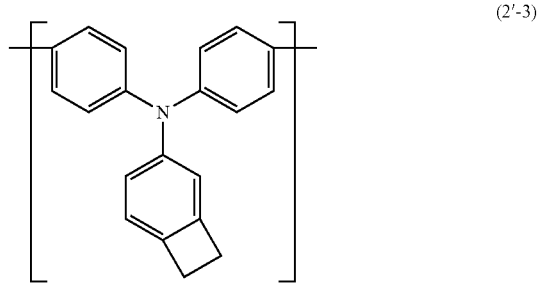
(2'-4)
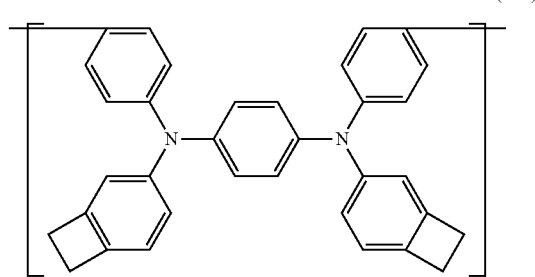
(2'-5)
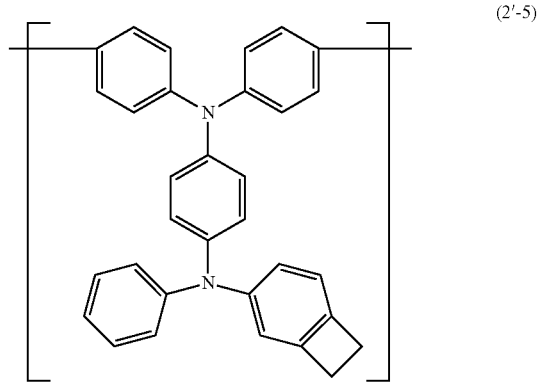
(2'-6)
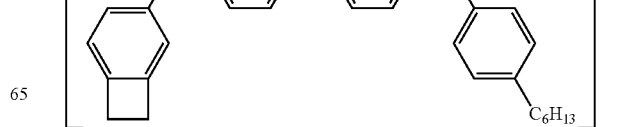

-continued (2'-7)
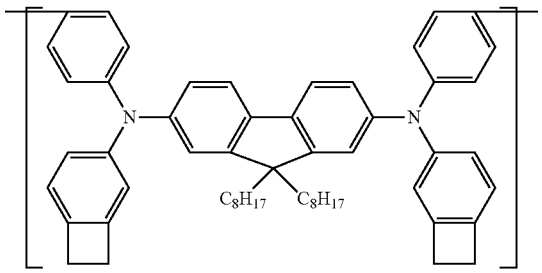

(2'-8)
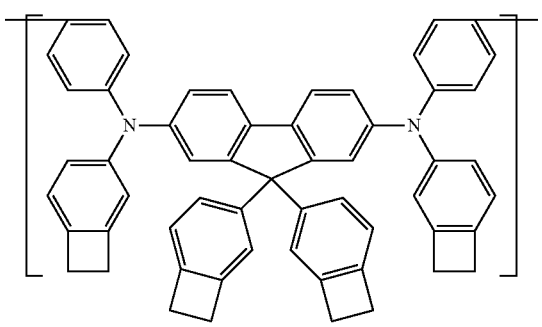

(2'-9)
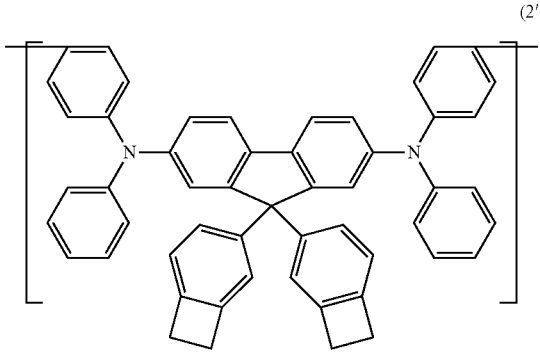

Other Constitutional Units

It is preferable that the polymer compound of the second organic layer further contains a constitutional unit represented by the formula (X) from the viewpoint of hole transportability, and further contains a constitutional unit represented by the formula (Y) from the viewpoint of luminance life.

It is preferable that the polymer compound of the second organic layer further contains a constitutional unit represented by the formula (X) and a constitutional unit represented by the formula (Y), since hole transportability is excellent and since the light emitting device of the present invention is more excellent in luminance life.

[Chemical Formula 72]

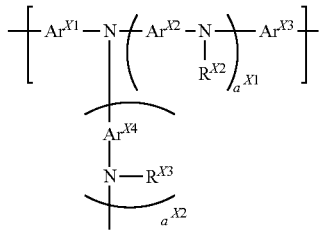

(X)

[wherein, $a^{X1}$ and $a^{X2}$ each independently represent an integer of 0 or more.

$Ar^{X1}$ and $Ar^{X3}$ each independently represent an arylene group or a divalent heterocyclic group, and the foregoing groups optionally have a substituent.

$Ar^{X2}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent. When a plurality of $R^{X2}$ and $R^{X3}$ are present, they may be the same or different at each occurrence.]

$a^{X1}$ is preferably an integer of 2 or less, more preferably 1, since the light emitting device of the present invention is more excellent in luminance life.

$a^{X2}$ is preferably an integer of 2 or less, more preferably 0, since the light emitting device of the present invention is more excellent in luminance life.

$R^{X1}$, $R^{X2}$ and $R^{X3}$ are each preferably an alkyl group, a cycloalkyl group, an aryl group or a monovalent heterocyclic group, more preferably an aryl group, and the foregoing groups optionally have a substituent.

The arylene group represented by $Ar^{X1}$ and $Ar^{X3}$ is more preferably a group represented by the formula (A-1) or the formula (A-9), further preferably a group represented by the formula (A-1), and the foregoing groups optionally have a substituent.

The divalent heterocyclic group represented by $Ar^{X1}$ and $Ar^{X3}$ is more preferably a group represented by the formula (AA-1), the formula (AA-2) or the formula (AA-7) to the formula (AA-26), and the foregoing groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and the foregoing groups optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group as the divalent group in which at least one arylene group and at least one divalent heterocyclic group are bonded directly represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly represented by $Ar^{X2}$ and $Ar^{X4}$ includes, for example, groups represented by the following formulae, and these optionally have a substituent.

[Chemical Formula 73]

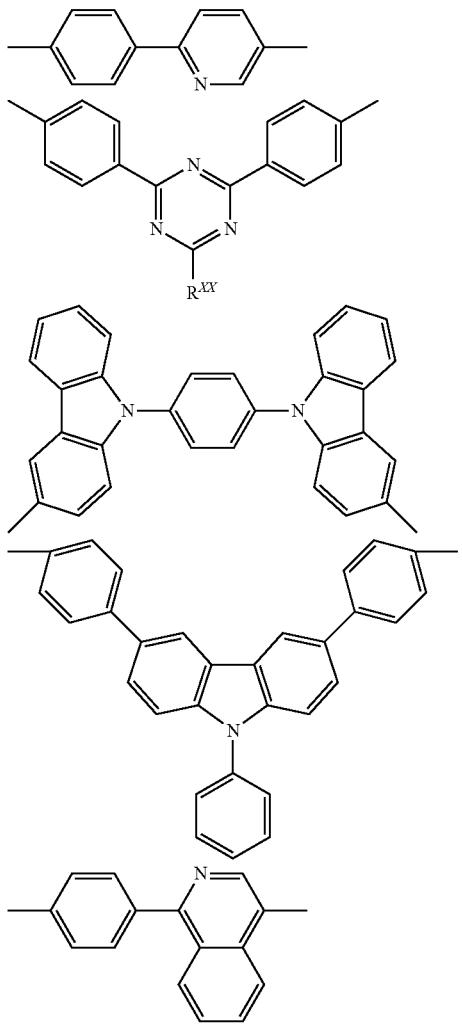

[wherein, $R^{XX}$ represents a hydrogen atom, an alkyl group, a cycloalkyl group, an aryl group or a monovalent heterocyclic group, and the foregoing groups optionally have a substituent.]

$R^{XX}$ is preferably an alkyl group, a cycloalkyl group or an aryl group, and the foregoing groups optionally have a substituent.

$Ar^{X2}$ and $Ar^{X4}$ are each preferably an arylene group optionally having a substituent.

The substituent which groups represented by $Ar^{X1}$ to $Ar^{X4}$ and $R^{X1}$ to $R^{X3}$ optionally have is preferably an alkyl group, a cycloalkyl group or an aryl group, and the foregoing groups optionally further have a substituent.

The constitutional unit represented by the formula (X) is preferably a constitutional unit represented by the formula (X-1) to the formula (X-7), more preferably a constitutional unit represented by the formula (X-3) to the formula (X-7), further preferably a constitutional unit represented by the formula (X-3) to the formula (X-6).

[Chemical Formula 74]

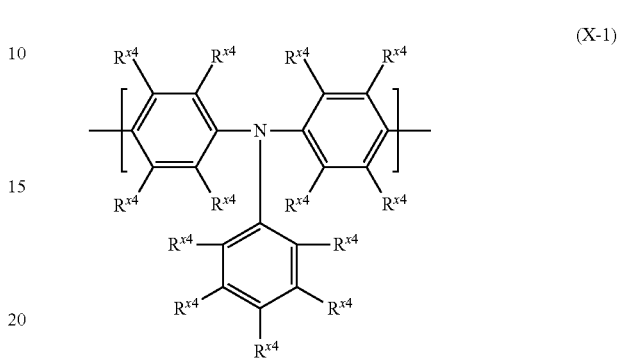

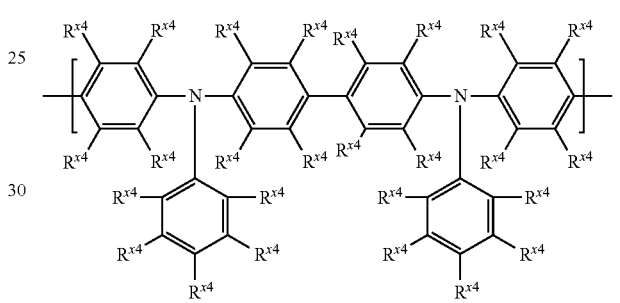

[Chemical Formula 75]

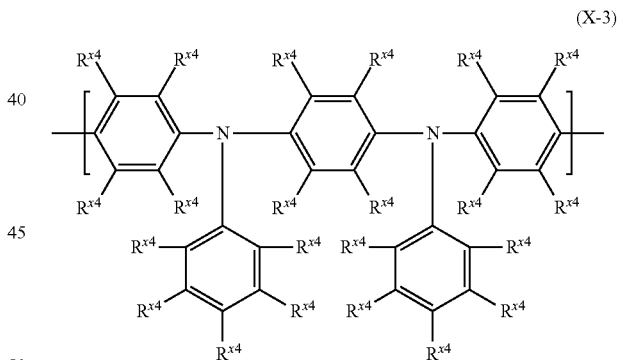

[Chemical Formula 76]

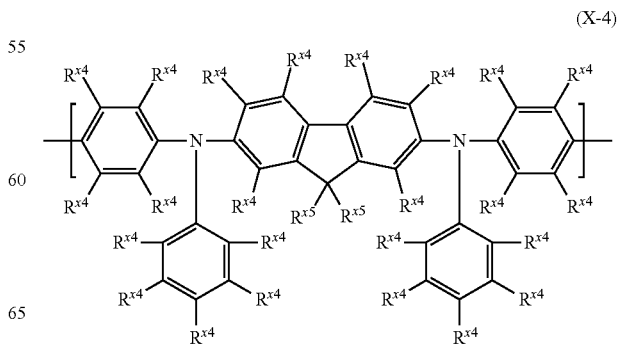

-continued

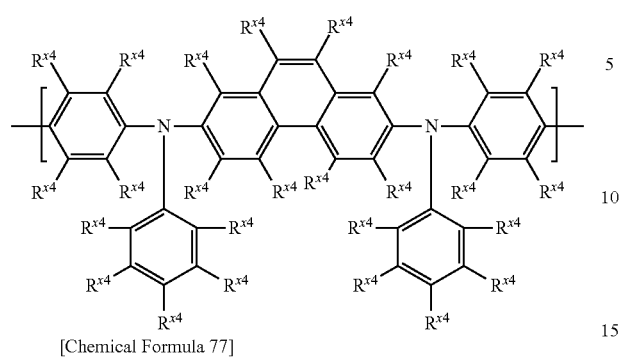

(X-5)

[Chemical Formula 77]

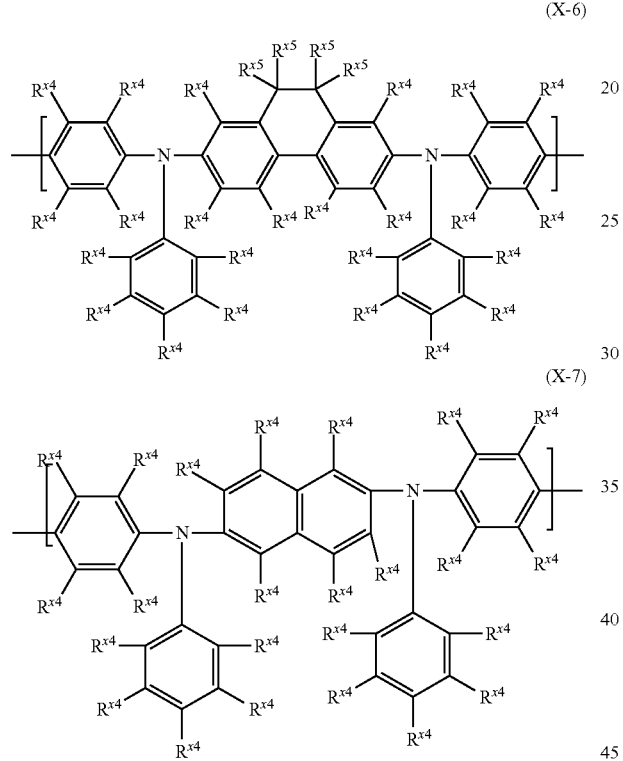

(X-6)

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and the foregoing groups optionally have a substituent. A plurality of $R^{X4}$ may be the same or different. A plurality of $R^{X5}$ may be the same or different, and the adjacent groups $R^{X5}$ may be combined together to form a ring together with the carbon atoms to which they are attached.]

The amount of the constitutional unit represented by the formula (X) is preferably 0.1 to 90% by mol, more preferably 1 to 70% by mol, further preferably 10 to 50% by mol, with respect to the total amount of the constitutional unit contained in the polymer compound of the second organic layer, since hole transportability is excellent.

The constitutional unit represented by the formula (X) includes, for example, constitutional units represented by the formula (X1-1) to the formula (X1-19), preferably constitutional units represented by the formula (X1-6) to the formula (X1-14).

[Chemical Formula 78]

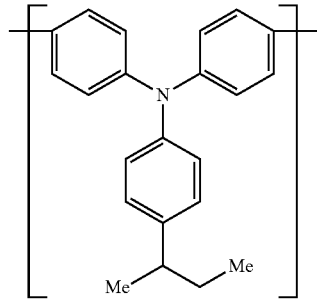

(X1-1)

(X1-2)

(X1-3)

[Chemical Formula 79]

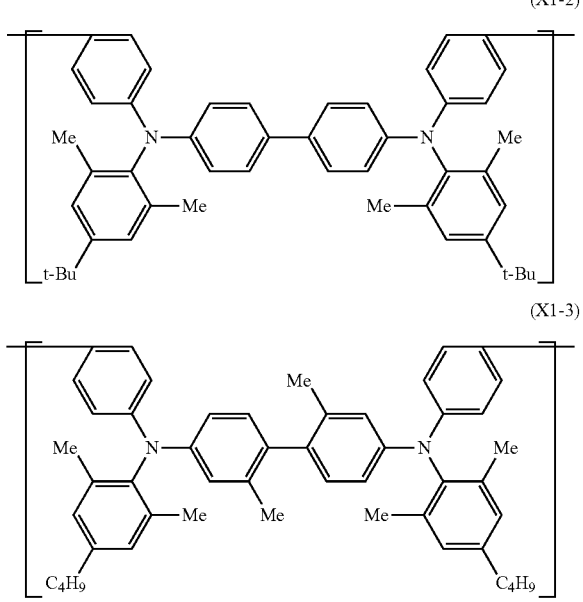

(X1-4)

(X1-5)

(X1-6)
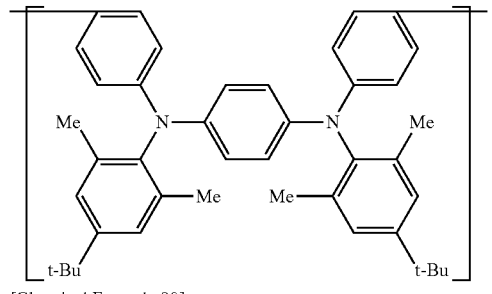
[Chemical Formula 80]
(X1-7)
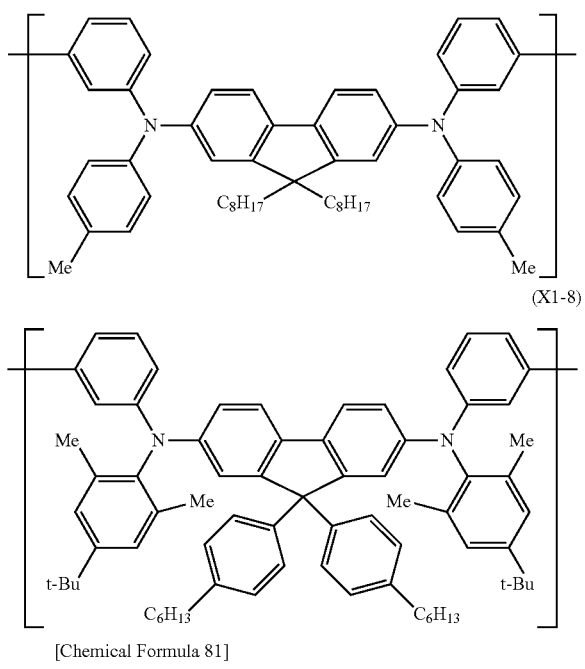
[Chemical Formula 81]
(X1-9)
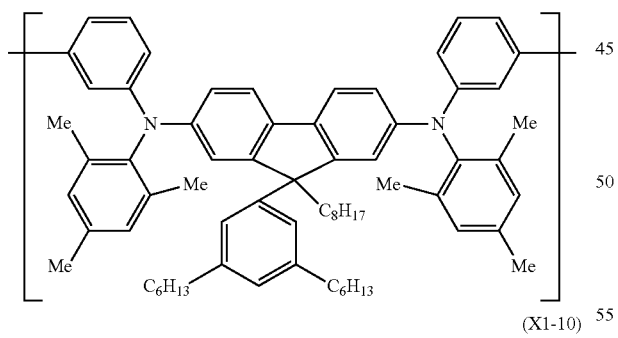
(X1-10)
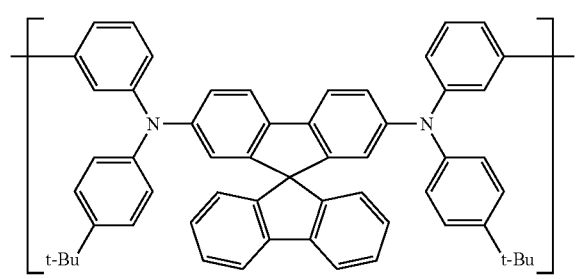
[Chemical Formula 82]
(X1-11)
(X1-12)
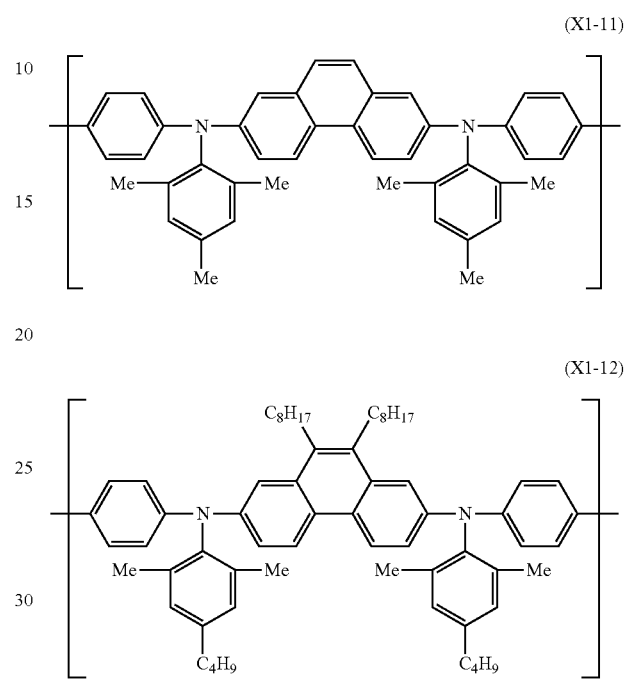
[Chemical Formula 83]
(X1-13)
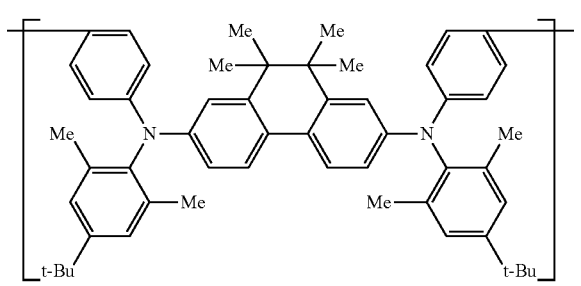
(X1-14)
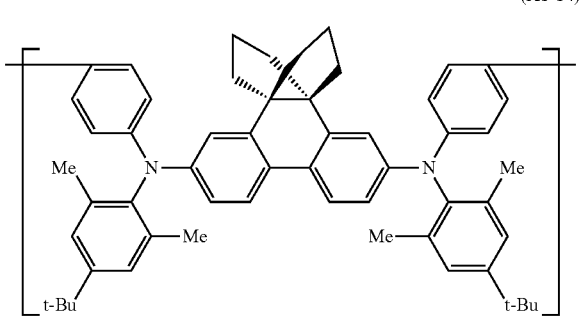

[Chemical Formula 84]

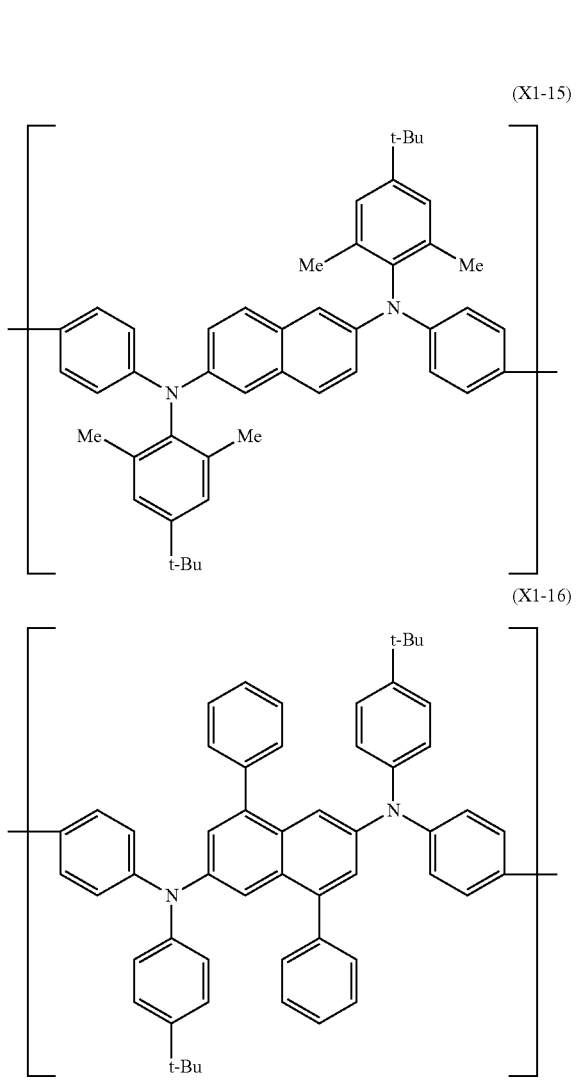

(X1-15)

(X1-16)

(X1-17)

[Chemical Formula 85]

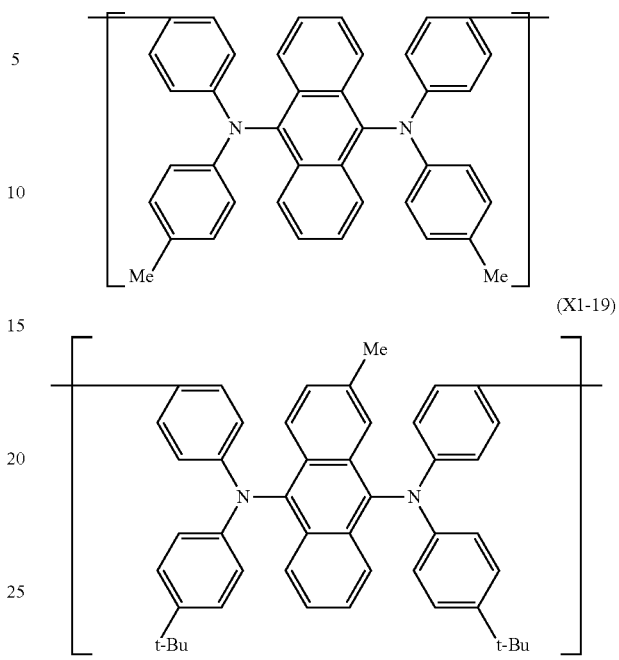

(X1-18)

(X1-19)

In the polymer compound of the second organic layer, the constitutional unit represented by the formula (X) may be contained only singly or in combination of two or more.

[Chemical Formula 86]

(Y)

[wherein, $Ar^{Y1}$ is an arylene group, a divalent heterocyclic group or a divalent group in which at least one arylene group and at least one divalent heterocyclic group are bonded directly, and the foregoing groups optionally have a substituent.]

The arylene group represented by $Ar^{Y1}$ is more preferably a group represented by the formula (A-1), the formula (A-6), the formula (A-7), the formula (A-9) to the formula (A-11), the formula (A-13) or the formula (A-19), further preferably a group represented by the formula (A-1), the formula (A-7), the formula (A-9) or the formula (A-19), and the foregoing groups optionally have a substituent.

The divalent heterocyclic group represented by $Ar^{Y1}$ is more preferably a group represented by the formula (AA-4), the formula (AA-10), the formula (AA-13), the formula (AA-15), the formula (AA-18) or the formula (AA-20), further preferably a group represented by the formula (AA-4), the formula (AA-10), the formula (AA-18) or the formula (AA-20), and the foregoing groups optionally have a substituent.

The more preferable range and the further preferable range of the arylene group and the divalent heterocyclic group as the divalent group in which at least one arylene group and at least one divalent heterocyclic group are bonded directly represented by $Ar^1$ are the same as the more preferable range and the further preferable range of the arylene group and the divalent heterocyclic group represented by $Ar^{Y1}$ described above, respectively.

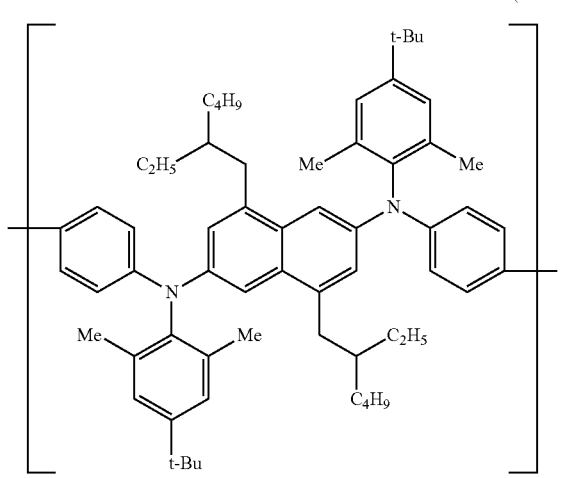

The divalent group in which at least one arylene group and at least one divalent heterocyclic group are bonded directly represented by $Ar^Y$ includes those which are the same as the divalent group in which at least one arylene group and at least one divalent heterocyclic group are bonded directly represented by $Ar^{X2}$ and $Ar^{X4}$ in the formula (X).

The substituent which the group represented by $Ar^{Y1}$ optionally has is preferably an alkyl group, a cycloalkyl group or an aryl group, and the foregoing groups optionally further have a substituent.

The constitutional unit represented by the formula (Y) includes, for example, constitutional units represented by the formula (Y-1) to the formula (Y-7), and it is preferably a constitutional unit represented by the formula (Y-1) or the formula (Y-2) from the viewpoint of the luminance life of the light emitting device of the present invention, preferably a constitutional unit represented by the formula (Y-3) or the formula (Y-4) from the viewpoint of electron transportability of the polymer compound of the second organic layer, preferably a constitutional unit represented by the formula (Y-5) to the formula (Y-7) from the viewpoint of hole transportability of the polymer compound of the second organic layer.

[Chemical Formula 87]

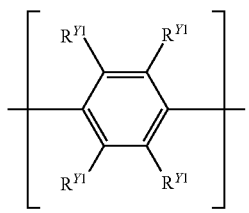

(Y-1)

[wherein, $R^{Y1}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y1}$ may be the same or different, and the adjacent groups $R^{Y1}$ may be combined together to form a ring together with the carbon atoms to which they are attached.]

$R^{Y1}$ is preferably a hydrogen atom, an alkyl group, a cycloalkyl group or an aryl group, and the foregoing groups optionally have a substituent.

The constitutional unit represented by the formula (Y-1) is preferably a constitutional unit represented by the formula (Y-1').

[Chemical formula 88]

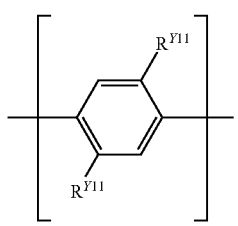

(Y-1')

[wherein, $R^{Y11}$ represents an alkyl group, a cycloalkyl group, an alkoxy group, a cycloalkoxy group, an aryl group or a monovalent heterocyclic group, and the foregoing groups optionally have a substituent. A plurality of $R^{Y11}$ may be the same or different.]

$R^{Y11}$ is preferably an alkyl group, a cycloalkyl group or an aryl group, more preferably an alkyl group or a cycloalkyl group, and the foregoing groups optionally have a substituent.

[Chemical Formula 89]

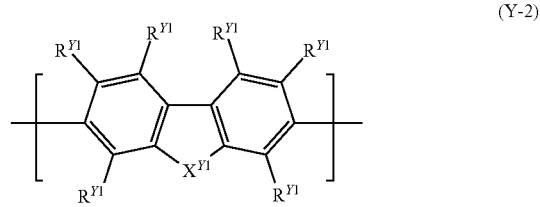

(Y-2)

[wherein,
$R^{Y1}$ represents the same meaning as described above.
$X^{Y1}$ represents a group represented by —$C(R^{Y2})_2$—, —$C(R^{Y2})$=$C(R^{Y2})$— or —$C(R^{Y2})_2$—$C(R^{Y2})_2$—. $R^{Y2}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y2}$ may be the same or different, and groups $R^{Y2}$ may be combined together to form a ring together with the carbon atoms to which they are attached.]

$R^{Y2}$ is preferably an alkyl group, a cycloalkyl group, an aryl group or a monovalent heterocyclic group, more preferably an alkyl group, a cycloalkyl group or an aryl group, and the foregoing groups optionally have a substituent.

Regarding the combination of two groups $R^{Y2}$ in the group represented by —$C(R^{Y2})_2$— represented by $X^{Y1}$, it is preferable that the both are alkyl groups or cycloalkyl groups, the both are aryl groups, the both are monovalent heterocyclic groups, or one is an alkyl group or a cycloalkyl group and the other is an aryl group or a monovalent heterocyclic group, it is more preferable that one is an alkyl group or a cycloalkyl group and the other is an aryl group, and the foregoing groups optionally have a substituent. Two groups $R^{Y2}$ may be combined together to form a ring together with the atoms to which they are attached, and when the groups $R^{Y2}$ form a ring, the group represented by —$C(R^{Y2})_2$— is preferably a group represented by the formula (Y-A1) to the formula (Y-A5), more preferably a group represented by the formula (Y-A4), and the foregoing groups optionally have a substituent.

[Chemical Formula 90]

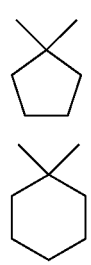

(Y-A1)

(Y-A2)

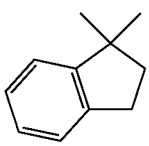
(Y-A3)

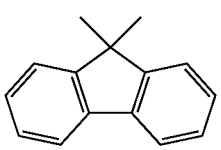
(Y-A4)

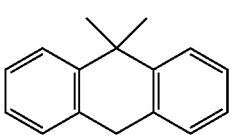
(Y-A5)

Regarding the combination of two groups $R^{Y2}$ in the group represented by —C($R^{Y2}$)=C($R^{Y2}$)— represented by $X^{Y1}$, it is preferable that the both are alkyl groups or cycloalkyl groups, or one is an alkyl group or a cycloalkyl group and the other is an aryl group, and the foregoing groups optionally have a substituent.

Four groups $R^{Y2}$ in the group represented by —C($R^{Y2}$)$_2$—C($R^{Y2}$)$_2$— represented by $X^{Y1}$ are preferably alkyl groups or cycloalkyl groups optionally having a substituent. A plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to the formula (Y-B5), more preferably a group represented by the formula (Y-B3), and the foregoing groups optionally have a substituent.

[Chemical Formula 91]

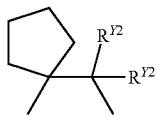
(Y-B1)

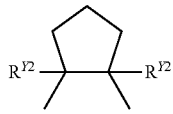
(Y-B2)

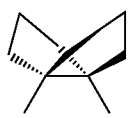
(Y-B3)

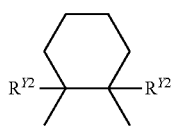
(Y-B4)

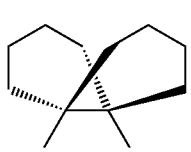
(Y-B5)

[wherein, $R^{Y2}$ represents the same meaning as described above.]

The constitutional unit represented by the formula (Y-2) is preferably a constitutional unit represented by the formula (Y-2').

[Chemical Formula 92]

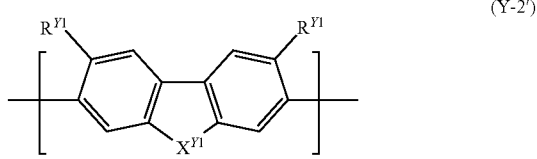
(Y-2')

[wherein, $R^{Y1}$ and $X^{Y1}$ represent the same meaning as described above.]

[Chemical Formula 93]

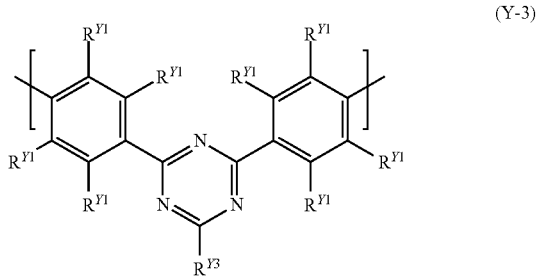
(Y-3)

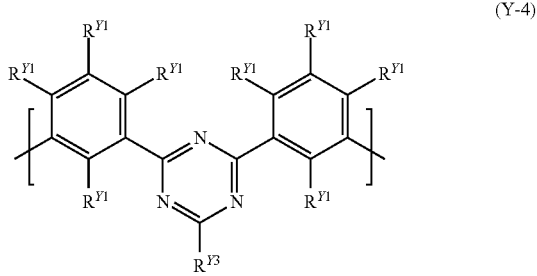
(Y-4)

[wherein,
$R^{Y1}$ represents the same meaning as described above.
$R^{Y3}$ represents a hydrogen atom, an alkyl group, a cycloalkyl group, an alkoxy group, a cycloalkoxy group, an aryl group or a monovalent heterocyclic group, and the foregoing groups optionally have a substituent.]
$R^{Y3}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

[Chemical Formula 94]

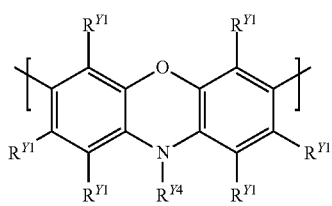
(Y-5)

(Y-6)

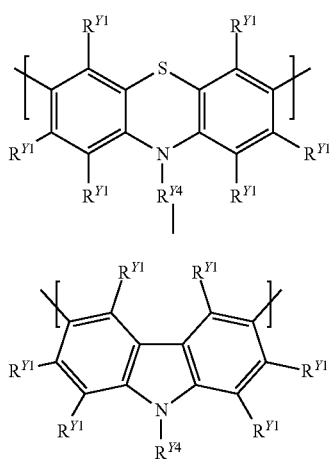

(Y-7)

[Chemical Formula 95]

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

The constitutional unit represented by the formula (Y) includes, for example, constitutional units represented by the formula (Y-11) to the formula (Y-56).

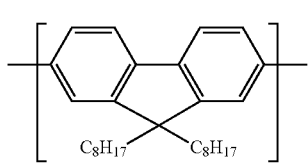 (Y-11)

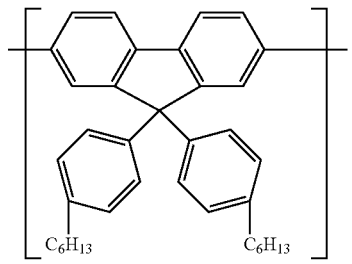 (Y-12)

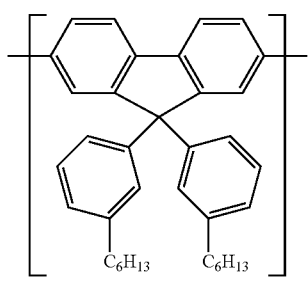 (Y-13)

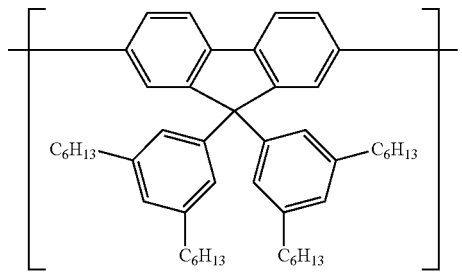 (Y-14)

[Chemical Formula 96]

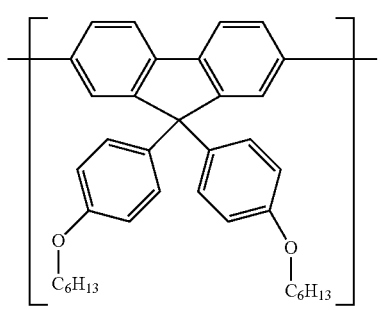 (Y-15)

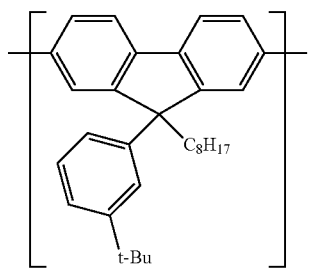 (Y-16)

-continued
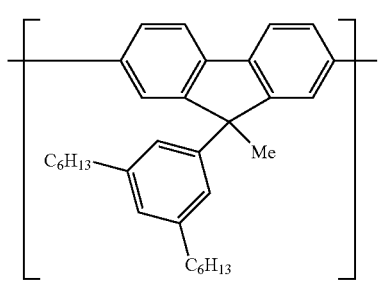 (Y-17)
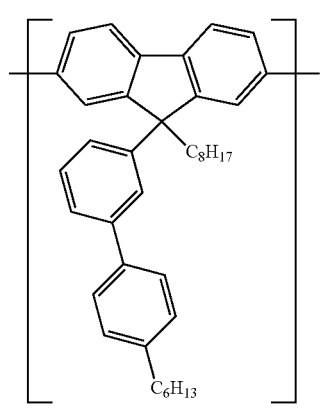 (Y-18)
[Chemical Formula 97]
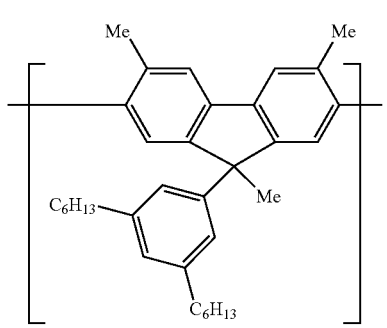 (Y-19)
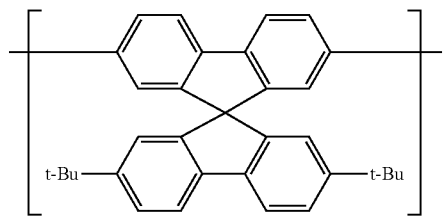 (Y-20)
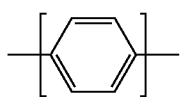 (Y-21)
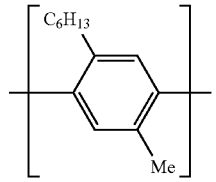 (Y-22)
(Y-23)
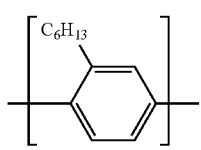
[Chemical Formula 98]
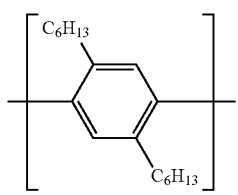
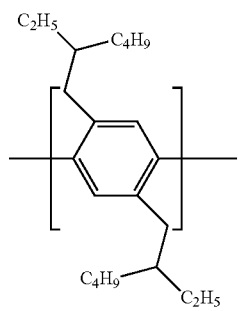 (Y-24)
(Y-25)

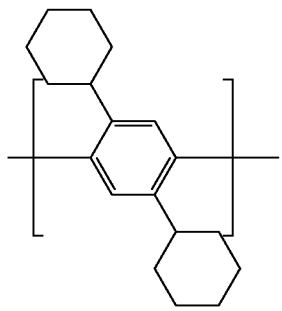 (Y-26)
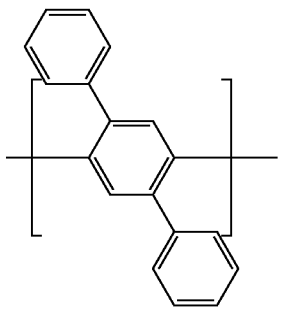 (Y-27)
(Y-28)
[Chemical Formula 99]
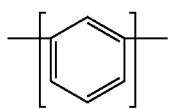
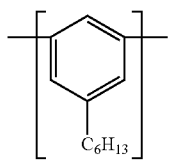 (Y-29)
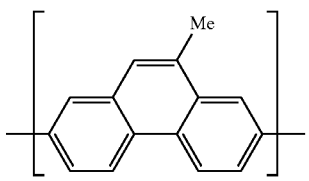 (Y-30)
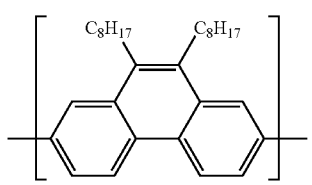 (Y-31)
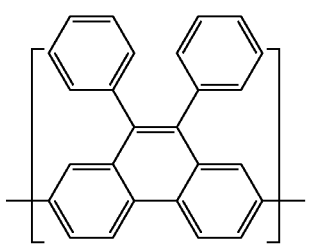 (Y-32)
(Y-33)
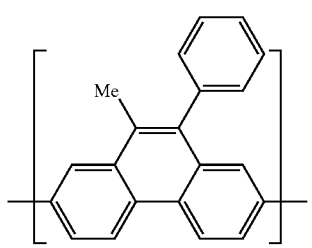
[Chemical Formula 100]
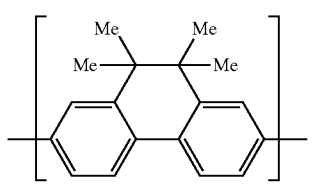 (Y-34)
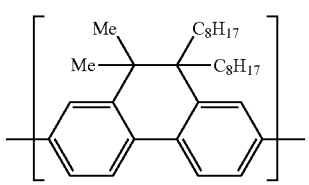 (Y-35)

-continued
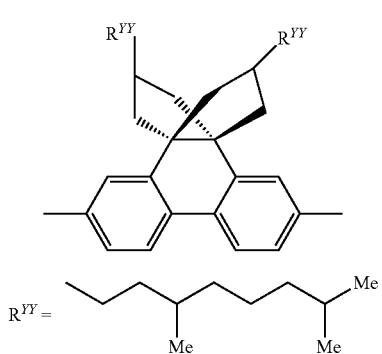 (Y-36)
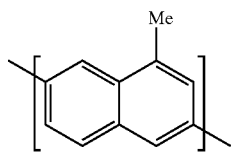 (Y-37)
$R^{YY} =$
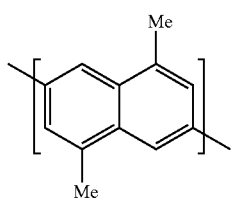 (Y-38)
[Chemical Formula 101]
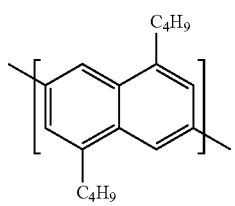 (Y-39)
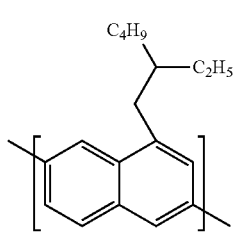 (Y-40)
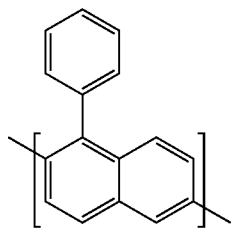 (Y-41)
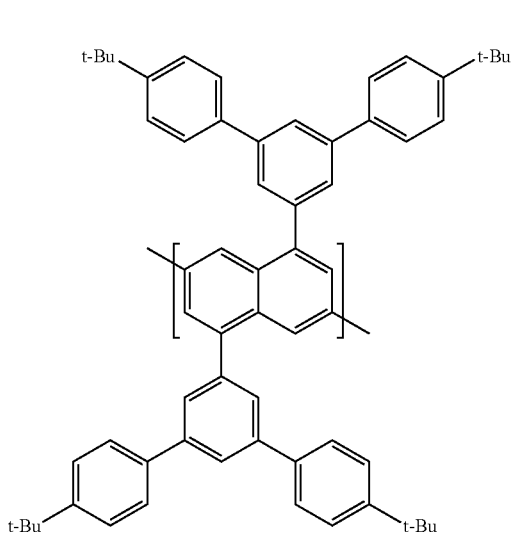 (Y-42)
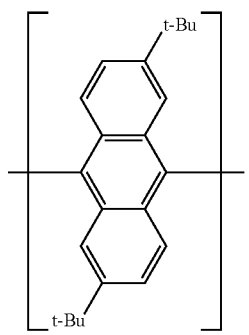 (Y-43)

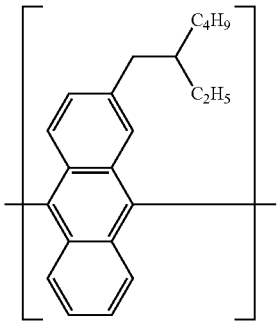
(Y-44)
[Chemical Formula 102]
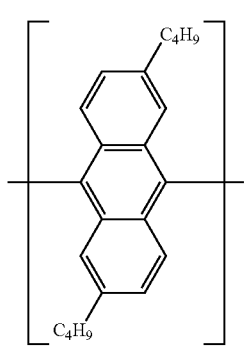
(Y-45)
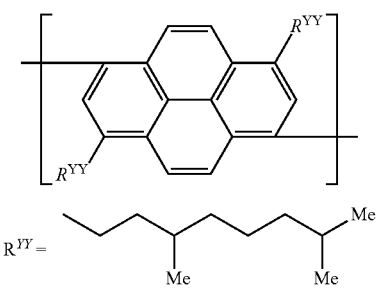
(Y-46)
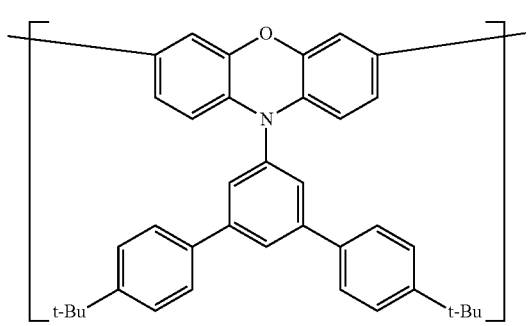
(Y-47)
[Chemical Formula 103]
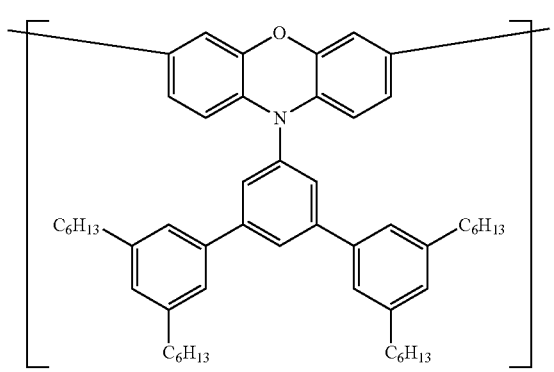
(Y-48)

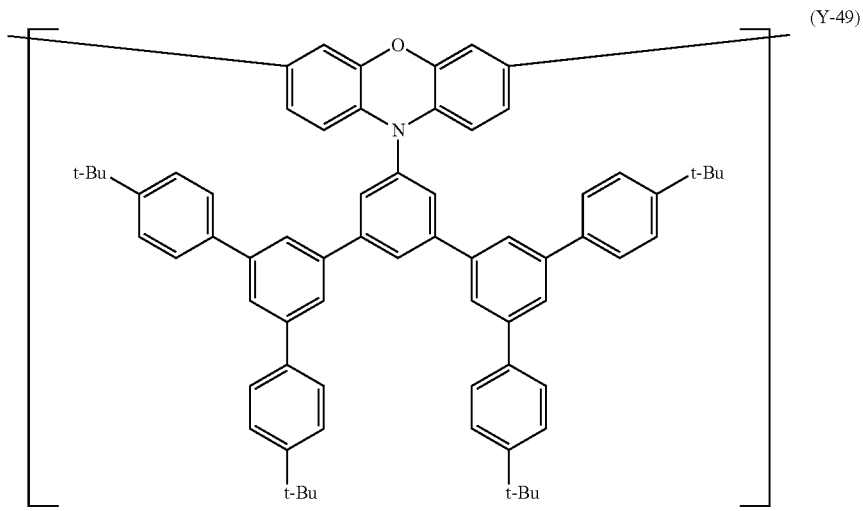
(Y-49)
[Chemical Formula 104]
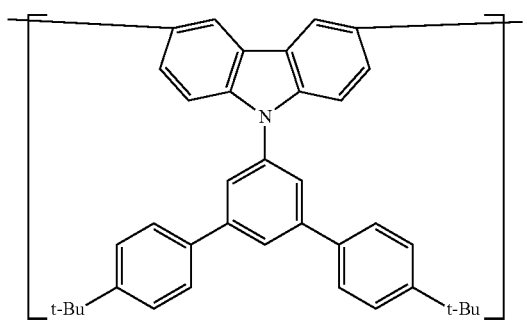
(Y-50)
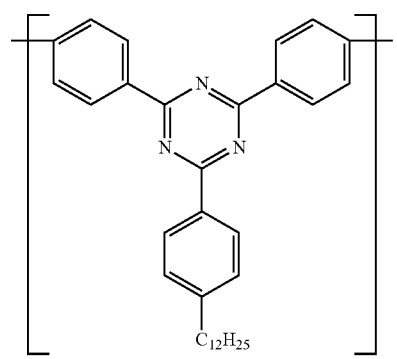
(Y-51)
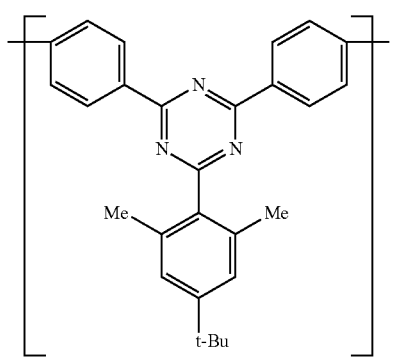
(Y-52)
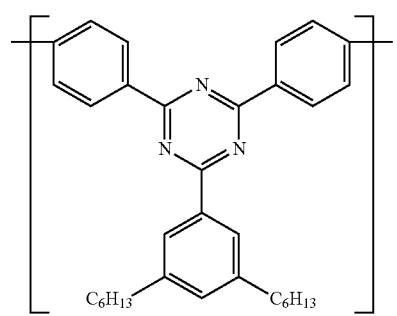
(Y-53)

[Chemical Formula 105]

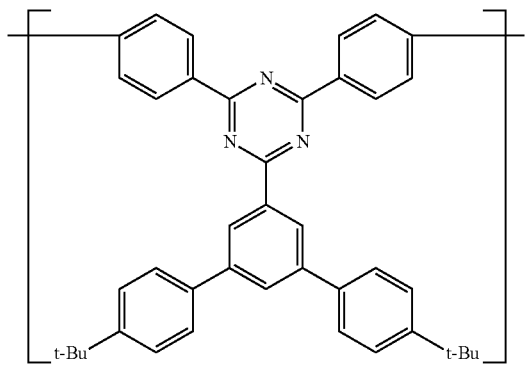

(Y-54)

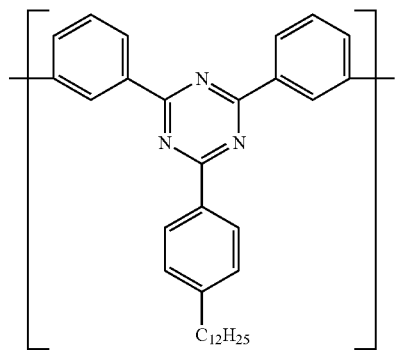

(Y-55)

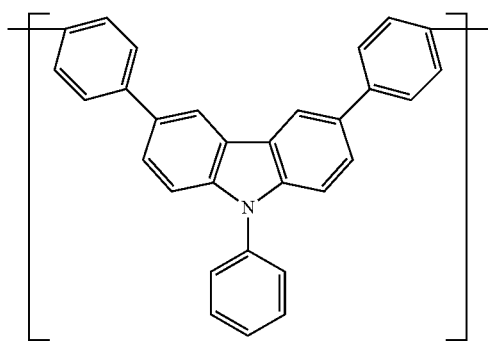

(Y-56)

The amount of the constitutional unit represented by the formula (Y) in which $Ar^{Y1}$ is an arylene group is preferably 0.5 to 80% by mol, more preferably 30 to 60% by mol, with respect to the total amount of the constitutional unit contained in the polymer compound of the second organic layer, since the light emitting device of the present invention is more excellent in luminance life.

The amount of the constitutional unit represented by the formula (Y) in which $Ar^{Y1}$ is a divalent heterocyclic group or a divalent group in which at least one arylene group and at least one divalent heterocyclic group are bonded directly is preferably 0.1 to 90% by mol, more preferably 1 to 70% by mol, further preferably 10 to 50% by mol, with respect to the total amount of the constitutional unit contained in the polymer compound of the second organic layer, since the polymer compound of the second organic layer is excellent in charge transportability.

The constitutional unit represented by the formula (Y) may be contained only singly or in combination of two or more in the polymer compound of the second organic layer The polymer compound of the second organic layer includes, for example, polymer compounds P-1 to P-8. "Other constitutional unit" denotes a constitutional unit other than the constitutional units represented by the formula (2), the formula (2'), the formula (X) and the formula (Y).

TABLE 1

| | constitutional unit and mole fraction thereof | | | | |
|---|---|---|---|---|---|
| polymer compound | the formula (2) p' | the formula (2') q' | the formula (X) r' | the formula (Y) s' | others t' |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.9 | 0 | 0 | 0.1 to 99.9 | 0 to 30 |
| P-4 | 0 | 0.1 to 99.9 | 0.1 to 99.9 | 0 | 0 to 30 |
| P-5 | 0 | 0.1 to 99.9 | 0 | 0.1 to 99.9 | 0 to 30 |
| P-6 | 0.1 to 99.8 | 0.1 to 99.8 | 0.1 to 99.8 | 0 | 0 to 30 |
| P-7 | 0.1 to 99.8 | 0.1 to 99.8 | 0 | 0.1 to 99.8 | 0 to 30 |
| P-8 | 0.1 to 99.7 | 0.1 to 99.7 | 0.1 to 99.7 | 0.1 to 99.7 | 0 to 30 |

[in the table, p', q', r', s' and t' represent the mole fraction of each constitutional unit. p'+q'+r'+s'+t'=100 and 70≤p'+q'+r'+s'≤100.]

The polymer compound of the second organic layer may be any of a block copolymer, a random copolymer, an alternating copolymer or a graft copolymer, and may also be a compound in other form, and a copolymer in which several raw material monomers are copolymerized is preferable.

The polymer compound of the second organic layer has a polystyrene-equivalent number-average molecular weight of preferably $5 \times 10^3$ to $1 \times 10^6$, more preferably $1 \times 10^4$ to $5 \times 10^5$, further preferably $1.5 \times 10^4$ to $1 \times 10^5$.

Production Method of Polymer Compound of Second Organic Layer

The polymer compound of the second organic layer can be produced using known polymerization methods described in Chemical Review, vol. 109, pp. 897-1091 (2009) and the like, and methods of polymerization by a coupling reaction using a transition metal catalyst such as Suzuki reaction, Yamamoto reaction, Buchwald reaction, Stille reaction, Negishi reaction and Kumada reaction, and the like, are exemplified.

The method of charging monomers in the above-described production method includes a method in which the whole monomer is charged in the reaction system at once, a method in which partial monomers are charged and reacted, then, the remaining monomers are charged at once, continuously or in parts, a method in which monomers are charged continuously or in parts, and the like.

The transition metal catalyst includes a palladium catalyst, a nickel catalyst and the like.

The post treatment of the polymerization reaction is conducted by using a known method, for example, a method of removing water-soluble impurities by liquid separation, a method of adding the reaction liquid after the polymerization reaction to a lower alcohol such as methanol and the like, filtrating the deposited precipitate, then, drying it, and other methods, singly or in combination. When the purity of the polymer compound of the second organic layer is low, it can be purified by a usual method such as, for example, crystallization, re-precipitation, continuous extraction with a Soxhlet extractor, column chromatography and the like.

Low Molecular Compound of Second Organic Layer

The low molecular compound of the second organic layer is preferably a low molecular compound represented by the formula (3).

$m^{B1}$ is preferably an integer of 0 to 5, more preferably an integer of 0 to 2, further preferably 0 or 1, particularly preferably 0, since synthesis of a crosslinkable material is easy.

$m^{B2}$ is preferably an integer of 0 to 5, more preferably an integer of 0 to 3, further preferably 1 or 2, particularly preferably 1, since synthesis of a crosslinkable material is easy and since the light emitting device of the present invention is more excellent in luminance life.

$m^{B3}$ is preferably an integer of 0 to 4, more preferably an integer of 0 to 2, further preferably 0, since synthesis of a crosslinkable material is easy.

The definition and examples of the arylene group portion obtained by removing $m^{B3}$ substituents from an aromatic hydrocarbon group represented by $Ar^7$ are the same as the definition and examples of the arylene group represented by $Ar^{X2}$ in the formula (X) described above.

The definition and examples of the divalent heterocyclic group portion obtained by removing $m^{B3}$ substituents from a heterocyclic group represented by $Ar^7$ are the same as the definition and examples of the divalent heterocyclic group portion represented by $Ar^{X2}$ in the formula (X) described above.

The definition and examples of the divalent group obtained by removing $m^{B3}$ substituents from a group in which at least one aromatic hydrocarbon group and at least one heterocyclic group are bonded directly represented by $Ar^7$ are the same as the definition and examples of the divalent group in which at least one arylene group and at least one divalent heterocyclic group are bonded directly represented by $Ar^{X2}$ in the formula (X) described above.

The definition and examples of the substituent which the group represented by $Ar^7$ optionally has are the same as the definition and examples of the substituent which the group represented by $Ar^{X2}$ optionally has in the formula (X) described above.

$Ar^7$ is preferably an aromatic hydrocarbon group, and this aromatic hydrocarbon group optionally has a substituent, since the light emitting device of the present invention is excellent in luminance life.

The definition and examples of the alkylene group, the cycloalkylene group, the arylene group and the divalent heterocyclic group represented by $L^{B1}$ are the same as the definition and examples of the alkylene group, the cycloalkylene group, the arylene group and the divalent heterocyclic group represented by $L^A$ described above, respectively.

$L^{B1}$ is preferably an alkylene group, an arylene group or an oxygen atom, more preferably an alkylene group or an arylene group, further preferably a phenylene group, a fluorenediyl group or an alkylene group, particularly preferably a phenylene group or an alkylene group, and the foregoing groups optionally have a substituent, since synthesis of a crosslinkable material is easy.

X" is preferably a crosslinkable group represented by any of the formula (XL-1) to the formula (XL-17), an aryl group or a monovalent heterocyclic group, more preferably a crosslinkable group represented by the formula (XL-1), the formula (XL-3), the formula (XL-7) to the formula (XL-10), the formula (XL-16) or the formula (XL-17) or an aryl group, further preferably a crosslinkable group represented by the formula (XL-1), the formula (XL-16) or the formula (XL-17), a phenyl group, a naphthyl group or a fluorenyl group, particularly preferably a crosslinkable group represented by the formula (XL-16) or the formula (XL-17), a phenyl group or a naphthyl group, especially preferably a crosslinkable group represented by the formula (XL-16) or a naphthyl group, and the foregoing groups optionally have a substituent.

The crosslinkable material includes, for example, low molecular compounds represented by the formula (3-1) to the formula (3-16), preferably low molecular compounds represented by the formula (3-1) to the formula (3-10), more preferably low molecular compounds represented by the formula (3-5) to the formula (3-9)

[Chemical Formula 106]
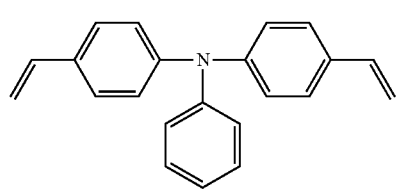 (3-1)
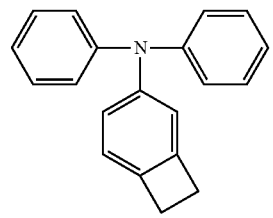 (3-2)
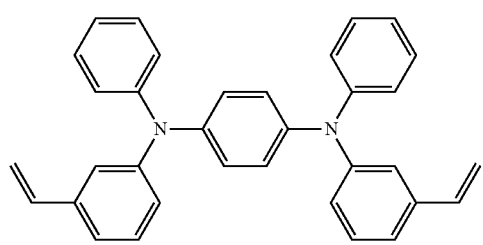 (3-3)
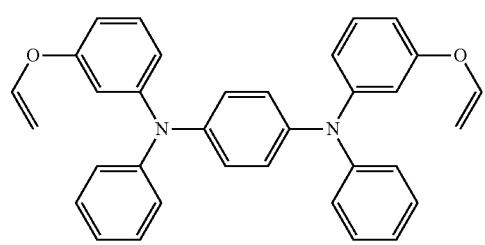 (3-4)
[Chemical Formula 107]
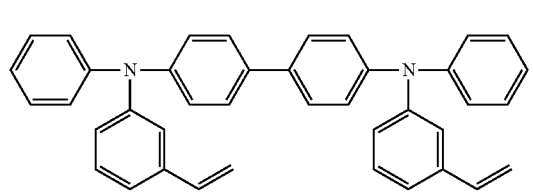 (3-5)
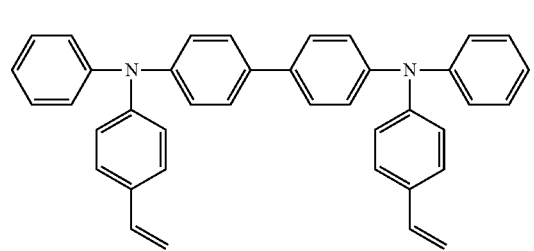 (3-6)
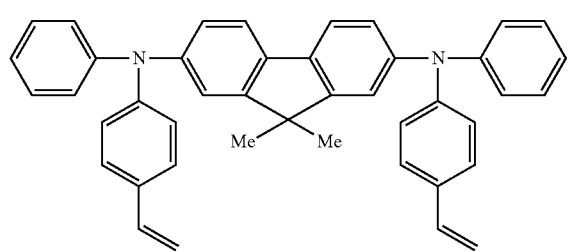 (3-7)
[Chemical Formula 108]
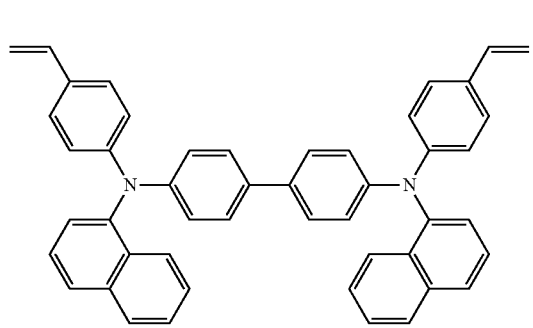 (3-8)
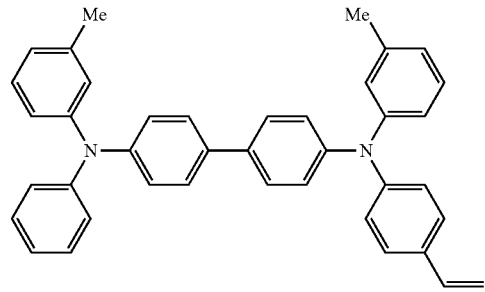 (3-9)

(3-10)
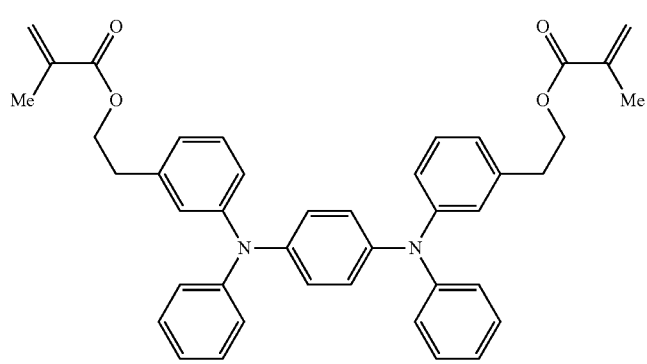
[Chemical Formula 109]
(3-11)
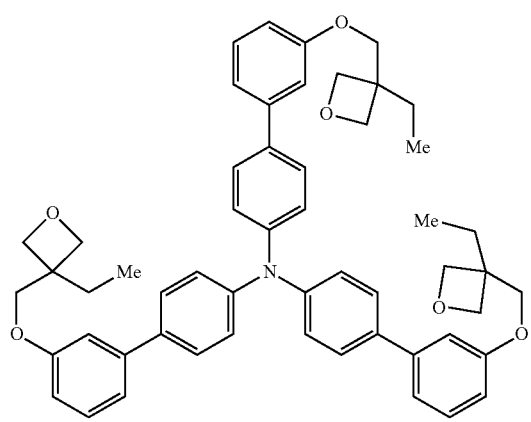
(3-12)
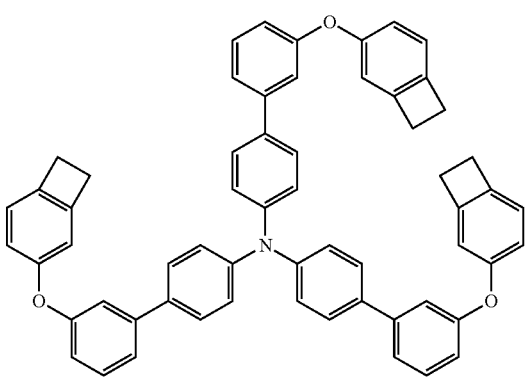
(3-13)
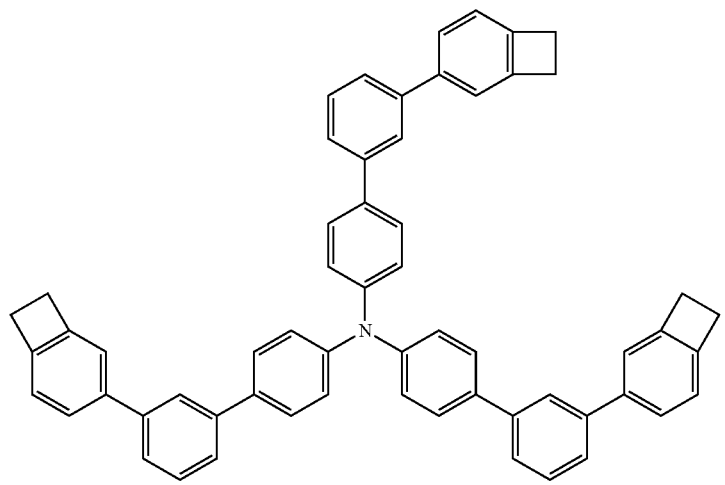

[Chemical Formula 110]

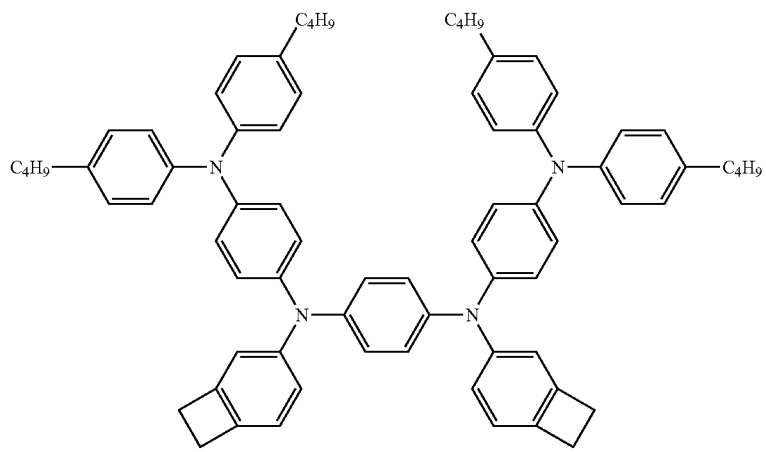

(3-14)

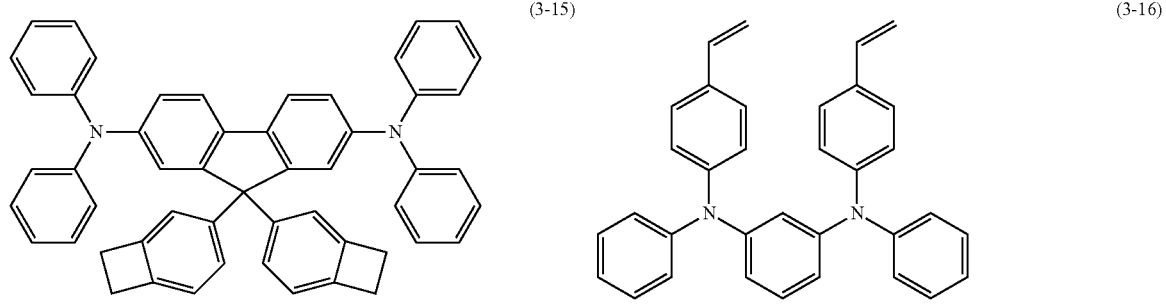

(3-15) (3-16)

The low molecular compound of the second organic layer is available, for example, from Aldrich, Luminescence Technology Corp. and American Dye Source. The low molecular compound of the second organic layer can be synthesized according to methods described, for example, in International Publication WO 1997/033193, International Publication WO 2005/035221 and International Publication WO 2005/049548, as other means.

Others

In the second organic layer, the cross-linked body of a crosslinkable material may be contained singly or in combination of two or more. In the second organic layer, the compound represented by the formula (C-1) may be contained singly or in combination of two or more.

The amount of the compound represented by the formula (C-1) contained in the second organic layer is usually 0.01 to 80 parts by mass, preferably 0.1 to 60 parts by mass, more preferably 1 to 40 parts by mass, further preferably 10 to 30 parts by mass, when the sum of the compound represented by the formula (C-1) and the cross-linked body of a crosslinkable material is taken as 100 parts by mass.

[Second Composition]

The second organic layer may be a layer containing a composition (hereinafter, referred to also as "second composition") comprising a compound represented by the formula (C-1), a cross-linked body of a crosslinkable material, and at least one material selected from the group consisting of a hole transporting material, a hole injection material, an electron transporting material, an electron injection material, a light emitting material and an antioxidant. In the second organic layer, the hole transporting material, the hole injection material, the electron transporting material, the electron injection material and the light emitting material are different from the compound represented by the formula (C-1). Further, in the second organic layer, the hole transporting material, the hole injection material, the electron transporting material, the electron injection material and the light emitting material are different from the cross-linked body of a crosslinkable material.

The examples and preferable ranges of the hole transporting material, the electron transporting material, the hole injection material and the electron injection material contained in the second composition are the same as the examples and preferable ranges of the hole transporting material, the electron transporting material, the hole injection material and the electron injection material and the light emitting material contained in the first composition. The light emitting material contained in the second composition includes light emitting materials and phosphorescent compounds contained in the first composition, and the examples and preferable ranges of them are the same as the examples and preferable ranges of the light emitting material and the phosphorescent compound contained in the first composition, respectively.

In the second composition, the compounding amounts of the hole transporting material, the electron transporting material, the hole injection material, the electron injection material and the light emitting material are each usually 1 to 400 parts by mass, preferably 5 to 150 parts by mass, when the sum of the compound represented by the formula (C-1) and the cross-linked body of a crosslinkable material is taken as 100 parts by mass.

The examples and preferable ranges of the antioxidant contained in the second composition are the same as the examples and preferable ranges of the antioxidant contained in first composition. In the second composition, the compounding amount of the antioxidant is usually 0.001 to 10 parts by mass, when the sum of the compound represented by the formula (C-1) and the cross-linked body of a crosslinkable material is taken as 100 parts by mass.

Second Ink

The composition containing a compound represented by the formula (C-1), a crosslinkable material and a solvent (hereinafter, referred to also as "second ink") can be suitably used for the application method explained in the section of the first ink. The preferable range of the viscosity of the second ink is the same as the preferable range of the viscosity of the first ink. The examples and preferable range of the solvent contained in the second ink are the same as the examples and preferable range of the solvent contained in the first ink.

In the second ink, the compounding amount of the solvent is usually 1000 to 100000 parts by mass, preferably 2000 to 20000 parts by mass, when the sum of the compound represented by the formula (C-1) and the crosslinkable material is taken as 100 parts by mass.

[Other Layers, Electrode]

In the light emitting device of the present invention, the compound represented by the formula (C-1) contained in the first organic layer and the compound represented by the formula (C-1) contained in the second organic layer may be the same or different.

It is preferable that at least one of the compound represented by the formula (C-1) contained in the first organic layer and the compound represented by the formula (C-1) contained in second organic layer is a compound represented by the formula (C-2-1) or a compound represented by the formula (C-2-2), it is more preferable that both the compound represented by the formula (C-1) contained in the first organic layer and the compound represented by the formula (C-1) contained in the second organic layer are a compound represented by the formula (C-2-1) or a compound represented by the formula (C-2-2), it is further preferable that both the compound represented by the formula (C-1) contained in the first organic layer and the compound represented by the formula (C-1) contained in the second organic layer are a compound represented by the formula (C-2-1), since the light emitting device of the present invention is more excellent in luminance life.

When at least one of the compound represented by the formula (C-1) contained in the first organic layer and the compound represented by the formula (C-1) contained in the second organic layer is a compound represented by the formula (C-2-1), the compound represented by the formula (C-2-1) is preferably a compound represented by the formula (C-3-1), since the light emitting device of the present invention is more excellent in luminance life.

When at least one of the compound represented by the formula (C-1) contained in the first organic layer and the compound represented by the formula (C-1) contained in the second organic layer is a compound represented by the formula (C-2-2), the compound represented by the formula (C-2-2) is preferably a compound represented by the formula (C-3-2), since the light emitting device of the present invention is more excellent in luminance life.

When both the compound represented by the formula (C-1) contained in the first organic layer and the compound represented by the formula (C-1) contained in the second organic layer are a compound represented by the formula (C-2-1), the compound represented by the formula (C-2-1) is preferably a compound represented by the formula (C-3-1), since the light emitting device of the present invention is more excellent in luminance life.

When both the compound represented by the formula (C-1) contained in the first organic layer and the compound represented by the formula (C-1) contained in the second organic layer are a compound represented by the formula (C-2-2), the compound represented by the formula (C-2-2) is preferably a compound represented by the formula (C-3-2), since the light emitting device of the present invention is more excellent in luminance life.

At least one compound represented by the formula (C-1) out of the compound represented by the formula (C-1) contained in the first organic layer and the compound represented by the formula (C-1) contained in the second organic layer preferably has a group represented by the formula (D-1) or the formula (E-1), more preferably has a group represented by the formula (D-1), since the light emitting device of the present invention is more excellent in luminance life.

It is preferable that both the compound represented by the formula (C-1) contained in the first organic layer and the compound represented by the formula (C-1) contained in the second organic layer have a group represented by the formula (D-1) or the formula (E-1), since the light emitting device of the present invention is more excellent in luminance life.

The method for forming the first organic layer and the second organic layer includes, for example, dry methods such as a vacuum vapor deposition method and the like, and application methods such as a spin coat method, an inkjet printing method and the like, and preferable are application methods. When the first organic layer is formed by an application method, it is preferable to use the first ink.

When the second organic layer is formed by an application method, it is preferable to use the second ink. After formation of the second organic layer, a crosslinkable material can be crosslinked by heating or light irradiation, and it is preferable to crosslink the crosslinkable material by heating. Since the crosslinkable material is contained in cross-linked state (cross-linked body of the crosslinkable material) in the second organic layer, the second organic layer is substantially insolubilized in a solvent. Hence, the second organic layer can be suitably used for lamination of the light emitting device.

The temperature of heating for crosslinking is usually 25° C. to 300° C., preferably 50° C. to 260° C., more preferably 130° C. to 230° C., further preferably 180° C. to 210° C.

The time of heating is usually 0.1 minute to 1000 minutes, preferably 0.5 minutes to 500 minutes, more preferably 1 minute to 120 minutes, further preferably 10 minutes to 60 minutes.

The kind of light used for light irradiation is, for example, ultraviolet light, near ultraviolet light or visible light.

As the method for analyzing components contained in the first organic layer or the second organic layer, for example, chemical separation analysis methods such as extraction and the like, instrumental analysis methods such as infrared spectroscopy (IR), nuclear magnetic resonance spectroscopy (NMR), mass spectrometry (MS) and the like, and analysis methods combining chemical separation analysis methods and instrumental analysis methods are be mentioned.

The first organic layer or the second organic layer can be subjected to solid-liquid extraction using an organic solvent such as toluene, xylene, chloroform, tetrahydrofuran and the like to separate the components into components substantially insoluble in an organic solvent (insoluble component) and components soluble in an organic solvent (soluble component). The insoluble component can be analyzed by infrared spectroscopy or nuclear magnetic resonance spectroscopy, and the soluble component can be analyzed by nuclear magnetic resonance spectroscopy or mass spectrometry.

[Layer Constitution]

The light emitting device of the present invention may have layers other than the anode, the cathode, the first organic layer and the second organic layer.

The first organic layer is usually a light emitting layer (hereinafter, referred to as "first light emitting layer").

The second organic layer is usually a hole transporting layer, a second light emitting layer or an electron transporting layer, preferably a hole transporting layer or a second light emitting layer.

It is preferable that the first organic layer and the second organic layer are adjacent, since the light emitting device of the present invention is more excellent in luminance life.

The second organic layer is preferably a layer disposed between an anode and a first organic layer, more preferably a hole transporting layer or a second light emitting layer disposed between an anode and a first organic layer, since the light emitting device of the present invention is more excellent in luminance life.

When the second organic layer is a hole transporting layer disposed between an anode and a first organic layer, it is preferable that a hole injection layer is further present between an anode and a second organic layer, since the light emitting device of the present invention is more excellent in luminance life. When the second organic layer is a hole transporting layer disposed between an anode and a first organic layer, it is preferable that at least one layer out of an electron injection layer and an electron transporting layer is further present between a cathode and a first organic layer, since the light emitting device of the present invention is more excellent in luminance life.

When the second organic layer is a second light emitting layer disposed between an anode and a first organic layer, it is preferable that at least one layer out of a hole injection layer and a hole transporting layer is further present between an anode and a second organic layer, since the light emitting device of the present invention is more excellent in luminance life. When the second organic layer is a second light emitting layer disposed between an anode and a first organic layer, it is preferable that at least one layer out of an electron injection layer and an electron transporting layer is further present between a cathode and a first organic layer, since the light emitting device of the present invention is more excellent in luminance life.

When the second organic layer is a second light emitting layer disposed between a cathode and a first organic layer, it is preferable that at least one layer out of a hole injection layer and a hole transporting layer is further present between an anode and a first organic layer, since the light emitting device of the present invention is more excellent in luminance life. When the second organic layer is a second light emitting layer disposed between a cathode and a first organic layer, it is preferable that at least one layer out of an electron injection layer and an electron transporting layer is further present between a cathode and a second organic layer, since the light emitting device of the present invention is more excellent in luminance life.

When the second organic layer is an electron transporting layer disposed between a cathode and a first organic layer, it is preferable that at least one layer out of a hole injection layer and a hole transporting layer is further present between an anode and a first organic layer, since the light emitting device of the present invention is more excellent in luminance life. When the second organic layer is an electron transporting layer disposed between a cathode and a first organic layer, it is preferable that an electron injection layer is further present between a cathode and a second organic layer, since the light emitting device of the present invention is more excellent in luminance life.

The specific layer constitution of the light emitting device of the present invention includes, for example, layer constitutions represented by the following (D1) to (D15). The light emitting device of the present invention usually has a substrate, and an anode may be first laminated on the substrate, or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In the above-described (D1) to (D15), "/" means that layers before and behind that are laminated adjacently. Specifically, "second light emitting layer (second organic layer)/first light emitting layer (first organic layer)" means that a second light emitting layer (second organic layer) and a first light emitting layer (first organic layer) are laminated adjacently.

Layer constitutions represented by (D3) to (D12) are preferable, since the light emitting device of the present invention is more excellent in luminance life.

In the light emitting device of the present invention, if necessary, two or more layers of the anode, the hole injection layer, the hole transporting layer, the second light emitting layer, the electron transporting layer, the electron injection layer and the cathode may be provided, respectively.

When a plurality of the anodes, the hole injection layers, the hole transporting layers, the second light emitting layers, the electron transporting layers, the electron injection layers and the cathodes are present, they may be the same or different at each occurrence.

The thicknesses of the anode, the hole injection layer, the hole transporting layer, the first light emitting layer, the second light emitting layer, the electron transporting layer, the electron injection layer and the cathode are each usually 1 nm to 1 μm, preferably 2 nm to 500 nm, further preferably 5 nm to 150 nm.

In the light emitting device of the present invention, the order, number and thickness of layers to be laminated may be controlled in view of the luminance life, the driving voltage and the device life of the light emitting device.

[Second Light Emitting Layer]

The second light emitting layer is usually a second organic layer or a layer containing a light emitting material, preferably a layer containing a light emitting material. When the second light emitting layer is a layer containing a light emitting material, the light emitting material contained in the second light emitting layer includes, for example, light emitting materials which may be contained in the first composition described above. The light emitting material contained in the second light emitting layer may be contained singly or in combination of two or more.

When the light emitting device of the present invention has a second light emitting layer and if the second organic layer is not a hole transporting layer and an electron transporting layer, it is preferable that the second light emitting layer is a second organic layer.

[Hole Transporting Layer]

The hole transporting layer is usually a second organic layer or a layer containing a hole transporting material, preferably a second organic layer. When the hole transporting layer is a layer containing a hole transporting material, the hole transporting material includes, for example, hole transporting materials which may be contained in the first composition described above. The hole transporting material contained in the hole transporting layer may be contained singly or in combination of two or more.

When the light emitting device of the present invention has a hole transporting layer and if the second organic layer is not a second light emitting layer and an electron transporting layer, it is preferable that the hole transporting layer is a second organic layer.

[Electron Transporting Layer]

The electron transporting layer is usually a second organic layer or a layer containing an electron transporting material, preferably a layer containing an electron transporting material. When the electron transporting layer is a layer containing an electron transporting material, the electron transporting material contained in the electron transporting layer includes, for example, electron transporting materials which may be contained in the first composition described above.

The electron transporting material contained in the electron transporting layer may be contained singly or in combination of two or more.

When the light emitting device of the present invention has an electron transporting layer and if the second organic layer is not a second light emitting layer and a hole transporting layer, it is preferable that the electron transporting layer is a second organic layer.

[Hole Injection Layer and Electron Injection Layer]

The hole injection layer is a layer containing a hole injection material. The hole injection material contained in the hole injection layer includes, for example, hole injection materials which may be contained in the first composition described above. The hole injection material contained in the hole injection layer may be contained singly or in combination of two or more.

The electron injection layer is a layer containing an electron injection material. The electron injection material contained in the electron injection layer includes, for example, electron injection materials which may be contained in the first composition described above. The electron injection material contained in the electron injection layer may be contained singly or in combination of two or more.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

The method for forming the anode and the cathode includes, for example, a vacuum vapor deposition method, a sputtering method, an ion plating method, a plating method and a lamination method.

[Production Method]

The method for forming each layer such as a first light emitting layer, a second light emitting layer, a hole transporting layer, an electron transporting layer, a hole injection layer, an electron injection layer and the like in the light emitting device of the present invention includes, for example, a vacuum vapor deposition method from a powder and a method by film formation from a solution or melted state when a low molecular compound is used, and, for example, a method by film formation from a solution or melted state when a polymer compound is used.

The first light emitting layer, the second light emitting layer, the hole transporting layer, the electron transporting layer, the hole injection layer and the electron injection layer can be formed by application methods such as a spin coat method, an inkjet printing method and the like using the first ink, the second ink, and inks containing the light emitting material, the hole transporting material, the electron transporting material, the hole injection material and the electron injection material described above, respectively.

[Application]

In order to obtain planar light emission using a light emitting device, the planar anode and the planar cathode may be arranged so as to overlap each other. In order to obtain patterned light emission, there are a method of installing a mask having a patterned window on the surface of a planar light emitting device, a method in which a layer to be formed as a non-light emitting part is formed extremely thick so as to cause substantially non light emission and a method of forming an anode or a cathode, or both electrodes in a pattern. A segment type display capable of displaying numerals, letters and the like can be obtained by forming a pattern by any one of these methods and disposing several electrodes so that several electrodes can be turned on and off independently. In order to obtain a dot matrix display, both the anode and the cathode may be formed in a stripe shape and arranged so as to be orthogonal to each other. Partial color display and multicolor display become possible by a method of separately coating plural kinds of polymer compounds having different emission colors or a method using a color filter or a fluorescence conversion filter. The dot matrix display can be driven passively or can be driven actively in combination with a TFT and the like. These displays can be used for displays of computers, televisions, portable terminals, and the like. The planar light emitting device can be suitably used as a planar light source for backlight of a liquid crystal display, or as a planar light source for illumination. If a flexible substrate is used, it can be used as a curved light source and a curved display.

EXAMPLES

The present invention will be illustrated further in detail by examples below, but the present invention is not limited to these examples.

In examples, the polystyrene-equivalent number-average molecular weight (Mn) and the polystyrene-equivalent weight-average molecular weight (Mw) of polymer compounds were determined by the following size exclusion chromatography (SEC) using tetrahydrofuran as a mobile phase.

A polymer compound to be measured was dissolved in tetrahydrofuran at a concentration of about 0.05% by mass, and 10 µL of the solution was injected into SEC. The mobile phase was flowed at a flow rate of 1.0 mL/min. As a column, PLgel MIXED-B (manufactured by Polymer Laboratories Ltd.) was used. As a detector, a UV-VIS detector (trade name: UV-8320GPC manufactured by Tosoh Corp.) was used.

NMR was measured by the following method.

Five to ten mg of a measurement sample was dissolved in about 0.5 mL of deuterated chloroform (CDCl$_3$), deuterated tetrahydrofuran, deuterated dimethyl sulfoxide, deuterated acetone, deuterated N,N-dimethylformamide, deuterated toluene, deuterated methanol, deuterated ethanol, deuterated 2-propanol or deuterated methylene chloride, and NMR thereof was measured using an NMR apparatus (trade name: JNM-ECZ400S/L1 manufactured by JEOL RESONANCE).

As an indicator of the purity of the compound, high performance liquid chromatography (HPLC) area percentage value was used. This value is a value by HPLC (trade name: LC-20A manufactured by Shimadzu Corp.) at UV=254 nm unless otherwise stated. In this operation, the compound to be measured was dissolved in tetrahydrofuran or chloroform so as to give a concentration of 0.01 to 0.2% by mass, and 1 to 10 µL of the solution was poured into HPLC depending on the concentration. As a mobile phase of HPLC, acetonitrile/tetrahydrofuran were used while changing the ratio thereof from 100/0 to 0/100 (volume ratio), and flowed at a flow rate of 1.0 mL/min. As a column, SUMI-PAX ODS Z-CLUE (manufactured by Sumika Chemical Analysis Service, Ltd., internal diameter: 4.6 mm, length: 250 mm, particle size: 3 µm) or an ODS column having the equivalent performance was used. As a detector, a photodiode array detector (trade name: SPD-M20A manufactured by Shimadzu Corp.) was used.

<Synthesis Example M1> Synthesis of Compounds M1 to M5 and Metal Complex RM1

Compounds M1, M2 and M3 were synthesized according to the method described in International Publication WO 2013/146806.

A compound M4 was synthesized according to the method described in JP-A No. 2012-33845.

A compound M5 was synthesized according to the method described in JP-A No. 2010-189630.

A metal complex RM1 was synthesized according to the method described in International Publication WO 2009/157424.

[Chemical Formula 111]

compound M1

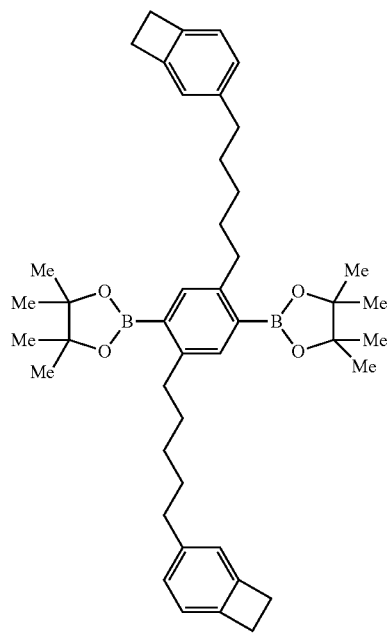

-continued compound M2

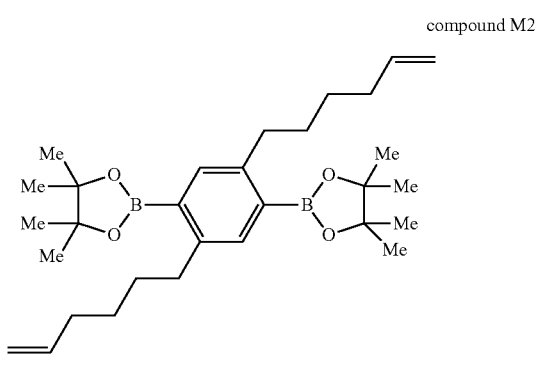

compound M3

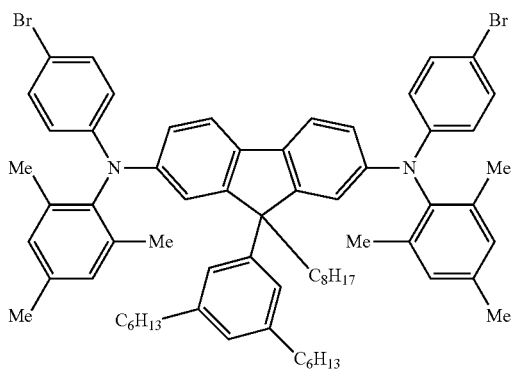

compound M4

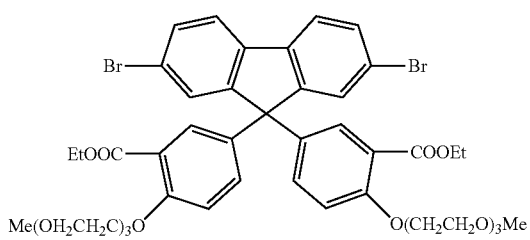

compound M5

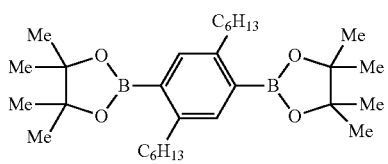

-continued

[Chemical Formula 112]

metal complex RM1

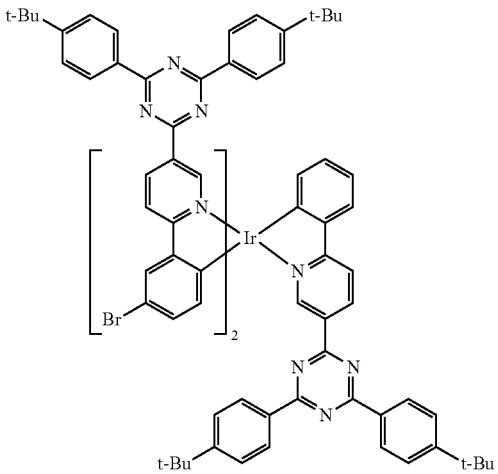

<Synthesis Example HTL1> Synthesis of Polymer Compound HTL-1

An inert gas atmosphere was prepared in a reaction vessel, then, a compound M1 (0.800 g), a compound M2 (0.149 g), a compound M3 (1.66 g), dichlorobis(tris-o-methoxyphenylphosphine)palladium (1.4 mg) and toluene (45 mL) were added, and the mixture was heated at 100° C. Thereafter, into this was dropped a 20% by mass tetraethyl ammonium hydroxide aqueous solution (16 mL), and the mixture was refluxed for 7 hours. Thereafter, to this were added 2-ethylphenylboronic acid (90 mg) and dichlorobis(tris-o-methoxyphenylphosphine)palladium (1.3 mg), and the solution was refluxed for 17.5 hours. Thereafter, to this was added a sodium diethyldithiacarbamate aqueous solution, and the mixture was stirred at 85° C. for 2 hours. The resultant reaction liquid was cooled, then, washed with 3.6% by mass hydrochloric acid, 2.5% by mass ammonia water, and water, respectively. The resultant solution was dropped into methanol, to generate a precipitate. The resultant precipitate was dissolved in toluene, and purified by passing through an alumina column and a silica gel column in this order. The resultant solution was dropped into methanol, stirred, then, the resultant precipitate was collected by filtration, and dried, to obtain 1.64 g of a polymer compound HTL-1. The polymer compound HTL-1 had an Mn of $3.5 \times 10^4$ and an Mw of $2.2 \times 10^5$.

The polymer compound HTL-1 is a copolymer constituted of a constitutional unit derived from the compound M1, a constitutional unit derived from the compound M2 and a constitutional unit derived from the compound M3 at a molar ratio of 40:10:50 according to the theoretical values calculated from the amounts of the charged raw materials.

<Synthesis Example HTL2> Synthesis of Polymer Compound HTL-2

An inert gas atmosphere was prepared in a reaction vessel, then, the compound M1 (2.52 g), the compound M2 (0.470 g), the compound M3 (4.90 g), the phosphorescent compound RM1 (0.530 g), dichlorobis(tris-o-methoxyphenylphosphine)palladium (4.2 mg) and toluene (158 mL) were added, and the mixture was heated at 100° C. Thereafter, into this was dropped a 20% by mass tetraethyl ammonium hydroxide aqueous solution (16 mL), and the mixture was refluxed for 8 hours. Thereafter, to this were added phenylboronic acid (116 mg) and dichlorobis(tris-o-methoxyphenylphosphine)palladium (4.2 mg), and the mixture was refluxed for 15 hours. Thereafter, to this was added a sodium diethyldithiacarbamate aqueous solution, and the mixture was stirred at 85° C. for 2 hours. The resultant reaction liquid was cooled, then, washed with 3.6% by mass hydrochloric acid, 2.5% by mass ammonia water, and water, respectively. The resultant solution was dropped into methanol, to generate a precipitate. The resultant precipitate was dissolved in toluene, and purified by passing through an alumina column and a silica gel column in this order. The resultant solution was dropped into methanol, stirred, then, the resultant precipitate was collected by filtration and dried, to obtain 6.02 g of a polymer compound HTL-2. The polymer compound HTL-2 had an Mn of $3.8 \times 10^4$ and an Mw of $4.5 \times 10^5$.

The polymer compound HTL-2 is a copolymer constituted of a constitutional unit derived from the compound M1, a constitutional unit derived from the compound M2, a constitutional unit derived from the compound M3 and a constitutional unit derived from the metal complex RM1 at a molar ratio of 40:10:47:3 according to the theoretical values calculated from the amounts of the charged raw materials.

<Compound HTL-M1, Compound HM-1 and Compound HM-8>

A compound HTL-M1 and a compound HM-1 were purchased from Luminescence Technology.

A compound HM-8 was purchased from 1-Material.

[Chemical Formula 113]

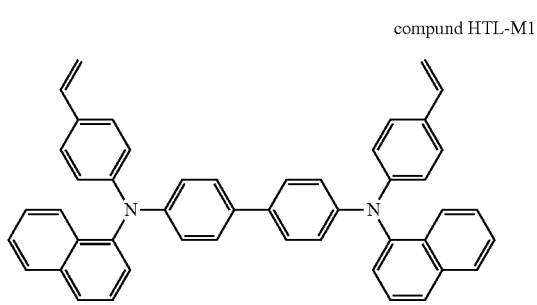

compund HTL-M1

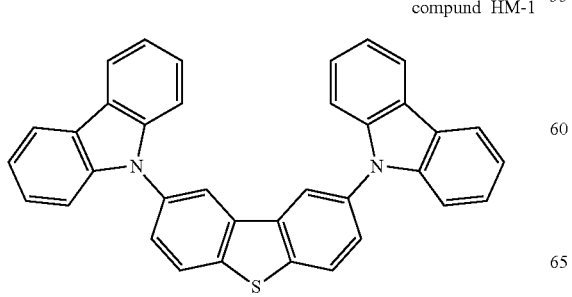

compund HM-1

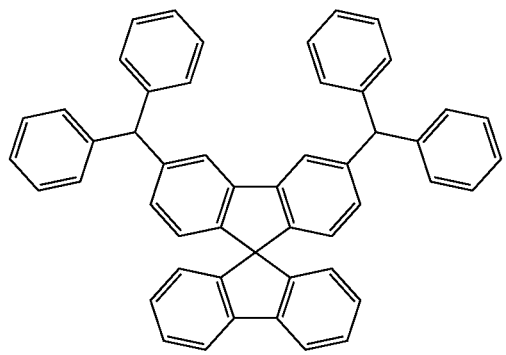

compund HM-8

Synthesis Examples HM-6, HM-7, HM-9 and HM-12

Synthesis of Compounds HM-6, HM-7, HM-9 and HM-12

A compound HM-6 was synthesized based on the method described in International Publication WO 2014/023388.

A compound HM-7 was synthesized based on the method described in International Publication WO 2013/045408.

A compound HM-9 was synthesized based on the method described in International Publication WO 2013/045410.

A compound HM-12 was synthesized based on the method described in International Publication WO 2013/045411.

[Chemical Formula 114]

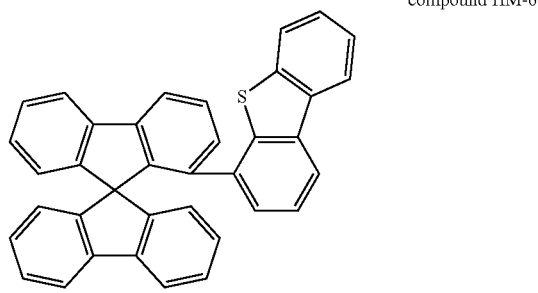

compund HM-6

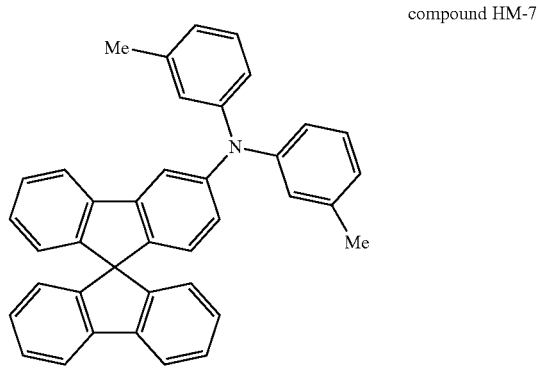

compund HM-7

-continued

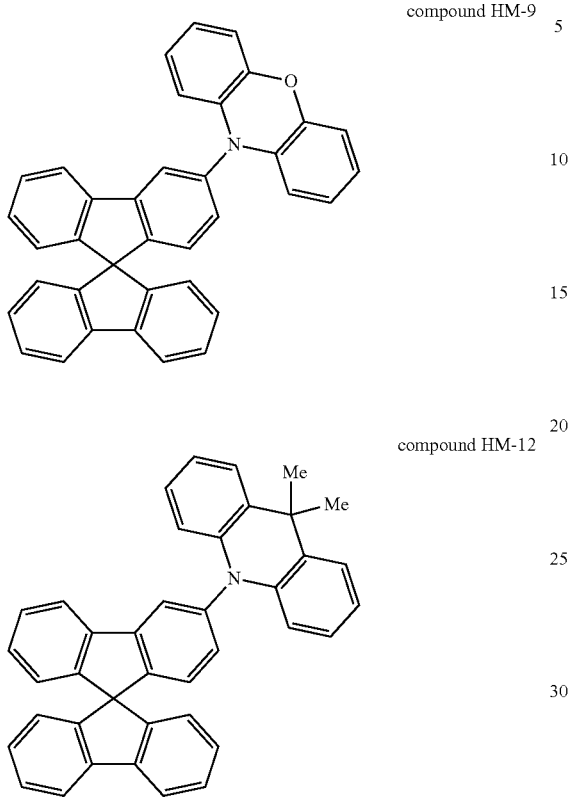

compound HM-9 compound HM-12

<Synthesis Example HM-2> Synthesis of Compound HM-2

[Chemical Formula 115]

compound HM-2a compound HM-2b

-continued

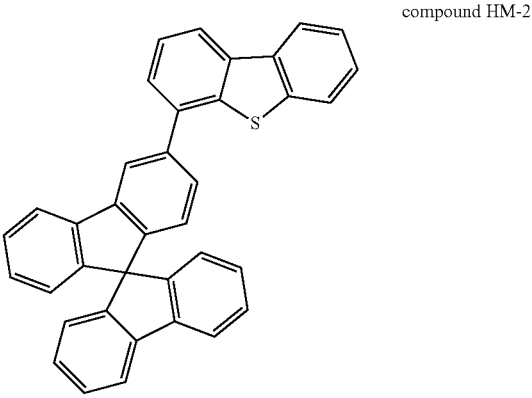

compound HM-2

A nitrogen gas atmosphere was prepared in a reaction vessel, then, a compound HM-2a (15.6 g), a compound HM-2b (10.3 g), toluene (390 mL), tetrakis(triphenylphosphine)palladium(0) (2.2 g) and a 20% by mass tetrabutylammonium hydroxide aqueous solution (194 g) were added, and the mixture was stirred at 90° C. for 4 hours. The resultant reaction liquid was cooled down to room temperature, then, filtrated through a filter paved with Celite. The resultant filtrate was washed with ion exchanged water, then, the resultant organic layer was dried over anhydrous sodium sulfate, and filtrated. The resultant filtrate was concentrated under reduced pressure, to obtain a solid. The resultant solid was crystallized using a mixed solvent of toluene and 2-propanol, then, dried at 50° C. under reduced pressure, to obtain a compound HM-2 (15.2 g). The HPLC area percentage value of the compound HM-2 was 99.5% or more.

The analysis result of the compound HM-2 was as described below.

$^1$H-NMR (CD$_2$Cl$_2$, 400 MHz): δ (ppm)=6.70-6.83 (4H, m), 7.15 (3H, t), 7.39 (3H, t), 7.48 (3H, t), 7.59 (2H, t), 7.83-7.93 (4H, m), 8.18-8.23 (3H, m).

<Synthesis Example HM-3> Synthesis of Compound HM-3

[Chemical Formula 116]

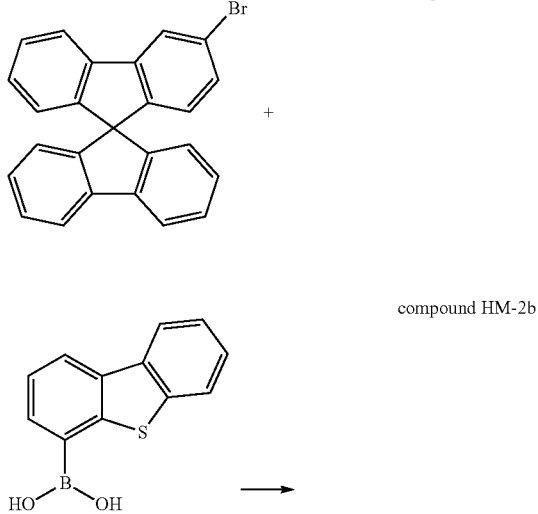

compound HM-3a compound HM-2b

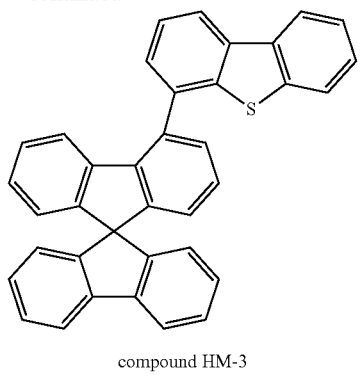

compound HM-3

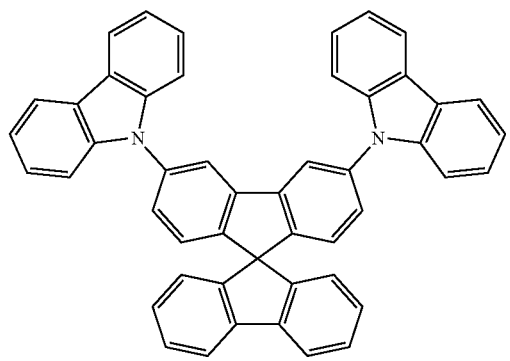

compound HM-4

A nitrogen gas atmosphere was prepared in a reaction vessel, then, a compound HM-3a (13.5 g), a compound HM-2b (8.9 g), toluene (404 mL), tetrakis(triphenylphosphine)palladium(0) (2.0 g) and a 20% by mass tetrabutylammonium hydroxide aqueous solution (166 g) were added, and the mixture was stirred at 90° C. for 3 hours. The resultant reaction liquid was cooled down to room temperature, then, filtrated through a filter paved with Celite. The resultant filtrate was washed with ion exchanged water, then, the resultant organic layer was dried over anhydrous sodium sulfate, and filtrated. The resultant filtrate was concentrated under reduced pressure, to obtain a solid. The resultant solid was purified by silica gel column chromatography (a mixed solvent of hexane and chloroform), and further, crystallized using a mixed solvent of toluene and methanol, then, dried at 50° C. under reduced pressure, to obtain a compound HM-3 (10.5 g). The HPLC area percentage value of the compound HM-3 was 99.5% or more.

The analysis result of the compound HM-3 was as described below.

$^1$H-NMR (CD$_2$Cl$_2$, 400 MHz): δ (ppm)=6.51 (1H, d), 6.60 (1H, d), 6.80 (4H, m), 6.92 (1H, t), 7.21 (3H, m), 7.34 (1H, d), 7.39-7.50 (4H, m), 7.65 (1H, d), 7.71 (1H, t), 7.81 (1H, d), 7.88 (2H, d), 8.28-8.35 (2H, m).

<Synthesis Example HM-4> Synthesis of Compound HM-4

[Chemical Formula 117]

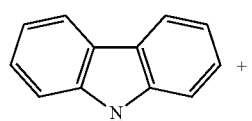

compound HM-4a

+

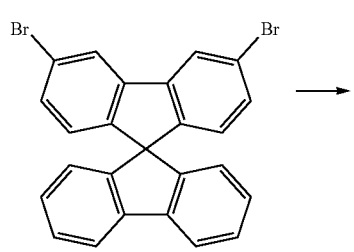

compound HM-4b

A nitrogen gas atmosphere was prepared in a reaction vessel, then, a compound HM-4a (1.6 g), a compound HM-4b (1.3 g), xylene (63 mL), palladium(II) acetate (22 mg), tri-tert-butylphosphonium tetrafluoroborate (63 mg) and sodium tert-butoxide (1.9 g) were added, and the mixture was stirred for 54 hours under reflux with heat. The resultant reaction liquid was cooled down to room temperature, then, filtrated through a filter paved with silica gel and Celite. The resultant filtrate was washed with ion exchanged water, then, the resultant organic layer was dried over anhydrous sodium sulfate, and filtrated. The resultant filtrate was concentrated under reduced pressure, to obtain a solid. The resultant solid was purified by silica gel column chromatography (a mixed solvent of hexane and chloroform), and further, crystallized using a mixed solvent of chloroform and 2-propanol, then, dried at 50° C. under reduced pressure, to obtain a compound HM-4 (1.0 g). The HPLC area percentage value of the compound HM-4 was 99.5% or more.

The analysis result of the compound HM-4 was as described below.

$^1$H-NMR (CD$_2$Cl$_2$, 400 MHz): δ (ppm)=7.08 (4H, t), 7.34 (6H, m), 7.47-7.57 (12H, m), 8.02 (2H, d), 8.12 (2H, s), 8.22 (4H, d).

<Synthesis Example HM-5> Synthesis of Compound HM-5

[Chemical Formula 118]

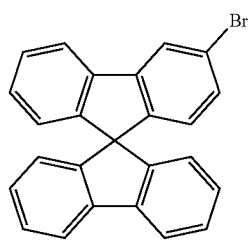

compound HM-2a

+

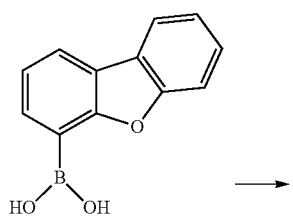

compound HM-5b compound HM-5

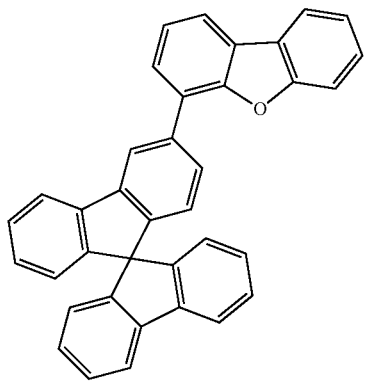

A nitrogen gas atmosphere was prepared in a reaction vessel, then, a compound HM-2a (1.64 g), a compound HM-5b (1.00 g), toluene (40 mL), tetrakis(triphenylphosphine)palladium(0) (0.24 g) and a 20% by mass tetrabutylammonium hydroxide aqueous solution (20 g) were added, and the mixture was stirred at 90° C. for 3 hours. The resultant reaction liquid was cooled down to room temperature, then, toluene was added, and the liquid was washed with ion exchanged water. The resultant organic layer was dried over anhydrous magnesium sulfate, then, filtrated through a filter paved with silica gel and Celite. The resultant filtrate was concentrated under reduced pressure, to obtain a solid. The resultant solid was crystallized using a mixed solvent of toluene and 2-propanol, then, dried at 50° C. under reduced pressure, to obtain a compound HM-5 (1.7 g). The HPLC area percentage value of the compound HM-5 was 99.5% or more.

The analysis result of the compound HM-5 was as described below.

$^1$H-NMR (CDCl$_3$, 400 MHz): δ (ppm)=8.36 (d, 1H), 8.03-7.99 (m, 1H), 7.98-7.93 (m, 2H), 7.89-7.86 (m, 2H), 7.70-7.60 (m, 3H), 7.51-7.35 (m, 6H), 7.17-7.12 (m, 3H), 6.89 (d, 1H), 6.86-6.82 (m, 2H), 6.78 (d, 1H).

<Synthesis Example HM-10> Synthesis of Compound HM-10

[Chemical Formula 119]

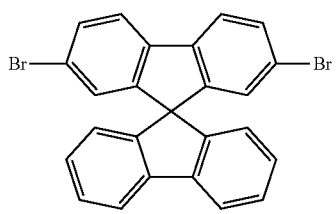

compound HM-10a

+

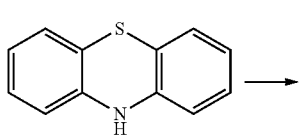

compound HM-10b compound HM-10

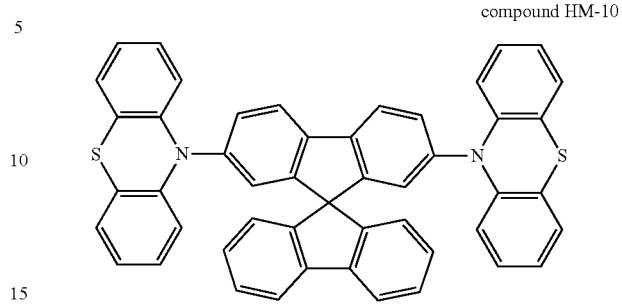

A nitrogen gas atmosphere was prepared in a reaction vessel, then, a compound HM-10a (3.0 g), a compound HM-10b (2.8 g), toluene (150 mL), palladium(II) acetate (43 mg), tri-tert-butylphosphonium tetrafluoroborate (0.12 g) and sodium tert-butoxide (3.7 g) were added, and the mixture was stirred at 105° C. for 3 hours. The resultant reaction liquid was cooled down to room temperature, to deposit a solid. The resultant solid was collected by filtration, then, dissolved in chloroform. To the resultant chloroform solution was added activated carbon, and the mixture was stirred, then, filtrated through a filter paved with Celite and silica gel. The resultant filtrate was concentrated under reduced pressure, to obtain a solid. The resultant solid was crystallized using toluene, then, dried at 50° C. under reduced pressure, to obtain a compound HM-10 (3.0 g). The HPLC area percentage value of the compound HM-10 was 99.5%.

The analysis result of the compound HM-10 was as described below.

$^1$H-NMR (CD$_2$Cl$_2$, 400 MHz): δ (ppm)=6.09 (2H, d), 6.72-6.77 (5H, m), 6.85-6.92 (3H, m), 7.11-7.21 (1H, m), 7.32 (1H, t), 7.45 (1H, d), 7.79 (1H, d), 8.15 (1H, d).

<Synthesis Example HM-11> Synthesis of Compound HM-11

[Chemical Formula 120]

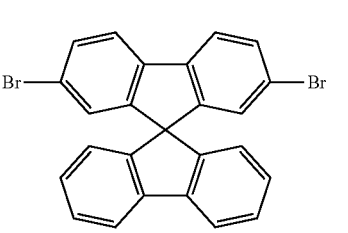

compound HM-10a

+

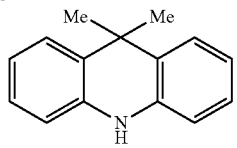

compound HM-11b

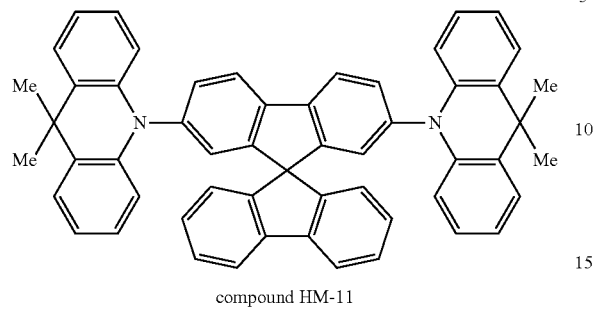

compound HM-11

A nitrogen gas atmosphere was prepared in a reaction vessel, then, a compound HM-10a (1.5 g), a compound HM-11b (1.5 g), toluene (75 mL), palladium(II) acetate (21 mg), tri-tert-butylphosphonium tetrafluoroborate (61 mg) and sodium tert-butoxide (1.2 g) were added, and the mixture was stirred at 105° C. for 3 hours. The resultant reaction liquid was cooled down to room temperature, then, toluene and ion exchanged water were added, and the mixture was filtrated through a filter paved with Celite. The aqueous layer was removed from the resultant filtrate, then, the resultant organic layer was washed with ion exchanged water. The resultant organic layer was dried over anhydrous sodium sulfate, and filtrated. The resultant filtrate was concentrated under reduced pressure, to obtain a solid. The resultant solid was dissolved in chloroform. To the resultant chloroform solution was added activated carbon, and the mixture was stirred, then, filtrated through a filter paved with Celite and silica gel. The resultant filtrate was concentrated under reduced pressure, to obtain a solid. The resultant solid was crystallized using toluene, then, dried at 50° C. under reduced pressure, to obtain a compound HM-11 (1.3 g). The HPLC area percentage value of the compound HM-11 was 99.5% or more.

The analysis result of the compound HM-11 was as described below.

$^1$H-NMR (CD$_2$Cl$_2$, 400 MHz): δ (ppm)=1.54 (6H, s), 6.16 (2H, d), 6.70 (1H, s), 6.80-6.94 (5H, m), 7.15 (1H, t), 7.28-7.39 (4H, m), 7.74 (1H, d), 8.19 (1H, d).

<Synthesis Example B1> Synthesis of Phosphorescent Compounds B1 to B3

A phosphorescent compound B1 was synthesized based on methods described in International Publication WO 2006/121811 and JP-A No. 2013-048190.

A phosphorescent compound B2 was synthesized based on the method described in International Publication WO 2006/121811.

A phosphorescent compound B3 was synthesized according to the method described in JP-A No. 2013-147551.

[Chemical Formula 121]

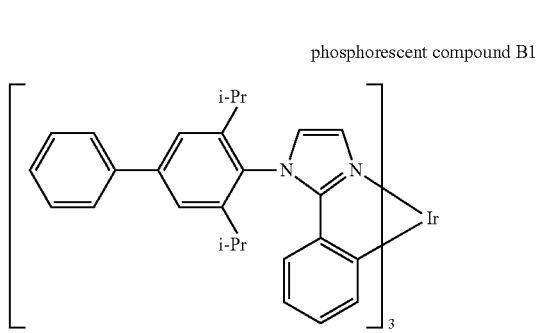

phosphorescent compound B1

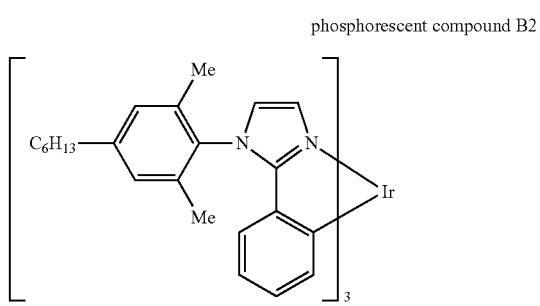

phosphorescent compound B2

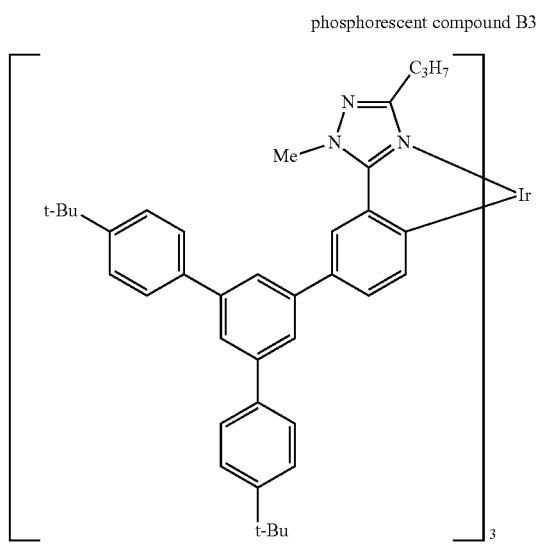

phosphorescent compound B3

<Synthesis Example G1> Synthesis of Phosphorescent Compounds G1 and G2

A phosphorescent compound G1 was synthesized based on the method described in International Publication WO 2009/131255.

A phosphorescent compound G2 was synthesized according to the method described in JP-A No. 2014-224101.

[Chemical Formula 122]

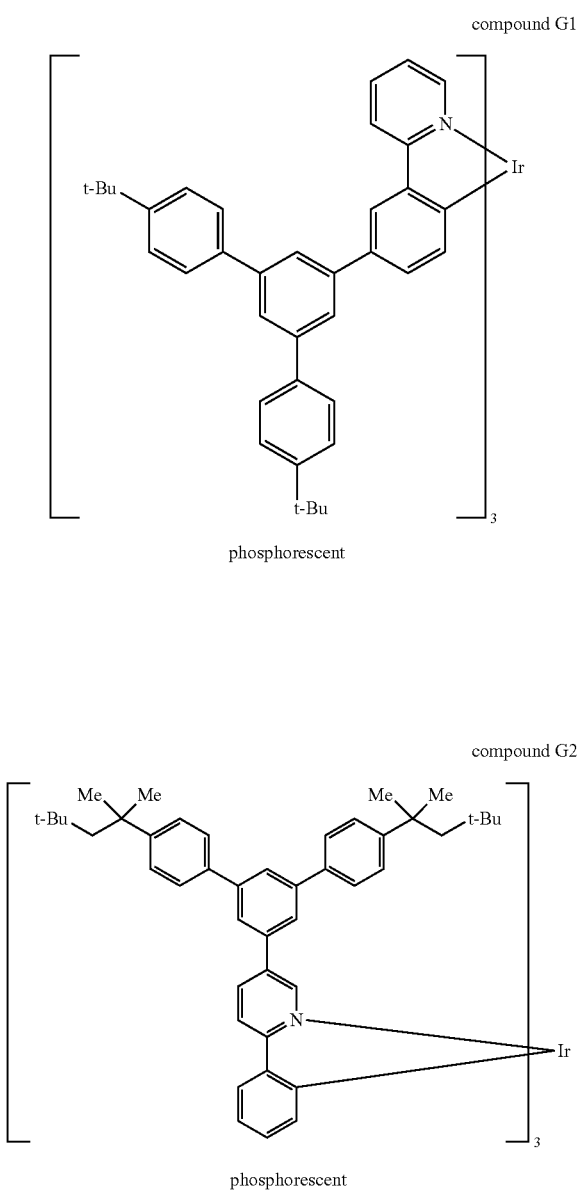

phosphorescent

<Synthesis Example R1> Synthesis of Phosphorescent Compounds R¹ and R²

A phosphorescent compound R1 was synthesized based on the method described in JP-A No. 2006-188673.

A phosphorescent compound R2 was synthesized according to the method described in JP-A No. 2008-179617.

[Chemical Formula 123]

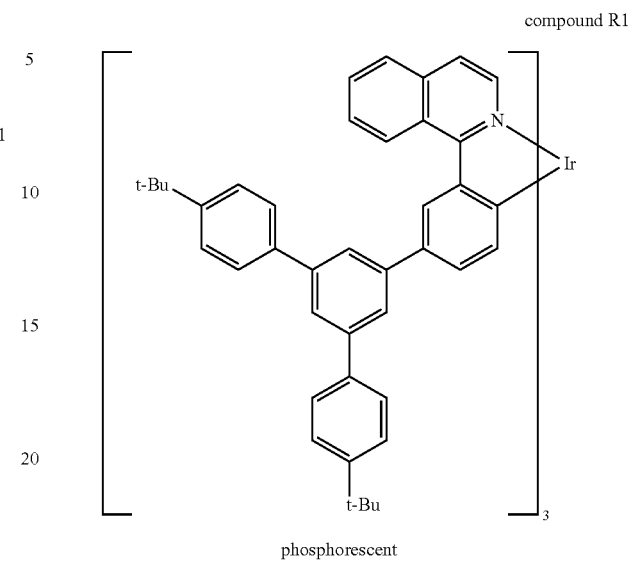

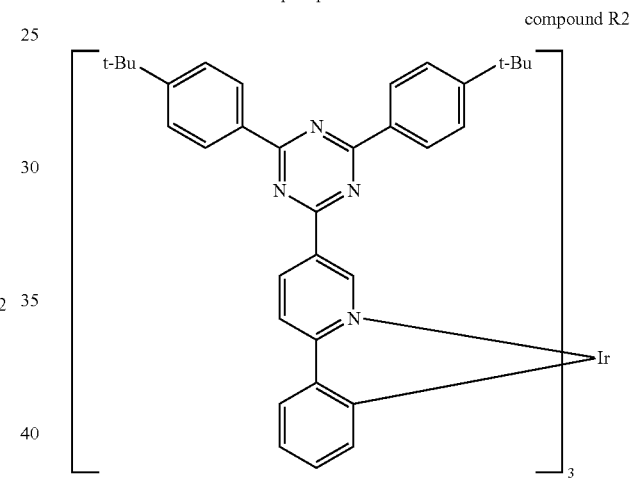

<Synthesis Example ETL1> Synthesis of Polymer Compound ETL-1

An inert gas atmosphere was prepared in a reaction vessel, then, the compound M4 (9.23 g), the compound M5 (4.58 g), dichlorobis(tris-o-methoxyphenylphosphine)palladium (8.6 mg), methyltrioctylammonium chloride (manufactured by Sigma Aldrich, trade name: Aliquat336 (registered trademark)) (0.098 g) and toluene (175 mL) were added, and the mixture was heated at 105° C. Thereafter, into this was dropped a 12% by mass sodium carbonate aqueous solution (40.3 mL), and the mixture was refluxed for 29 hours. Thereafter, to this were added phenylboronic acid (0.47 g) and dichlorobis(tris-o-methoxyphenylphosphine)palladium (8.7 mg), and the mixture was refluxed for 14 hours. Thereafter, to this was added a sodium diethyldithiacarbamate aqueous solution, and the mixture was stirred at 80° C. for 2 hours. The resultant reaction liquid was cooled, then, dropped into methanol, to generate a precipitate. The resultant precipitate was collected by filtration, and washed with methanol and water, respectively, then, dried. The resultant solid was dissolved in chloroform, and purified by passing through an alumina column and a silica gel column in series through which chloroform had been passed previously. The resultant purified liquid was dropped into methanol, and the mixture was stirred, to generate a precipitate. The resultant precipitate was collected by filtration, and dried, to obtain a polymer compound ETL-1a (7.15 g). The polymer compound ETL-1a had an Mn of $3.2\times10^4$ and an Mw of $6.0\times10^4$.

The polymer compound ETL-1a is a copolymer constituted of a constitutional unit derived from the compound M4 and a constitutional unit derived from the compound M5 at a molar ratio of 50:50 according to the theoretical values calculated from the amounts of the charged raw materials.

An argon gas atmosphere was prepared in a reaction vessel, then, the polymer compound ETL-1a (3.1 g), tetrahydrofuran (130 mL), methanol (66 mL), cesium hydroxide monohydrate (2.1 g) and water (12.5 mL) were added, and the mixture was stirred at 60° C. for 3 hours. Thereafter, to this was added methanol (220 mL), and the mixture was stirred for 2 hours. The resultant reaction mixture was concentrated, then, dropped into isopropyl alcohol, and stirred, to generate a precipitate. The resultant precipitate was collected by filtration, and dried, to obtain a polymer compound ETL-1 (3.5 g). The polymer compound ETL-1 was analyzed by $^1$H-NMR, to confirm that the signal at the ethyl ester portion in the polymer compound ETL-1 disappeared, and the reaction was completed.

The polymer compound ETL-1 is a copolymer constituted of a constitutional unit represented by the following formula and a constitutional unit derived from the compound M5 at a molar ratio of 50:50, according to the theoretical values calculated from the amounts of the charged raw materials of the polymer compound ETL-1a.

[Chemical Formula 124]

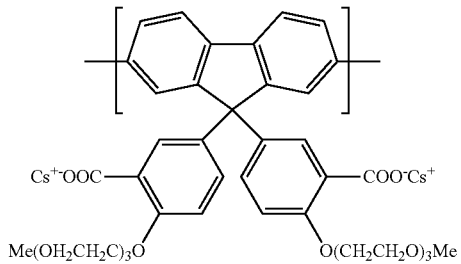

<Example D1> Fabrication and Evaluation of Light Emitting Device D1

(Formation of Anode and Hole Injection Layer)

An ITO film with a thickness of 45 nm was deposited on a glass substrate by a sputtering method, to form an anode. On the anode, a hole injection material ND-3202 (manufactured by Nissan Chemical Corporation) was spin-coated, to form a film with a thickness of 35 nm. In an air atmosphere, the film was heated on a hot plate at 50° C. for 3 minutes, and further, heated at 230° C. for 15 minutes, to form a hole injection layer.

(Formation of Second Organic Layer)

The polymer compound HTL-1 and the compound HM-3 (polymer compound HTL-1/compound HM-3=75% by mass/25% by mass) were dissolved in xylene at a concentration of 0.7% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer (hole transporting layer). By this heating, the polymer compound HTL-1 became a cross-linked body.

(Formation of First Organic Layer)

The compound HM-3 and the phosphorescent compound B1 (compound HM-3/phosphorescent compound B1=75% by mass/25% by mass) were dissolved at a concentration of 2.0% by mass in toluene. The resultant toluene solution was spin-coated on the second organic layer, to form a film with a thickness of 75 nm, and the film was heated at 130° C. for 10 minutes under a nitrogen gas atmosphere, to form a first organic layer (light emitting layer).

(Formation of Electron Transporting Layer)

The polymer compound ETL-1 was dissolved in 2,2,3,3,4,4,5,5-octafluoro-1-pentanol at a concentration of 0.25% by mass. The resultant 2,2,3,3,4,4,5,5-octafluoro-1-pentanol solution was spin-coated on the first organic layer, to form a film with a thickness of 10 nm, and the film was heated at 130° C. for 10 minutes under a nitrogen gas atmosphere, to form an electron transporting layer.

(Formation of Cathode)

The substrate carrying the electron transporting layer formed thereon was placed in a vapor deposition machine and the inner pressure thereof was reduced to $1.0\times10^{-4}$ Pa or less, then, as cathode, sodium fluoride was vapor-deposited with a thickness of about 4 nm on the electron transporting layer, then, aluminum was vapor-deposited with a thickness of about 80 nm on the sodium fluoride layer. After vapor deposition, sealing was performed with a glass substrate, to fabricate a light emitting device D1.

(Evaluation of Light Emitting Device)

Voltage was applied to the light emitting device D1, to observe EL light emission. The CIE chromaticity coordinate (x, y) at 1000 cd/m$^2$ was (0.19, 0.44). The light emitting device was driven under constant current at a current value of 1 mA, and the time until the luminance reached 85% of the initial luminance was measured.

<Example D2> Fabrication and Evaluation of Light Emitting Device D2

A light emitting device D2 was fabricated in the same manner as in Example D1, except that "the compound HM-1" was used instead of "the compound HM-3" in (Formation of second organic layer), and further, "the compound HM-1" was used instead of "the compound HM-3" in (Formation of first organic layer), in Example D1.

Voltage was applied to the light emitting device D2, to observe EL light emission. The CIE chromaticity coordinate (x, y) at 1000 cd/m$^2$ was (0.19, 0.43). The light emitting device was driven under constant current at a current value of 1 mA, and the time until the luminance reached 85% of the initial luminance was measured.

<Example D3> Fabrication and Evaluation of Light Emitting Device D3

A light emitting device D3 was fabricated in the same manner as in Example D1, except that "the compound HM-2" was used instead of "the compound HM-3" in (Formation of second organic layer), and further, "the compound HM-2" was used instead of "the compound HM-3" in (Formation of first organic layer), in Example D1.

Voltage was applied to the light emitting device D3, to observe EL light emission. The CIE chromaticity coordinate (x, y) at 1000 cd/m$^2$ was (0.19, 0.42). The light emitting device was driven under constant current at a current value

<Example D4> Fabrication and Evaluation of Light Emitting Device D4

A light emitting device D4 was fabricated in the same manner as in Example D1, except that "the compound HM-5" was used instead of "the compound HM-3" in (Formation of second organic layer), and further, "the compound HM-5" was used instead of "the compound HM-3" in (Formation of first organic layer), in Example D1.

Voltage was applied to the light emitting device D4, to observe EL light emission. The CIE chromaticity coordinate (x, y) at 1000 cd/m$^2$ was (0.19, 0.43). The light emitting device was driven under constant current at a current value of 1 mA, and the time until the luminance reached 85% of the initial luminance was measured.

<Example D5> Fabrication and Evaluation of Light Emitting Device D5

A light emitting device D5 was fabricated in the same manner as in Example D1, except that "the compound HM-7" was used instead of "the compound HM-3" in (Formation of second organic layer), and further, "the compound HM-2" was used instead of "the compound HM-3" in (Formation of first organic layer), in Example D1.

Voltage was applied to the light emitting device D5, to observe EL light emission. The CIE chromaticity coordinate (x, y) at 1000 cd/m$^2$ was (0.20, 0.45). The light emitting device was driven under constant current at a current value of 1 mA, and the time until the luminance reached 85% of the initial luminance was measured.

<Example D6> Fabrication and Evaluation of Light Emitting Device D6

A light emitting device D6 was fabricated in the same manner as in Example D1, except that "the compound HM-8" was used instead of "the compound HM-3" in (Formation of second organic layer), and further, "the compound HM-2" was used instead of "the compound HM-3" in (Formation of first organic layer), in Example D1.

Voltage was applied to the light emitting device D6, to observe EL light emission. The CIE chromaticity coordinate (x, y) at 1000 cd/m$^2$ was (0.22, 0.47). The light emitting device was driven under constant current at a current value of 1 mA, and the time until the luminance reached 85% of the initial luminance was measured.

<Example D7> Fabrication and Evaluation of Light Emitting Device D7

A light emitting device D7 was fabricated in the same manner as in Example D1, except that "the compound HM-9" was used instead of "the compound HM-3" in (Formation of second organic layer), and further, "the compound HM-2" was used instead of "the compound HM-3" in (Formation of first organic layer), in Example D1.

Voltage was applied to the light emitting device D7, to observe EL light emission. The CIE chromaticity coordinate (x, y) at 1000 cd/m$^2$ was (0.20, 0.43). The light emitting device was driven under constant current at a current value of 1 mA, and the time until the luminance reached 85% of the initial luminance was measured.

<Example D8> Fabrication and Evaluation of Light Emitting Device D8

A light emitting device D8 was fabricated in the same manner as in Example D1, except that "the compound HM-10" was used instead of "the compound HM-3" in (Formation of second organic layer), and further, "the compound HM-2" was used instead of "the compound HM-3" in (Formation of first organic layer), in Example D1.

Voltage was applied to the light emitting device D8, to observe EL light emission. The CIE chromaticity coordinate (x, y) at 1000 cd/m$^2$ was (0.22, 0.46). The light emitting device was driven under constant current at a current value of 1 mA, and the time until the luminance reached 85% of the initial luminance was measured.

<Comparative Example CD1> Fabrication and Evaluation of Light Emitting Device CD1

A light emitting device CD1 was fabricated in the same manner as in Example D1, except that "the polymer compound HTL-1 (polymer compound HTL-1=100% by mass)" was used instead of "the polymer compound HTL-1 and the compound HM-3 (polymer compound HTL-1/compound HM-3=75% by mass/25% by mass)" in (Formation of second organic layer), and further, "the compound HM-1" was used instead of "the compound HM-3" in (Formation of first organic layer), in Example D1.

Voltage was applied to the light emitting device CD1, to observe EL light emission. The CIE chromaticity coordinate (x, y) at 1000 cd/m$^2$ was (0.20, 0.46). The light emitting device was driven under constant current at a current value of 1 mA, and the time until the luminance reached 85% of the initial luminance was measured.

The results of Examples D1 to D9 and Comparative Example CD1 are shown in Table 2. The relative value of the time until the luminance of the light emitting devices D1 to D9 reached 85% of the initial luminance when the time until the luminance of the light emitting device CD1 reached 85% of the initial luminance was taken as 1.0 is shown.

TABLE 2

| | light emitting device | second organic layer | | | first organic layer | | luminance life (relative value) |
|---|---|---|---|---|---|---|---|
| | | | material | composition ratio (% by mass) | material | composition ratio (% by mass) | |
| Example D1 | D1 | hole transporting layer | HTL-1/HM-3 | 75/25 | HM-3/B1 | 75/25 | 12.2 |

TABLE 2-continued

| | light emitting device | second organic layer | | | first organic layer | | luminance life (relative value) |
| --- | --- | --- | --- | --- | --- | --- | --- |
| | | material | composition ratio (% by mass) | | material | composition ratio (% by mass) | |
| Example D2 | D2 | hole transporting layer | HTL-1/HM-1 | 75/25 | HM-1/B1 | 75/25 | 7.0 |
| Example D3 | D3 | hole transporting layer | HTL-1/HM-2 | 75/25 | HM-2/B1 | 75/25 | 11.0 |
| Example D4 | D4 | hole transporting layer | HTL-1/HM-5 | 75/25 | HM-5/B1 | 75/25 | 15.4 |
| Example D5 | D5 | hole transporting layer | HTL-1/HM-7 | 75/25 | HM-2/B1 | 75/25 | 11.2 |
| Example D6 | D6 | hole transporting layer | HTL-1/HM-8 | 75/25 | HM-2/B1 | 75/25 | 11.5 |
| Example D7 | D7 | hole transporting layer | HTL-1/HM-9 | 75/25 | HM-2/B1 | 75/25 | 11.6 |
| Example D8 | D8 | hole transporting layer | HTL-1/HM-10 | 75/25 | HM-2/B1 | 75/25 | 14.9 |
| Comparative Example CD1 | CD1 | hole transporting layer | HTL-1 | 100 | HM-1/B1 | 75/25 | 1.0 |

<Example D11> Fabrication and Evaluation of Light Emitting Device D11

(Formation of Anode and Hole Injection Layer)

An ITO film with a thickness of 45 nm was deposited on a glass substrate by a sputtering method, to form an anode. On the anode, a hole injection material ND-3202 (manufactured by Nissan Chemical Corporation) was spin-coated, to form a film with a thickness of 35 nm. In an air atmosphere, the film was heated on a hot plate at 50° C. for 3 minutes, and further, heated at 230° C. for 15 minutes, to form a hole injection layer.

(Formation of Second Organic Layer)

The polymer compound HTL-2 and the compound HM-3 (polymer compound HTL-2/compound HM-3=75% by mass/25% by mass) were dissolved in xylene at a concentration of 0.7% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer (second light emitting layer). By this heating, the polymer compound HTL-2 became a cross-linked body.

(Formation of First Organic Layer)

The compound HM-3 and the phosphorescent compound B1 (compound HM-3/phosphorescent compound B1=75% by mass/25% by mass) were dissolved at a concentration of 2.0% by mass in toluene. The resultant toluene solution was spin-coated on the second organic layer, to form a film with a thickness of 75 nm, and the film was heated at 130° C. for 10 minutes under a nitrogen gas atmosphere, to form a first organic layer (first light emitting layer).

(Formation of Electron Transporting Layer)

The polymer compound ETL-1 was dissolved in 2,2,3,3,4,4,5,5-octafluoro-1-pentanol at a concentration of 0.25% by mass. The resultant 2,2,3,3,4,4,5,5-octafluoro-1-pentanol solution was spin-coated on the first organic layer, to form a film with a thickness of 10 nm, and the film was heated at 130° C. for 10 minutes under a nitrogen gas atmosphere, to form an electron transporting layer.

(Formation of Cathode)

The substrate carrying the electron transporting layer formed thereon was placed in a vapor deposition machine and the inner pressure thereof was reduced to $1.0 \times 10^{-4}$ Pa or less, then, as cathode, sodium fluoride was vapor-deposited with a thickness of about 4 nm on the electron transporting layer, then, aluminum was vapor-deposited with a thickness of about 80 nm on the sodium fluoride layer. After vapor deposition, sealing was performed with a glass substrate, to fabricate a light emitting device D11.

(Evaluation of Light Emitting Device)

Voltage was applied to the light emitting device D11, to observe EL light emission. The CIE chromaticity coordinate (x, y) at 1000 cd/m² was (0.46, 0.41). The light emitting device was driven under constant current at a current value of 1 mA, and the time until the luminance reached 95% of the initial luminance was measured.

<Example D12> Fabrication and Evaluation of Light Emitting Device D12

A light emitting device D12 was fabricated in the same manner as in Example D11, except that "the compound HM-1" was used instead of "the compound HM-3" in (Formation of second organic layer), and further, "the compound HM-1" was used instead of "the compound HM-3" in (Formation of first organic layer), in Example D11.

Voltage was applied to the light emitting device D12, to observe EL light emission. The CIE chromaticity coordinate (x, y) at 1000 cd/m² was (0.46, 0.41). The light emitting device was driven under constant current at a current value of 1 mA, and the time until the luminance reached 95% of the initial luminance was measured.

<Example D13> Fabrication and Evaluation of Light Emitting Device D13

A light emitting device D13 was fabricated in the same manner as in Example D11, except that "the compound HM-1" was used instead of "the compound HM-3" in (Formation of second organic layer), and further, "the compound HM-1, the phosphorescent compound B1 and the phosphorescent compound G1 (compound HM-1/phosphorescent compound B1/phosphorescent compound G1=74% by mass/25% by mass/1% by mass)" were used instead of "the compound HM-3 and the phosphorescent compound B1 (compound HM-3/phosphorescent compound B1=75% by mass/25% by mass)" in (Formation of first organic layer), in Example D11.

Voltage was applied to the light emitting device D13, to observe EL light emission. The CIE chromaticity coordinate (x, y) at 1000 cd/m² was (0.47, 0.45). The light emitting device was driven under constant current at a current value of 1 mA, and the time until the luminance reached 95% of the initial luminance was measured.

<Comparative Example CD2> Fabrication and Evaluation of Light Emitting Device CD2

A light emitting device CD2 was fabricated in the same manner as in Example D11, except that "the polymer compound HTL-2 (polymer compound HTL-2=100% by mass)" was used instead of "the polymer compound HTL-2 and the compound HM-3 (polymer compound HTL-2/compound HM-3=75% by mass/25% by mass)" in (Formation of second organic layer), and further, "the compound HM-1" was used instead of "the compound HM-3" in (Formation of first organic layer), in Example D11.

Voltage was applied to the light emitting device CD2, to observe EL light emission. The CIE chromaticity coordinate (x, y) at 1000 cd/m² was (0.45, 0.41). The light emitting device was driven under constant current at a current value of 1 mA, and the time until the luminance reached 95% of the initial luminance was measured.

The results of Examples D11 to D13 and Comparative Example CD2 are shown in Table 3. The relative value of the time until the luminance of the light emitting devices D11 to D13 reached 95% of the initial luminance when the time until the luminance of the light emitting device CD2 reached 95% of the initial luminance was taken as 1.0 is shown.

<Example D14> Fabrication and Evaluation of Light Emitting Device D14

A light emitting device D14 was fabricated in the same manner as in Example D11, except that "the compound HM-2" was used instead of "the compound HM-3" in (Formation of second organic layer), and further, "the compound HM-2" was used instead of "the compound HM-3" in (Formation of first organic layer), in Example D11.

Voltage was applied to the light emitting device D14, to observe EL light emission. The CIE chromaticity coordinate (x, y) at 1000 cd/m² was (0.47, 0.40). The light emitting device was driven under constant current at a current value of 1 mA, and the time until the luminance reached 70% of the initial luminance was measured.

<Example D15> Fabrication and Evaluation of Light Emitting Device D15

A light emitting device D15 was fabricated in the same manner as in Example D11, except that "the compound HM-4" was used instead of "the compound HM-3" in (Formation of second organic layer), and further, "the compound HM-4" was used instead of "the compound HM-3" in (Formation of first organic layer), in Example D11.

Voltage was applied to the light emitting device D15, to observe EL light emission. The CIE chromaticity coordinate (x, y) at 1000 cd/m² was (0.32, 0.40). The light emitting device was driven under constant current at a current value of 1 mA, and the time until the luminance reached 70% of the initial luminance was measured.

<Example D16> Fabrication and Evaluation of Light Emitting Device D16

A light emitting device D16 was fabricated in the same manner as in Example D11, except that "the compound HM-4" was used instead of "the compound HM-3" in (Formation of second organic layer), and further, "the compound HM-2" was used instead of "the compound HM-3" in (Formation of first organic layer), in Example D11.

Voltage was applied to the light emitting device D16, to observe EL light emission. The CIE chromaticity coordinate (x, y) at 1000 cd/m² was (0.48, 0.41). The light emitting

TABLE 3

| | light emitting device | second organic layer | | | first organic layer | | luminance life (relative value) |
|---|---|---|---|---|---|---|---|
| | | | material | composition ratio (% by mass) | material | composition ratio (% by mass) | |
| Example D11 | D11 | second light emitting layer | HTL-2/HM-3 | 75/25 | HM-3/B1 | 75/25 | 1.3 |
| Example D12 | D12 | second light emitting layer | HTL-2/HM-1 | 75/25 | HM-1/B1 | 75/25 | 1.2 |
| Example D13 | D13 | second light emitting layer | HTL-2/HM-1 | 75/25 | HM-1/B1/G1 | 74/25/1 | 1.6 |
| Comparative Example CD2 | CD2 | second light emitting layer | HTL-2 | 100 | HM-1/B1 | 75/25 | 1.0 |

<Example D17> Fabrication and Evaluation of Light Emitting Device D17

A light emitting device D17 was fabricated in the same manner as in Example D11, except that "the compound HM-5" was used instead of "the compound HM-3" in (Formation of second organic layer), and further, "the compound HM-5" was used instead of "the compound HM-3" in (Formation of first organic layer), in Example D11.

Voltage was applied to the light emitting device D17, to observe EL light emission. The CIE chromaticity coordinate (x, y) at 1000 cd/m$^2$ was (0.47, 0.40). The light emitting device was driven under constant current at a current value of 1 mA, and the time until the luminance reached 70% of the initial luminance was measured.

<Example D18> Fabrication and Evaluation of Light Emitting Device D18

A light emitting device D18 was fabricated in the same manner as in Example D11, except that "the compound HM-6" was used instead of "the compound HM-3" in (Formation of second organic layer), and further, "the compound HM-6" was used instead of "the compound HM-3" in (Formation of first organic layer), in Example D11.

Voltage was applied to the light emitting device D18, to observe EL light emission. The CIE chromaticity coordinate (x, y) at 1000 cd/m$^2$ was (0.48, 0.40). The light emitting device was driven under constant current at a current value of 1 mA, and the time until the luminance reached 70% of the initial luminance was measured.

<Example D19> Fabrication and Evaluation of Light Emitting Device D19

A light emitting device D19 was fabricated in the same manner as in Example D11, except that "the compound HM-7" was used instead of "the compound HM-3" in (Formation of second organic layer), and further, "the compound HM-2" was used instead of "the compound HM-3" in (Formation of first organic layer), in Example D11.

Voltage was applied to the light emitting device D19, to observe EL light emission. The CIE chromaticity coordinate (x, y) at 1000 cd/m$^2$ was (0.48, 0.40). The light emitting device was driven under constant current at a current value of 1 mA, and the time until the luminance reached 70% of the initial luminance was measured.

<Example D20> Fabrication and Evaluation of Light Emitting Device D20

A light emitting device D20 was fabricated in the same manner as in Example D11, except that "the compound HM-8" was used instead of "the compound HM-3" in (Formation of second organic layer), and further, "the compound HM-2" was used instead of "the compound HM-3 in (Formation of first organic layer), in Example D11.

Voltage was applied to the light emitting device D20, to observe EL light emission. The CIE chromaticity coordinate (x, y) at 1000 cd/m$^2$ was (0.49, 0.40). The light emitting device was driven under constant current at a current value of 1 mA, and the time until the luminance reached 70% of the initial luminance was measured.

<Example D21> Fabrication and Evaluation of Light Emitting Device D21

A light emitting device D21 was fabricated in the same manner as in Example D11, except that "the compound HM-9" was used instead of "the compound HM-3" in (Formation of second organic layer), and further, "the compound HM-2" was used instead of "the compound HM-3" in (Formation of first organic layer), in Example D11.

Voltage was applied to the light emitting device D21, to observe EL light emission. The CIE chromaticity coordinate (x, y) at 1000 cd/m$^2$ was (0.49, 0.41). The light emitting device was driven under constant current at a current value of 1 mA, and the time until the luminance reached 70% of the initial luminance was measured.

<Example D22> Fabrication and Evaluation of Light Emitting Device D22

A light emitting device D22 was fabricated in the same manner as in Example D11, except that "the compound HM-10" was used instead of "the compound HM-3" in (Formation of second organic layer), and further, "the compound HM-2" was used instead of "the compound HM-3" in (Formation of first organic layer), in Example D11.

Voltage was applied to the light emitting device D22, to observe EL light emission. The CIE chromaticity coordinate (x, y) at 1000 cd/m$^2$ was (0.49, 0.41). The light emitting device was driven under constant current at a current value of 1 mA, and the time until the luminance reached 70% of the initial luminance was measured.

<Example D23> Fabrication and Evaluation of Light Emitting Device D23

A light emitting device D23 was fabricated in the same manner as in Example D11, except that "the compound HM-11" was used instead of "the compound HM-3" in (Formation of second organic layer), and further, "the compound HM-2" was used instead of "the compound HM-3" in (Formation of first organic layer), in Example D11.

Voltage was applied to the light emitting device D23, to observe EL light emission. The CIE chromaticity coordinate (x, y) at 1000 cd/m$^2$ was (0.49, 0.40). The light emitting device was driven under constant current at a current value of 1 mA, and the time until the luminance reached 70% of the initial luminance was measured.

<Example D24> Fabrication and Evaluation of Light Emitting Device D24

A light emitting device D23 was fabricated in the same manner as in Example D11, except that "the compound HM-12" was used instead of "the compound HM-3" in (Formation of second organic layer), and further, "the compound HM-2" was used instead of "the compound HM-3" in (Formation of first organic layer), in Example D11.

Voltage was applied to the light emitting device D23, to observe EL light emission. The CIE chromaticity coordinate (x, y) at 1000 cd/m$^2$ was (0.48, 0.40). The light emitting device was driven under constant current at a current value of 1 mA, and the time until the luminance reached 70% of the initial luminance was measured.

<Comparative Example CD3> Fabrication and Evaluation of Light Emitting Device CD3

A light emitting device CD3 was fabricated in the same manner as in Example D11, except that "the polymer compound HTL-2 (polymer compound HTL-2=100% by mass)" was used instead of "the polymer compound HTL-2 and the compound HM-3 (polymer compound HTL-2/compound HM-3=75% by mass/25% by mass)" in (Formation of second organic layer), and further, "the compound HM-4" was used instead of "the compound HM-3" in (Formation of first organic layer), in Example D11. Voltage was applied to the light emitting device CD3, to observe EL light emission. The CIE chromaticity coordinate (x, y) at 1000 cd/m$^2$ was (0.32, 0.40). The light emitting device was driven under constant current at a current value of 1 mA, and the time until the luminance reached 70% of the initial luminance was measured.

The results of Examples D14 to D24 and Comparative Example CD3 are shown in Table 5. The relative value of the time until the luminance of the light emitting devices D14 to D24 reached 70% of the initial luminance when the time until the luminance of the light emitting device CD3 reached 70% of the initial luminance was taken as 1.0 is shown.

<Example D25> Fabrication and Evaluation of Light Emitting Device D25

A light emitting device D25 was fabricated in the same manner as in Example D1, except that "the compound HM-4" was used instead of "the compound HM-3" in (Formation of second organic layer), and further, "the compound HM-4" was used instead of "the compound HM-3" in (Formation of first organic layer), in Example D1.

Voltage was applied to the light emitting device D25, to observe EL light emission. The CIE chromaticity coordinate (x, y) at 1000 cd/m$^2$ was (0.18, 0.40). The light emitting device was driven under constant current at a current value of 1 mA, and the time until the luminance reached 70% of the initial luminance was measured.

<Example D26> Fabrication and Evaluation of Light Emitting Device D26

A light emitting device D26 was fabricated in the same manner as in Example D1, except that "the compound HM-4" was used instead of "the compound HM-3" in (Formation of second organic layer), and further, "the compound HM-2" was used instead of "the compound HM-3" in (Formation of first organic layer), in Example D1.

Voltage was applied to the light emitting device D26, to observe EL light emission. The CIE chromaticity coordinate (x, y) at 1000 cd/m$^2$ was (0.20, 0.44). The light emitting

TABLE 4

| | light emitting device | second organic layer | | | first organic layer | | luminance life (relative value) |
|---|---|---|---|---|---|---|---|
| | | | material | composition ratio (% by mass) | material | composition ratio (% by mass) | |
| Example D14 | D14 | second light emitting layer | HTL-2/HM-2 | 75/25 | HM-2/B1 | 75/25 | 20.6 |
| Example D15 | D15 | second light emitting layer | HTL-2/HM-4 | 75/25 | HM-4/B1 | 75/25 | 1.5 |
| Example D16 | D16 | second light emitting layer | HTL-2/HM-4 | 75/25 | HM-2/B1 | 75/25 | 26.7 |
| Example D17 | D17 | second light emitting layer | HTL-2/HM-5 | 75/25 | HM-5/B1 | 75/25 | 12.5 |
| Example D18 | D18 | second light emitting layer | HTL-2/HM-6 | 75/25 | HM-6/B1 | 75/25 | 36.2 |
| Example D19 | D19 | second light emitting layer | HTL-2/HM-7 | 75/25 | HM-2/B1 | 75/25 | 27.1 |
| Example D20 | D20 | second light emitting layer | HTL-2/HM-8 | 75/25 | HM-2/B1 | 75/25 | 32.2 |
| Example D21 | D21 | second light emitting layer | HTL-2/HM-9 | 75/25 | HM-2/B1 | 75/25 | 26.0 |
| Example D22 | D22 | second light emitting layer | HTL-2/HM-10 | 75/25 | HM-2/B1 | 75/25 | 19.7 |
| Example D23 | D23 | second light emitting layer | HTL-2/HM-11 | 75/25 | HM-2/B1 | 75/25 | 32.4 |
| Example D24 | D24 | second light emitting layer | HTL-2/HM-12 | 75/25 | HM-2/B1 | 75/25 | 28.4 |
| Comparative Example CD3 | CD3 | second light emitting layer | HTL-2 | 100 | HM-4/B1 | 75/25 | 1.0 | device was driven under constant current at a current value of 1 mA, and the time until the luminance reached 70% of the initial luminance was measured.

<Comparative Example CD4> Fabrication and Evaluation of Light Emitting Device CD4

A light emitting device CD4 was fabricated in the same manner as in Example D1, except that "the polymer compound HTL-1 (polymer compound HTL-1=100% by mass)" was used instead of "the polymer compound HTL-1 and the compound HM-3 (polymer compound HTL-1/compound HM-3=75% by mass/25% by mass)" in (Formation of second organic layer), and further, "the compound HM-4" was used instead of "the compound HM-3" in (Formation of first organic layer), in Example D1.

Voltage was applied to the light emitting device CD4, to observe EL light emission. The CIE chromaticity coordinate (x, y) at 1000 cd/m$^2$ was (0.21, 0.47). The light emitting device was driven under constant current at a current value of 1 mA, and the time until the luminance reached 70% of the initial luminance was measured.

The results of Example D25, Example D26 and Comparative Example CD4 are shown in Table 5. The relative value of the time until the luminance of the light emitting devices D25 and D26 reached 70% of the initial luminance when the time until the luminance of the light emitting device CD4 reached 70% of the initial luminance was taken as 1.0 is shown.

the phosphorescent compound B1 (compound HM-3/phosphorescent compound B1=75% by mass/25% by mass)" in (Formation of first organic layer), in Example D1.

Voltage was applied to the light emitting device D27, to observe EL light emission. The CIE chromaticity coordinate (x, y) at 1000 cd/m$^2$ was (0.35, 0.50). The light emitting device was driven under constant current at a current value of 1 mA, and the time until the luminance reached 95% of the initial luminance was measured.

<Comparative Example CD5> Fabrication and Evaluation of Light Emitting Device CD5

A light emitting device CD5 was fabricated in the same manner as in Example D1, except that "the polymer compound HTL-1 (polymer compound HTL-1=100% by mass)" was used instead of "the polymer compound HTL-1 and the compound HM-3 (polymer compound HTL-1/compound HM-3=75% by mass/25% by mass)" in (Formation of second organic layer), and further, "the compound HM-1, the phosphorescent compound B1, the phosphorescent compound G1 and the phosphorescent compound R1 (compound HM-1/phosphorescent compound B1/phosphorescent compound G1/phosphorescent compound R1=73.9% by mass/25% by mass/1% by mass/0.1% by mass)" were used instead of "the compound HM-3 and the phosphorescent compound B1 (compound HM-3/phosphorescent compound B1=75% by mass/25% by mass)" in (Formation of first organic layer), in Example D1.

TABLE 5

|  |  | second organic layer | | first organic layer | | luminance |
| --- | --- | --- | --- | --- | --- | --- |
|  | light emitting device | material | composition ratio (% by mass) | material | composition ratio (% by mass) | life (relative value) |
| Example D25 | D25 | hole transporting layer | HTL-1/HM-4 | 75/25 | HM-4/B1 | 75/25 | 3.7 |
| Example D26 | D26 | hole transporting layer | HTL-1/HM-4 | 75/25 | HM-2/B1 | 75/25 | 51.9 |
| Comparative Example CD4 | CD4 | hole transporting layer | HTL-1 | 100 | HM-4/B1 | 75/25 | 1.0 |

<Example D27> Fabrication and Evaluation of Light Emitting Device D27

A light emitting device D27 was fabricated in the same manner as in Example D1, except that "the compound HM-1" was used instead of "the compound HM-3" in (Formation of second organic layer), and further, "the compound HM-1, the phosphorescent compound B1, the phosphorescent compound G1 and the phosphorescent compound R1 (compound HM-1/phosphorescent compound B1/phosphorescent compound G1/phosphorescent compound R1=73.9% by mass/25% by mass/1% by mass/0.1% by mass)" were used instead of "the compound HM-3 and Voltage was applied to the light emitting device CD5, to observe EL light emission. The CIE chromaticity coordinate (x, y) at 1000 cd/m$^2$ was (0.35, 0.49). The light emitting device was driven under constant current at a current value of 1 mA, and the time until the luminance reached 95% of the initial luminance was measured.

The results of Example D27 and Comparative Example CD5 are shown in Table 6. The relative value of the time until the luminance of the light emitting device D27 reached 95% of the initial luminance when the time until the luminance of the light emitting device CD5 reached 95% of the initial luminance was taken as 1.0 is shown.

TABLE 6

| | light emitting device | second organic layer | | | first organic layer | | luminance life (relative value) |
|---|---|---|---|---|---|---|---|
| | | material | composition ratio (% by mass) | | material | composition ratio (% by mass) | |
| Example D27 | D97 | hole transporting layer | HTL-1/HM-1 | 75/25 | HM-1/B1/G1/R1 | 73.9/25/1/0.1 | 1.4 |
| Comparative Example CD5 | CD5 | hole transporting layer | HTL-1 | 100 | HM-1/B1/G1/R1 | 73.9/25/1/0.1 | 1.0 |

<Example D28> Fabrication and Evaluation of Light Emitting Device D28

A light emitting device D28 was fabricated in the same manner as in Example D1, except that "the compound HM-1" was used instead of "the compound HM-3" in (Formation of second organic layer), and further, "the compound HM-1, the phosphorescent compound B3, the phosphorescent compound G2 and the phosphorescent compound R2 (compound HM-1/phosphorescent compound B3/phosphorescent compound G2/phosphorescent compound R2=62.05% by mass/37.5% by mass/0.25% by mass/0.2% by mass)" were used instead of "the compound HM-3 and the phosphorescent compound B1 (compound HM-3/phosphorescent compound B1=75% by mass/25% by mass)" in (Formation of first organic layer), in Example D1.

Voltage was applied to the light emitting device D28, to observe EL light emission. The CIE chromaticity coordinate (x, y) at 1000 cd/m$^2$ was (0.34, 0.37). The light emitting device was driven under constant current at a current value of 1 mA, and the time until the luminance reached 90% of the initial luminance was measured.

<Comparative Example CD6> Fabrication and Evaluation of Light Emitting Device CD6

A light emitting device CD6 was fabricated in the same manner as in Example D1, except that "the polymer compound HTL-1 (polymer compound HTL-1=100% by mass)" was used instead of "the polymer compound HTL-1 and the compound HM-3 (polymer compound HTL-1/compound HM-3=75% by mass/25% by mass)" in (Formation of second organic layer), and further, "the compound HM-1, the phosphorescent compound B3, the phosphorescent compound G2 and the phosphorescent compound R2 (compound HM-1/phosphorescent compound B3/phosphorescent compound G2/phosphorescent compound R2=62.05% by mass/37.5% by mass/0.25% by mass/0.2% by mass)" were used instead of "the compound HM-3 and the phosphorescent compound B1 (compound HM-3/phosphorescent compound B1=75% by mass/25% by mass)" in (Formation of first organic layer), in Example D1.

Voltage was applied to the light emitting device CD6, to observe EL light emission. The CIE chromaticity coordinate (x, y) at 1000 cd/m$^2$ was (0.34, 0.38). The light emitting device was driven under constant current at a current value of 1 mA, and the time until the luminance reached 90% of the initial luminance was measured.

The results of Example D28 and Comparative Example CD6 are shown in Table 7. The relative value of the time until the luminance of the light emitting device D28 reached 90% of the initial luminance when the time until the luminance of the light emitting device CD6 reached 90% of the initial luminance was taken as 1.0 is shown.

TABLE 7

| | light emitting device | second organic layer | | | first organic layer | | luminance life (relative value) |
|---|---|---|---|---|---|---|---|
| | | material | composition ratio (% by mass) | | material | composition ratio (% by mass) | |
| Example D28 | D28 | hole transporting layer | HTL-1/HM-1 | 75/25 | HM-1/B3/G2/R2 | 62.05/37.5/0.25/0.2 | 1.2 |
| Comparative Example CD6 | CD6 | hole transporting layer | HTL-1 | 100 | HM-1/B3/G2/R2 | 62.05/37.5/0.25/0.2 | 1.0 |

<Example D29> Fabrication and Evaluation of Light Emitting Device D29

A light emitting device D29 was fabricated in the same manner as in Example D1, except that (Formation of second organic layer: -D29) described below was applied instead of (Formation of second organic layer), and further, "the compound HM-1 and the phosphorescent compound B2 (compound HM-1/phosphorescent compound B2=75% by mass/25% by mass)" were used instead of "the compound HM-3 and the phosphorescent compound B1 (compound HM-3/phosphorescent compound B1=75% by mass/25% by mass)" in (Formation of first organic layer), in Example D1.
(Formation of Second Organic Layer: -D29)

The compound HTL-M1 and the compound HM-1 (compound HTL-M1/compound HM-1=75% by mass/25% by mass) were dissolved in xylene at a concentration of 0.7% by mass. The resultant xylene solution was spin-coated on the hole injection layer to form a film with a thickness of 20 nm, and the film was heated on a hot plate at 180° C. for 60 minutes under a nitrogen gas atmosphere, to form a second organic layer (hole transporting layer). By this heating, the compound HTL-M1 became a cross-linked body.

Voltage was applied to the light emitting device D29, to observe EL light emission. The CIE chromaticity coordinate (x, y) at 1000 cd/m² was (0.21, 0.45). The light emitting device was driven under constant current at a current value of 1 mA, and the time until the luminance reached 60% of the initial luminance was measured.

<Comparative Example CD7> Fabrication and Evaluation of Light Emitting Device CD7

A light emitting device CD7 was fabricated in the same manner as in Example D29, except that "the compound HTL-M1 (compound HTL-M1=100% by mass)" was used instead of "the compound HTL-M1 and the compound HM-1 (compound HTL-M1/compound HM-1=75% by mass/25% by mass)" in (Formation of second organic layer: -D29), in Example D29.

Voltage was applied to the light emitting device CD7, to observe EL light emission. The CIE chromaticity coordinate (x, y) at 1000 cd/m² was (0.22, 0.47). The light emitting device was driven under constant current at a current value of 1 mA, and the time until the luminance reached 60% of the initial luminance was measured.

The results of Example D29 and Comparative Example CD7 are shown in Table 8. The relative value of the time until the luminance of the light emitting device D29 reached 60% of the initial luminance when the time until the luminance of the light emitting device CD7 reached 60% of the initial luminance was taken as 1.0 is shown.

TABLE 8

|  | light emitting device | second organic layer | | first organic layer | | luminance life (relative value) |
|---|---|---|---|---|---|---|
|  |  | material | composition ratio (% by mass) | material | composition ratio (% by mass) |  |
| Example D29 | D29 | hole transporting layer | HTL-M1/HM-1 | 75/25 | HM-1/B2 | 75/25 | 2.8 |
| Comparative Example CD7 | CD7 | hole transporting layer | HTL-M1 | 100 | HM-1/B2 | 75/25 | 1.0 |

<Example D30> Fabrication and Evaluation of Light Emitting Device D30

A light emitting device D30 was fabricated in the same manner as in Example D29, except that "phosphorescent compound B1" was used instead of "phosphorescent compound B2" in (Formation of first organic layer), in Example D29.

Voltage was applied to the light emitting device D30, to observe EL light emission. The CIE chromaticity coordinate (x, y) at 1000 cd/m² was (0.21, 0.46). The light emitting device was driven under constant current at a current value of 1 mA, and the time until the luminance reached 95% of the initial luminance was measured.

<Comparative Example CD8> Fabrication and Evaluation of Light Emitting Device CD8

A light emitting device CD8 was fabricated in the same manner as in Example D29, except that "the compound HTL-M1 (compound HTL-M1=100% by mass)" was used instead of "the compound HTL-M1 and the compound HM-1 (compound HTL-M1/compound HM-1=75% by mass/25% by mass)" in (Formation of second organic layer: -D29), and further, "phosphorescent compound B1" was used instead of "phosphorescent compound B2" in (Formation of first organic layer), in Example D29.

Voltage was applied to the light emitting device CD8, to observe EL light emission. The CIE chromaticity coordinate (x, y) at 1000 cd/m² was (0.21, 0.47). The light emitting device was driven under constant current at a current value of 1 mA, and the time until the luminance reached 95% of the initial luminance was measured.

TABLE 9

| light emitting device | | second organic layer | | first organic layer | | luminance life (relative value) |
|---|---|---|---|---|---|---|
| | | material | composition ratio (% by mass) | material | composition ratio by mass) | |
| Example D30 | D30 | hole transporting layer | HTL-M1/HM-1 | 75/25 | HM-1/B1 | 75/25 | 2.8 |
| Comparative Example CD8 | CD8 | hole transporting layer | HTL-M1 | 100 | HM-1/B1 | 75/25 | 1.0 |

INDUSTRIAL APPLICABILITY

According to the present invention, a light emitting device excellent in luminance life can be provided.

The invention claimed is:

1. A light emitting device comprising
an anode,
a cathode,
a first organic layer disposed between the anode and the cathode, and
a second organic layer disposed between the anode and the cathode, wherein
the first organic layer contains a compound represented by the formula (C-1), and
the second organic layer is a hole-transporting layer and contains a compound represented by the formula (C-1) and a cross-linked body of a crosslinkable material:

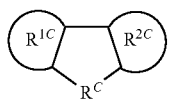

(C-1)

wherein,
Ring $R^{1C}$ and Ring $R^{2C}$ each independently represent an aromatic hydrocarbon ring or an aromatic hetero ring, and the foregoing rings optionally have a substituent, and when a plurality of the substituents are present, they may be combined together to form a ring together with atoms to which they are attached,
$R^C$ represents an oxygen atom, a sulfur atom or a group represented by the formula (C'-1),

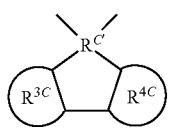

(C'-1)

wherein,
Ring $R^{3C}$ and Ring $R^{4C}$ each independently represent an aromatic hydrocarbon ring or an aromatic hetero ring, and the foregoing rings optionally have a substituent, and when a plurality of the substituents are present, they may be combined together to form a ring together with atoms to which they are attached, and
$R^{C'}$ represents a carbon atom, a silicon atom, a germanium atom, a tin atom or a lead atom.

2. The light emitting device according to claim 1, wherein at least one of said compound represented by the formula (C-1) contained in said first organic layer and said compound represented by the formula (C-1) contained in said second organic layer is a compound represented by the formula (C-2-1) or a compound represented by the formula (C-2-2):

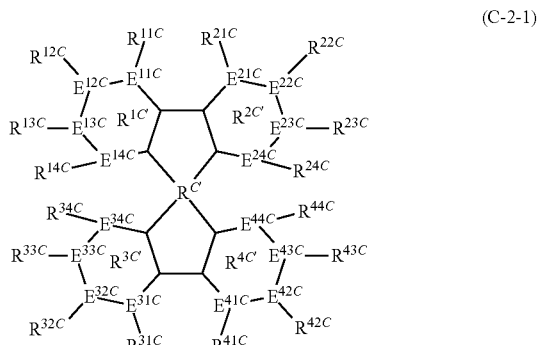

(C-2-1)

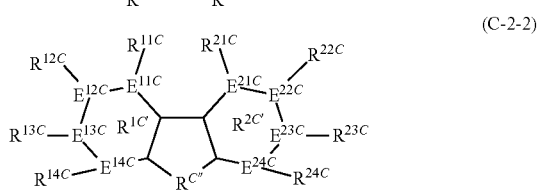

(C-2-2)

wherein,
$R^{C'}$ represents the same meaning as described above,
$R^{C''}$ represents an oxygen atom or a sulfur atom,
$E^{11C}$, $E^{12C}$, $E^{13C}$, $E^{14C}$, $E^{21C}$, $E^{22C}$, $E^{23C}$, $E^{24C}$, $E^{31C}$, $E^{32C}$, $E^{33C}$, $E^{34C}$, $E^{41C}$, $E^{42C}$, $E^{43C}$ and $E^{44C}$ each independently represent a nitrogen atom or a carbon atom,
Ring $R^{1C'}$, Ring $R^{2C'}$, Ring $R^{3C'}$ and Ring $R^{4C'}$ each independently represent a benzene ring, a pyridine ring or a diazabenzene ring,
$R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$ and $R^{44C}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and
when $E^{11C}$ is a nitrogen atom, $R^{11C}$ is absent, when $E^{12C}$ is a nitrogen atom, $R^{12C}$ is absent, when $E^{13C}$ is a nitrogen atom, $R^{13C}$ is absent, when $E^{14C}$ is a nitrogen atom, $R^{14C}$ is absent, when $E^{21C}$ is a nitrogen atom, $R^{21C}$ is absent, when $E^{22C}$ is a nitrogen atom, $R^{22C}$ is absent, when $E^{23C}$ is a nitrogen atom, $R^{23C}$ is absent, when $E^{24C}$ is a nitrogen atom, $R^{24C}$ is absent, when $E^{31C}$ is a nitrogen atom, $R^{31C}$ is absent, when $E^{32C}$ is a nitrogen atom, $R^{32C}$ is absent, when $E^{33C}$ is a nitrogen atom, $R^{33C}$ is absent, when $E^{34C}$ is a nitrogen atom, $R^{34C}$ is absent, when $E^{41C}$ is a nitrogen atom, $R^{41C}$ is absent, when $E^{42C}$ is a nitrogen atom, $R^{42C}$ is absent, when $E^{43C}$ is a nitrogen atom, $R^{43C}$ is absent, when $E^{44C}$ is a nitrogen atom, $R^{44C}$ is absent, and $R^{11C}$ and $R^{12C}$, $R^{12C}$ and $R^{13C}$, $R^{13C}$ and $R^{14C}$, $R^{14C}$ and $R^{34C}$, $R^{34C}$ and $R^{33C}$, $R^{33C}$ and $R^{32C}$, $R^{32C}$ and $R^{31C}$, $R^{31C}$ and $R^{41C}$, $R^{41C}$ and $R^{42C}$, $R^{42C}$ and $R^{43C}$, $R^{43C}$ and $R^{44C}$, $R^{44C}$ and $R^{24C}$, $R^{24C}$ and $R^{23C}$, $R^{23C}$ and $R^{22C}$, $R^{22C}$ and $R^{21C}$, and $R^{21C}$ and $R^{11C}$ each may be combined together to form a ring together with carbon atoms to which they are attached.

3. The light emitting device according to claim 2, wherein at least one of said compound represented by the formula (C-1) contained in said first organic layer and said compound represented by the formula (C-1) contained in said second organic layer is a compound represented by the formula (C-2-1), and said compound represented by the formula (C-2-1) is a compound represented by the formula (C-3-1):

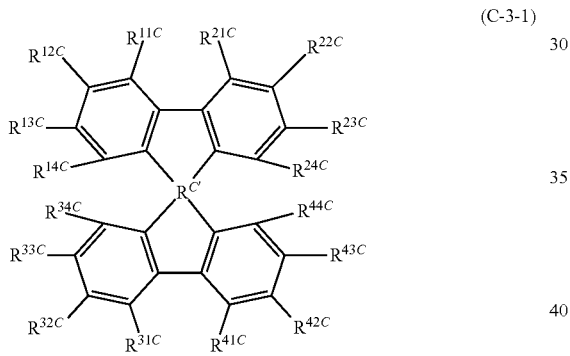

(C-3-1)

wherein, $R^{C'}$, $R^{11C}$, $R^{12C}$, $R^{13C}$, $R^{14C}$, $R^{21C}$, $R^{22C}$, $R^{23C}$, $R^{24C}$, $R^{31C}$, $R^{32C}$, $R^{33C}$, $R^{34C}$, $R^{41C}$, $R^{42C}$, $R^{43C}$, and $R^{44C}$ represent the same meaning as described above.

4. The light emitting device according to claim 2, wherein at least one of said compound represented by the formula (C-1) contained in said first organic layer and said compound represented by the formula (C-1) contained in said second organic layer is a compound represented by the formula (C-2-2), and said compound represented by the formula (C-2-2) is a compound represented by the formula (C-3-2):

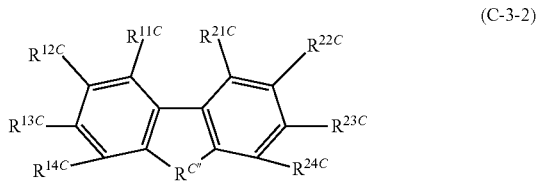

(C-3-2)

wherein, $R^{C''}$, $R^{11C}$, $R^{12C}$, $R^{13C}$, $R^{14C}$, $R^{21C}$, $R^{22C}$, $R^{23C}$ and $R^{24C}$ represent the same meaning as described above.

5. The light emitting device according to claim 1, wherein said first organic layer further contains a phosphorescent compound represented by the formula (1):

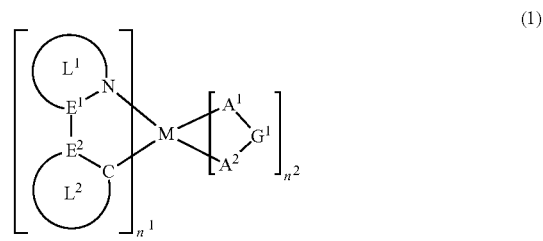

(1)

wherein,

M represents a ruthenium atom, a rhodium atom, a palladium atom, an iridium atom or a platinum atom, $n^1$ represents an integer of 1 or more, and $n^2$ represents an integer of 0 or more, and, $n^1+n^2$ is 3 when M is a ruthenium atom, a rhodium atom or an iridium atom, while $n^1+n^2$ is 2 when M is a palladium atom or a platinum atom, $E^1$ and $E^2$ each independently represent a carbon atom or a nitrogen atom, and at least one of $E^1$ and $E^2$ is a carbon atom, and when a plurality of $E^1$ and $E^2$ are present, they may be the same or different at each occurrence, Ring $L^1$ represents an aromatic hetero ring, and the aromatic hetero ring optionally has a substituent, and when a plurality of the substituents are present, they may be combined together to form a ring together with atoms to which they are attached, and when a plurality of Ring $L^1$ are present, they may be the same or different, Ring $L^2$ represents an aromatic hydrocarbon ring or an aromatic hetero ring, and the foregoing rings optionally have a substituent, and when a plurality of the substituents are present, they may be combined together to form a ring together with atoms to which they are attached, and when a plurality of Ring $L^2$ are present, they may be the same or different, the substituent which Ring $L^1$ optionally has and the substituent which Ring $L^2$ optionally has may be combined together to form a ring together with atoms to which they are attached, $A^1$-$G^1$-$A^2$ represents an anionic bidentate ligand, and $A^1$ and $A^2$ each independently represent a carbon atom, an oxygen atom or a nitrogen atom, and the foregoing atoms may be a ring constituent atom, $G^1$ represents a single bond or an atomic group constituting a bidentate ligand together with $A^1$ and $A^2$, and when a plurality of $A^1$-$G^1$-$A^2$ are present, they may be the same or different.

6. The light emitting device according to claim 5, wherein said phosphorescent compound represented by the formula (1) is a phosphorescent compound represented by the formula (1-B):

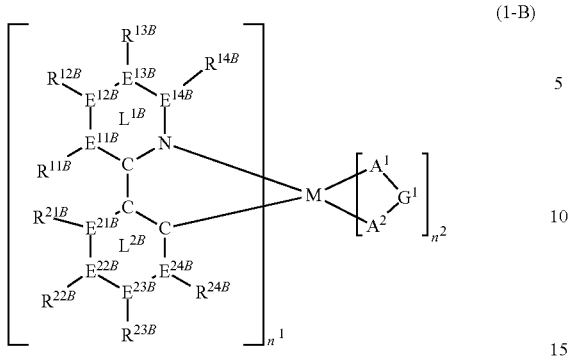

(1-B)

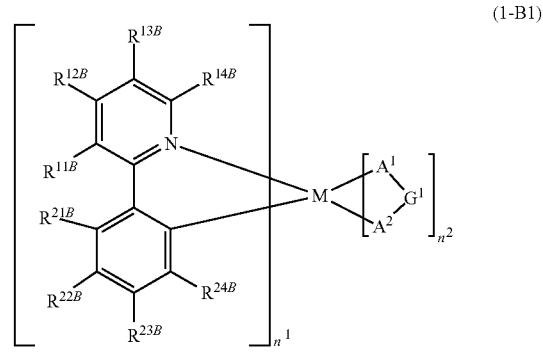

(1-B1)

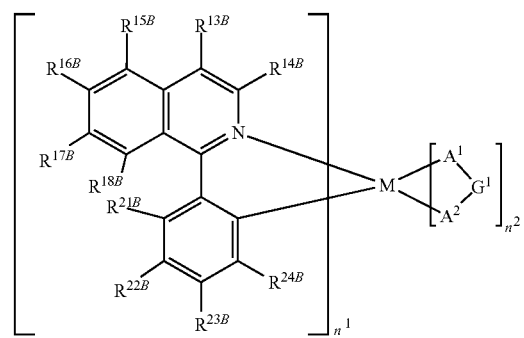

(1-B2)

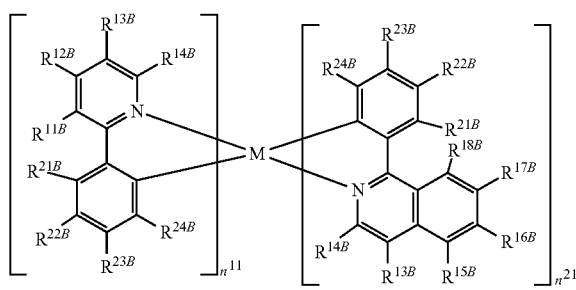

(1-B3)

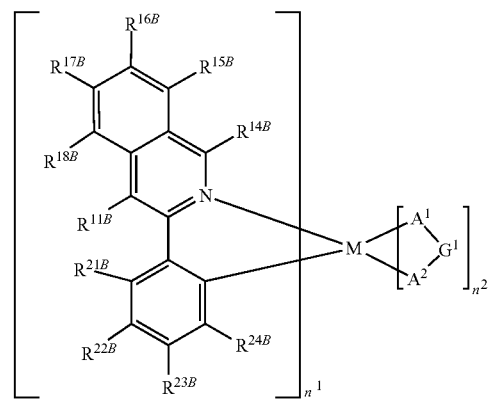

(1-B4)

wherein,

M, $n^1$, $n^2$ and $A^1$-$G^1$-$A^2$ represent the same meaning as described above, $E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom, and when a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence, and, when $E^{11B}$ is a nitrogen atom, $R^{11B}$ is absent, when $E^{12B}$ is a nitrogen atom, $R^{12B}$ is absent, when $E^{13B}$ is a nitrogen atom, $R^{13B}$ is absent, when $E^{14B}$ is a nitrogen atom, $R^{14B}$ is absent, when $E^{21B}$ is a nitrogen atom, $R^{21B}$ is absent, when $E^{22B}$ is a nitrogen atom, $R^{22B}$ is absent, when $E^{23B}$ is a nitrogen atom, $R^{23B}$ is absent, and when $E^{24B}$ is a nitrogen atom, $R^{24B}$ is absent, $R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence, and, $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with atoms to which they are attached, Ring $L^{1B}$ represents a pyridine ring or a diazabenzene ring, and Ring $L^{2B}$ represents a benzene ring, a pyridine ring or a diazabenzene ring.

7. The light emitting device according to claim 6, wherein said phosphorescent compound represented by the formula (1-B) is a phosphorescent compound represented by the formula (1-B1), a phosphorescent compound represented by the formula (1-B2), a phosphorescent compound represented by the formula (1-B3), a phosphorescent compound represented by the formula (1-B4) or a phosphorescent compound represented by the formula (1-B5):

-continued (1-B5)

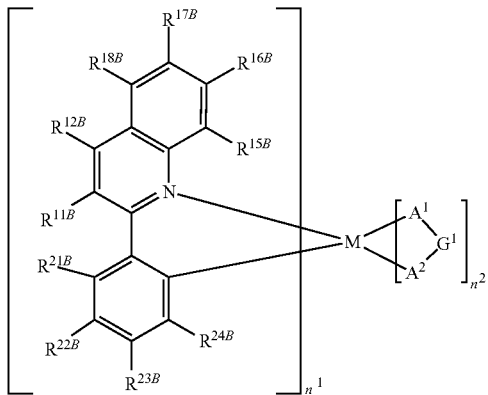

wherein,

M, $n^1$, $n^2$, $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above, $n^{11}$ and $n^{21}$ each independently represent an integer of 1 or more, and, $n^{11}+n^{21}$ is 3 when M is a ruthenium atom, a rhodium atom or an iridium atom, while $n^{11}+n^{21}$ is 2 when M is a palladium atom or a platinum atom, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of $R^{15B}$, $R^{16B}$, $R^{17B}$ and $R^{18B}$ are present, they may be the same or different at each occurrence, and, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21B}$ each may be combined together to form a ring together with atoms to which they are attached.

8. The light emitting device according to claim 5, wherein said phosphorescent compound represented by the formula (1) is a phosphorescent compound represented by the formula (1-A):

(1-A)

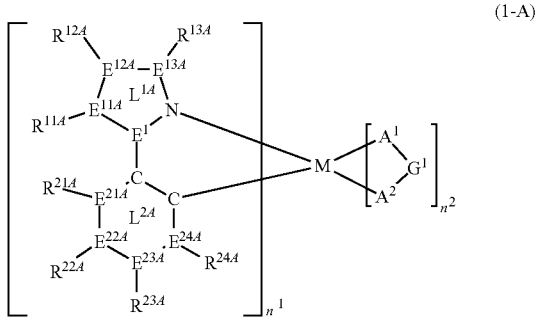

wherein,

M, $n^1$, $n^2$, $E^1$ and $A^1$-$G^1$-$A^2$ represent the same meaning as described above, $E^{11A}$, $E^{12A}$, $E^{13A}$, $E^{21A}$, $E^{22A}$, $E^{23A}$ and $E^{24A}$ each independently represent a nitrogen atom or a carbon atom, and when a plurality of $E^{11A}$, $E^{12A}$, $E^{13A}$, $E^{21A}$, $E^{22A}$, $E^{23A}$ and $E^{24A}$ are present, they may be the same or different at each occurrence, and, when $E^{11A}$ is a nitrogen atom, $R^{11A}$ may be present or absent, when $E^{12A}$ is a nitrogen atom, $R^{12A}$ may be present or absent, when $E^{13A}$ is a nitrogen atom, $R^{13A}$ may be present or absent, when $E^{21A}$ is a nitrogen atom, $R^{21A}$ is absent, when $E^{22A}$ is a nitrogen atom, $R^{22A}$ is absent, when $E^{23A}$ is a nitrogen atom, $R^{23A}$ is absent, and when $E^{24A}$ is a nitrogen atom, $R^{24A}$ is absent, $R^{11A}$, $R^{12A}$, $R^{13A}$, $R^{14A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of $R^{11A}$, $R^{12A}$, $R^{13A}$, $R^{14A}$, $R^{21A}$, $R^{22A}$, $R^{23A}$ and $R^{24A}$ are present, they may be the same or different at each occurrence, and, $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with atoms to which they are attached, Ring $L^{1A}$ represents a triazole ring or a diazole ring, and Ring $L^{2A}$ represents a benzene ring, a pyridine ring or a diazabenzene ring.

9. The light emitting device according to claim 8, wherein said phosphorescent compound represented by the formula (1-A) is a phosphorescent compound represented by the formula (1-A1), a phosphorescent compound represented by the formula (1-A2), a phosphorescent compound represented by the formula (1-A3), a phosphorescent compound represented by the formula (1-A4) or a phosphorescent compound represented by the formula (1-A5):

(1-A1)

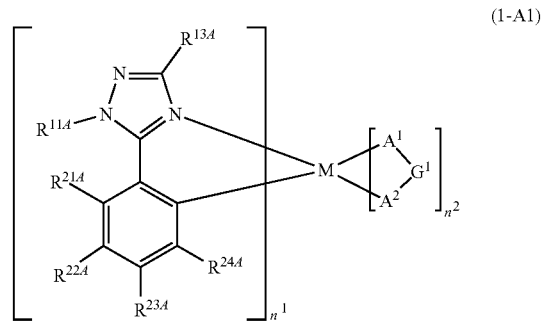

(1-A2)

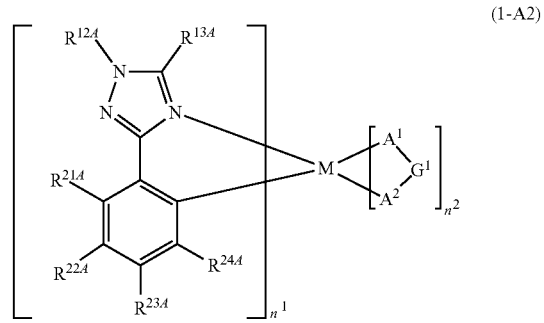

(1-A3)

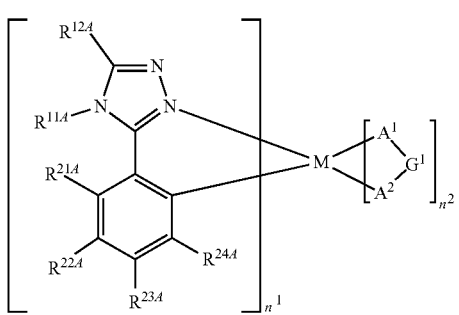

(1-A4)

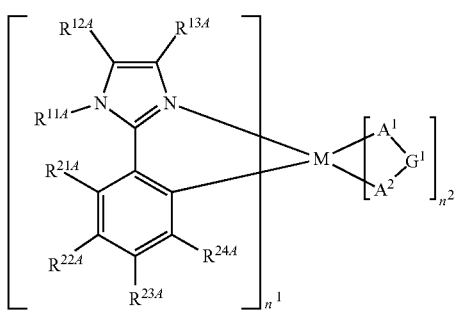

(1-A5)

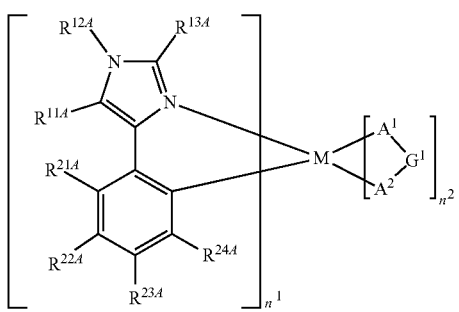

wherein, M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.

10. The light emitting device according to claim 1, wherein said crosslinkable material is
a low molecular compound having at least one crosslinkable group selected from Group A of crosslinkable group or a polymer compound containing a crosslinkable constitutional unit having at least one crosslinkable group selected from Group A of crosslinkable group:
(Group A of crosslinkable group)

(XL-1)

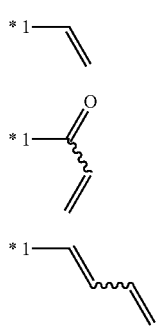

(XL-2)

(XL-3)

(XL-4)

(XL-5)

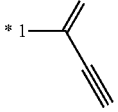

(XL-6)

(XL-7)

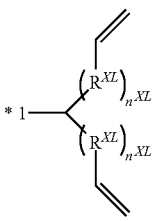

(XL-8)

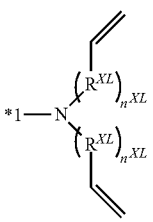

(XL-9)

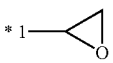

(XL-10)

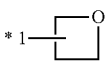

(XL-11)

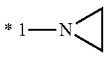

(XL-12)

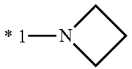

(XL-13)

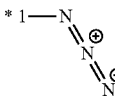

(XL-14)

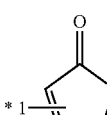

(XL-15)

-continued

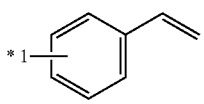
(XL-16)

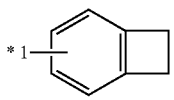
(XL-17)

wherein, $R^{XL}$ represents a methylene group, an oxygen atom or a sulfur atom, and $n^{XL}$ represents an integer of 0 to 5, and when a plurality of $R^{XL}$ are present, they may be the same or different, and when a plurality of $n^{XL}$ are present, they may be the same or different, *1 represents a binding position, and the foregoing crosslinkable groups optionally have a substituent.

11. The light emitting device according to claim 10, wherein said crosslinkable material is a polymer compound containing a crosslinkable constitutional unit having at least one crosslinkable group selected from Group A of crosslinkable group, and said crosslinkable constitutional unit is a constitutional unit represented by the formula (2) or a constitutional unit represented by the formula (2'):

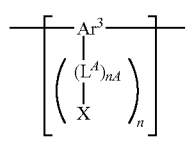
(2)

wherein,
nA represents an integer of 0 to 5, and n represents 1 or 2, and when a plurality of nA are present, they may be the same or different, $Ar^3$ represents an aromatic hydrocarbon group or a heterocyclic group, and the foregoing groups optionally have a substituent, $L^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, and when a plurality of $L^A$ are present, they may be the same or different, X represents a crosslinkable group selected from said Group A of crosslinkable group, and when a plurality of X are present, they may be the same or different,

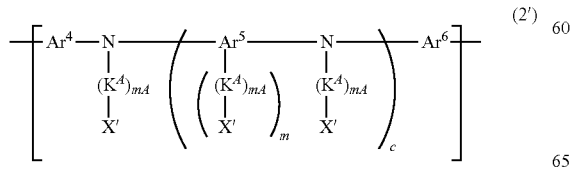
(2')

wherein,
mA represents an integer of 0 to 5, m represents an integer of 1 to 4, and c represents 0 or 1, and when a plurality of mA are present, they may be the same or different, $Ar^5$ represents an aromatic hydrocarbon group, a heterocyclic group, or a group in which at least one aromatic hydrocarbon ring and at least one hetero ring are bonded directly, and the foregoing groups optionally have a substituent, $Ar^4$ and $Ar^6$ each independently represent an arylene group or a divalent heterocyclic group, and the foregoing groups optionally have a substituent, $Ar^4$, $Ar^5$ and $Ar^6$ may each be bonded directly or via an oxygen atom or a sulfur atom to a group other than the group bonding to a nitrogen atom to which the group is attached, to form a ring, $K^A$ represents an alkylene group, a cycloalkylene group, an arylene group, a divalent heterocyclic group, a group represented by —NR"—, an oxygen atom or a sulfur atom, and the foregoing groups optionally have a substituent, R" represents a hydrogen atom, an alkyl group, a cycloalkyl group, an aryl group or a monovalent heterocyclic group, and the foregoing groups optionally have a substituent, and when a plurality of $K^A$ are present, they may be the same or different, X' represents a crosslinkable group selected from said Group A of crosslinkable group, a hydrogen atom, an alkyl group, a cycloalkyl group, an aryl group or a monovalent heterocyclic group, and the foregoing groups optionally have a substituent, and at least one X' is a crosslinkable group selected from said Group A of crosslinkable group.

12. The light emitting device according to claim 10, wherein said crosslinkable material is a low molecular compound represented by the formula (3):

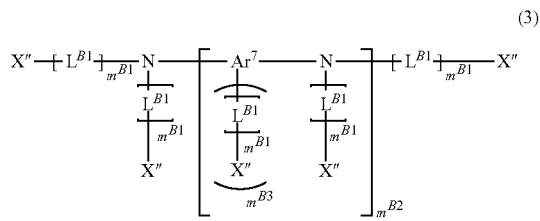
(3)

wherein,
$m^{B1}$, $m^{B2}$ and $m^{B3}$ each independently represent an integer of 0 or more and 10 or less, a plurality of $m^{B1}$ may be the same or different, and when a plurality of $m^{B3}$ are present, they may be the same or different, $Ar^7$ represents an aromatic hydrocarbon group, a heterocyclic group, or a group in which at least one aromatic hydrocarbon ring and at least one hetero ring are bonded directly, and the foregoing groups optionally have a substituent, and when a plurality of $Ar^7$ are present, they may be the same or different, $L^{B1}$ represents an alkylene group, a cycloalkylene group, an arylene group, a divalent heterocyclic group, a group represented by —NR'''—, an oxygen atom or a sulfur atom, and the foregoing groups optionally have a substituent, R''' represents a hydrogen atom, an alkyl group, a cycloalkyl group, an aryl group or a monovalent heterocyclic group, and the foregoing groups optionally have a substituent, and when a plurality of $L^{B1}$ are present, they may be the same or different, X" represents a crosslinkable group selected from Group A of crosslinkable group, a hydrogen atom, an alkyl group, a cycloalkyl group, an aryl group or a monovalent heterocyclic group, and the foregoing groups optionally have a substituent, a plurality of X" may be the same or different, and at least one of the plurality of X" is a crosslinkable group selected from Group A of crosslinkable group.

13. The light emitting device according to claim 1, wherein said first organic layer further contains at least one material selected from the group consisting of a hole transporting material, a hole injection material, an electron transporting material, an electron injection material and a light emitting material.

14. The light emitting device according to claim 1, wherein said first organic layer and said second organic layer are adjacent.

15. The light emitting device according to claim 1, wherein said second organic layer is a layer disposed between said anode and said first organic layer.

16. The light emitting device according to claim 1, wherein said crosslinkable material is a low molecular compound represented by the formula (3), or a polymer compound consisting of a constitutional unit represented by the formula (2) or a constitutional unit represented by the formula (2'), and optionally a constitutional unit represented by the formula (X) and/or a constitutional unit represented by the formula (Y):

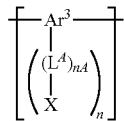

(2)

wherein, nA represents an integer of 0 to 5, and n represents 1 or 2, and when a plurality of nA are present, they may be the same or different, $Ar^3$ represents an aromatic hydrocarbon group or a heterocyclic group, and the foregoing groups optionally have a substituent, $L^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, and when a plurality of $L^A$ are present, they may be the same or different, X represents a crosslinkable group selected from said Group A of crosslinkable group, and when a plurality of X are present, they may be the same or different, (Group A of crosslinkable group)

(XL-1)

(XL-2)

(XL-3)

(XL-4)

(XL-5)

(XL-6)

(XL-7)

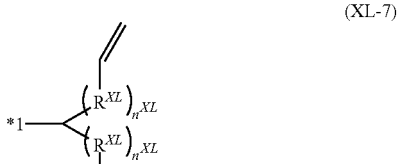
(XL-8)

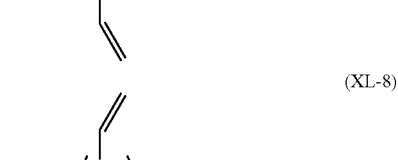

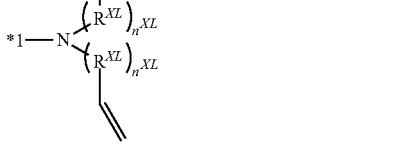
(XL-9)

(XL-10)

(XL-11)

(XL-12)

(XL-13)

-continued

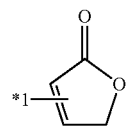
(XL-14)

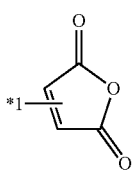
(XL-15)

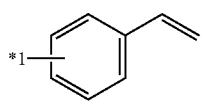
(XL-16)

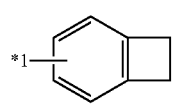
(XL-17)

wherein, $R^{XL}$ represents a methylene group, an oxygen atom or a sulfur atom, and $n^{XL}$ represents an integer of 0 to 5, and when a plurality of $R^{XL}$ are present, they may be the same or different, and when a plurality of $n^{XL}$ are present, they may be the same or different, *1 represents a binding position, and the foregoing crosslinkable groups optionally have a substituent

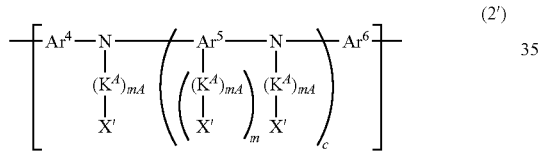
(2')

wherein,
mA represents an integer of 0 to 5, m represents an integer of 1 to 4, and c represents 0 or 1, and when a plurality of mA are present, they may be the same or different, $Ar^5$ represents an aromatic hydrocarbon group, a heterocyclic group, or a group in which at least one aromatic hydrocarbon ring and at least one hetero ring are bonded directly, and the foregoing groups optionally have a substituent, $Ar^4$ and $Ar^6$ each independently represent an arylene group or a divalent heterocyclic group, and the foregoing groups optionally have a substituent, $Ar^4$, $Ar^5$ and $Ar^6$ may each be bonded directly or via an oxygen atom or a sulfur atom to a group other than the group bonding to a nitrogen atom to which the group is attached, to form a ring, $K^A$ represents an alkylene group, a cycloalkylene group, an arylene group, a divalent heterocyclic group, a group represented by —NR"—, an oxygen atom or a sulfur atom, and the foregoing groups optionally have a substituent, R" represents a hydrogen atom, an alkyl group, a cycloalkyl group, an aryl group or a monovalent heterocyclic group, and the foregoing groups optionally have a substituent, and when a plurality of $K^A$ are present, they may be the same or different, X' represents a crosslinkable group selected from said Group A of crosslinkable group, a hydrogen atom, an alkyl group, a cycloalkyl group, an aryl group or a monovalent heterocyclic group, and the foregoing groups optionally have a substituent, and at least one X' is a crosslinkable group selected from said Group A of crosslinkable group:

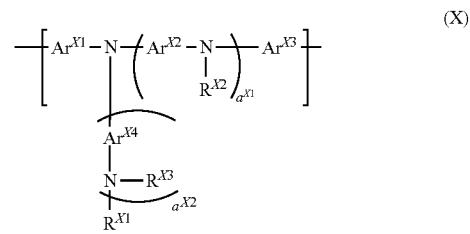
(X)

wherein,
$a^{X1}$ and $a^{X2}$ each independently represent an integer of 0 or more, $Ar^{X1}$ and $Ar^{X3}$ each independently represent an arylene group or a divalent heterocyclic group, and the foregoing groups optionally have a substituent, $Ar^{X2}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent, and when a plurality of $Ar^{X2}$ and $Ar^{X4}$ are present, they may be the same or different at each occurrence, $R^{X1}$, $R^{X2}$ and RX 3 each independently represent a hydrogen atom, an alkyl group, a cycloalkyl group, an aryl group or a monovalent heterocyclic group, and the foregoing groups optionally have a substituent, and when a plurality of $R^{X2}$ and $R^{X3}$ are present, they may be the same or different at each occurrence;

(Y)

wherein, ArY1 is an arylene group, a divalent heterocyclic group or a divalent group in which at least one arylene group and at least one divalent heterocyclic group are bonded directly, and the foregoing groups optionally have a substituent;

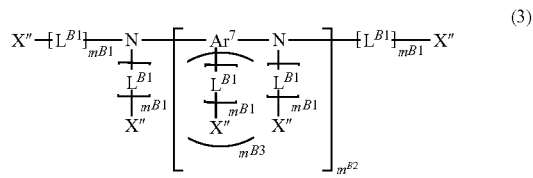
(3)

wherein,
$m^{B1}$, $m^{B2}$ and $m^{B3}$ each independently represent an integer of 0 or more and 10 or less, a plurality of $m^{B1}$ may be the same or different, and when a plurality of $m^{B3}$ are present, they may be the same or different, $Ar^7$ represents an aromatic hydrocarbon group, a heterocyclic group, or a group in which at least one aromatic hydrocarbon ring and at least one hetero ring are bonded directly, and the foregoing groups optionally have a substituent, and when a plurality of AC are present, they may be the same or different, $L^{B1}$ represents an alkylene group, a cycloalkylene group, an arylene group, a divalent heterocyclic group, a group represented by —NR'"—, an oxygen atom or a sulfur atom, and the foregoing groups optionally have a substituent, R'" represents a hydrogen atom, an alkyl group, a cycloalkyl group, an aryl group or a monovalent heterocyclic group, and the foregoing groups optionally have a substituent, and when a plurality of $L^{B1}$ are present, they may be the same or different, X" represents a crosslinkable group selected from Group A of crosslinkable group, a hydrogen atom, an alkyl group, a cycloalkyl group, an aryl group or a monovalent heterocyclic group, and the foregoing groups optionally have a substituent, a plurality of X" may be the same or different, and at least one of the plurality of X" is a crosslinkable group selected from Group A of crosslinkable group.

\* \* \* \* \*